US012255191B2

(12) United States Patent
Sawada

(10) Patent No.: US 12,255,191 B2
(45) Date of Patent: Mar. 18, 2025

(54) SEMICONDUCTOR DEVICE

(71) Applicant: ROHM CO., LTD., Kyoto (JP)

(72) Inventor: Hideki Sawada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 591 days.

(21) Appl. No.: 17/626,070

(22) PCT Filed: Sep. 7, 2020

(86) PCT No.: PCT/JP2020/033835
§ 371 (c)(1),
(2) Date: Jan. 10, 2022

(87) PCT Pub. No.: WO2021/059947
PCT Pub. Date: Apr. 1, 2021

(65) Prior Publication Data
US 2022/0254764 A1    Aug. 11, 2022

(30) Foreign Application Priority Data

Sep. 27, 2019 (JP) .................................. 2019-177885

(51) Int. Cl.
*H01L 25/16* (2023.01)
*H01L 23/00* (2006.01)
(Continued)

(52) U.S. Cl.
CPC ........ *H01L 25/162* (2013.01); *H01L 23/3121* (2013.01); *H01L 24/48* (2013.01);
(Continued)

(58) Field of Classification Search
None
See application file for complete search history.

(56) References Cited

U.S. PATENT DOCUMENTS

2014/0118056 A1    5/2014  Amada
2015/0043228 A1*   2/2015  Kogure ................... H01L 21/78
                                                                362/382
(Continued)

FOREIGN PATENT DOCUMENTS

JP    2014093373    5/2014
WO   2014033857    3/2014

OTHER PUBLICATIONS

International Search Report and Written Opinion issued for International Patent Application No. PCT/JP2020/033835, Date of mailing: Dec. 1, 2020, 9 pages including English translation of Search Report.

(Continued)

*Primary Examiner* — Michelle Mandala
*Assistant Examiner* — Jordan M Klein
(74) *Attorney, Agent, or Firm* — HSML P.C.

(57) ABSTRACT

Provided is a semiconductor device comprising: a semiconductor element; a supporting board supporting the semiconductor element; a wiring unit electrically connected to the semiconductor element; and a resin member sealing the semiconductor element. The resin member is provided with a first driving-side opening part, a second driving-side opening part, a first control-side opening part, and a second control-side opening part, in which a part of the wiring unit is exposed and on which electronic parts electrically connected to the wiring unit can be mounted.

17 Claims, 67 Drawing Sheets

(51) Int. Cl.
    *H01L 23/31*    (2006.01)
    *H02M 1/32*     (2007.01)
    *H02M 7/48*     (2007.01)
(52) U.S. Cl.
    CPC .... *H01L 24/49* (2013.01); *H01L 2224/48225* (2013.01); *H01L 2224/49175* (2013.01); *H01L 2924/19041* (2013.01); *H01L 2924/19105* (2013.01); *H02M 1/32* (2013.01); *H02M 7/48* (2013.01)

(56) References Cited

U.S. PATENT DOCUMENTS

2015/0171764 A1    6/2015  Ujita et al.
2016/0358848 A1*  12/2016  Meyer .................... H01L 25/16

OTHER PUBLICATIONS

International Preliminary Report on Patentability issued for International Patent Application No. PCT/JP2020/033835, Date of issuance: Mar. 15, 2022, 10 pages including English translation.
Office Action issued for German Patent Application No. 11 2020 005 270.2, dated Sep. 4, 2023, 9 pages including partial English machine translation.
Notice of Reasons for Refusal issued for Japanese Patent Application No. 2021-548756, Dispatch date: Sep. 24, 2024, 6 pages including English machine translation.

* cited by examiner

SEMICONDUCTOR DEVICE

TECHNICAL FIELD

The present disclosure relates to a semiconductor device.

BACKGROUND ART

A semiconductor device that is used in an inverter circuit or the like includes an island, which serves as a conductive member, a transistor, of which the drain electrode is connected to the island, a plurality of terminals electrically connected to the transistor, and a resin member, which encapsulates the transistor and portions of the terminals (refer to, for example, Patent Literature 1).

Patent Literature 1: Japanese Laid-Open Patent Publication No. 2014-93373

SUMMARY

When a semiconductor device is used in an inverter circuit, surge or disturbance caused by the inverter circuit may affect the semiconductor device. Thus, a control board on which the inverter circuit is formed and the semiconductor device is mounted includes a surge reduction circuit that reduces surge at the gate electrode of the transistor or a short-circuiting protection circuit that protects circuits including transistors. However, the arrangement of the surge reduction circuit on the control board increases the distance between the surge reduction circuit and the semiconductor device. This increases the inductance of the conductor (wire) connecting the surge reduction circuit and the transistor. Further, the arrangement of the short-circuiting protection circuit on the control board results in the need for the short-circuiting protection circuit to be distanced from signal terminals of the semiconductor devices to provide insulation. This imposes restrictions on the degree of design freedom in the periphery of the short-circuiting protection circuit.

Accordingly, the semiconductor device may incorporate portions of the surge reduction circuit and the short circuit protection circuit. This will decrease the distance between the surge reduction circuit and the transistor as compared with when the surge reduction circuit and the short-circuiting protection circuit are formed outside the semiconductor device. Thus, the length of the conductor connecting the surge reduction circuit and the transistor will be shortened. In addition, there will be no need for the short circuit protection circuit to be distanced for insulation from the signal terminals. This will simplify the layout of the control board.

However, when portions of the surge reduction circuit and the short-circuiting protection circuit are incorporated in the semiconductor device, the electrical characteristics of the surge reduction circuit and the electrical characteristics of the short-circuiting protection circuit cannot be adjusted after the resin member is formed. This adversely affects the usability of the semiconductor device. The same problem occurs when a semiconductor device incorporates an electric circuit, other than the surge reduction circuit and the short-circuiting protection circuit, that is electrically connected to a transistor.

It is an objective of the present disclosure to provide a semiconductor device that reduces inductance, simplifies the layout of a control board, and is easy to use.

A semiconductor device according to one aspect of the present disclosure includes a semiconductor element, a support substrate that supports the semiconductor element, a conductor electrically connected to the semiconductor element, and a resin member that encapsulates the semiconductor element. The conductor includes a mounting region on which an electronic component is mounted, and the resin member includes a resin opening that exposes the mounting region.

With this configuration, the semiconductor device incorporates the conductor that is connected to, for example, electronic components of a surge reduction circuit. This decreases the length of the conductor compared with when the conductor is arranged outside the semiconductor device. Accordingly, the inductance of the conductor is reduced.

Further, the semiconductor device incorporates portions of an electronic component forming an electric circuit such as a short circuit protection circuit. This simplifies the layout of a control board compared with when the electric circuit of a short-circuiting protection circuit or the like is arranged outside the semiconductor device.

Electronic components of an electrical circuit electrically connected to, for example, semiconductor elements of a surge reduction circuit, a short-circuiting protection circuit, or the like are mounted through a resin opening on the mounting region of the conductor. This allows the electrical characteristics of the electrical circuit to be adjusted after the resin member is formed. Accordingly, after mounting the semiconductor device on, for example, a control board, the electrical characteristics of the semiconductor device can be adjusted so that the electrical characteristics are suitable for the electrical circuits applied to the semiconductor device.

The semiconductor device reduces inductance, simplifies the layout of the control board, and is easy to use.

DESCRIPTION OF EMBODIMENTS

Embodiments of a semiconductor device will now be described with reference to the drawings. The embodiments described below exemplify configurations and methods for embodying a technical concept without any intention to limit the material, shape, structure, arrangement, dimensions, and the like of each component. The embodiments described below may undergo various modifications.

First Embodiment

Figure 10:
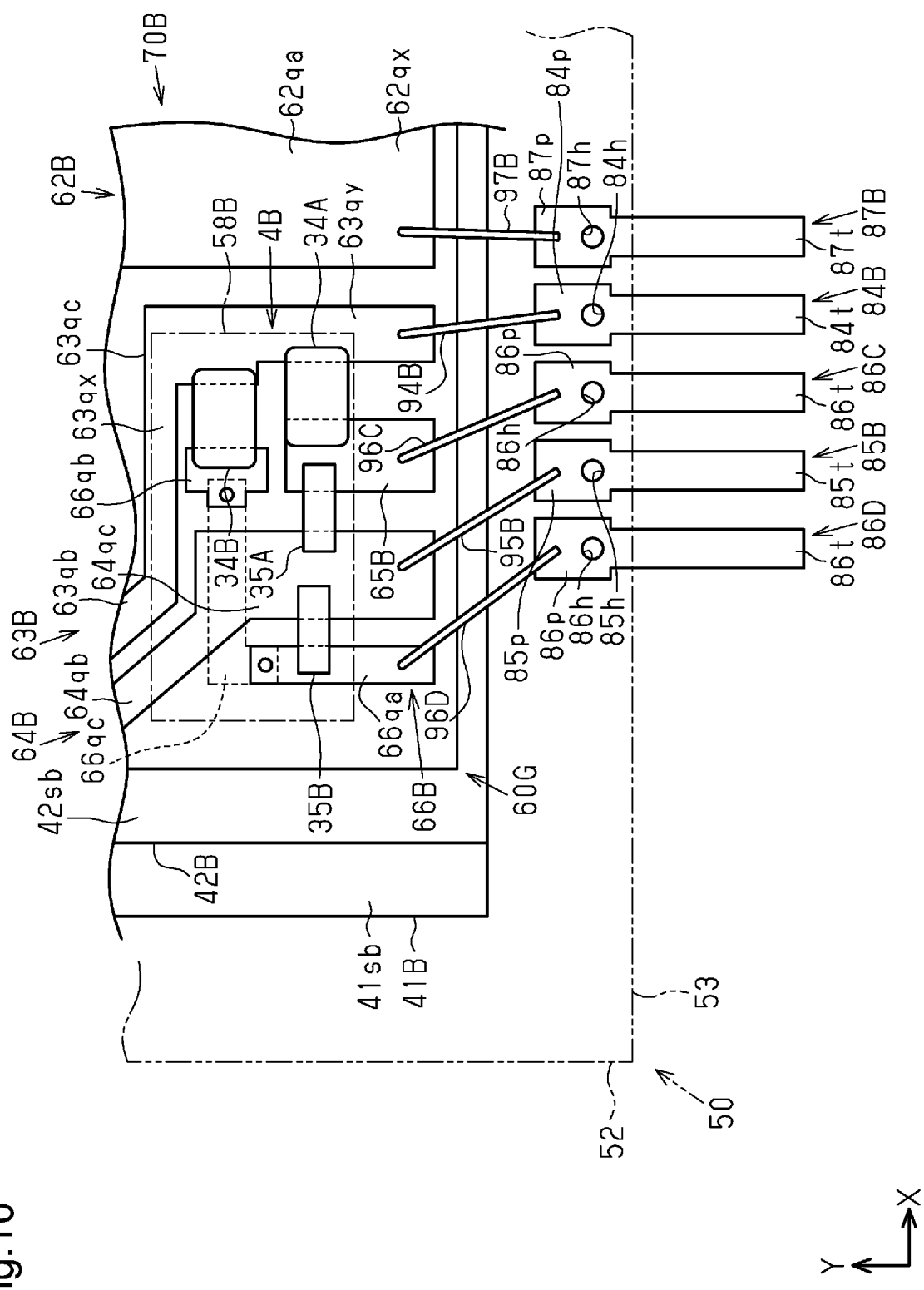
FIG. 10 is an enlarged view of a second wiring region in the semiconductor device shown in FIG. 7A.
Figure 11A:
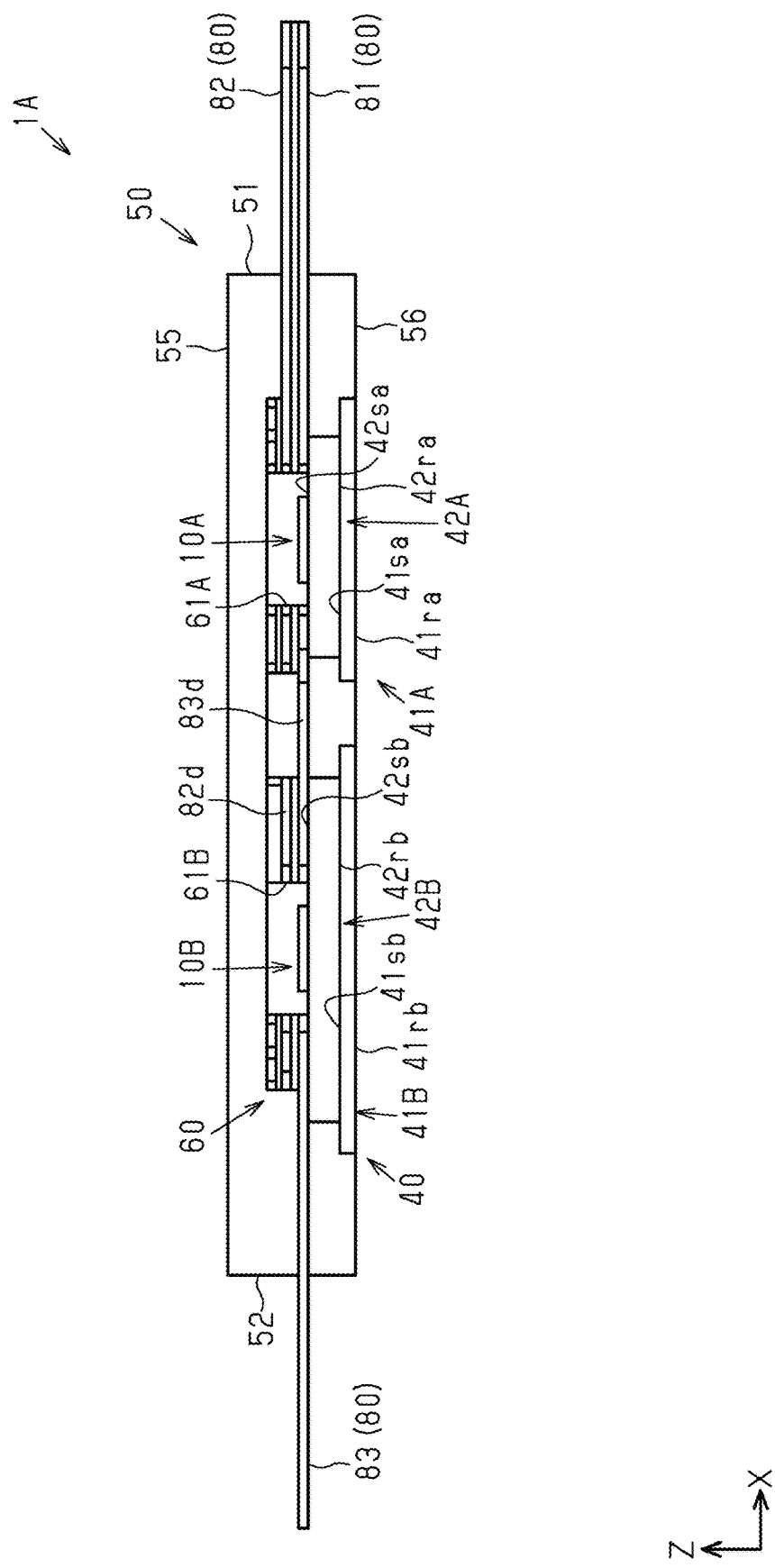
FIG. 11A is a cross-sectional diagram of the semiconductor device.
Figure 11B:
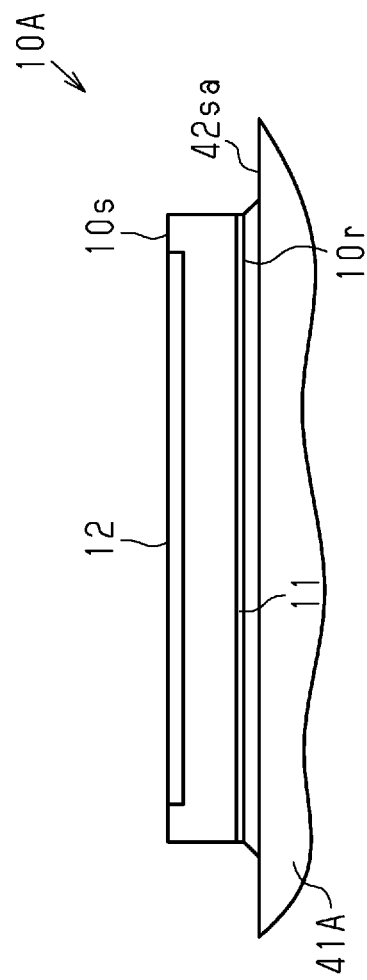
FIG. 11B is an enlarged view of one first semiconductor element shown in FIG. 11A.

With reference to FIGS. 1 to 14, a semiconductor device in accordance with a first embodiment will now be described. Hatching lines indicating the cross section of semiconductor elements are not used in the cross-sectional views of FIGS. 11A and 11B showing the semiconductor device.

General Configuration of Semiconductor Device

Figure 1:
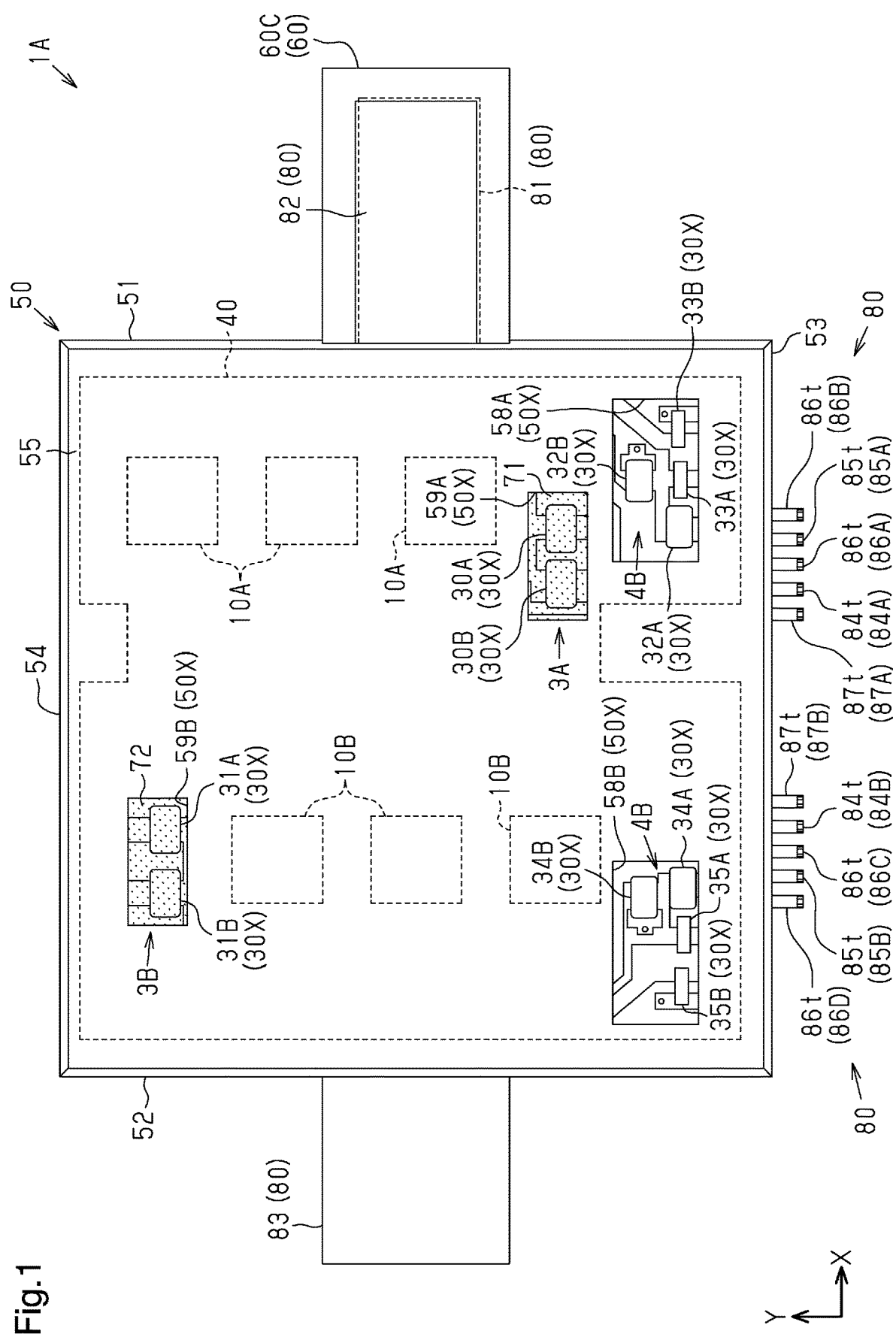
FIG. 1 is a plan view of a semiconductor device in accordance with a first embodiment.

As shown in FIG. 1, a semiconductor device 1A includes first semiconductor elements 10A and second semiconductor elements 10B, each serving as a semiconductor element, a support substrate 40, which supports the semiconductor elements 10A and 10B, a resin member 50, which encapsulates the support substrate 40 and the semiconductor elements 10A and 10B, and leads 80, which project from the resin member 50. The resin member 50 includes resin openings 50X that allow for mounting of electronic components. The semiconductor device 1A is operated by electronic components 30X that are mounted in the resin openings 50X.

One example of a circuit configuration of the semiconductor device 1A will now be described.

Circuit Configuration of Semiconductor Device

Figure 5:
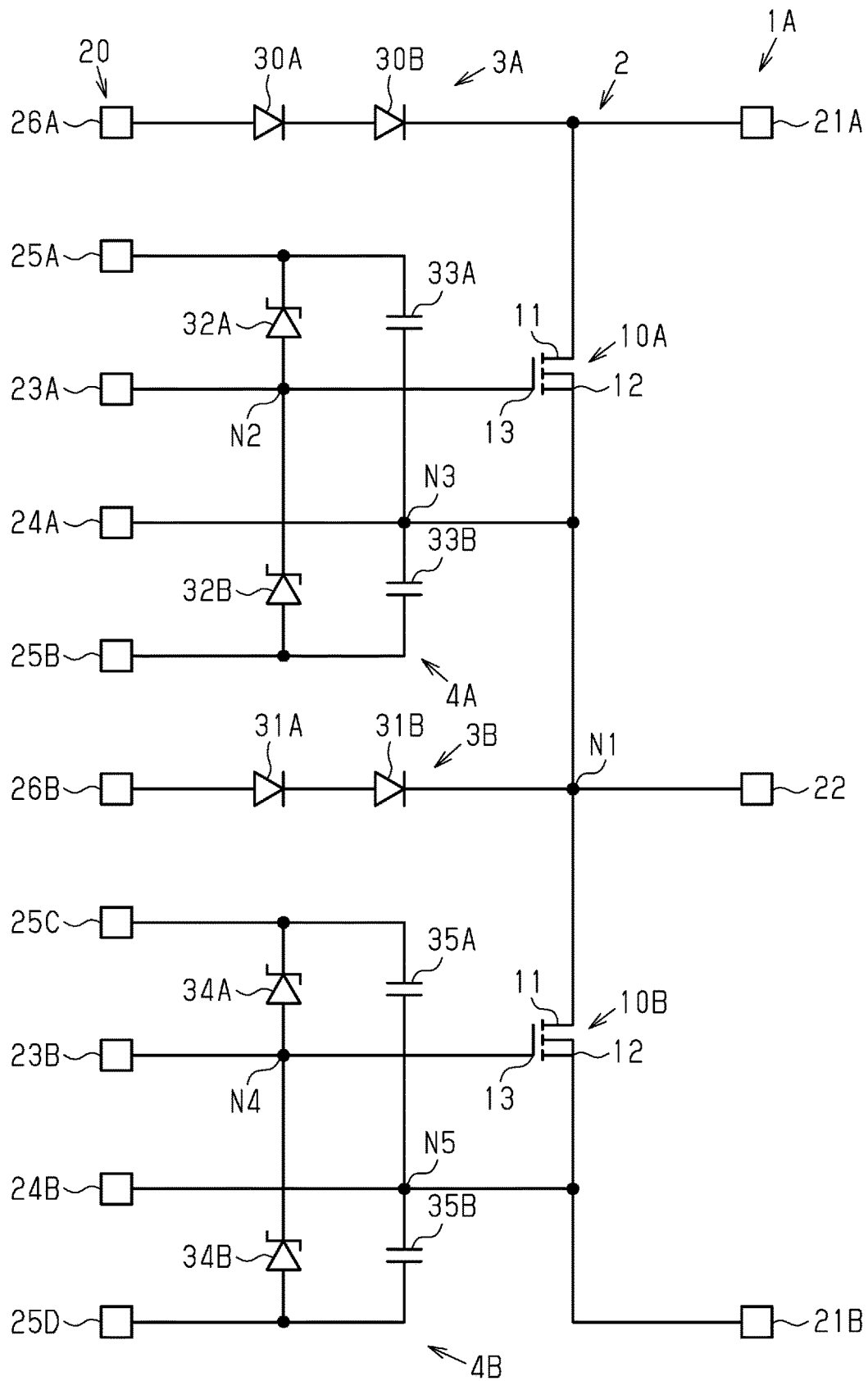
FIG. 5 is a circuit diagram of the semiconductor device shown in FIG. 1.

As shown in FIG. 5, the semiconductor device 1A includes a half-bridge type switching circuit 2, in which a first semiconductor element 10A and a second semiconductor element 10B are connected in series, and terminals 20. The semiconductor device 1A is a power converter (power module) used in, for example, a drive source for a motor, an inverter for various types of electronic devices, a DC/DC converter for various types of electronic devices, or the like.

The semiconductor elements 10A and 10B are used as switching elements. The semiconductor elements 10A and 10B use, for example, transistors formed by silicon (Si) or silicon carbide (SiC), transistors formed by gallium nitride (GaN) or gallium arsenide (GaAs), transistors formed by gallium oxide (Ga2O3), or the like. The semiconductor elements 10A and 10B that are formed from SiC are suited for high-speed operations. In the present embodiment, the semiconductor elements 10A and 10B use n-type Metal-Oxide-Semiconductor Field-Effect Transistors (MOSFETs) formed from SiC. Each of the semiconductor elements 10A and 10B is not limited to a MOSFET and may be a field effect transistor such as a Metal-Insulative Material-Semiconductor FET (MISFET) or a bipolar transistor such as an Insulated Gate Bipolar Transistor (IGBT). The semiconductor elements 10A and 10B may be n-channel MOSFETs or p-channel MOSFETs.

Each of the semiconductor elements 10A and 10B includes a drain electrode 11, which is one example of a first drive electrode, a source electrode 12, which is one example of a second drive electrode, and a gate electrode 13, which is one example of a control electrode. The gate electrode 13 of the first semiconductor element 10A controls the voltage supplied to the first semiconductor element 10A. The gate electrode 13 of the second semiconductor element 10B controls the voltage supplied to the second semiconductor element 10B. As shown in FIG. 5, in the present embodiment, the source electrode 12 of the first semiconductor element 10A is connected to the drain electrode 11 of the second semiconductor element 10B to form the switching circuit 2. More specifically, the first semiconductor element 10A forms the upper arm of the switching circuit 2, and the second semiconductor element 10B forms the lower arm of the switching circuit 2.

The semiconductor device 1A includes a first short-circuiting detection circuit 3A, which detects short-circuiting of the first semiconductor element 10A, and a second short-circuiting detection circuit 3B, which detects short-circuiting of the second semiconductor element 10B. The first short-circuiting detection circuit 3A and the second short-circuiting detection circuit 3B each form part of a short-circuiting protection circuit (not shown) in a later stage. The short-circuiting protection circuit is a circuit providing protection from short-circuiting of each of the semiconductor elements 10A and 10B and is arranged outside the semiconductor device 1A except for the circuit section of the short-circuiting detection circuits 3A and 3B.

In further detail, the semiconductor device 1A includes first high-voltage diodes 30A and 30B, which are examples of electronic components that protect the first semiconductor element 10A, and second high-voltage diodes 31A and 31B, which are examples of electronic components that protect the second semiconductor element 10B. The high-voltage diodes 30A, 30B, 31A, and 31B each correspond to one of the electronic components 30X, which are mounted in the resin openings 50X.

The first high-voltage diodes 30A and 30B are connected to each other in series. The cathode electrode of the first high-voltage diode 30A is electrically connected to the anode electrode of the first high-voltage diode 30B, and the anode electrode of the first high-voltage diode 30B is electrically connected to the drain electrode 11 of the first semiconductor element 10A. This forms the first short-circuiting detection circuit 3A.

The second high-voltage diodes 31A and 31B are connected to each other in series, the cathode electrode of the second high-voltage diode 31A is electrically connected to the anode electrode of the second high-voltage diode 31B, and the anode electrode of the second high-voltage diode 31B is electrically connected to the drain electrode 11 of the second semiconductor element 10B. This forms the second short-circuiting detection circuit 3B.

Further, the semiconductor device 1A includes a first surge reduction circuit 4A, which reduces surge in the voltage Vgs at the gate electrode 13 of the first semiconductor element 10A, and a second surge reduction circuit 4B, which reduces surge in the voltage Vgs at the gate electrode 13 of the second semiconductor element 10B. In further detail, the semiconductor device 1A includes first low-voltage diodes 32A and 32B and first capacitors 33A and 33B, which are examples of electronic components that reduce surge in the voltage Vgs applied to the gate electrode 13 of the first semiconductor element 10A, and second low-voltage diodes 34A and 34B and second capacitors 35A and 35B, which are examples of electronic components that reduce surge in the voltage Vgs applied to the gate electrode 13 of the second semiconductor element 10B. In the present embodiment, Schottky barrier diodes are used as the low-voltage diodes 32A, 32B, 34A, and 34B. The low-voltage diodes 32A, 32B, 34A, and 34B and the capacitors 33A, 33B, 35A, and 35B each correspond to one of the electronic components 30X, which are mounted in the resin openings 50X.

The first low-voltage diodes 32A and 32B are connected to each other in series. The cathode electrode of the first low-voltage diode 32B is electrically connected to the anode electrode of the first low-voltage diode 32A. A node N2 between the anode electrode of the first low-voltage diode 32A and the cathode electrode of the first low-voltage diode 32B is connected to the gate electrode 13 of the first semiconductor element 10A.

The first capacitors 33A and 33B are connected to each other in series and connected parallel to the first low-voltage diodes 32A and 32B. A first terminal of the first capacitor 33A is electrically connected to the cathode electrode of the first low-voltage diode 32A, and a second terminal of the first capacitor 33A is connected to a first terminal of the first capacitor 33B. A second terminal of the first capacitor 33B is connected to the anode electrode of the first low-voltage diode 32B. A node N3 between the second terminal of the first capacitor 33A and the first terminal of the first capacitor 33B is electrically connected to the source electrode 12 of the first semiconductor element 10A. The first low-voltage diodes 32A and 32B and the first capacitors 33A and 33B are connected in this manner to form the first surge reduction circuit 4A.

The second low-voltage diodes 34A and 34B are connected to each other in series. The cathode electrode of the second low-voltage diode 34B is electrically connected to the anode electrode of the second low-voltage diode 34A, and a node N4 between the anode electrode of the second low-voltage diode 34A and the cathode electrode of the second low-voltage diode 34B is connected to the gate electrode 13 of the second semiconductor element 10B.

The second capacitors 35A and 35B are connected to each other in series and connected parallel to the second low-voltage diodes 34A and 34B. A first terminal of the second capacitor 35A is connected to the cathode electrode of the second low-voltage diode 34A, and a second terminal of the second capacitor 35A is connected to a first terminal of the second capacitor 35B. A second terminal of the second capacitor 35B is connected to the anode electrode of the second low-voltage diode 34B. A node N5 between the second terminal of the second capacitor 35A and the first terminal of the second capacitor 35B is connected to the source electrode 12 of the second semiconductor element 10B. The second low-voltage diodes 34A and 34B and the second capacitors 35A and 35B are connected in this manner to form the second surge reduction circuit 4B.

The terminals 20 include a first power terminal 21A, a second power terminal 21B, an output terminal 22, a first control terminal 23A, a second control terminal 23B, a first source terminal 24A, a second source terminal 24B, a first control power terminal 25A, a first control power terminal 25B, a second control power terminal 25C, a second control power terminal 25D, a first short-circuiting detection terminal 26A, and a second short-circuiting detection terminal 26B. The first short-circuiting detection terminal 26A and the second short-circuiting detection terminal 26B are DESAT control power terminals that detect short-circuiting in a load.

The first power terminal 21A is electrically connected to the drain electrode 11 of the first semiconductor element 10A. The second power terminal 21B is electrically connected to the source electrode 12 of the second semiconductor element 10B. The output terminal 22 is electrically connected to a node N1 between the source electrode 12 of the first semiconductor element 10A and the drain electrode 11 of the second semiconductor element 10B.

The first control terminal 23A is electrically connected to the node N2 between the anode electrode of the first low-voltage diode 32A and the cathode electrode of the first low-voltage diode 32B, and electrically connected via the node N2 to the gate electrode 13 of the first semiconductor element 10A.

The first source terminal 24A is electrically connected to the node N3 between the second terminal of the first capacitor 33A and the first terminal of the first capacitor 33B, and electrically connected via the node N3 to the source electrode 12 of the first semiconductor element 10A.

The first control power terminal 25A is electrically connected to the cathode electrode of the first low-voltage diode 32A and the first terminal of the first capacitor 33A. The first control power terminal 25B is electrically connected to the anode electrode of the first low-voltage diode 32B and the second terminal of the first capacitor 33B. In this manner, the first surge reduction circuit 4A is electrically connected to the first control power terminal 25A and the first control power terminal 25B.

The second control power terminal 25C is electrically connected to the cathode electrode of the second low-voltage diode 34A and the first terminal of the second capacitor 35A. The second control power terminal 25D is electrically connected to the anode electrode of the second low-voltage diode 34B and the second terminal of the second capacitor 35B. In this manner, the second surge reduction circuit 4B is electrically connected to the second control power terminal 25C and the second control power terminal 25D.

The first short-circuiting detection terminal 26A is electrically connected to the anode electrode of the first high-voltage diode 30A. Thus, the first short-circuiting detection terminal 26A is connected via the first short-circuiting detection circuit 3A to the drain electrode 11 of the first semiconductor element 10A. The second short-circuiting detection terminal 26B is electrically connected to the anode electrode of the second high-voltage diode 31A. Thus, the second short-circuiting detection terminal 26B is electrically connected via the second short-circuiting detection circuit 3B to the drain electrode 11 of the second semiconductor element 10B.

Configuration of Semiconductor Device

The high-voltage diodes 30A, 30B, 31A, and 31B, the low-voltage diodes 32A, 32B, 34A, and 34B, and the capacitors 33A, 33B, 35A, and 35B are mounted as the electronic components 30X on the semiconductor device 1A. Any one of the electronic components described above may be mounted from the beginning on the semiconductor device 1A.

The configuration of the semiconductor device 1A will now be described in detail. In FIGS. 1, 2, 6, and 7A, electronic components are mounted from the beginning on the semiconductor device 1A.

As shown in FIGS. 1 to 4, 6, and 7A, the semiconductor device 1A includes the support substrate 40, which supports the semiconductor elements 10A and 10B, and the resin member 50, which encapsulates the semiconductor elements 10A and 10B. In the present embodiment, the support substrate 40 and the resin member 50 form a package. In the description hereafter, orthogonally intersecting directions are defined as the width direction X, the length direction Y, and the thickness direction Z. The thickness direction Z is the thickness direction of the support substrate 40 and the direction in which the support substrate 40 and the resin member 50 are aligned. The width direction X is, for example, the direction in which a first input lead 81, a second input lead 82, and an output lead 83, which will be described later, are aligned in the semiconductor device 1A. The length direction Y is a direction perpendicular to the width direction X in a view of the semiconductor device 1A taken in the thickness direction Z (hereinafter, referred to as plan view).

As shown in FIGS. 1 to 4, the resin member 50 has the form of a substantially flat plate. As shown in FIG. 1, the resin member 50 has a rectangular shape in a plan view. In the present embodiment, the shape of the resin member 50 in a plan view is rectangular so that the width direction X is the long-side direction and the length direction Y is the short-side direction. The resin member 50 may have any shape in a plan view. For example, the shape of the resin member 50 in a plan view may be square. The resin member 50 is formed from a thermosetting resin. In the present embodiment, the material forming the resin member 50 is an epoxy resin having a black color.

The resin member 50 includes a top resin surface 55 and a back resin surface 56, which are faced away from each other in the thickness direction Z, and a first resin side surface 51, a second resin side surface 52, a third resin side surface 53, and a fourth resin side surface 54, which are formed between the top resin surface 55 and the back resin surface 56 in the thickness direction Z and intersect the top resin surface 55 and the back resin surface 56. In the present embodiment, the first resin side surface 51 and the second resin side surface 52 are faced away from each other in the width direction X. In a plan view, the first resin side surface 51 and the second resin side surface 52 each extend in the length direction Y. The third resin side surface 53 and the fourth resin side surface 54 are faced toward opposite directions in the length direction Y. In a plan view, the third resin side surface 53 and the fourth resin side surface 54 each extend in the width direction X. In the present embodiment, in a plan view, the first resin side surface 51 and the second resin side surface 52 are the short sides of the resin member 50, and the third resin side surface 53 and the fourth resin side surface 54 are the long sides of the resin member 50.

Figure 3:
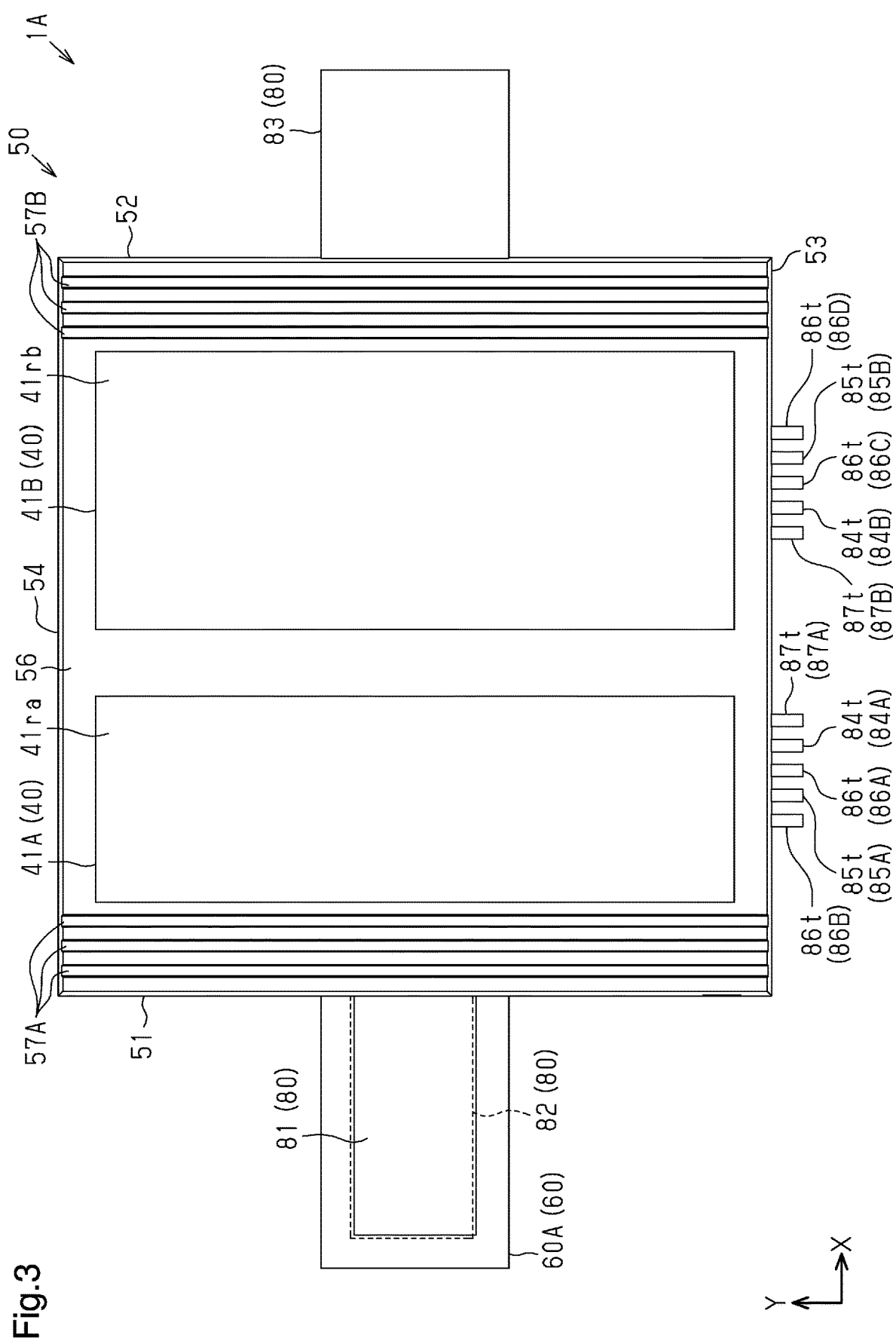
FIG. 3 is a bottom view of the semiconductor device shown in FIG. 1.
Figure 4:
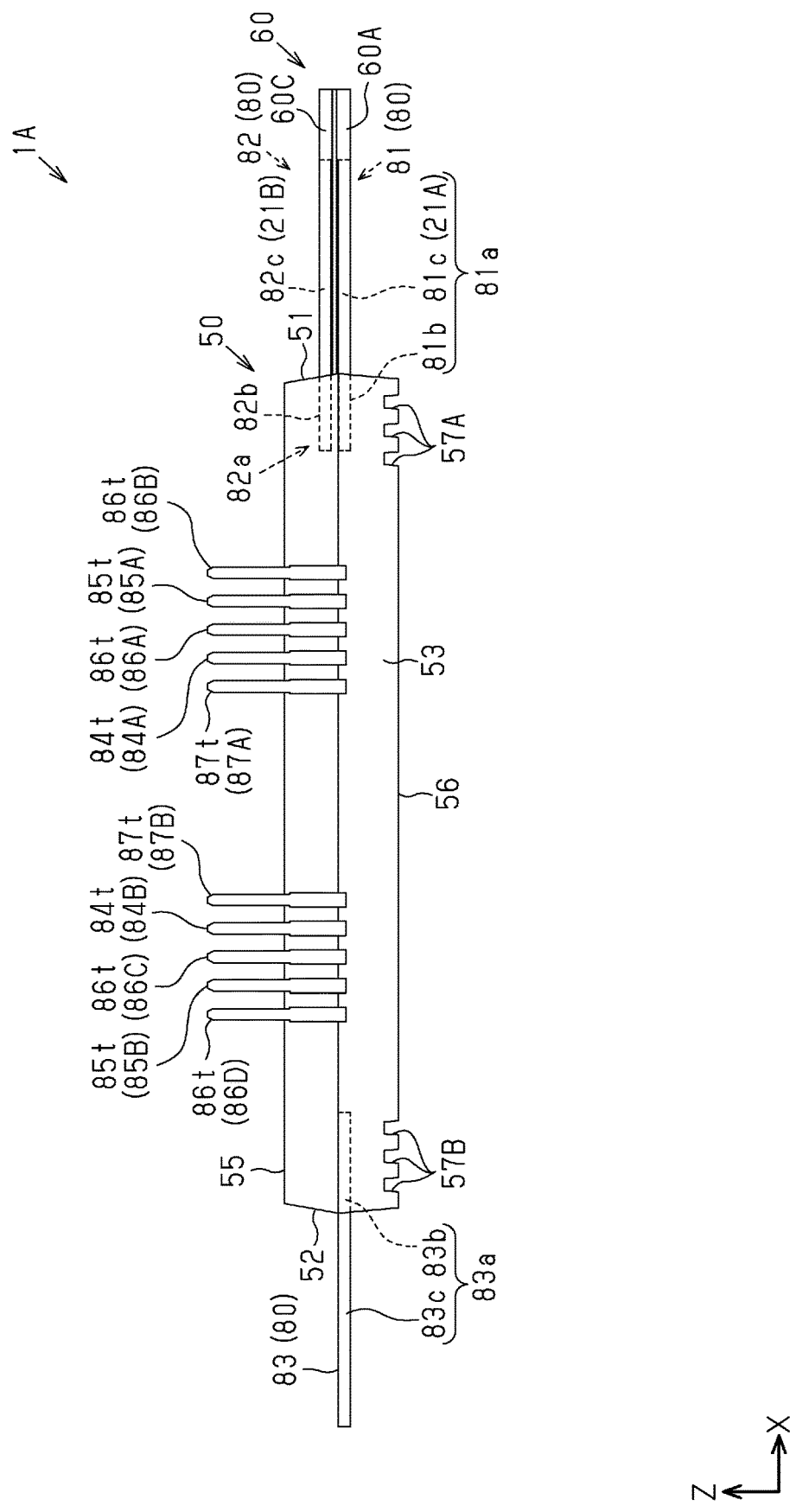
FIG. 4 is a side view of the semiconductor device shown in FIG. 1.

As shown in FIGS. 3 and 4, a portion of the resin member 50 located toward the back resin surface 56 includes grooves 57A and 57B that are recessed from the back resin surface 56 in the thickness direction Z. The grooves 57A are arranged at the end of the resin member 50 in the width direction X near the first resin side surface 51. A multiple number of grooves 57A (three in the present embodiment) are arranged spaced apart from one another in the width direction X. The grooves 57B are arranged at the end of the resin member 50 in the width direction X near the second resin side surface 52. A multiple number of grooves 57B (three in the present embodiment) are arranged spaced apart from one another in the width direction X. The grooves 57A and 57B each extend in the length direction Y. In one example, the grooves 57A and 57B extend in the resin member 50 from the third resin side surface 53 to the fourth resin side surface 54. The number of the grooves 57A and 57B may be freely changed. Further, either the grooves 57A or the grooves 57B may be omitted from the resin member 50.

The support substrate 40 forms a conductive path electrically connected to the semiconductor elements 10A and 10B and supports the semiconductor elements 10A and 10B. The support substrate 40 includes a first insulative substrate 41A, a second insulative substrate 41B, a first conductive member 42A, and a second conductive member 42B. The support substrate 40 is formed by stacking the insulative substrates 41A and 41B and the conductive members 42A and 42B in this order in the thickness direction Z.

The insulative substrates 41A and 41B are each electrically insulative. The insulative substrates 41A and 41B are formed from, for example, a ceramic having excellent thermal conductivity. Examples of such a ceramic includes aluminum nitride (AlN), silicon nitride (SiN), aluminum oxide (Al2O3), and the like. In the present embodiment, the shape of each of the insulative substrates 41A and 41B in a plan view is rectangular so that the length direction Y is the long-side direction and the width direction X is the short-side direction. The length of the first insulative substrate 41A in the width direction X is less than the length of the second insulative substrate 41B in the width direction X. The length of the first insulative substrate 41A in the length direction Y is equal to the length of the second insulative substrate 41B in the length direction Y. The thickness of the first insulative substrate 41A (dimension of first insulative substrate 41A in thickness direction Z) is equal to the thickness of the second insulative substrate 41B (dimension of second insulative substrate 41B in thickness direction Z). As shown in FIG. 11A, the first insulative substrate 41A includes a substrate main surface 41sa and a substrate back surface 41ra that are faced away from each other in the thickness direction Z. The second insulative substrate 41B includes a substrate main surface 41sb and a substrate back surface 41rb that are faced away from each other in the thickness direction Z. The first insulative substrate 41A and the second insulative substrate 41B are arranged spaced apart in the width direction X. The first conductive member 42A is disposed on the substrate main surface 41sa of the first insulative substrate 41A. The second conductive member 42B is disposed on the substrate main surface 41sb of the second insulative substrate 41B. The first conductive member 42A and the second conductive member 42B are arranged in a state spaced apart in a first direction that is orthogonal to the thickness direction Z. In the present embodiment, the first conductive member 42A and the second conductive member 42B are arranged spaced apart in the length direction Y. The substrate main surface 41sa and 41sb of the insulative substrates 41A and 41B are encapsulated together with the conductive members 42A and 42B by the resin member 50. As shown in FIG. 3, the substrate back surface 41ra and 41rb of the insulative substrates 41A and 41B are exposed from the resin member 50. The substrate back surface 41ra and 41rb of the insulative substrates 41A and 41B are connected to, for example, a heat sink (not shown). The substrate back surface 41ra and 41rb of the insulative substrates 41A and 41B are located between the grooves 57A and the grooves 57B of the resin member 50 in the width direction X.

Each of the first conductive member 42A and the second conductive member 42B is a metal plate. The material of the metal plate is copper (Cu) or a copper alloy. The conductive members 42A and 42B form conductive paths with the semiconductor elements 10A and 10B. The conductive members 42A and 42B are bonded by, for example, a bonding material such as silver paste or solder to the substrate main surface 41sa and 41sb of the insulative substrates 41A and 41B. The bonding material may be a conductive material, such as silver paste or solder, or an electrically insulative material. The thickness (dimension in thickness direction Z) of each of the conductive members 42A and 42B is greater than the thickness (dimension in thickness direction Z) of each of the insulative substrates 41A and 41B and is, for example, 0.4 mm or greater and 3.0 mm or less. The surfaces of the conductive members 42A and 42B may be coated by silver plating.

In a plan view, the shape of the first conductive member 42A and the shape of the second conductive member 42B may be rectangular so that the length direction Y is the long-side direction and the width direction X is the short-side direction. In a plan view, the shape of the first conductive member 42A differs from the shape of the second conductive member 42B. In detail, the length of the first conductive member 42A in the width direction X is less than the length of the second conductive member 42B in the width direction X. The length of the first conductive member 42A in the length direction Y is equal to the length of the second conductive member 42B in the length direction Y.

Figure 6:
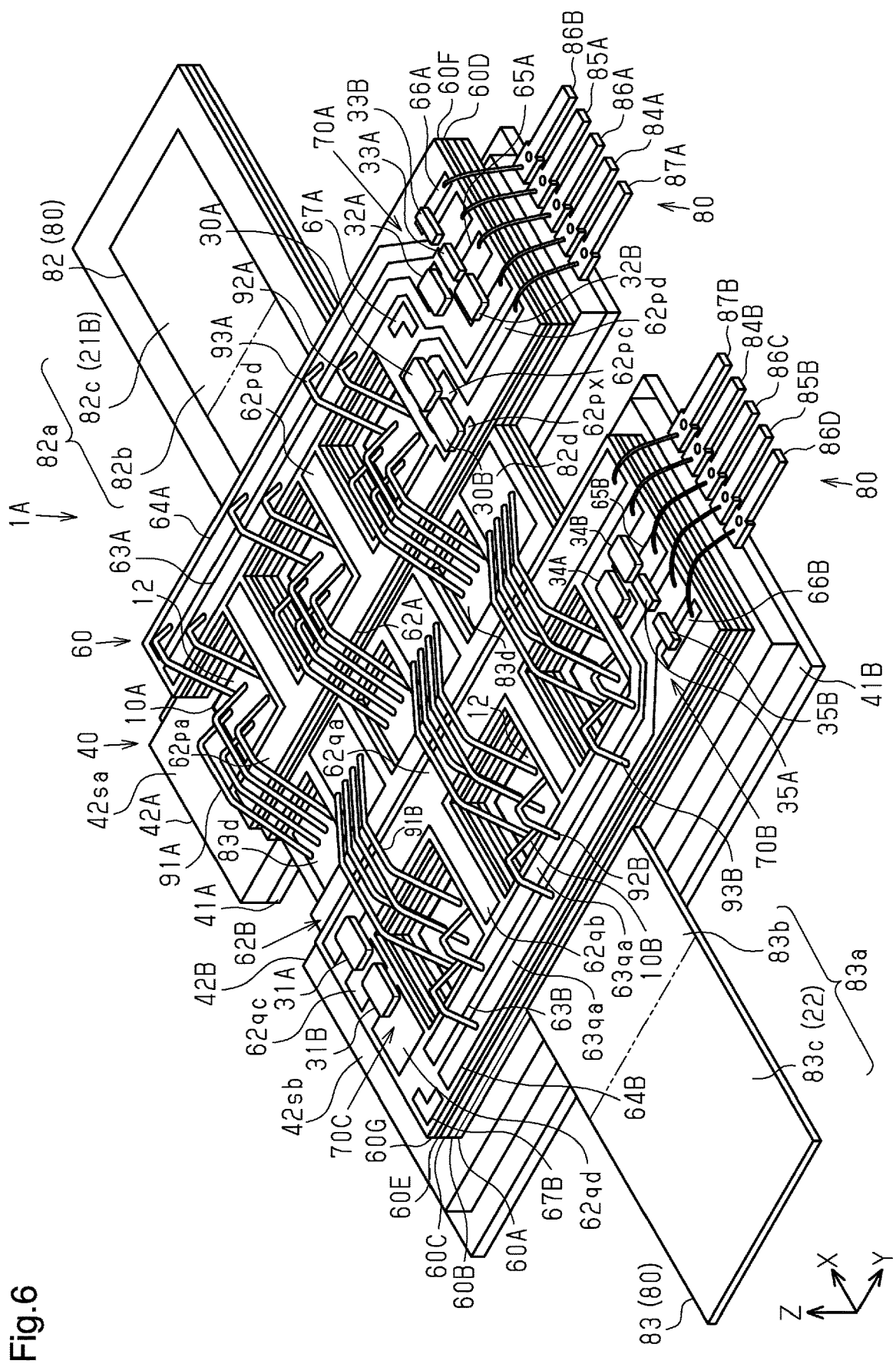
FIG. 6 is a perspective view of the semiconductor device shown in FIG. 1 without a resin member.
Figure 7A:
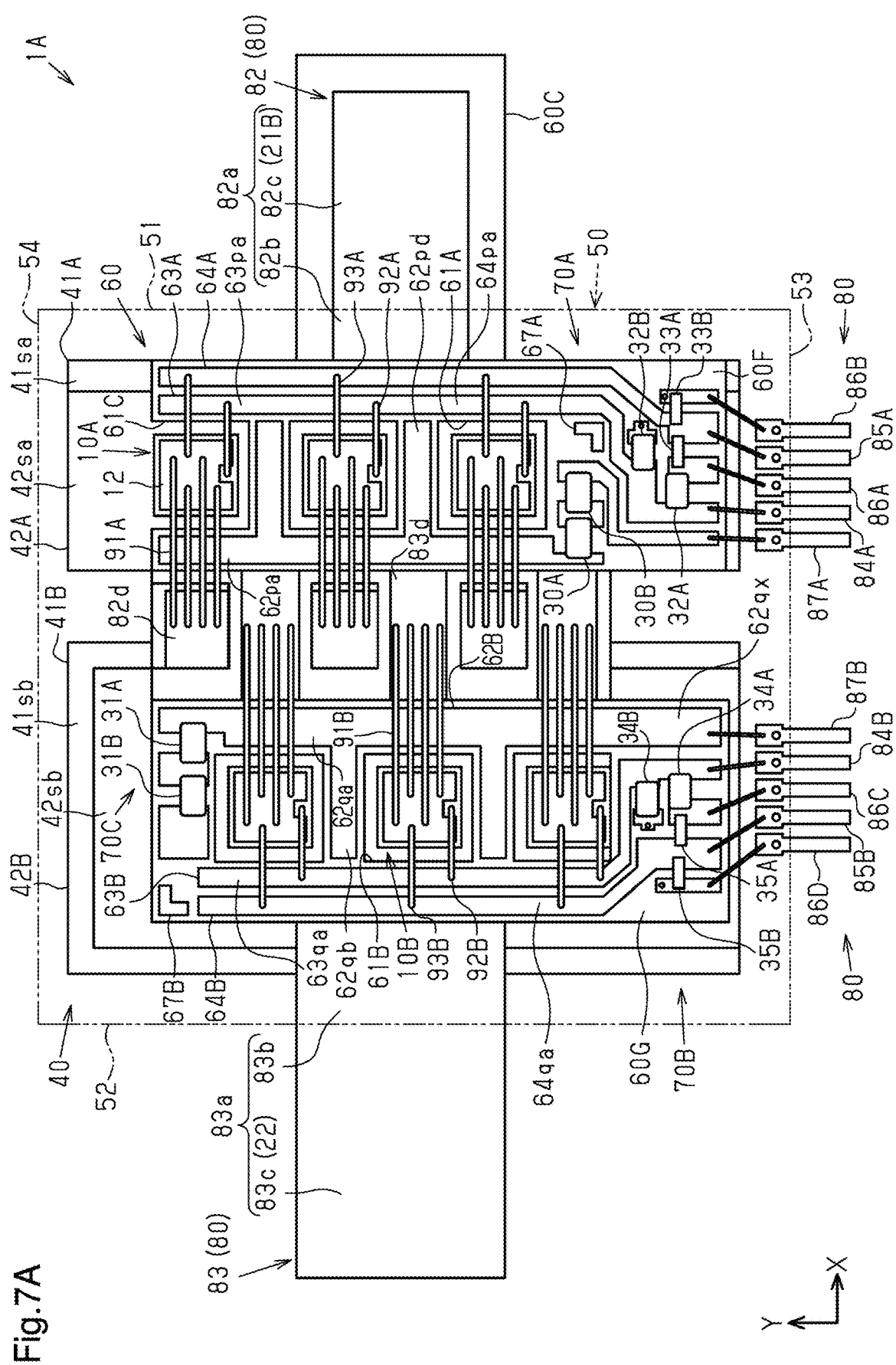
FIG. 7A is a plan view of the semiconductor device indicating the resin member with double-dashed lines.

As shown in FIG. 11A, the first conductive member 42A is located toward the first resin side surface 51 of the resin member 50 from the second conductive member 42B in the width direction X. The first conductive member 42A includes a main surface 42sa and a back surface 42ra faced away from each other in the thickness direction Z. The main surface 42sa is faced toward the same direction as the substrate main surface 41sa of the first insulative substrate 41A in the thickness direction Z. The back surface 42ra is faced toward the same direction as the substrate back surface 41ra of the first insulative substrate 41A in the thickness direction Z. The back surface 42ra is connected by a bonding material to the substrate main surface 41sa of the first insulative substrate 41A. In the present embodiment, as shown in FIGS. 6 and 7A, three first semiconductor elements 10A are mounted on the main surface 42sa. The three first semiconductor elements 10A are disposed in the central portion of the first conductive member 42A in the width direction X. The three first semiconductor elements 10A are aligned with one another in the width direction X and spaced apart in the length direction Y.

As shown in FIG. 11A, the second conductive member 42B is located toward the second resin side surface 52 of the resin member 50 from the first conductive member 42A in the width direction X. The second conductive member 42B includes a main surface 42sb and a back surface 42rb face away from each other in the thickness direction Z. The main surface 42sb is faced toward the same direction as the substrate main surface 41sb of the second insulative substrate 41B in the thickness direction Z. The back surface 42rb is faced toward the same direction as the substrate back surface 41rb of the second insulative substrate 41B in the thickness direction Z. The back surface 42rb is connected by a bonding material to the substrate main surface 41sb of the second insulative substrate 41B. In the present embodiment, as shown in FIGS. 6 and 7A, three second semiconductor elements 10B are mounted on the main surface 42sb. The three second semiconductor elements 10B are disposed in the central portion of the second conductive member 42B in the width direction X. The three second semiconductor elements 10B are arranged to align with one another in the width direction X and spaced apart in the length direction Y. As viewed in the width direction X, the three second semiconductor elements 10B are disposed so as not to overlap over the three first semiconductor elements 10A. The three second semiconductor elements 10B and the first semiconductor elements 10A are arranged alternately in the length direction Y.

The first semiconductor elements 10A have the same configuration as the second semiconductor elements 10B. The configuration of the first semiconductor element 10A will now be described. Same references numerals are given to those elements of the second semiconductor element 10B that are the same as the corresponding elements of the first semiconductor element 10A. Such elements will not be described in detail.

The first semiconductor element 10A has the form of a plate. As shown in FIG. 7A, the first semiconductor element 10A has a square shape in a plan view. The semiconductor elements 10A and 10B may have any shape in a plan view. For example, in a plan view, the shape of each of the semiconductor elements 10A and 10B may be rectangular so that one of the width direction X and the length direction Y is the long-side direction and the other one of the width direction X and the length direction Y is the short-side direction.

Figure 7B:
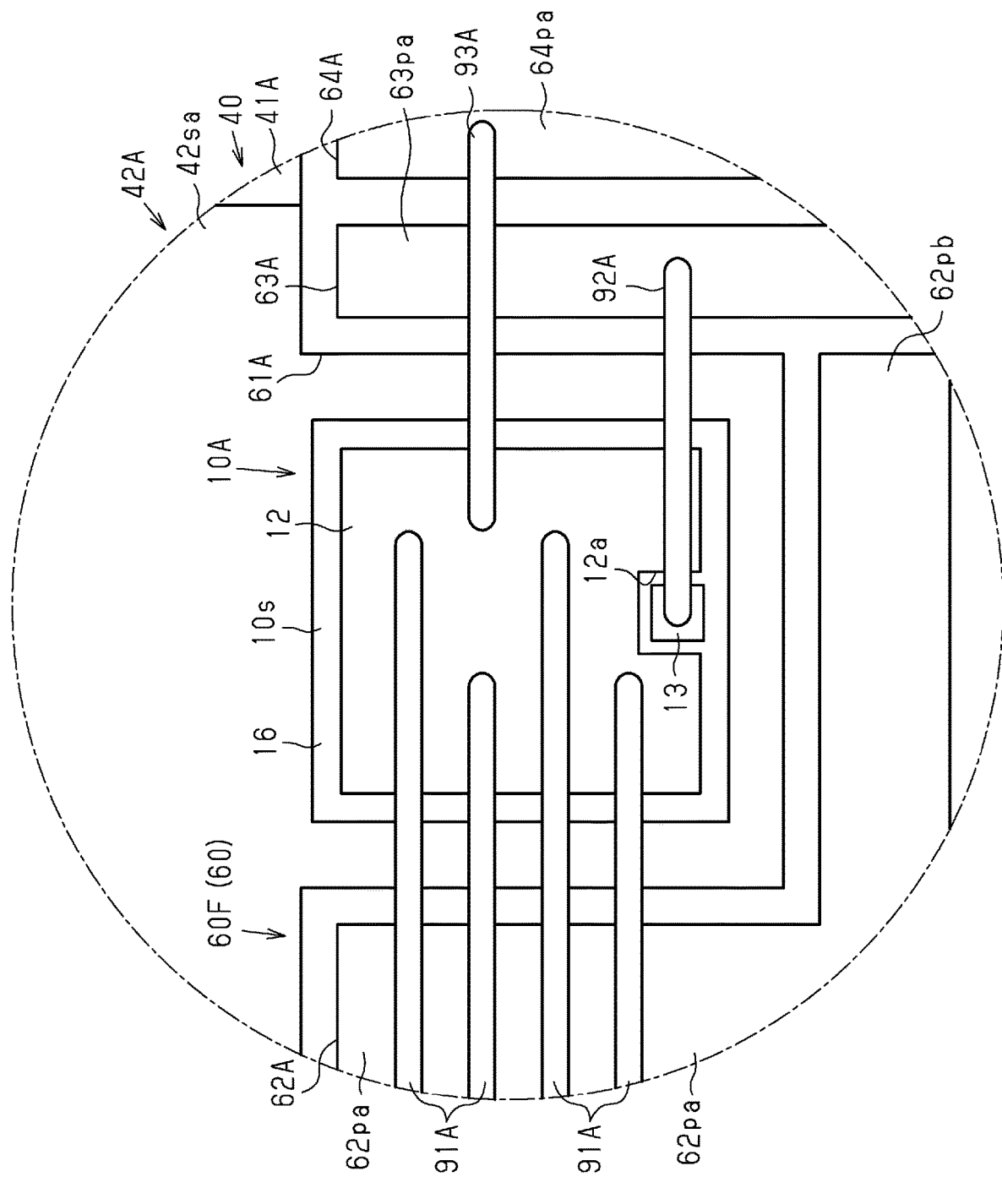
FIG. 7B is an enlarged view of one semiconductor element shown in FIG. 7A.

As shown in FIG. 11B, the first semiconductor element 10A includes an element main surface 10s and an element back surface 10r that are faced away from each other in the thickness direction Z. As shown in FIGS. 7B and 11B, the source electrode 12 and the gate electrode 13 are arranged on the element main surface 10s, and the drain electrode 11 is arranged on the element back surface 10r. A gate voltage for driving the first semiconductor element 10A is applied to the gate electrode 13. In the first semiconductor elements 10A, when the gate voltage becomes greater than or equal to a preset threshold value, drain current flows to the drain electrode 11 and source current flows to the source electrode 12.

As shown in FIG. 7B, in a plan view, the region in which the source electrode 12 is formed is larger than the region in which the gate electrode 13 is formed. The source electrode 12 is formed over most of the element main surface 10s. The gate electrode 13 is disposed in a recess 12a formed in the source electrode 12. As shown in FIG. 11B, the drain electrode 11 is formed over the entire element back surface 10r.

As shown in FIG. 7B, an insulative film 16 is applied to the source electrode 12 and the gate electrode 13. The insulative film 16 is electrically insulative. In a plan view, the insulative film 16 surrounds the source electrode 12 and the gate electrode 13. The insulative film 16 is formed by, for example, a silicon dioxide (SiO2) layer, a silicon nitride (SiN4) layer, and a polybenzoxazole layer stacked in this order from the element main surface 10s. In the insulative film 16, the polybenzoxazole layer may be replaced by a polyimide layer.

As shown in FIGS. 1 to 4, 6, 7A, 8, and 10, the semiconductor device 1A includes the leads 80 that form the terminals 20 of FIG. 5. The leads 80 are electrically connected to the semiconductor elements 10A and 10B, the high-voltage diodes 30A, 30B, 31A, and 31B, the low-voltage diodes 32A, 32B, 34A, and 34B, and the capacitors 33A, 33B, 35A, and 35B.

The leads 80 include the first input lead 81, the second input lead 82, the output lead 83, first control leads 84A and 85A, second control leads 84B and 85B, first control power leads 86A and 86B, second control power leads 86C and 86D, a first short-circuiting detection lead 87A, and a second short-circuiting detection lead 87B.

The first power terminal 21A is formed by the first input lead 81, and the second power terminal 21B is formed by the second input lead 82. The output terminal 22 is formed by the output lead 83. The first control terminal 23A is formed by the first control lead 84A, and the second control terminal 23B is formed by the second control lead 84B. The first source terminal 24A is formed by the first control lead 85A, and the second source terminal 24B is formed by the second control lead 85B. The first control power terminal 25A is formed by the first control power lead 86A, the first control power terminal 25B is formed by the first control power lead 86B, the second control power terminal 25C is formed by the second control power lead 86C, and the second control power terminal 25D is formed by the second control power lead 86D. The first short-circuiting detection terminal 26A is formed by the first short-circuiting detection lead 87A, and the second short-circuiting detection terminal 26B is formed by the second short-circuiting detection lead 87B.

The first semiconductor elements 10A are electrically connected to the first input lead 81, the output lead 83, the first control leads 84A and 85A, the first control power lead 86A, the first control power lead 86B, and the first short-circuiting detection lead 87A. The second semiconductor elements 10B are electrically connected to the second input lead 82, the output lead 83, the second control leads 84B and 85B, the second control power lead 86C, the second control power lead 86D, and the second short-circuiting detection lead 87B.

The input leads 81 and 82 are supported by the first conductive member 42A, and the output lead 83 is supported by the second conductive member 42B. In contrast, the control leads 84A, 84B, 85A, and 85B, the control power leads 86A to 86D, and the short-circuiting detection leads 87A and 87B are disposed outside the conductive members 42A and 42B and thus not supported by the conductive members 42A and 42B.

As shown in FIGS. 1 to 4, the input leads 81 and 82 project from the first resin side surface 51 of the resin member 50. The output lead 83 projects from the second resin side surface 52 of the resin member 50.

The input leads 81 and 82 are each formed by a metal plate. The material of the metal plate is, for example, copper (Cu) or a Cu alloy. In the present embodiment, the input leads 81 and 82 have a thickness (dimension in thickness direction Z) of 0.8 mm. There is no limit to the thickness. The input leads 81 and 82 are each disposed near the first resin side surface 51 of the resin member 50. Power supply voltage, for example, is applied to the input leads 81 and 82. In the present embodiment, a first power supply voltage is applied to the first input lead 81, and a second power supply voltage, which is lower than the first power supply voltage, is applied to the second input lead 82. The first input lead 81 and the second input lead 82 are disposed where they overlap each other in the thickness direction Z. Further, the first input lead 81 and the second input lead 82 are spaced apart in the thickness direction Z.

The output lead 83 is a metal plate. The material of the metal plate is, for example, Cu or a Cu alloy. the output lead 83 is disposed near the second resin side surface 52 of the resin member 50. The semiconductor elements 10A and 10B convert power to AC power (voltage), which is output from the output lead 83.

In the present embodiment, the control leads 84A, 84B, 85A, and 85B, the control power leads 86A, 86B, 86C, and 86D, and the short-circuiting detection leads 87A and 87B each project from the third resin side surface 53 of the resin member 50. The control leads 84A, 84B, 85A, and 85B, the control power leads 86A, 86B, 86C, and 86D, and the short-circuiting detection leads 87A and 87B may each project from any position on a resin side surface of the resin member 50. For example, among the control leads 84A, 84B, 85A, and 85B, the control power leads 86A, 86B, 86C, and 86D, and the short-circuiting detection leads 87A and 87B, some may project from the third resin side surface 53 of the resin member 50, while the others project from the fourth resin side surface 54.

The control leads 84A, 84B, 85A, and 85B, the control power leads 86A, 86B, 86C, and 86D, and the short-circuiting detection leads 87A and 87B are arrayed in the width direction X. In further detail, the first control leads 84A and 85A, the first control power leads 86A and 86B, and the first short-circuiting detection lead 87A are located next to the first conductive member 42A of the support substrate 40 in the length direction Y. The second control leads 84B and 85B, the second control power leads 86C and 86D, and the second short-circuiting detection lead 87B are located next to the second conductive member 42B of the support substrate 40 in the length direction Y, a first lead group including the first control leads 84A and 85A, the first control power leads 86A and 86B, and the first short-circuiting detection lead 87A and a second lead group including the second control leads 84B and 85B, the second control power leads 86C and 86D, and the second short-circuiting detection lead 87B are spaced apart in the width direction X by a distance that is greater than the distance in the width direction X between adjacent leads in the first lead group of the first control leads 84A and 85A, the first control power leads 86A and 86B, and the first short-circuiting detection lead 87A and the distance in the width direction X between adjacent leads in the second lead group of the second control leads 84B and 85B, the second control power leads 86C and 86D, and the second short-circuiting detection lead 87B. Further, in the present embodiment, the control leads 84A, 84B, 85A, and 85B, the control power leads 86A, 86B, 86C, and 86D, and the short-circuiting detection leads 87A and 87B are formed from the same lead frame. The material forming the lead frame is copper (Cu) or aluminum (Al). In the present embodiment, the control leads 84A, 84B, 85A, and 85B, the control power leads 86A, 86B, 86C, and 86D, and the short-circuiting detection leads 87A and 87B are identical in shape.

In a plan view of the first lead group, the first control power lead 86A, the first control lead 85A, the first control power lead 86B, the first control lead 84A, and the first short-circuiting detection lead 87A are disposed in order from the input leads 81 and 82 toward the output lead 83 in the width direction X. In a plan view of the second lead group, the second short-circuiting detection lead 87B, the second control lead 84B, the second control power lead 86C, the second control lead 85B, and the second control power lead 86C are disposed in order from the input leads 81 and 82 toward the output lead 83 in the width direction X. The leads in the first lead group and the second lead group will now be described.

A gate voltage is applied to the first control lead 84A to drive the first semiconductor elements 10A. A gate voltage is applied to the second control lead 84B to drive the second semiconductor elements 10B. The first control lead 85A is electrically connected to the source electrodes 12 of the first semiconductor elements 10A. The first control lead 85A is used to detect voltage at the source electrodes 12 of the first semiconductor elements 10A. The second control lead 85B is electrically connected to the source electrodes 12 of the second semiconductor elements 10B. The second control lead 85B is used to detect voltage at the source electrodes 12 of the second semiconductor elements 10B. A first control voltage VA1 from a first control power supply (not shown) is applied to the first control power lead 86A. A first control voltage VB1, which is lower than the first control voltage VA1, is applied to the first control power lead 86B. A second control voltage VA2 from a second control power supply (not shown) is applied to the second control power lead 86C. A second control voltage VB2, which is lower than the second control voltage VA2, is applied to the second control power lead 86D. The first control power supply is insulated from the second control power supply. The first short-circuiting detection lead 87A is electrically connected to the drain electrodes 11 of the first semiconductor elements 10A. The first short-circuiting detection lead 87A is used to detect a non-saturated state of the drain electrodes 11 of the first semiconductor elements 10A. The second short-circuiting detection lead 87B is electrically connected to the drain electrodes 11 of the second semiconductor elements 10B. The second short-circuiting detection lead 87B is used to detect a non-saturated state of the drain electrodes 11 of the second semiconductor elements 10B.

The control leads 84A and 84B each include a pad portion 84p and a terminal portion 84t. In the present embodiment, each of the control leads 84A and 84B is a single component in which the pad portion 84p and the terminal portion 84t are formed integrally. The control leads 85A and 85B each include a pad portion 85p and a terminal portion 85t. In the present embodiment, each of the control leads 85A and 85B is a single component in which the pad portion 85p and the terminal portion 85t are formed integrally. The control power leads 86A to 86D each include a pad portion 86p and a terminal portion 86t. In the present embodiment, each of the control power leads 86A to 86D is a single component in which the pad portion 86p and the terminal portion 86t are formed integrally. The short-circuiting detection leads 87A and 87B each include a pad portion 87p and a terminal portion 87t. In the present embodiment, each of the short-circuiting detection leads 87A and 87B is a single component in which the pad portion 87p and the terminal portion 87t are formed integrally.

The pad portions 84p, 85p, 86p, and 8'7p are covered by the resin member 50. Thus, the control leads 84A, 84B, 85A, and 85B, the control power leads 86A to 86D, and the short-circuiting detection leads 87A and 87B are each supported by the resin member 50. The surfaces of the pad portions 84p, 85p, 86p, and 87p may be coated by, for example, silver plating. The pad portions 84p, 85p, 86p, and 87p respectively include through holes 84h, 85h, 86h, and 87h. The through holes 84h, 85h, 86h, and 87h extend through the pad portions 84p, 85p, 86p, and 8'7p in the thickness direction Z. Parts of the resin member 50 are included the through holes 84h, 85h, 86h, and 87h. This holds together the resin member 50, the control leads 84A, 84B, 85A, and 85B, the control power leads 86A to 86D, and the short-circuiting detection leads 87A and 87B.

The terminal portions 84t, 85t, 86t, and 87t project from the third resin side surface 53 of the resin member 50. The terminal portion 84t of the first control lead 84A forms the first control terminal 23A (refer to FIG. 5), and the terminal portion 84t of the second control lead 84B forms the second control terminal 23B (refer to FIG. 5). The terminal portion 85t of the first control lead 85A forms the first source terminal 24A (refer to FIG. 5), and the terminal portion 85t of the second control lead 85B forms the second source terminal 24B (refer to FIG. 5). The terminal portion 86t of the first control power lead 86A forms the first control power terminal 25A (refer to FIG. 5), the terminal portion 86t of the first control power lead 86B forms the first control power terminal 25B (refer to FIG. 5), the terminal portion 86t of the second control power lead 86C forms the second control power terminal 25C (refer to FIG. 5), and the terminal portion 86t of the second control power lead 86D forms the second control power terminal 25D (refer to FIG. 5). The terminal portion 87t of the first short-circuiting detection lead 87A forms the first short-circuiting detection terminal 26A (refer to FIG. 5), and the terminal portion 87t of the second short-circuiting detection lead 87B forms the second short-circuiting detection terminal 26B (refer to FIG. 5).

As shown in FIGS. 6 and 11A, a conductive substrate 60, which is one example of a conductor, is mounted on the main surface 42sa of the first conductive member 42A and the main surface 42sb of the second conductive member 42B. More specifically, the conductive substrate 60 is disposed over the first conductive member 42A and the second conductive member 42B and across the gap between the first conductive member 42A and the second conductive member 42B. The conductive substrate 60 electrically connects the semiconductor elements 10A and 10B to the leads 80. Thus, the conductive substrate 60 forms a conductive path between the semiconductor elements 10A and 10B and the leads 80. The conductive substrate 60 is a multilayer substrate. The conductive substrate 60 includes a substrate, formed from a resin material that is electrically insulative, and a metal foil, which is applied to the substrate. The material forming the substrate is, for example, a glass epoxy resin. The material forming the metal foil is, for example, copper foil. The material forming the metal foil may be, for example, silver (Ag) paste. The material forming the substrate may be silicon (Si), alumina (Al2O3), AlN, prepreg, or the like.

The conductive substrate 60 includes a plurality of (three in the present embodiment) first substrate openings 61A, which accommodate the first semiconductor elements 10A, a first substrate recess 61C, and a plurality of (three in the present embodiment) of second substrate openings 61B, which accommodate the second semiconductor elements 10B. The quantity of the substrate openings 61A and 61B and the first substrate recess 61C corresponds to the quantity of the semiconductor elements 10A and 10B. The substrate openings 61A and 61B extend through the conductive substrate 60 in the thickness direction Z. The first substrate recess 61C is arranged in the one of the first substrate openings 61A that is the closest to the fourth resin side surface 54 of the resin member 50 in the length direction Y. The first substrate recess 61C is recessed so that the side located toward the fourth resin side surface 54 is open. Each of the first substrate openings 61A and the second substrate openings 61B is a through hole extending through the conductive substrate 60 in the thickness direction Z. The high-voltage diodes 30A, 30B, 31A, and 31B, the low-voltage diodes 32A, 32B, 34A, and 34B, and the capacitors 33A, 33B, 35A, and 35B are mounted on the conductive substrate 60.

The input leads 81 and 82 and the output lead 83 are integrated with the conductive substrate 60. As shown in FIG. 11A, the first input lead 81 is sandwiched between the first conductive member 42A and the conductive substrate 60. The second input lead 82 is sandwiched in the conductive substrate 60. The output lead 83 is sandwiched between the second conductive member 42B and the conductive substrate 60.

The conductive substrate 60, the input leads 81 and 82, and the output lead 83 will now be described in detail.

Figure 12:
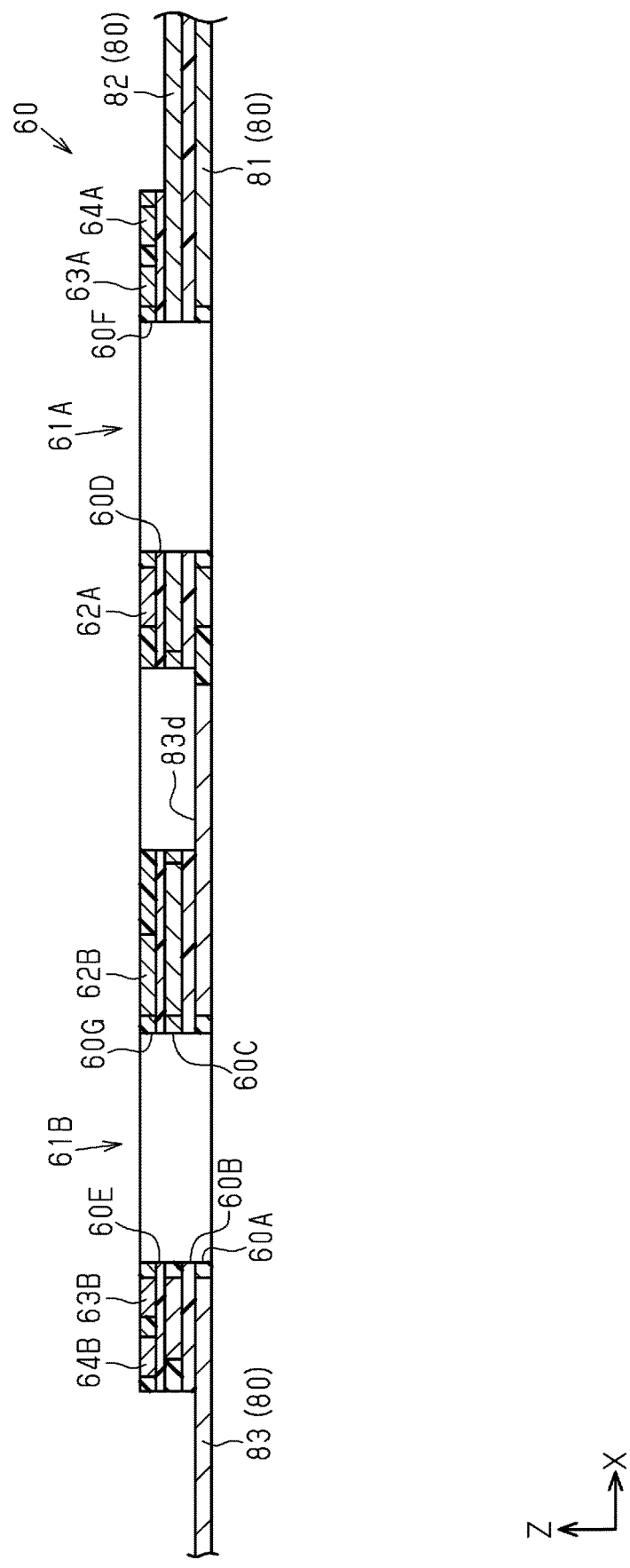
FIG. 12 is a cross-sectional diagram of a conductive substrate of the semiconductor device shown in FIG. 7A.

As shown in FIG. 12, the conductive substrate 60 of the present embodiment is a multilayer substrate including five layers, namely, a first substrate layer 60A, a second substrate layer 60B, a third substrate layer 60C, a fourth substrate layer 60D or 60E, and a fifth substrate layer 60F or 60G, that are stacked in the thickness direction Z. The conductive substrate 60 is stacked in the order of the first substrate layer 60A, the second substrate layer 60B, the third substrate layer 60C, the fourth substrate layer 60D or 60E, and the fifth substrate layer 60F or 60G on the conductive members 42A and 42B. The fourth substrate layer 60D and the fourth substrate layer 60E are spaced apart in the width direction X. The fifth substrate layer 60F and the fifth substrate layer 60G are spaced apart in the width direction X.

The first input lead 81 and the output lead 83 is attached to the first substrate layer 60A.

As shown in FIG. 11A, the first input lead 81 is bonded by, for example, a conductive bonding material, such as solder or silver paste, to the main surface 42sa of the first conductive member 42A of the support substrate 40. As shown in FIG. 4, the first input lead 81 includes a projection 81a that projects from the first substrate layer 60A in the width direction X. The shape of the projection 81a in a plan view is rectangular so that the width direction X is the long-side direction and the length direction Y is the short-side direction. The projection 81a can be separated into a middle portion 81b, which is located inside the resin member 50, and a terminal portion 81c, which projects from the first resin side surface 51 of the resin member 50. The terminal portion 81c forms the first power terminal 21A (refer to FIG. 5).

As shown in FIG. 11A, the output lead 83 is bonded by, for example, a conductive bonding material, such as solder or silver paste, to the main surface 42sb of the second conductive member 42B of the support substrate 40. As shown in FIG. 4, the output lead 83 includes a projection 83a that projects from the first substrate layer 60A in the width direction X. The shape of the projection 83a in a plan view is rectangular so that the width direction X is the long-side direction and the length direction Y is the short-side direction. The projection 83a can be separated into a middle portion 83b, which is located inside the resin member 50, and a terminal portion 83c, which projects from the second resin side surface 52 of the resin member 50. The terminal portion 83c forms the output terminal 22 (refer to FIG. 5).

As shown in FIGS. 6 and 7A, the end of the output lead 83 at the side opposite to the projection 83a in the width direction X includes a plurality of (three in the present embodiment) exposed portions 83d that are exposed from the conductive substrate 60. The exposed portions 83d are arranged to align with one another in the width direction X and spaced apart in the length direction Y. In a plan view, the exposed portions 83d are located between the first conductive member 42A and the second conductive member 42B in the width direction X. In the thickness direction Z, the exposed portions 83d are arranged to partially overlap the end of the second conductive member 42B that is located toward the first conductive member 42A in the width direction X. Further, the exposed portions 83d are spaced apart from the first conductive member 42A in the width direction X. The shape of each exposed portions 83d in a plan view is square.

The exposed portions 83d may have any shape in a plan view. In one example, the shape of each exposed portion 83d in a plan view is rectangular so that one of the width direction X and the length direction Y is the long-side direction and the other one of the width direction X and the length direction Y is the short-side direction.

As shown in FIG. 12, the second substrate layer 60B electrically insulates the first input lead 81 and the output lead 83 from the third substrate layer 60C. In the thickness direction Z, the second substrate layer 60B covers the projection 81a of the first input lead 81 and the portion of the first input lead 81 attached to the first substrate layer 60A. Further, in the thickness direction Z, the second substrate layer 60B covers the portion of the output lead 83 attached to the first substrate layer 60A.

The second input lead 82 is attached to the third substrate layer 60C. The second input lead 82 is electrically insulated by the second substrate layer 60B from the first input lead 81. The second input lead 82 includes a projection 82a that projects from the third substrate layer 60C in the width direction X. The shape of the projection 82a in a plan view is rectangular so that the width direction X is the long-side direction and the length direction Y is the short-side direction. In the present embodiment, the shape of the projection 82a in a plan view is identical to the shape of the projection 81a of the first input lead 81 in a plan view. The projection 82a can be separated into a middle portion 82b, which is located inside the resin member 50, and a terminal portion 82c, which projects from the first resin side surface 51 of the resin member 50. The terminal portion 82c forms the second power terminal 21B (refer to FIG. 5).

As shown in FIG. 7A, the end of the second input lead 82 at the side opposite to the projection 82a in the width direction X includes a plurality of (three in the present embodiment) exposed portions 82d that are exposed from the conductive substrate 60. In a plan view, the exposed portions 82d are located between the first conductive member 42A and the second conductive member 42B in the width direction X. In the thickness direction Z, the exposed portions 82d are arranged to partially overlap the end of the second conductive member 42B that is located toward the first conductive member 42A in the width direction X. Further, the exposed portions 82d are spaced apart from the first conductive member 42A in the width direction X. The shape of each exposed portion 82d in a plan view is rectangular so that the width direction X is the long-side direction and the length direction Y is the short-side direction. The length of each exposed portion 82d in the width direction X is greater than the length of each exposed portion 83d of the output lead 83 in the width direction X. The length of each exposed portion 82d in the length direction Y is less than the length of each exposed portion 83d in the length direction Y. The exposed portions 82d are arranged to align with one another in the width direction X and spaced apart in the length direction Y. In the length direction Y, the exposed portions 82d are overlapped with the exposed portions 83d of the output lead 83. The exposed portions 82d and the exposed portions 83d are arranged alternately in the length direction Y.

As shown in FIG. 12, the fourth substrate layer 60D electrically insulates the second input lead 82 from the fifth substrate layer 60F. The fourth substrate layer 60D is stacked on the portion of the third substrate layer 60C located near the first conductive member 42A. In other words, the fourth substrate layer 60D is smaller in dimension in the width direction X than the first to third substrate layers 60A to 60C and not arranged near the second conductive member 42B.

The fourth substrate layer 60E electrically insulates the portion of the third substrate layer 60C located near the second conductive member 42B (located near output lead 83) from the fifth substrate layer 60G. The fourth substrate layer 60E is aligned with the fourth substrate layer 60D in the thickness direction Z and spaced apart from the fourth substrate layer 60D in the width direction X. The fourth substrate layer 60E is stacked on the portion of the third substrate layer 60C located near the second conductive member 42B. In other words, the fourth substrate layer 60E is smaller in dimension in the width direction X than the first to third substrate layers 60A to 60C and not arranged near the first conductive member 42A.

As shown in FIG. 7A, the fifth substrate layer 60F is the outermost layer of the conductive substrate 60 on which the first high-voltage diodes 30A and 30B, the first low-voltage diodes 32A and 32B, and the first capacitors 33A and 33B are mounted. The fifth substrate layer 60F is stacked on the fourth substrate layer 60D. Thus, the fifth substrate layer 60F is smaller in dimension in the width direction X than the first to third substrate layers 60A to 60C and not arranged near the second conductive member 42B. The fifth substrate layer 60F forms the first short-circuiting detection circuit 3A and the first surge reduction circuit 4A shown in FIG. 5.

The fifth substrate layer 60F is the outermost layer of the conductive substrate 60 and includes a first drive wire 62A, first control wires 63A and 64A, first control power wires 65A and 66A, and a first wire piece 67A. In a plan view, the conductive substrate 60 (fifth substrate layer 60F) includes a first wiring region 70A that extends from the first semiconductor elements 10A toward the third resin side surface 53 of the resin member 50 in the width direction X. The first wiring region 70A is a mounting region in the conductive substrate 60 (fifth substrate layer 60F) for mounting components other than the first semiconductor elements 10A.

The first drive wire 62A and the first control wires 63A and 64A each extend from a region other than the first wiring region 70A of the fifth substrate layer 60F to the first wiring region 70A. The first control power wires 65A and 66A and the first wire piece 67A are arranged in the first wiring region 70A. The first high-voltage diodes 30A and 30B, the first low-voltage diodes 32A and 32B, and the first capacitors 33A and 33B are mounted in the first wiring region 70A. Thus, the first short-circuiting detection circuit 3A and the first surge reduction circuit 4A are formed in the first wiring region 70A. That is, a wiring region is formed in the fifth substrate layer 60F at one side of the first semiconductor elements 10A in the length direction Y (toward third resin side surface 53 of resin member 50 from first semiconductor elements 10A in present embodiment).

The first drive wire 62A is electrically connected to the drain electrode 11 of each first semiconductor element 10A (refer to FIG. 11B). Further, the first drive wire 62A is electrically connected via the first high-voltage diodes 30A and 30B to the first short-circuiting detection lead 87A. Thus, short-circuiting of the first semiconductor elements 10A is detected via the first drive wire 62A. In this manner, the first drive wire 62A electrically connects the drain electrode 11 of each first semiconductor element 10A to the first short-circuiting detection lead 87A.

Figure 8:
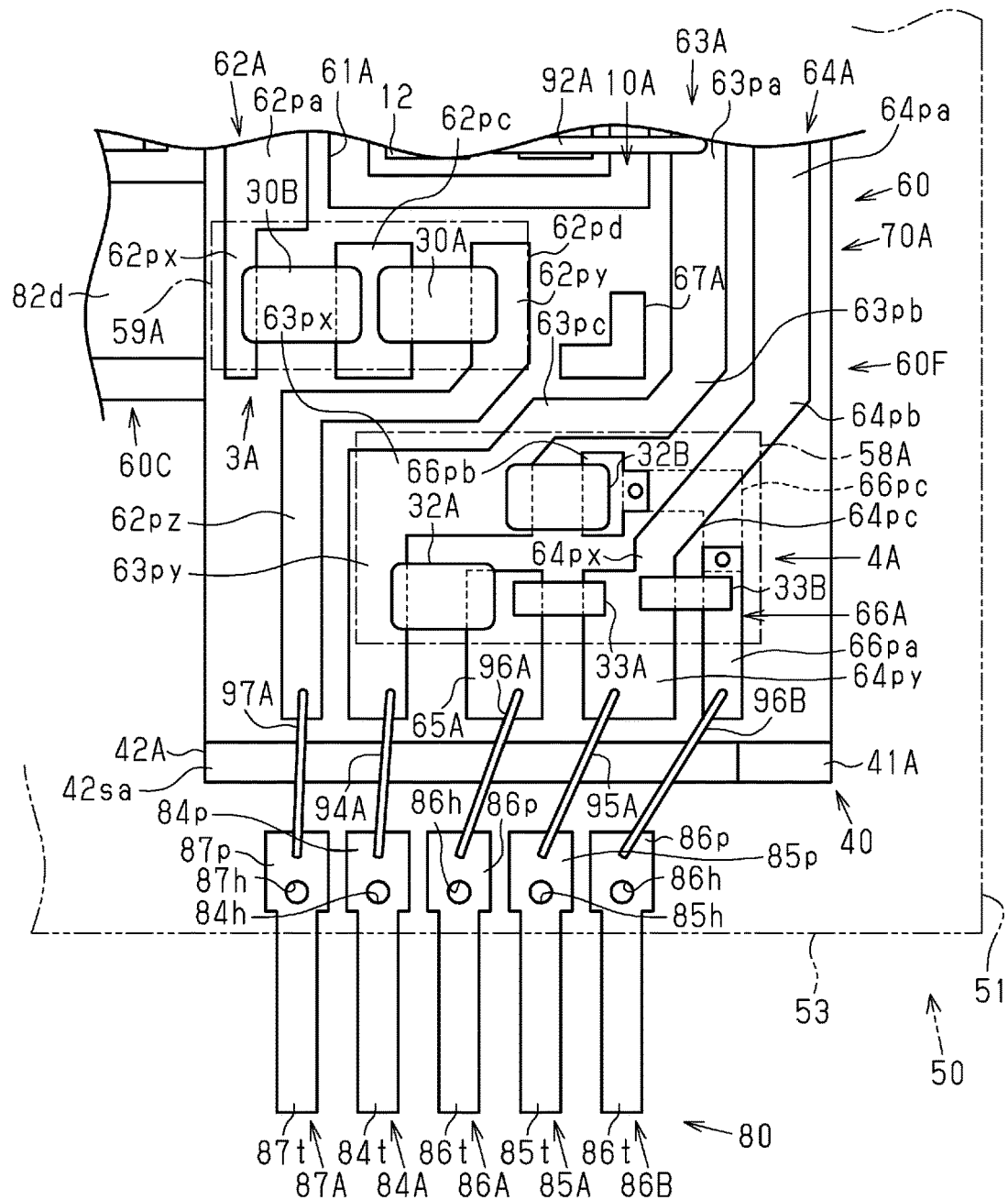
FIG. 8 is an enlarged view of a first wiring region in the semiconductor device shown in FIG. 7A.

As shown in FIGS. 7A and 8, the first drive wire 62A includes a first wire portion 62pa extending in the length direction Y, a plurality of (two in the present embodiment) second wire portions 62pb extending from the first wire portion 62pa in the width direction X, a third wire portion 62pc connecting the first high-voltage diodes 30A and 30B, and a fourth wire portion 62pd connecting the first high-voltage diode 30B and the first short-circuiting detection lead 87A.

The first wire portion 62pa is located toward the second conductive member 42B from the first semiconductor elements 10A in the width direction X. The first wire portion 62pa is arranged in the fifth substrate layer 60F at the end located toward the second conductive member 42B (refer to FIG. 7A) in the width direction X. The first wire portion 62pa extends overlapping the first semiconductor elements 10A as viewed in the width direction X. The second wire portions 62pb are located between adjacent ones of the first semiconductor elements 10A in the length direction Y.

As shown in FIG. 8, the first wire portion 62pa includes an end 62px that is located toward the third resin side surface 53 of the resin member 50 in the length direction Y located and arranged in the first wiring region 70A. The width of the end 62px in the width direction X is less than the width of the part of the first wire portion 62pa other than the end 62px in the width direction X. The third wire portion 62pc is aligned with the end 62px in the length direction Y and spaced apart from the end 62px in the width direction X. In the present embodiment, the length of the third wire portion 62pc in the length direction Y is equal to the length of the end 62px in the length direction Y. Further, the width of the third wire portion 62pc in the width direction X is greater than the width of the end 62px in the width direction X.

The fourth wire portion 62pd includes a first part 62py, which is located at the side of the third wire portion 62pc opposite to the end 62px in the width direction X, and a second part 62pz, which extends from the first part 62py toward the first short-circuiting detection lead 87A.

The first part 62py extends in the length direction Y. The width of the first part 62py in the width direction X is greater than the width of the end 62px in the width direction X. In the present embodiment, the width of the first part 62py in the width direction X is equal to the width of the third wire portion 62pc in the width direction X. The second part 62pz is L-shaped in a plan view. More specifically, the second part 62pz extends from the end of the first part 62py, which is located toward the third resin side surface 53 in the length direction Y, toward the second conductive member 42B in the width direction X, and extends from a position aligned with the first short-circuiting detection lead 87A in the width direction X toward the first short-circuiting detection lead 87A in the length direction Y. The second part 62pz is located toward the first resin side surface 51 of the resin member 50 from the end 62px of the first wire portion 62pa in the width direction X.

The end of the second part 62pz located toward the first short-circuiting detection lead 87A is connected by a first short-circuiting detection connection member 97A to the pad portion 87p of the first short-circuiting detection lead 87A. The first short-circuiting detection connection member 97A is, for example, a wire formed through wire bonding.

The first high-voltage diodes 30A and 30B are mounted on the first drive wire 62A. In further detail, the first high-voltage diode 30A is connected to the end 62px of the first wire portion 62pa and the third wire portion 62pc. Specifically, the cathode electrode of the first high-voltage diode 30A is connected to the end 62px, and the anode electrode of the first high-voltage diode 30A is connected to the third wire portion 62pc. Further, the first high-voltage diode 30B is connected to the third wire portion 62pc and the first part 62py of the fourth wire portion 62pd. Specifically, the cathode electrode of the first high-voltage diode 30B is connected to the third wire portion 62pc, and the anode electrode of the first high-voltage diode 30B is connected to the first part 62py. In this manner, the first wire portion 62pa, the third wire portion 62pc, and the fourth wire portion 62pd connect the first high-voltage diode 30A and the first high-voltage diode 30B in series.

In the present embodiment, the first high-voltage diode 30A is positioned so that its anode electrode and cathode electrode are arranged in the width direction X. Further, the first high-voltage diode 30B is positioned so that its anode electrode and cathode electrode are arranged in the width direction X. Moreover, the first high-voltage diode 30A and the first high-voltage diode 30B are arranged aligned with each other in the length direction Y and spaced apart in the width direction X.

As shown in FIGS. 7A and 7B, the first control wire 63A is a wire section that electrically connects the gate electrode 13 of each first semiconductor element 10A to the first control lead 84A. As shown in FIG. 7B, the gate electrode 13 of each first semiconductor element 10A is connected to the first control wire 63A by a first control connection member 92A. The first control connection member 92A is, for example, a wire formed through wire bonding. As shown in FIG. 8, the first control wire 63A includes a first wire portion 63pa extending in the length direction Y, a second wire portion 63pb extending diagonally from the first wire portion 63pa with respect to the length direction Y toward the second conductive member 42B (refer to FIG. 7A), and a third wire portion 63pc extending from the second wire portion 63pb toward the first control lead 84A.

As shown in FIG. 7A, the first wire portion 63*pa* is arranged next to the first semiconductor elements 10A and toward the first resin side surface 51 from the first semiconductor elements 10A in the width direction X. The first wire portion 63*pa* extends overlapping the first semiconductor elements 10A in the width direction X and further toward the third resin side surface 53 from the first semiconductor elements 10A in the length direction Y. As shown in FIG. 8, the end of the first wire portion 63*pa* at the side of the third resin side surface 53 in the length direction Y is arranged overlapping the third wire portion 62*pc* and the first part 62*py* of the fourth wire portion 62*pd* as viewed in the width direction X.

The second wire portion 63*pb* and the third wire portion 63*pc* are each arranged in the first wiring region 70A. That is, in a plan view, the second wire portion 63*pb* and the third wire portion 63*pc* are each located between the first semiconductor elements 10A and the first control lead 84A in the length direction Y.

The second wire portion 63*pb* is arranged overlapping the first part 62*py* and the second part 62*pz* of the fourth wire portion 62*pd* as viewed in the width direction X.

The third wire portion 63*pc* is arranged toward the third resin side surface 53 from the first part 62*py* of the fourth wire portion 62*pd* of the first drive wire 62A. The third wire portion 63*pc* is L-shaped in a plan view. The third wire portion 63*pc* includes a first part 63*px*, which extends from the second wire portion 62*pb* toward the second conductive member 42B in the width direction X, and a second part 63*py*, which extends from the end of the first part 63*px* located at the side of the second conductive member 42B in the width direction X toward the first control lead 84A in the length direction Y. The width of the third wire portion 63*pc* (plan view dimension in direction orthogonal to extending direction of third wire portion 63*pc*) is greater than the width of the first wire portion 63*pa* in the width direction X. The end of the third wire portion 63*pc* at the side of the first control lead 84A is connected to the pad portion 84*p* of the first control lead 84A by a first control lead connection member 94A. The first control lead connection member 94A is, for example, a wire formed through wire bonding.

As shown in FIG. 7A, the first control wire 64A is a wire section that electrically connects the source electrode 12 of each first semiconductor element 10A to the first control lead 85A. The first control wire 64A is a wire section that extends the source electrode 12 of each first semiconductor element 10A toward the outside and supplies gate voltage to between the gate electrode 13 and the source electrode 12 of each first semiconductor element 10A. The source electrode 12 of each first semiconductor element 10A is connected to the first control wire 64A by a first control connection member 93A. The first control connection member 93A is, for example, a wire formed through wire bonding. As shown in FIG. 8, the first control wire 64A includes a first wire portion 64*pa* extending in the length direction Y, a second wire portion 64*pb* extending diagonally from the first wire portion 64*pa* with respect to the length direction Y toward the second conductive member 42B, and a third wire portion 64*pc* extending from the second wire portion 64*pb* toward the first control lead 85A.

The first wire portion 64*pa* is located at the side of the first control wire 63A opposite to the first semiconductor elements 10A in the width direction X. The first wire portion 64*pa* is formed in the fifth substrate layer 60F at the end of located toward the first resin side surface 51 in the width direction X. In the present embodiment, the length of the first wire portion 64*pa* in the length direction Y is equal to the length of the first wire portion 63*pa* of the first control wire 63A in the length direction Y (refer to FIG. 7A). The second wire portion 64*pb* is parallel to the second wire portion 63*pb* of the first control wire 63A. The second wire portion 64*pb* is arranged overlapping the second wire portion 63*pb* as viewed in the width direction X. Further, the second wire portion 64*pb* is arranged overlapping the second wire portion 63*pb* as viewed in the length direction Y. The third wire portion 64*pc* is located toward the first resin side surface 51 from the first control lead 85A in the width direction X. The third wire portion 64*pc* includes a first part 64*px*, which extends from the second wire portion 63*pb* in the length direction Y, and a second part 64*py*. The second part 64*py* is located toward the third resin side surface 53 from the first part 64*px* in the length direction Y. The width of the second part 64*py* in the width direction X is greater than the width of the first part 64*px* in the width direction X. The second part 64*py* and the pad portion 85*p* of the first control lead 85A are connected by a first control lead connection member 95A. The first control lead connection member 95A is, for example, a wire formed through wire bonding.

The first control power wire 65A is located between the first control wire 63A and the first control wire 64A in the width direction X. Specifically, the first control power wire 65A is located between the second part 63*py* of the third wire portion 63*pc* of the first control wire 63A and the second part 64*py* of the third wire portion 64*pc* of the first control wire 64A in the width direction X. The first control power wire 65A is arranged in the fifth substrate layer 60F at the end located toward the third resin side surface 53 in the length direction Y. The first control power wire 65A extends in the length direction Y. The width of the first control power wire 65A in the width direction X is greater than the width of the second part 62*pz* of the fourth wire portion 62*pd* of the first drive wire 62A (plan view dimension in direction orthogonal to extending direction of second part 62*pz*). In the present embodiment, the width of the first control power wire 65A in the width direction X is equal to the width of the third wire portion 63*pc* of the first control wire 63A (plan view dimension in direction orthogonal to extending direction of third wire portion 63*pc*). The first control power wire 65A and the pad portion 86*p* of the first control power lead 86A are connected by a first control power connection member 96A. The first control power connection member 96A is, for example, a wire formed through wire bonding.

The first control power wire 66A is a first wire portion 66*pa* extending in the length direction Y, a second wire portion 66*pb* spaced apart from the first wire portion 66*pa* and extending in the length direction Y, and a third wire portion 66*pc* connecting the first wire portion 66*pa* and the second wire portion 66*pb*. The first wire portion 66*pa* is arranged in the fifth substrate layer 60F at the end located toward the first resin side surface 51 in the width direction X and the end located toward the third resin side surface 53 in the length direction Y. The first wire portion 66*pa* is arranged toward the third resin side surface 53 from the first part 63*px* of the third wire portion 63*pc* of the first control wire 63A. The first wire portion 66*pa* is arranged overlapping the third wire portion 64*pc* of the first control wire 64A as viewed in the width direction X. The length of the first wire portion 66*pa* in the length direction Y is greater than the length of the second part 63*py* of the third wire portion 63*pc* in the length direction Y. The width of the first wire portion 66*pa* in the width direction X is less than the width of the first control power wire 65A in the width direction X. In the present embodiment, the width of the first wire portion 66*pa* in the width direction X is equal to the width of the second part 62*pz* of the fourth wire portion 62*pd* of the first drive wire 62A (plan view dimension in direction orthogonal to extending direction of second part 62*pz*). The first wire portion 66*pa* and the first control power lead 86B are connected by a first control power connection member 96B. The first control power connection member 96B is, for example, a wire formed through wire bonding.

The second wire portion 66*pb* is located toward the second resin side surface 52 from the first wire portion 66*pa* in the width direction X. The second wire portion 66*pb* is located toward the fourth resin side surface 54 (toward first semiconductor elements 10A) from the first wire portion 66*pa* in the length direction Y. The second wire portion 66*pb* is arranged overlapping the third wire portion 63*pc* of the first control wire 63A, the second part 64*py* of the first control wire 64A, and the first control power lead 86B as viewed in the length direction Y. The second wire portion 66*pb* is located between the first part 63*px* of the third wire portion 63*pc* of the first control wire 63A and the second wire portions 62*pb* of the first control wire 64A in the width direction X.

The third wire portion 66*pc* is arranged in the third substrate layer 60C (refer to FIG. 6). Thus, the third wire portion 66*pc* is concealed in a plan view. The third wire portion 66*pc* is electrically connected to the first wire portion 66*pa* by a through-electrode arranged in the first wire portion 66*pa* and to the second wire portion 66*pb* by a through-electrode arranged in the second wire portion 66*pb*. The third wire portion 66*pc* is, for example, L-shaped in a plan view. The third wire portion 66*pc* does not have to be L-shaped in a plan view and may be shaped to extend diagonally so that the third resin side surface 53 becomes closer as the first resin side surface 51 becomes closer.

The first low-voltage diodes 32A and 32B and the first capacitors 33A and 33B of the first surge reduction circuit 4A are connected to the first control wires 63A and 64A and the first control power wires 65A and 66A.

The first low-voltage diode 32A is connected to the first control wire 63A and the first control power wire 65A. Specifically, the anode electrode of the first low-voltage diode 32A is connected to the part of the third wire portion 63*pc* of the first control wire 63A located toward the first control lead 84A. The cathode electrode of the first low-voltage diode 32A is connected to the first control power wire 65A.

The first low-voltage diode 32B is connected to the first control wire 63A and the first control power wire 66A. Specifically, the cathode electrode of the first low-voltage diode 32B is connected to the end of the third wire portion 63*pc* of the first control wire 63A at the side of the second wire portion 63*pb*. The anode electrode of the first low-voltage diode 32B is connected to the second wire portion 66*pb* of the first control power wire 66A. In this manner, the first low-voltage diodes 32A and 32B are connected in series between the first control power wire 66A and the first control power wire 65A by the first control wire 63A.

In the present embodiment, the first low-voltage diode 32A is positioned so that its anode electrode and cathode electrode are arranged in the width direction X. Further, the first low-voltage diode 32B is positioned so that its anode electrode and cathode electrode are arranged in the width direction X. Moreover, the first low-voltage diode 32A and the first low-voltage diode 32B are disposed at different positions in the length direction Y. The first low-voltage diode 32A is located toward the third resin side surface 53 from the first low-voltage diode 32B in the length direction Y. The first low-voltage diode 32B is located toward the first resin side surface 51 from the first low-voltage diode 32A in the width direction X.

The first capacitor 33A is connected to the first control power wire 65A and the first control wire 64A. Specifically, the first terminal of the first capacitor 33A is connected to the first control power wire 65A. The second terminal of the first capacitor 33A is connected to the second part 64*py* of the first control wire 64A.

The first capacitor 33B is connected to the first control power wire 66A and the first control wire 64A. Specifically, the first terminal of the first capacitor 33B is connected to the first wire portion 66*pa* of the first control power wire 66A. The second terminal of the first capacitor 33B is connected to the second part 64*py* of the first control wire 64A. In this manner, the first capacitors 33A and 33B are connected in series between the first control power wire 65A and the first control power wire 66A by the first control wire 64A.

In the present embodiment, the first capacitor 33A is positioned so that its first terminal and second terminal are arranged in the width direction X. Further, the first capacitor 33B is positioned so that its first terminal and second terminal are arranged in the width direction X. Moreover, the first capacitor 33A and the first capacitor 33B are overlapped with each other in the length direction Y and spaced apart in the width direction X. The capacitors 33A and 33B overlap the first low-voltage diode 32A in the width direction X. The first capacitor 33A overlaps the first low-voltage diode 32B in the length direction Y. The first capacitor 33B is located toward the first resin side surface 51 from the first low-voltage diode 32B in the width direction X.

The first wire piece 67A is arranged, in the width direction X, between the first part 62*py* of the fourth wire portion 62*pd* of the first drive wire 62A and the end of the first wire portion 63*pa* of the first control wire 63A that is located toward the third resin side surface 53 in the length direction Y. Thus, the first wire piece 67A is arranged in the first wiring region 70A. The first wire piece 67A is L-shaped in a plan view.

As shown in FIGS. 6 and 7A, the second high-voltage diodes 31A and 31B, the second low-voltage diodes 34A and 34B, and the second capacitors 35A and 35B are mounted on the fifth substrate layer 60G. The fifth substrate layer 60G is stacked on the fourth substrate layer 60E. Thus, the fifth substrate layer 60G is smaller in dimension in the width direction X than the first to third substrate layers 60A to 60C and not arranged on the first conductive member 42A in the width direction X. The fifth substrate layer 60G forms the second short-circuiting detection circuit 3B and the second surge reduction circuit 4B shown in FIG. 5.

The fifth substrate layer 60G includes a second drive wire 62B, second control wires 63B and 64B, a second control power wire 65B, a second control power wire 66B, and a second wire piece 67B. In a plan view, the conductive substrate 60 (fifth substrate layer 60G) includes a second wiring region 70B, which extends from the second semiconductor elements 10B toward the third resin side surface 53 of the resin member 50 in the width direction X, and a third wiring region 70C, which extends from the second semiconductor elements 10B toward the fourth resin side surface 54 of the resin member 50 in the width direction X. That is, wiring regions are formed in the fifth substrate layer 60G at opposite sides of the second semiconductor elements 10B in the length direction Y. The second wiring region 70B and the third wiring region 70C are mounting regions in the conductive substrate 60 (fifth substrate layer 60G) for mounting components other than the second semiconductor elements 10B.

The second drive wire 62B and the second control wires 63B and 64B each extend from a region other than the second wiring region 70B of the fifth substrate layer 60G to the second wiring region 70B. The second control power wire 65B, the second control power wire 66B, and the second wire piece 67B are arranged in the second wiring region 70B. The second low-voltage diodes 34A and 34B, and the second capacitors 35A and 35B are mounted in the second wiring region 70B. Thus, the second surge reduction circuit 4B is formed in the second wiring region 70B.

The second drive wire 62B extends from a region other than the third wiring region 70C of the fifth substrate layer 60G to the third wiring region 70C. The second high-voltage diodes 31A and 31B is mounted in the third wiring region 70C. Thus, the second short-circuiting detection circuit 3B is formed in the third wiring region 70C. In this manner, the fifth substrate layer 60G differs from the fifth substrate layer 60F in that the wiring region in which the second surge reduction circuit 4B (refer to FIG. 5) is formed (second wiring region 70B) is separate from the wiring region in which the second short-circuiting detection circuit 3B (refer to FIG. 5) is formed (third wiring region 70C). Further, in the present embodiment, the second wiring region 70B and the third wiring region 70C sandwich the second semiconductor elements 10B in the length direction Y.

The second drive wire 62B is electrically connected to the second short-circuiting detection lead 87B. Further, the second drive wire 62B is electrically connected by the second high-voltage diodes 31A and 31B to the drain electrode 11 of each second semiconductor element 10B. Thus, short-circuiting of the second semiconductor elements 10B is detected via the second drive wire 62B. In this manner, the second drive wire 62B electrically connects the drain electrode 11 of each second semiconductor element 10B to the second short-circuiting detection lead 87B.

Figure 9:
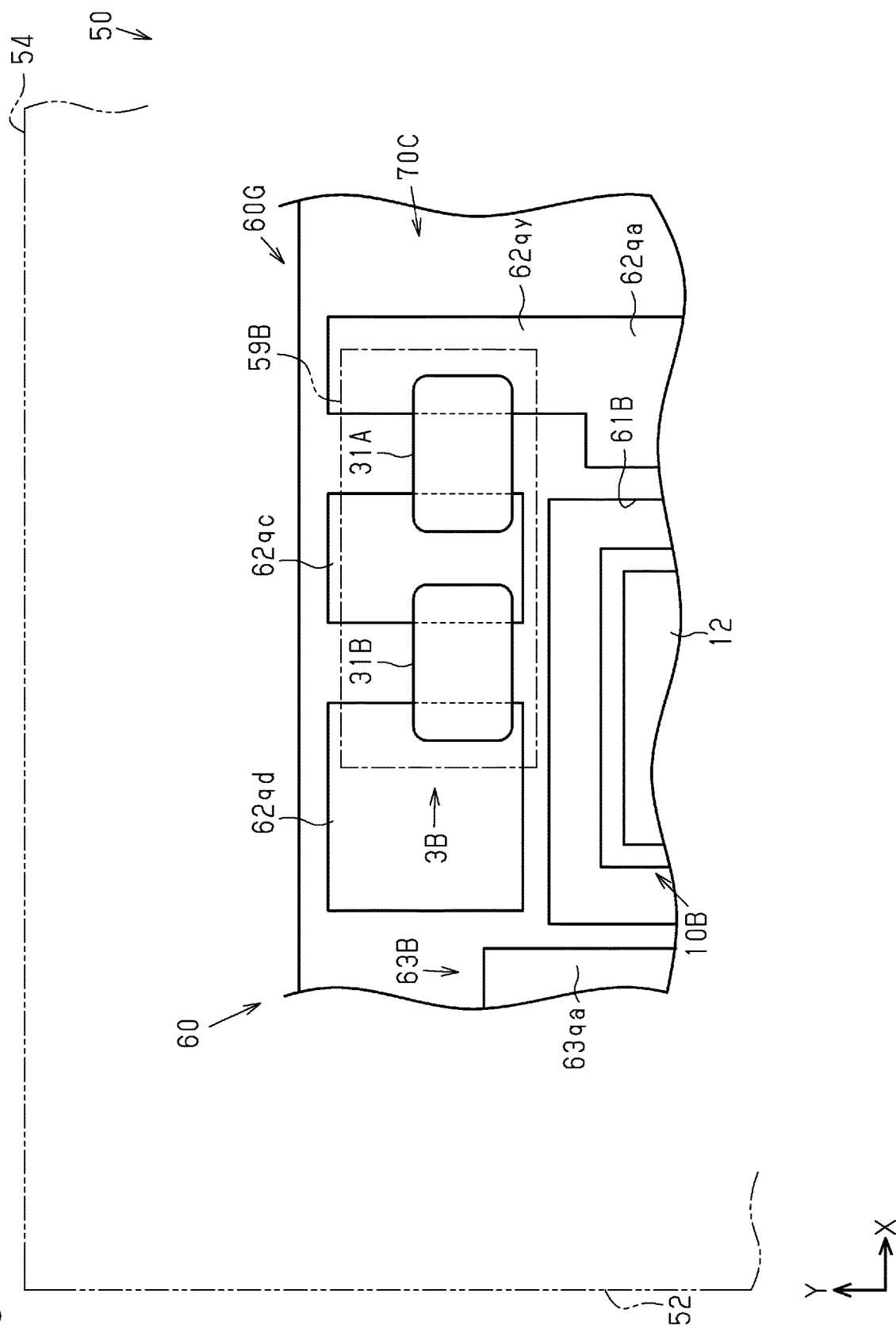
FIG. 9 is an enlarged view of a third wiring region in the semiconductor device shown in FIG. 7A.

As shown in FIGS. 7A and 9, the second drive wire 62B includes a first wire portion 62$qa$ extending in the length direction Y, a plurality of (two in the present embodiment) the second wire portions 62$qb$ extending from the first wire portion 62$qa$ in the width direction X, a third wire portion 62$qc$ connecting the second high-voltage diodes 31A and 31B, and a fourth wire portion 62$qd$ electrically connecting the second high-voltage diode 31B and the drain electrode 11 of each second semiconductor element 10B.

The first wire portion 62$qa$ is located toward the first conductive member 42A from the second semiconductor elements 10B in the width direction X. The first wire portion 62$qa$ is arranged in the fifth substrate layer 60F at the end located toward the first conductive member 42A in the width direction X. The first wire portion 62$qa$ extends overlapping the second semiconductor elements 10B as viewed in the width direction X. The second wire portions 62$qb$ are located between adjacent ones of the second semiconductor elements 10B in the length direction Y As shown in FIG. 10, the first wire portion 62$qa$ includes a first end 62$qx$ that is located toward the third resin side surface 53 in the length direction Y and extends to the second wiring region 70B. The first end 62$qx$ and the pad portion 87$p$ of the second short-circuiting detection lead 87B are connected by a second short-circuiting detection connection member 97B. The second short-circuiting detection connection member 97B is, for example, a wire formed through wire bonding.

As shown in FIG. 9, the first wire portion 62$qa$ includes a second end 62$qy$ that is located toward the fourth resin side surface 54 in the length direction Y and extends to the third wiring region 70C. The width of the second end 62$qy$ in the width direction X is less than the width of the part of the first wire portion 62$qa$ other than the second end 62$qy$ in the width direction X. The third wire portion 62$qc$ is aligned with the second end 62$qy$ in the length direction Y and spaced apart from the second end 62$qy$ in the width direction X. Thus, the third wire portion 62$qc$ is arranged in the third wiring region 70C. In the present embodiment, the length of the third wire portion 62$qc$ in the length direction Y is equal to the length of the second end 62$qy$ in the length direction Y. Further, the width of the third wire portion 62$qc$ in the width direction X is greater than the width of the second end 62$qy$ in the width direction X.

The fourth wire portion 62$qd$ and the second end 62$qy$ are spaced apart and located at opposite sides of the third wire portion 62$qc$ in the width direction X. Thus, the fourth wire portion 62$qd$ is arranged in the third wiring region 70C. The third wire portion 62$qc$ and the fourth wire portion 62$qd$ are arranged overlapping the second semiconductor elements 10B in the length direction Y. The third wire portion 62$qc$ and the fourth wire portion 62$qd$ are each arranged further toward the fourth resin side surface 54 from the one of the second semiconductor elements 10B that is the closest to the fourth resin side surface 54 in the length direction Y and next to the second semiconductor elements 10B in the length direction Y.

The second high-voltage diodes 31A and 31B are mounted on the second drive wire 62B. In further detail, the second high-voltage diode 31A is connected to the second end 62$qy$ and the third wire portion 62$qc$. Specifically, the anode electrode of the second high-voltage diode 31A is connected to the second end 62$qy$, and the cathode electrode of the second high-voltage diode 31A is connected to the third wire portion 62$qc$. The second high-voltage diode 31B is connected to the third wire portion 62$qc$ and the fourth wire portion 62$qd$. Specifically, the anode electrode of the second high-voltage diode 31B is connected to the third wire portion 62$qc$, and the cathode electrode of the second high-voltage diode 31B is connected to the fourth wire portion 62$qd$. In this manner, the first wire portion 62$qa$, the third wire portion 62$qc$, and the fourth wire portion 62$qd$ connect the second high-voltage diode 31A and the second high-voltage diode 31B in series.

In the present embodiment, the second high-voltage diode 31A is positioned so that its anode electrode and cathode electrode are arranged in the width direction X. Further, the second high-voltage diode 31B is positioned so that its anode electrode and cathode electrode are arranged in the width direction X. Moreover, the second high-voltage diode 31A and the second high-voltage diode 31B are arranged to align with each other in the length direction Y and spaced apart in the width direction X.

As shown in FIGS. 7A and 10, the second control wire 63B is a wire section that electrically connects the gate electrode 13 of each second semiconductor element 10B to the second control lead 84B. The gate electrode 13 of each second semiconductor element 10B is connected to the second control wire 63B by a second control connection member 92B. The second control connection member 92B is, for example, a wire formed through wire bonding. The second control wire 63B includes a first wire portion 63$qa$ extending in the length direction Y, a second wire portion 63$qb$ extending diagonally from the first wire portion 63$qa$ with respect to the length direction Y so that the third resin side surface 53 becomes closer as the first conductive member 42A becomes closer, and a third wire portion 63$qc$ extending from the second wire portion 63$qb$ toward the second control lead 84B.

The first wire portion 63$qa$ is arranged next to the second semiconductor elements 10B and toward the second resin side surface 52 from the second semiconductor elements 10B in the width direction X. The first wire portion 63$qa$ extends overlapping the second semiconductor elements 10B as viewed in the width direction X. In the present embodiment, the first wire portion 63$qa$ is not arranged in the second wiring region 70B.

The second wire portion 63$qb$ and the third wire portion 63$qc$ are each arranged in the second wiring region 70B. That is, in a plan view, the second wire portion 63$qb$ and the third wire portion 63$qc$ are each located between the second semiconductor elements 10B and the second control lead 84B in the length direction Y.

The second wire portion 63$qb$ is arranged next to the one of the second semiconductor elements 10B that is the closest to the third resin side surface 53 in the length direction Y.

The third wire portion 63$qc$ is L-shaped in a plan view. The third wire portion 63$qc$ includes a first part 63$qx$, which extends from the second wire portion 62$qb$ toward the first conductive member 42A in the width direction X, and a second part 63$qy$, which extends from a position overlapping the second control lead 84B as viewed in the length direction Y toward the second control lead 84B in the length direction Y. The width of the third wire portion 63$qc$ of the first part 63$qx$ in the length direction Y is greater than the width of the part of the second control wire 63B other than the first part 63$qx$ (plan view dimension in direction orthogonal to extending direction of second control wire 63B). The end of the second part 63$qy$ at the side of the third resin side surface 53 in the length direction Y is connected to the second control lead 84B by a second control lead connection member 94B. The second control lead connection member 94B is, for example, a wire formed through wire bonding.

The second control wire 64B is a wire section that connects the source electrode 12 of each second semiconductor element 10B to the second control lead 85B. In the present embodiment, the second control wire 64B is a wire section that extends from the source electrode 12 of each second semiconductor element 10B toward the outside and supplies gate voltage to between the source electrode 12 and the gate electrode 13 of each second semiconductor element 10B. The source electrode 12 of each second semiconductor element 10B is connected to the second control wire 64B by a second control connection member 93B. The second control connection member 93B is, for example, a wire formed through wire bonding. The second control wire 64B includes a first wire portion 64$qa$ extending in the length direction Y, a second wire portion 64$qb$ extending diagonally from the first wire portion 64$qa$ with respect to the length direction Y toward the first conductive member 42A, and a third wire portion 64$qc$ extending from the second wire portion 64$qb$ toward the second control lead 85B.

The first wire portion 64$qa$ is located at the side of the second control wire 63B opposite to the second semiconductor elements 10B in the width direction X. The first wire portion 64$qa$ is formed in the fifth substrate layer 60G at the end located toward the second resin side surface 52 in the width direction X. In the present embodiment, the length of the first wire portion 64$qa$ in the length direction Y is equal to the length of the first wire portion 63$qa$ of the second control wire 63B in the length direction Y.

The second wire portion 64$qb$ is parallel to the second wire portion 63$qb$ of the second control wire 63B. The second wire portion 64$qb$ is arranged overlapping the second wire portion 63$qb$ as viewed in the width direction X. Further, the second wire portion 64$qb$ is arranged overlapping the second wire portion 63$qb$ as viewed in the length direction Y.

The third wire portion 64$qc$ is located toward the second resin side surface 52 from the second control lead 85B in the width direction X. The third wire portion 64$qc$ extends in the length direction Y. The width of the third wire portion 64$qc$ in the width direction X is greater than the width of the part of the second control wire 64B other than the third wire portion 64$qc$ (plan view dimension in direction orthogonal to extending direction of second control wire 64B). The end of the third wire portion 64$qc$ at the side of the third resin side surface 53 in the length direction Y is connected to the pad portion 85$p$ of the second control lead 85B by a second control lead connection member 95B. The second control lead connection member 95B is, for example, a wire formed through wire bonding.

The second control power wire 65B is located between the second control wire 63B and the second control wire 64B in the width direction X. Specifically, the second control power wire 65B is located between the second part 63$qy$ of the third wire portion 63$qc$ of the second control wire 63B and the third wire portion 64$qc$ of the second control wire 64B in the width direction X. The second control power wire 65B is arranged in the fifth substrate layer 60G at the end located toward the third resin side surface 53 in the length direction Y. The second control power wire 65B is arranged toward the third resin side surface 53 from the first part 63$qx$ of the third wire portion 63$qc$ of the second control wire 63B. The second control power wire 65B extends in the length direction Y. The width of the second control power wire 65B in the width direction X is greater than the width of the second end 62$qy$ in the third wire portion 62$qc$ of the second control wire 63B in the width direction X. The second control power wire 65B and the pad portion 86$p$ of the second control power lead 86C are connected by a second control power connection member 96C. The second control power connection member 96C is, for example, a wire formed through wire bonding.

The second control power wire 66B includes a first wire portion 66$qa$ extending in the length direction Y, a second wire portion 66$qb$ spaced apart from the first wire portion 66$qa$ and extending in the length direction Y, and a third wire portion 66$qc$ connecting the first wire portion 66$qa$ and the second wire portion 66$qb$. The first wire portion 66$qa$ is arranged in the fifth substrate layer 60G at the end located toward the second resin side surface 52 in the width direction X and the end located toward the third resin side surface 53 in the length direction Y The first wire portion 66$qa$ extends in the length direction Y The first wire portion 66$qa$ is arranged overlapping the third wire portion 64$qc$ of the second control wire 64B as viewed in the width direction X. The length of the first wire portion 66$qa$ in the length direction Y is less than the length of the third wire portion 63$qc$ in the length direction Y. In the present embodiment, the width of the first wire portion 66$qa$ in the width direction X is less than the widths of the second drive wire 62B, the second control wire 63B, the second control wire 64B, and the second control power wire 65B (plan view dimension in direction orthogonal to extending direction of each wire in plan view). The second control power wire 66B and the second control power lead 86D are connected by a second control power connection member 96D. The second control power connection member 96D is, for example, a wire formed through wire bonding.

The second wire portion 66qb is located toward the first resin side surface 51 (toward first wire portion 62qa of second drive wire 62B) from the first wire portion 66qa in the width direction X. The second wire portion 66qb is located toward the fourth resin side surface 54 (toward second semiconductor elements 10B) from the first wire portion 66qa in the length direction Y. The second wire portion 66qb is arranged overlapping the first part 63qx of the third wire portion 63qc of the second control wire 63B, the second control power wire 65B, and the second control lead 85B as viewed in the length direction Y. The second wire portion 66qb is located between the second part 63qy of the third wire portion 63qc of the second control wire 63B and the third wire portion 62qc of the second control wire 64B in the width direction X.

The third wire portion 66qc is arranged in the third substrate layer 60C (refer to FIG. 6). Thus, the third wire portion 66qc is concealed in a plan view. The third wire portion 66qc is electrically connected to the first wire portion 66qa by a through-electrode arranged in the first wire portion 66qa and to the second wire portion 66qb by a through-electrode arranged in the second wire portion 66qb. The third wire portion 66qc is, for example, L-shaped in a plan view. The third wire portion 66qc does not have to be L-shaped in a plan view and may be shaped to extend diagonally so that the second resin side surface 52 becomes closer as the third resin side surface 53 becomes closer.

The second low-voltage diodes 34A and 34B and the second capacitors 35A and 35B of the second surge reduction circuit 4B are connected to the second control wires 63B and 64B, the second control power wire 65B, and the second control power wire 66B.

The second low-voltage diode 34A is connected to the second control wire 63B and the second control power wire 65B. Specifically, the anode electrode of the second low-voltage diode 34B is connected to the second part 63qy of the third wire portion 63qc of the second control wire 63B. The cathode electrode of the second low-voltage diode 34B is connected to the second control power wire 65B.

The second low-voltage diode 34B is connected to the second control wire 63B and the second control power wire 66B. Specifically, the cathode electrode of the second low-voltage diode 34A is connected to the first part 63qx of the third wire portion 63qc of the second control wire 63B. The anode electrode of the second low-voltage diode 34A is connected to the second wire portion 64qb of the second control power wire 66B. In this manner, the second low-voltage diodes 34B and 34B are connected in series between the second control power wire 66B and the second control power wire 65B by the second control wire 63B.

In the present embodiment, the second low-voltage diode 34A is positioned so that its anode electrode and cathode electrode are arranged in the width direction X. Further, the second low-voltage diode 34B is positioned so that its anode electrode and cathode electrode are arranged in the width direction X. Moreover, the second low-voltage diode 34A and the second low-voltage diode 34B are disposed at different positions in the length direction Y. The second low-voltage diode 34A and the second low-voltage diode 34B are disposed to overlap each other in the length direction Y. The second low-voltage diode 34A is located toward the third resin side surface 53 from the second low-voltage diode 34B in the length direction Y.

The second capacitor 35A is connected to the second control power wire 65B and the second control wire 64B.

Specifically, the first terminal of the second capacitor 35A is connected to the second control power wire 65B. The second terminal of the second capacitor 35A is connected to the third wire portion 63qc of the second control wire 64B.

The second capacitor 35B is connected to the second control power wire 66B and the second control wire 64B. Specifically, the first terminal of the second capacitor 35B is connected to the first wire portion 66qa of the second control power wire 66B. The second terminal of the second capacitor 35B is connected to the third wire portion 64qc of the second control wire 64B. In this manner, the second capacitors 35A and 35B are connected in series between the second control power wire 65B and the second control power wire 66B by the second control wire 64B.

In the present embodiment, the second capacitor 35A is positioned so that its first terminal and second terminal are arranged in the width direction X. Further, the second capacitor 35B is positioned so that its first terminal and second terminal are arranged in the width direction X. Moreover, the second capacitor 35A and the second capacitor 35B are arranged to align with each other in the length direction Y and spaced apart in the width direction X. The capacitors 35A and 35B overlap the second low-voltage diode 34A in the width direction X. The capacitors 35A and 35B are located toward the second resin side surface 52 from the low-voltage diodes 34A and 34B in the width direction X.

The control connection members 92A, 92B, 93A, and 93B, the control lead connection members 94A, 94B, 95A, and 95B, the control power connection members 96A to 96D, and the short-circuiting detection connection members 97A and 97B are each formed from gold (Au) or copper (Cu). Further, the control connection members 92A, 92B, 93A, and 93B, the control lead connection members 94A, 94B, 95A, and 95B, the control power connection members 96A to 96D, and the short-circuiting detection connection members 97A and 97B have equal diameters.

As shown in FIG. 7A, the second wire piece 67B is arranged in the fifth substrate layer 60G at the end located toward the output lead 83 in the width direction X and the end at the side opposite to the third resin side surface 53 in the length direction Y. The second wire piece 67B is L-shaped in a plan view.

As shown in FIGS. 6 and 7A, the first semiconductor elements 10A accommodated in the first substrate openings 61A and the first substrate recess 61C of the conductive substrate 60 are electrically connected to the first conductive member 42A and the output lead 83. The first conductive member 42A is electrically connected to the first input lead 81. Thus, the first semiconductor elements 10A are also electrically connected to the first input lead 81. Specifically, the drain electrode 11 of each first semiconductor element 10A is bonded by, for example, a conductive bonding material, such as solder or silver paste, to the first conductive member 42A. The source electrode 12 of each first semiconductor element 10A is connected by a plurality of (four in the present embodiment) first drive connection members 91A to a corresponding one of the exposed portions 83d of the output lead 83. The first drive connection members 91A are, for example, wires formed through wire bonding. The first drive connection members 91A extend across the first wire portion 62pa of the first drive wire 62A. The number of the first drive connection members 91A is not limited to four and may be changed freely.

The second semiconductor elements 10B, accommodated in the second substrate opening 61B of the conductive substrate 60, are electrically connected to the second conductive member 42B and the second input lead 82. The second conductive member 42B is electrically connected to the output lead 83. Thus, the second semiconductor elements 10B are also electrically connected to the output lead 83. Specifically, the drain electrode 11 of each second semiconductor element 10B is bonded by, for example, a conductive bonding material, such as solder or silver paste, to the second conductive member 42B. The source electrode 12 of each second semiconductor element 10B is connected by a plurality of (four in the present embodiment) the second drive connection members 91B to a corresponding one of the exposed portions 82d of the second input lead 82. the second drive connection members 91B are, for example, wires formed through wire bonding. The second drive connection members 91B extend across the first wire portion 62qa of the second drive wire 62B. The number of the second drive connection members 91B is not limited to four and may be changed freely.

The drive connection members 91A and 91B are formed from copper (Cu) or aluminum (Al). In the present embodiment, the drive connection members 91A and 91B are formed from the same material as the control connection members 92A, 92B, 93A, and 93B, the control lead connection members 94A, 94B, 95A, and 95B, the control power connection members 96A to 96D, and the short-circuiting detection connection members 97A and 97B. Further, the drive connection members 91A and 91B have equal diameters. In the present embodiment, the diameter of the drive connection members 91A and 91B is equal to the diameter of each of the control connection members 92A, 92B, 93A, and 93B, the control lead connection members 94A, 94B, 95A, and 95B, the control power connection members 96A to 96D, and the short-circuiting detection connection members 97A and 97B.

Figure 2:
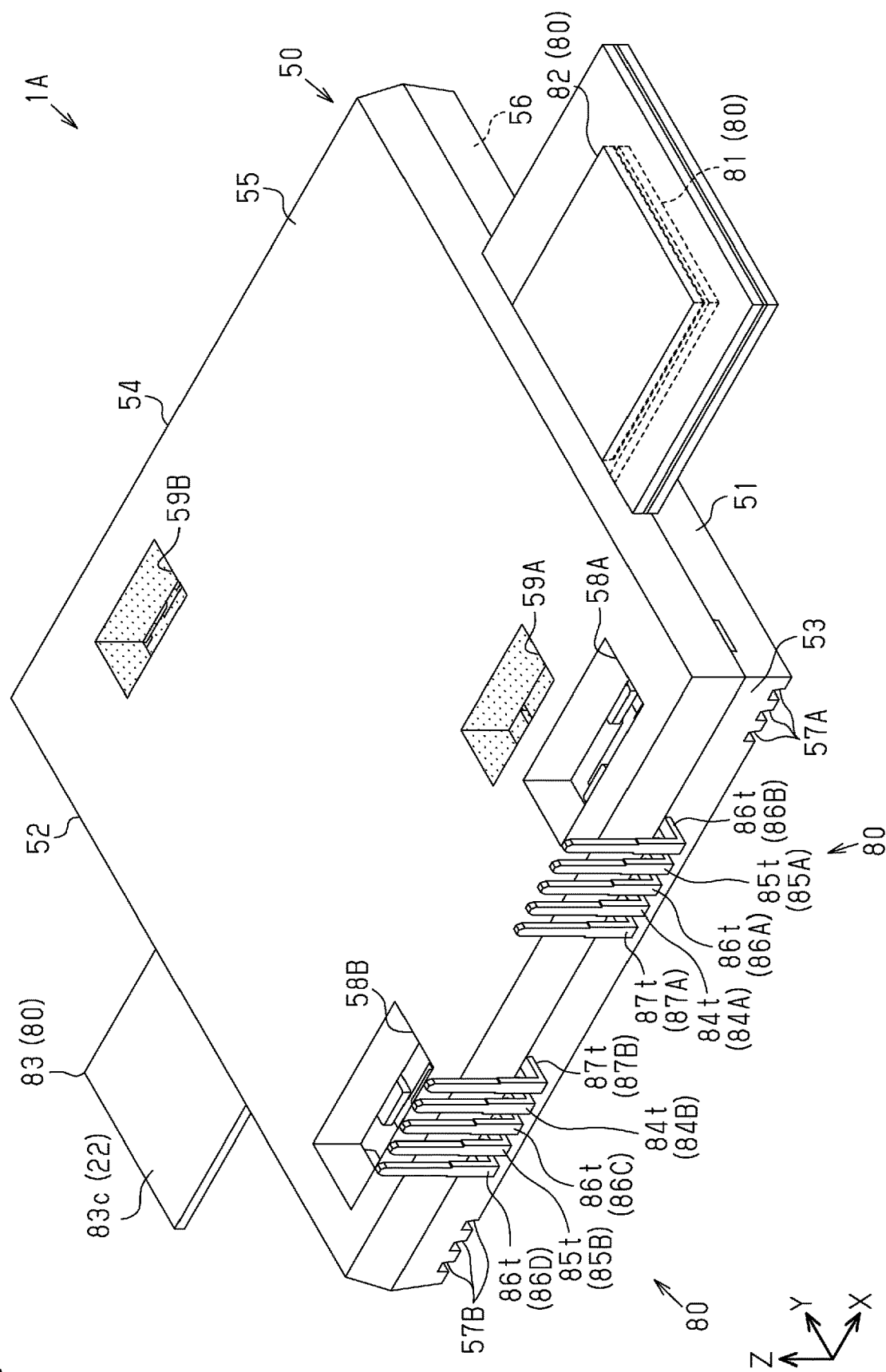
FIG. 2 is a perspective view of the semiconductor device in accordance with the first embodiment.

As shown in FIGS. 1 and 2, the resin member 50 includes four resin openings that expose the conductive substrate 60 from the top resin surface 55, namely, a first control side opening 58A, a second control side opening 58B, a first drive side opening 59A, and a second drive side opening 59B. As shown in FIGS. 1 and 2, the first control side opening 58A is separate from the first drive side opening 59A. The second control side opening 58B is separate from the second drive side opening 59B.

The first control side opening 58A is located at a position overlapping the first semiconductor elements 10A as viewed in the length direction Y and toward the third resin side surface 53 from the first semiconductor elements 10A. The second control side opening 58B is located at a position overlapping the second semiconductor elements 10B as viewed in the length direction Y and toward the third resin side surface 53 from the second semiconductor elements 10B. In this manner, the first control side opening 58A and the second control side opening 58B are arranged along one side of the resin member 50 in a state spaced apart from each other in a plan view. That is, in a plan view, the first control side opening 58A and the second control side opening 58B are arranged to align with each other in the length direction Y and spaced apart in the width direction X. In a plan view, the control side openings 58A and 58B are arranged in the top resin surface 55 at the end located toward the third resin side surface 53. The first control side opening 58A is located toward the first resin side surface 51 from the second control side opening 58B.

In a plan view, the first control side opening 58A is located between the first semiconductor elements 10A and the terminal portion 84t of the first control lead 84A in the length direction Y. In the present embodiment, the first control side opening 58A is located between the first semiconductor elements 10A and the pad portion 84p of the first control lead 84A in the length direction Y in a plan view. Further, in a plan view, the first control side opening 58A is located between the first semiconductor elements 10A and the terminal portion 85t of the first control lead 85A in the length direction Y. In the present embodiment, the first control side opening 58A is located between the first semiconductor elements 10A and the pad portion 85p of the first control lead 85A in the length direction Y.

In a plan view, the second control side opening 58B is located between the second semiconductor elements 10B and the terminal portion 84t of the second control lead 84B in the length direction Y. In the present embodiment, the second control side opening 58B is located between the second semiconductor elements 10B and the pad portion 84p of the second control lead 84B in the length direction Y. Further, in a plan view, the second control side opening 58B is located between the second semiconductor elements 10B and the terminal portion 85t of the second control lead 85B in the length direction Y. In the present embodiment, the second control side opening 58B is located between the second semiconductor elements 10B and the pad portion 85p of the second control lead 85B in the length direction Y in a plan view.

The first drive side opening 59A is located at a position overlapping the first semiconductor elements 10A as viewed in the length direction Y and toward the third resin side surface 53 from the first semiconductor elements 10A. Further, the first drive side opening 59A is located toward the first semiconductor elements 10A from the first control side opening 58A in the length direction Y. Thus, the first drive side opening 59A is located between the first semiconductor elements 10A and the terminal portion 84t of the first control lead 84A in the length direction Y in a plan view. The first drive side opening 59A is located between the first semiconductor elements 10A and the terminal portion 85t of the first control lead 85A in the length direction Y. In the present embodiment, the first drive side opening 59A is located between the first semiconductor elements 10A and the first control side opening 58A in the length direction Yin a plan view.

The second drive side opening 59B is located at a position overlapping the second semiconductor elements 10B as viewed in the length direction Y and toward the fourth resin side surface 54 from the second semiconductor elements 10B. Thus, in a plan view, the first drive side opening 59A is located toward the first resin side surface 51 from the second control side opening 58B and the second drive side opening 59B. The first drive side opening 59A is located toward the second resin side surface 52 from the first control side opening 58A. The first drive side opening 59A is located closer to the first control side opening 58A than the second control side opening 58B and the second drive side opening 59B. In a plan view, the second drive side opening 59B is arranged in the top resin surface 55 at the end located toward the fourth resin side surface 54. The second drive side opening 59B is located toward the first resin side surface 51 from the second control side opening 58B. The area of each of the drive side openings 59A and 59B in a plan view is smaller than the area of each of the control side openings 58A and 58B in a plan view.

As shown in FIG. 8, the first control side opening 58A exposes part of the first wiring region 70A of the conductive substrate 60. Thus, the first control side opening 58A exposes part of a mounting region in the conductive substrate 60 (fifth substrate layer 60F) on which electronic components other than the first semiconductor elements 10A are mounted. The first control side opening 58A exposes an area of the first wiring region 70A located toward the third resin side surface 53. In the present embodiment, the first control side opening 58A exposes the first surge reduction circuit 4A, which is electrically connected to the first semiconductor elements 10A. In further detail, as shown in FIG. 8, the first control side opening 58A exposes the first low-voltage diodes 32A and 32B, the first capacitors 33A and 33B, the third wire portion 63pc of the first control wire 63A, the third wire portion 64pc of the first control wire 64A, the first control power wire 65A, and the first control power wire 66A. In the present embodiment, the first control side opening 58A does not expose the first control lead connection members 94A and 95A, the first control power connection members 96A and 96B, and the first short-circuiting detection connection member 97A. The shape of the first control side opening 58A in a plan view, although not limited in particular, is rectangular so that the width direction X is the long-side direction and the length direction Y is the short-side direction. The interior of the first control side opening 58A is an open space.

As shown in FIG. 10, the second control side opening 58B exposes part of the second wiring region 70B of the conductive substrate 60. Thus, the second control side opening 58B exposes part of a mounting region in the conductive substrate 60 (fifth substrate layer 60G) on which electronic components other than the second semiconductor elements 10B are mounted. The second control side opening 58B exposes an area of the second wiring region 70B located toward the third resin side surface 53. In the present embodiment, the second control side opening 58B exposes the second surge reduction circuit 4B, which is electrically connected to the second semiconductor elements 10B. In further detail, the second control side opening 58B exposes the second low-voltage diodes 34A and 34B, the second capacitors 35A and 35B, the third wire portion 63pc of the second control wire 63B, the third wire portion 64qc of the second control wire 64B, the second control power wire 65B, and the second control power wire 66B. In the present embodiment, the second control side opening 58B does not expose the second control lead connection members 94B and 95B, the second control power connection members 96C and 96D, and the second short-circuiting detection connection member 97B. The shape of the second control side opening 58B in a plan view, although not limited in particular, is rectangular so that the width direction X is the long-side direction and the length direction Y is the short-side direction. The interior of the second control side opening 58B is an open space.

The first drive side opening 59A exposes an area of the first wiring region 70A that differs from the area exposed by the first control side opening 58A. Thus, the first drive side opening 59A exposes part of a mounting region in the conductive substrate 60 (fifth substrate layer 60F) on which electronic components other than the first semiconductor elements 10A and other than those exposed from the first control side opening 58A are mounted. The first drive side opening 59A exposes an area of the first wiring region 70A located toward the first semiconductor elements 10A. In the present embodiment, the first drive side opening 59A exposes the first short-circuiting detection circuit 3A, which is connected to the drain electrode 11 of the first semiconductor element 10A. In further detail, as shown in FIG. 8, the first drive side opening 59A exposes the first high-voltage diodes 30A and 30B, the end 62px of the first drive wire 62A, the third wire portion 62pc, and the first part 62py of the fourth wire portion 62pd. In the present embodiment, the first drive side opening 59A does not expose the first semiconductor elements 10A. The shape of the first drive side opening 59A in a plan view, although not limited in particular, is rectangular so that the width direction X is the long-side direction and the length direction Y is the short-side direction. Further, the first drive side opening 59A is filled with an insulative material 71 that is electrically insulative. One example of the insulative material 71 is silicone resin.

As shown in FIG. 9, the second drive side opening 59B exposes part of the third wiring region 70C of the conductive substrate 60. Thus, the second drive side opening 59B exposes part of a mounting region in the conductive substrate 60 (fifth substrate layer 60G) on which electronic components other than the second semiconductor elements 10B are mounted. The exposed part differs from the part exposed from the second control side opening 58B. The second drive side opening 59B exposes the second short-circuiting detection circuit 3B, which is connected to the drain electrode 11 of each second semiconductor element 10B. In further detail, the second drive side opening 59B exposes the second high-voltage diodes 31A and 31B, the second end 62qy of the second drive wire 62B, the third wire portion 62qc, and the fourth wire portion 62qd. In the present embodiment, the second drive side opening 59B does not expose the second semiconductor elements 10B. The shape of the second drive side opening 59B in a plan view, although not limited in particular, is rectangular so that the width direction X is the long-side direction, and the length direction Y is the short-side direction. Further, the second drive side opening 59B is filled with an insulative material 72 that is electrically insulative. One example of the insulative material 72 is silicone resin.

Manufacturing Method

A method for manufacturing the semiconductor device 1A will now be described.

Figure 13:
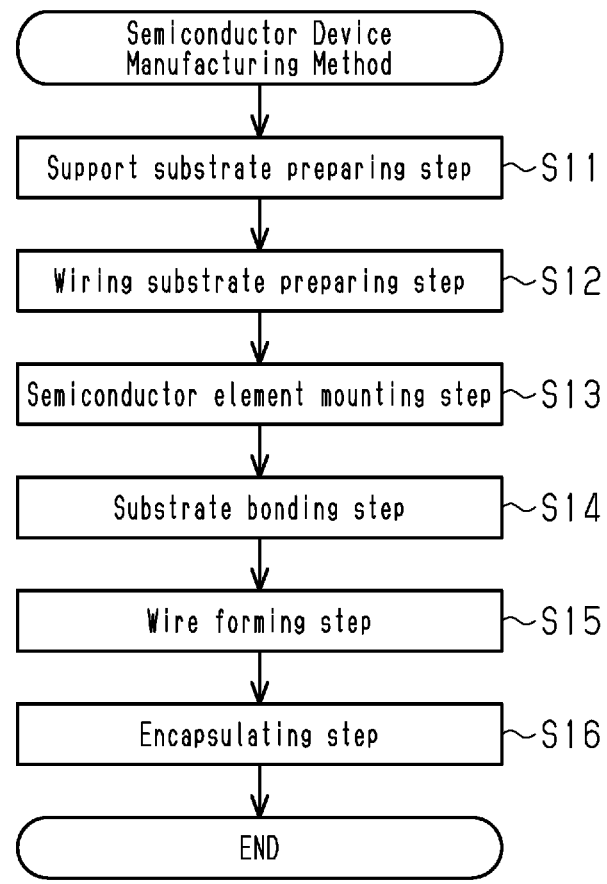
FIG. 13 is a flowchart illustrating a method for manufacturing the semiconductor device in accordance with the first embodiment.

As shown in FIG. 13, the method for manufacturing the semiconductor device 1A includes a support substrate preparing step (step S11), a conductive substrate preparing step (step S12), a semiconductor element mounting step (step S13), a substrate bonding step (step S14), a wire forming step (step S15), and an encapsulating step (step S16). In the present embodiment, the support substrate preparing step, the conductive substrate preparing step, the semiconductor element mounting step, the substrate bonding step, the wire forming step, and the encapsulating step are sequentially performed to manufacture the semiconductor device 1A.

In the support substrate preparing step, the support substrate 40 is manufactured. More specifically, the first conductive member 42A is bonded to the substrate main surface 41sa of the first insulative substrate 41A with a conductive bonding material, such as silver paste or solder. The second conductive member 42B is bonded to the substrate main surface 41sb of the second insulative substrate 41B with the conductive bonding material. The assembly of the first insulative substrate 41A and the first conductive member 42A is spaced apart in the width direction X from the assembly of the second insulative substrate 41B and the second conductive member 42B.

In the conductive substrate preparing step, an assembly including the conductive substrate 60, the input leads 81 and 82, and the output lead 83 is produced. More specifically, the first substrate layer 60A, the second substrate layer 60B, the third substrate layer 60C, the fourth substrate layers 60D and 60E, and the fifth substrate layers 60F and 60G, which are formed from glass epoxy resin, are prepared. Then, the first substrate layer 60A is coupled with the first input lead 81 and the output lead 83. The second substrate layer 60B is formed on the first substrate layer 60A. Then, after coupling the third substrate layer 60C with the second input lead 82, the third substrate layer 60C is formed on the second substrate layer 60B. The fourth substrate layers 60D and 60E are then formed on the third substrate layer 60C. Further, the fifth substrate layer 60F is formed on the fourth substrate layer 60D, and the fifth substrate layer 60G is formed on the fourth substrate layer 60E. Then, the first high-voltage diodes 30A and 30B, the first low-voltage diodes 32A and 32B, and the first capacitors 33A and 33B are mounted on the fifth substrate layer 60F, and the second high-voltage diodes 31A and 31B, the second low-voltage diodes 34A and 34B, and the second capacitors 35A and 35B are mounted on the fifth substrate layer 60G.

In the support substrate preparing step, a lead frame is bonded to the first conductive member 42A and the second conductive member 42B before the control leads 84A, 84B, 85A, and 85B, the control power leads 86A to 86D, and the short-circuiting detection leads 87A and 87B are formed on the lead frame. Thus, the control leads 84A, 84B, 85A, and 85B, the control power leads 86A to 86D, and the short-circuiting detection leads 87A and 87B are supported by the support substrate 40 in a state spaced apart from the support substrate 40.

Figure 14:
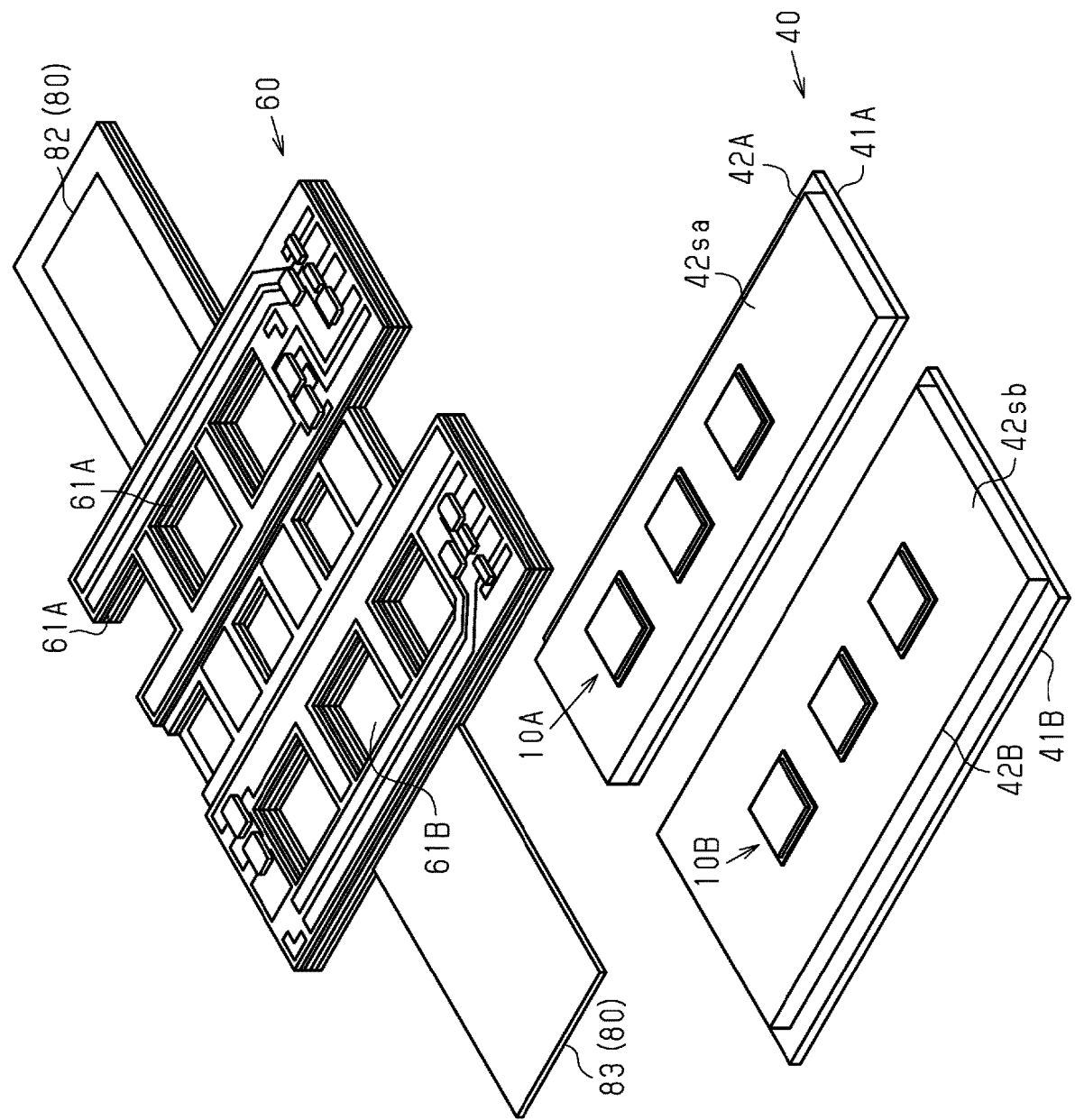
FIG. 14 is a diagram illustrating a substrate joining step in the method for manufacturing the semiconductor device.

In the semiconductor element mounting step, for example, as shown in FIG. 14, the first semiconductor elements 10A are bonded to the main surface 42sa of the first conductive member 42A with a conductive bonding material, such as silver paste or solder. Further, the second semiconductor elements 10B are bonded to the main surface 42sb of the second conductive member 42B with the conductive bonding material. Each first semiconductor element 10A is bonded to the main surface 42sa of the first conductive member 42A with the conductive bonding material in a state in which its drain electrode 11 is opposed toward the main surface 42sa. In this case, the conductive bonding material is applied between the drain electrode 11 of each first semiconductor element 10A and the main surface 42sa of the first conductive member 42A. This electrically connects the drain electrode 11 of each first semiconductor element 10A to the first conductive member 42A. Further, each second semiconductor element 10B is bonded to the main surface 42sb of the second conductive member 42B with the conductive bonding material in a state in which its drain electrode 11 is opposed toward the main surface 42sb. In this case, the conductive bonding material is applied between the drain electrode 11 of each second semiconductor element 10B and the main surface 42sb of the second conductive member 42B. This electrically connects the drain electrode 11 of each second semiconductor element 10B to the second conductive member 42B.

As shown in FIG. 14, in the substrate bonding step, the assembly including the conductive substrate 60, the input leads 81 and 82, and the output lead 83 is bonded to the main surface 42sa of the first conductive member 42A and the main surface 42sb of the second conductive member 42B with a conductive bonding material, such as silver paste or solder. In this case, the first input lead 81 is bonded to the main surface 42sa of the first conductive member 42A, and the output lead 83 is bonded to the main surface 42sb of the second conductive member 42B. Thus, the first input lead 81 is electrically connected to the first conductive member 42A, and the output lead 83 is electrically connected to the second conductive member 42B. As a result, the first input lead 81 is electrically connected to the drain electrode 11 of each first semiconductor element 10A, and the output lead 83 is electrically connected to the drain electrode 11 of each second semiconductor element 10B.

In the wire forming step, a bonding device (not shown) forms the drive connection members 91A and 91B, the control connection members 92A, 92B, 93A, and 93B, the control lead connection members 94A, 94B, 95A, and 95B, the control power connection members 96A to 96D, and the short-circuiting detection connection members 97A and 97B.

More specifically, the bonding device bonds a wire to the source electrode 12 of a predetermined one of the first semiconductor elements 10A. Then, the bonding device moves in the width direction X, while extending the wire, to the exposed portion 83d of the output lead 83 corresponding to the predetermined one of the first semiconductor elements 10A and bonds the wire to the exposed portion 83d. The bonding device repeats the action described above four times. This forms the four first drive connection members 91A connecting the source electrode 12 of the predetermined one of the first semiconductor elements 10A to the exposed portion 83d of the output lead 83 corresponding to the predetermined one of the first semiconductor elements 10A. In this case, the first drive connection members 91A are formed to extend over the first drive wire 62A of the conductive substrate 60. In the same manner, the bonding device forms four first drive connection members 91A on the source electrode 12 of each of the remaining first semiconductor elements 10A and the exposed portions 83d of the output lead 83 corresponding to the first semiconductor elements 10A.

The bonding device bonds a wire to the gate electrode 13 of a predetermined one of the first semiconductor elements 10A. Then, the bonding wire moves in the width direction X, while extending the wire, to the first control wire 63A and bonds the wire to the first wire portion 63pa of the first control wire 63A. This forms the first control connection member 92A connecting the gate electrode 13 of the predetermined one of the first semiconductor elements 10A to the first control wire 63A. In the same manner, the bonding device forms the first control connection member 92A on the gate electrode 13 of each of the remaining first semiconductor elements 10A and the first control wire 63A.

The bonding device bonds a wire to the source electrode 12 of a predetermined one of the first semiconductor elements 10A. Then, the bonding device moves in the width direction X, while extending the wire, to the first control wire 64A and bonds the wire to the first wire portion 64pa of the first control wire 64A. This forms the first control connection member 93A connecting the source electrode 12 of the predetermined one of the first semiconductor elements 10A to the first control wire 64A. In the same manner, the bonding device forms the first control connection member 93A on the source electrode 12 of each of the remaining first semiconductor elements 10A and the first control wire 64A.

Further, the bonding device bonds a wire to the source electrode 12 of a predetermined one of the second semiconductor elements 10B. Then, the bonding device moves, while extending the wire, to the exposed portion 82d of the second input lead 82 corresponding to the predetermined one of the second semiconductor elements 10B and bonds the wire to the exposed portion 82d. The bonding device repeats the action described above four times. This forms the four second drive connection members 91B connecting the source electrode 12 of the predetermined one of the second semiconductor elements 10B to the exposed portion 82d of the second input lead 82 corresponding to the predetermined one of the second semiconductor elements 10B. In this case, the second drive connection members 91B are formed to extend over the second drive wire 62B of the conductive substrate 60. In the same manner, the bonding device forms four second drive connection members 91B on the source electrode 12 of each of the remaining second semiconductor elements 10B and the exposed portions 82*d* of the second input lead 82 corresponding to the second semiconductor elements 10B.

The bonding device bonds a wire to the gate electrode 13 of a predetermined one of the second semiconductor elements 10B. Then, the bonding wire moves in the width direction X, while extending the wire, to the second control wire 63B and bonds the wire to the first wire portion 63*qa* of the second control wire 63B. This forms the second control connection member 92B connecting the gate electrode 13 of the second semiconductor element 10B to the second control wire 63B. In the same manner, the bonding wire forms the second control connection member 92B on the gate electrode 13 of each of the remaining second semiconductor elements 10B and the second control wire 63B.

The bonding device bonds a wire to the source electrode 12 of a predetermined one of the second semiconductor elements 10B. Then, the bonding device moves in the width direction X, while extending the wire, to the second control wire 64B and bonds the wire to the first wire portion 64*qa* of the second control wire 64B. This forms the second control connection member 93B connecting the source electrode 12 of the predetermined one of the second semiconductor elements 10B to the second control wire 64B. In the same manner, the bonding device forms the second control connection member 93B on the source electrode 12 of each of the remaining second semiconductor elements 10B and the second control wire 64B.

The bonding device bonds a wire to the pad portion 87*p* of the first short-circuiting detection lead 87A. Then, the bonding device moves, while extending the wire, to the second part 62*pz* of the fourth wire portion 62*pd* in the first drive wire 62A and bonds the wire to the second part 62*pz*. This forms the first short-circuiting detection connection member 97A connecting the first short-circuiting detection lead 87A to the first drive wire 62A.

The bonding device bonds a wire to the pad portion 84*p* of the first control lead 84A. Then, the bonding device moves, while extending the wire, to the third wire portion 63*pc* of the first control wire 63A and bonds the wire to the third wire portion 63*pc*. This forms the first control lead connection member 94A connecting the first control lead 84A and the first control wire 63A.

The bonding device bonds a wire to the pad portion 86*p* of the first control power lead 86A. Then, the bonding device moves, while extending the wire, to the first control power wire 65A and bonds the wire to the first control power wire 65A. This forms the first control power connection member 96A connecting the first control power lead 86A and the first control power wire 65A.

The bonding device bonds a wire to the pad portion 85*p* of the first control lead 85A. Then, the bonding device moves, while extending the wire, to the second part 64*py* of the first control wire 64A and bonds the wire to the second part 64*py*. This forms the first control lead connection member 95A connecting the first control lead 85A and the first control wire 64A.

The bonding device bonds a wire to the pad portion 86*p* of the first control power lead 86B. Then, the bonding device moves, while extending the wire, to the first wire portion 66*pa* of the first control power wire 66A and bonds the wire to the first wire portion 66*pa*. This forms the first control power connection member 96B connecting the first control power lead 86B and the first control power wire 66A.

The bonding device bonds a wire to the pad portion 87*p* of the second short-circuiting detection lead 87B. Then, the bonding device moves, while extending the wire, to the first end 62*qx* of the first wire portion 62*qa* in the second drive wire 62B and bonds the wire to the first end 62*qx*. This forms the second short-circuiting detection connection member 97B connecting the second short-circuiting detection lead 87B and the second drive wire 62B.

The bonding device bonds a wire to the pad portion 84*p* of the second control lead 84B. Then, the bonding device moves, while extending the wire, to the second part 63*qy* of the third wire portion 63*qc* in the second control wire 63B and bonds the wire to the second part 63*qy*. This forms the second control lead connection member 94B connecting the second control lead 84B and the second control wire 63B.

The bonding device bonds a wire to the pad portion 86*p* of the second control power lead 86C. Then, the bonding device moves, while extending the wire, to the second control power wire 65B and bonds the wire to the second control power wire 65B. This forms the second control power connection member 96C connecting the second control power lead 86C and the second control power wire 65B.

The bonding device bonds a wire to the pad portion 85*p* of the second control lead 85B. Then, the bonding device moves, while extending the wire, to the third wire portion 64*qc* of the second control wire 64B and bonds the wire to the third wire portion 64*qc*. This forms the second control lead connection member 95B connecting the second control lead 85B and the second control wire 64B.

Finally, the bonding device bonds a wire to the pad portion 86*p* of the second control power lead 86D. Then, the bonding device moves, while extending the wire, to the first wire portion 66*qa* of the second control power wire 66B and bonds the wire to the first wire portion 66*qa*. This forms the second control power connection member 96D connecting the second control power lead 86D and the second control power wire 66B.

In the encapsulating step, the resin member 50 is formed. More specifically, transfer molding is performed to form the resin member 50 using, for example, black epoxy resin. In this case, the mold used during transfer molding integrally forms the first control side opening 58A, the second control side opening 58B, the first drive side opening 59A, and the second drive side opening 59B. Further, the mold integrally forms the grooves 57A and 57B. Then, the first drive side opening 59A is filled with the insulative material 71, and the second drive side opening 59B is filled with the insulative material 72. Silicone resin is used as the insulative materials 71 and 72.

Afterwards, a lead frame cutting step and a terminal forming step are performed. This produces the semiconductor device 1A. In the lead frame cutting step, the control leads 84A, 84B, 85A, and 85B, the control power leads 86A to 86D, and the short-circuiting detection leads 87A and 87B are cut out from the lead frame. In the terminal forming step, the control leads 84A, 84B, 85A, and 85B, the control power leads 86A to 86D, and the short-circuiting detection leads 87A and 87B are bent to form the terminal portions 84*t*, 85*t*, 86*t*, and 87*t*.

The semiconductor element mounting step may be performed after the support substrate preparing step and before the conductive substrate preparing step. Further, the semiconductor element mounting step may be performed after the substrate bonding step and before the wire forming step. The conductive substrate preparing step may be performed before the support substrate preparing step.

In the wire forming step, the drive connection members 91A and 91B, the control connection members 92A, 92B, 93A, and 93B, the control lead connection members 94A, 94B, 95A, and 95B, the control power connection members 96A to 96D, and the short-circuiting detection connection members 97A and 97B may be formed in any order.

In the present embodiment, the high-voltage diodes 30A, 30B, 31A, and 31B of the short-circuiting detection circuits 3A and 3B do not have to be mounted on the conductive substrate 60 in the conductive substrate preparing step. For example, the high-voltage diodes 30A, 30B, 31A, and 31B do not have to be mounted on the conductive substrate 60 in the conductive substrate preparing step. The high-voltage diodes 30A, 30B, 31A, and 31B may be mounted in the first drive side opening 59A and the second drive side opening 59B after the encapsulating step. In this case, the first drive side opening 59A is filled with the insulative material 71 after mounting the high-voltage diodes 30A and 30B on the conductive substrate 60. Further, the second drive side opening 59B is filled with the insulative material 72 after mounting the high-voltage diodes 31A and 31B on the conductive substrate 60. The semiconductor device 1A may be shipped out of a factory without the high-voltage diodes 30A, 30B, 31A, and 31B. In this case, the user of the semiconductor device 1A mounts the high-voltage diodes 30A, 30B, 31A, and 31B on the conductive substrate 60 through the first drive side opening 59A and the second drive side opening 59B.

In the present embodiment, the low-voltage diodes 32A, 32B, 34A, and 34B and the capacitors 33A, 33B, 35A, and 35B of the surge reduction circuits 4A and 4B do not have to be mounted on the conductive substrate 60 in the conductive substrate preparing step. For example, the low-voltage diodes 32A, 32B, 34A, and 34B and the capacitors 33A, 33B, 35A, and 35B do not have to be mounted on the conductive substrate 60 in the conductive substrate preparing step. The low-voltage diodes 32A, 32B, 34A, and 34B and the capacitors 33A, 33B, 35A, and 35B may be mounted on the conductive substrate 60 through the first control side opening 58A and the second control side opening 58B after the encapsulating step. The semiconductor device 1A may be shipped out of a factory without the low-voltage diodes 32A, 32B, 34A, and 34B and the capacitors 33A, 33B, 35A, and 35B mounted on the conductive substrate 60. In this case, the user of the semiconductor device 1A mounts the low-voltage diodes 32A, 32B, 34A, and 34B and the capacitors 33A, 33B, 35A, and 35B on the conductive substrate 60 through the first control side opening 58A and the second control side opening 58B.

Operation

The operation of the semiconductor device 1A in accordance with the present embodiment will now be described.

If the semiconductor device 1A were not to include the short-circuiting detection circuits 3A and 3B, the drain electrode 11 of each of the semiconductor elements 10A and 10B would have to be extended out of the semiconductor device and the drain electrode 11 would have to be directly connected to, for example, the short-circuiting detection leads 87A and 87B. In this case, to obtain distance for insulation of the short-circuiting detection leads 87A and 87B, which are high-voltage terminals, from the control leads 84A, 84B, 85A, and 85B and the control power leads 86A to 86D, which are low-voltage terminals, the short-circuiting detection leads 87A and 87B will have to be spaced apart by a greater distance from the control leads 84A, 84B, 85A, and 85B and the control power leads 86A to 86D. In a case where a short-circuiting protection circuit is formed outside the semiconductor device 1A, that is, in a case where a short-circuiting protection circuit is arranged on a control board on which the semiconductor device 1A is mounted, distance for insulation on the control board will need to be provided between the wire electrically connected to the short-circuiting detection leads 87A and 87B and the wire electrically connected to the control leads 84A, 84B, 85A, and 85B and the control power leads 86A to 86D.

In this respect, in the present embodiment, the semiconductor device 1A incorporates the high-voltage diodes 30A, 30B, 31A, and 31B that lower the voltage at the high-voltage terminals in the short-circuiting detection circuit to the voltage at the low-voltage terminals. Consequently, the voltage at the drain electrode 11 of each first semiconductor element 10A is lowered by the high-voltage diodes 30A and 30B and then sent from the first short-circuiting detection lead 87A to the outside of the semiconductor device 1A, and the voltage at the drain electrode 11 of each second semiconductor element 10B is lowered by the high-voltage diodes 31A and 31B and then sent from the second short-circuiting detection lead 87B to the outside of the semiconductor device 1A. Thus, there is no need to provide distance in the semiconductor device 1A for insulation of the short-circuiting detection leads 87A and 87B from the control leads 84A, 84B, 85A, and 85B and the control power leads 86A to 86D. That is, the short-circuiting detection leads 87A and 87B may be arranged in the same terminal intervals as the control leads 84A, 84B, 85A, and 85B and the control power leads 86A to 86D. Low-voltage wires are electrically connected to the short-circuiting detection leads 87A and 87B on the control board. Thus, there is no need to provide distance for insulation of the wires electrically connected to the short-circuiting detection leads 87A and 87B from the wires electrically connected to the control leads 84A, 84B, 85A, and 85B and the control power leads 86A to 86D. This increases the degree of design freedom for the control board.

Generally, it is preferred that the first surge reduction circuit 4A be located proximate to the gate electrode 13 of each first semiconductor element 10A and that the second surge reduction circuit 4B be located proximate to the gate electrode 13 of each second semiconductor element 10B. If the surge reduction circuits 4A and 4B were to be located outside the semiconductor device 1A, this would lower the effect of the first surge reduction circuit 4A for reducing the surge applied to the gate electrode 13 of each first semiconductor element 10A and lower the effect of the second surge reduction circuit 4B for reducing the surge applied to the gate electrode 13 of each second semiconductor element 10B. To avoid decreases in the surge reduction effect, the surge reduction circuits 4A and 4B may be arranged outside the semiconductor device 1A near the terminal portions 84t, 85t, and 86t of the leads 84A, 84B, 85A, 85B, and 86A to 86D. However, this will lead to various design limitations and cause difficulties in circuit design.

In this respect, in the present embodiment, the surge reduction circuits 4A and 4B are incorporated in the semiconductor device 1A. Thus, the first surge reduction circuit 4A is located proximate to the gate electrode 13 of each first semiconductor element 10A, and the second surge reduction circuit 4B is located proximate to the gate electrode 13 of each second semiconductor element 10B. This minimizes decreases in the effect of the first surge reduction circuit 4A that reduces surge applied to the gate electrode 13 of each first semiconductor element 10A and the effect of the second surge reduction circuit 4B that reduces surge applied to the gate electrode 13 of each second semiconductor element 10B. In addition, there is no need to form the surge reduction circuits 4A and 4B outside the semiconductor device 1A near the terminal portions 84*t*, 85*t*, and 86*t* of the leads 84A, 84B, 85A, 85B, and 86A to 86D. This facilitates circuit designing on the control board.

Various types of circuits use the semiconductor device 1A. Each type of circuit requires different electrical characteristics for the short-circuiting detection circuits 3A and 3B and the surge reduction circuits 4A and 4B. Accordingly, it is preferred that the electrical characteristics of the short-circuiting detection circuits 3A and 3B and the electrical characteristics of the surge reduction circuits 4A and 4B be adjustable. However, if the short-circuiting detection circuits 3A and 3B and the surge reduction circuits 4A and 4B are simply incorporated in the semiconductor device, the electronic components of the short-circuiting detection circuits 3A and 3B and the surge reduction circuits 4A and 4B cannot be changed because of the resin member. Thus, the electrical characteristics cannot be adjusted.

In this respect, in the present embodiment, the resin member 50 includes the first control side opening 58A that exposes part of the first wiring region 70A and the second control side opening 58B that exposes part of the second wiring region 70B. The first low-voltage diodes 32A and 32B and the first capacitors 33A and 33B are exposed from the first control side opening 58A. The second low-voltage diodes 34A and 34B and the second capacitors 35A and 35B are exposed from the second control side opening 58B. In this manner, electronic components are exposed from the first control side opening 58A and the second control side opening 58B. This allows the electronic components to be changed. Thus, the electrical characteristics of electrical circuits including electronic components can be adjusted so that the electrical characteristics of the semiconductor device 1A become suitable for the electrical circuit to which the semiconductor device 1A is applied.

Further, the control side openings 58A and 58B and the drive side openings 59A and 59B allow the semiconductor device 1A to be shipped out of a factory in accordance with the needs of a user. More specifically, the semiconductor device 1A may be shipped out of a factory in a state the high-voltage diodes 30A, 30B, 31A, and 31B, the low-voltage diodes 32A, 32B, 34A, and 34B, and the capacitors 33A, 33B, 35A, and 35B are mounted in advance on the conductive substrate 60. Alternatively, the semiconductor device 1A may be shipped out of a factory in a state in which the high-voltage diodes 30A, 30B, 31A, and 31B, the low-voltage diodes 32A, 32B, 34A, and 34B, and the capacitors 33A, 33B, 35A, and 35B are not mounted on the conductive substrate 60.

Advantages

The semiconductor device 1A of the present embodiment has the advantages described below.

(1-1) The semiconductor device 1A includes the first wiring region 70A, the second wiring region 70B, and the third wiring region 70C. The first wiring region 70A includes the first drive wire 62A and the first high-voltage diodes 30A and 30B that form the first short-circuiting detection circuit 3A. Further, the first wiring region 70A includes the first drive wire 62A, the first control wires 63A and 64A, the first control power wires 65A and 66A, the first low-voltage diodes 32A and 32B, and the first capacitors 33A and 33B that form the first surge reduction circuit 4A. The second wiring region 70B includes the second drive wire 62B, the second control wires 63B and 64B, the second control power wires 65B and 66B, the second low-voltage diodes 34A and 34B, and the second capacitors 35A and 35B that form the second surge reduction circuit 4B. The third wiring region 70C includes the second drive wire 62B and the second high-voltage diodes 31A and 31B that form the second short-circuiting detection circuit 3B. In this manner, the short-circuiting detection circuits 3A and 3B and the surge reduction circuits 4A and 4B are incorporated in the semiconductor device 1A. Thus, in comparison with when the short-circuiting detection circuits 3A and 3B and the surge reduction circuits 4A and 4B are arranged outside the semiconductor device 1A, the wires extending from the short-circuiting detection circuits 3A and 3B and the surge reduction circuits 4A and 4B to the semiconductor elements 10A and 10B can be shortened in length. This reduces the inductance of the semiconductor device 1A.

(1-2) The high-voltage diodes 30A, 30B, 31A, and 31B that lower the voltage at the high-voltage terminals in the short-circuit detection circuits to the voltage at the low-voltage terminals are incorporated in the semiconductor device 1A. Consequently, the voltage at the drain electrode 11 of each first semiconductor element 10A is lowered by the high-voltage diodes 30A and 30B and then sent from the first short-circuiting detection lead 87A to outside of the semiconductor device 1A, and the voltage at the drain electrode 11 of each second semiconductor element 10B is lowered by the high-voltage diodes 31A and 31B and then sent from the second short-circuiting detection lead 87B to outside of the semiconductor device 1A. Thus, there is no need to provide distance in the semiconductor device 1A for insulation of the short-circuiting detection leads 87A and 87B from the control leads 84A, 84B, 85A, and 85B and the control power leads 86A to 86D. Accordingly, the short-circuiting detection leads 87A and 87B may be arranged in the same terminal intervals as the control leads 84A, 84B, 85A, and 85B and the control power leads 86A to 86D. Low-voltage wires are electrically connected to the short-circuiting detection leads 87A and 87B on the control board. Thus, there is no need to provide distance for insulation of the wires electrically connected to the short-circuiting detection leads 87A and 87B from the wires electrically connected to the control leads 84A, 84B, 85A, and 85B and the control power leads 86A to 86D. This increases the degree of design freedom for the control board. Thus, the semiconductor device 1A is versatile.

(1-3) The resin member 50 includes the first drive side opening 59A, the second drive side opening 59B, the first control side opening 58A, and the second control side opening 58B. The first drive side opening 59A exposes the first high-voltage diodes 30A and 30B and the portions of the first drive wire 62A on which the first high-voltage diodes 30A and 30B are mounted. The second drive side opening 59B exposes the second high-voltage diodes 31A and 31B and the portions of the second drive wire 62B on which the second high-voltage diodes 31A and 31B are mounted. The first control side opening 58A exposes the first low-voltage diodes 32A and 32B, the first capacitors 33A and 33B, and the portions of the first drive wire 62A, the first control wire 63A, the first control wire 64A, the first control power wires 65A and 66A on which the first low-voltage diodes 32A and 32B and the first capacitors 33A and 33B are mounted. The second control side opening 58B exposes the second low-voltage diodes 34A and 34B, the second capacitors 35A and 35B, and the portions of the second drive wire 62B, the second control wires 63B and 64B, and the second control power wires 65B and 66B on which the second low-voltage diodes 34A and 34B and the second capacitors 35A and 35B are mounted. In this manner, after the resin member 50 is formed, the first high-voltage diodes 30A and 30B can be changed through the first drive side opening 59A. Thus, the electrical characteristics of the first short-circuiting detection circuit 3A can be changed after the resin member 50 is formed. After the resin member 50 is formed, the second high-voltage diodes 31A and 31B can be changed through the second drive side opening 59B. Thus, the electrical characteristics of the second short-circuiting detection circuit 3B can be adjusted after the resin member 50 is formed. After the resin member 50 is formed, the first low-voltage diodes 32A and 32B and the first capacitors 33A and 33B can be changed through the first control side opening 58A. Thus, the electrical characteristics of the first surge reduction circuit 4A can be adjusted after the resin member 50 is formed. After the resin member 50 is formed, the second low-voltage diodes 34A and 34B and the second capacitors 35A and 35B can be changed through the second control side opening 58B. Thus, after the resin member 50 is formed, the electrical characteristics of the second surge reduction circuit 4B can be changed.

(1-4) The conductive substrate 60 includes the first wiring region 70A, the second wiring region 70B, and the third wiring region 70. With this configuration, the wiring on the conductive substrate 60 forms the wires of the short-circuiting detection circuits 3A and 3B and the surge reduction circuits 4A and 4B. This facilitates wiring of the short-circuiting detection circuits 3A and 3B and the surge reduction circuits 4A and 4B compared with when, for example, using metal plate leads to form the wires of the short-circuiting detection circuits 3A and 3B and the surge reduction circuits 4A and 4B.

(1-5) The first drive side opening 59A is filled with the insulative material 71, and the second drive side opening 59B is filled with the insulative material 72. This avoids short-circuiting of the short-circuiting detection circuits 3A and 3B.

(1-6) The first drive side opening 59A is separate from the first control side opening 58A, and the second drive side opening 59B is separate from the second control side opening 58B. This allows only the drive side openings 59A and 59B to be filled with the insulative materials 71 and 72.

(1-7) The first semiconductor elements 10A are mounted on the first conductive member 42A, and the second semiconductor elements 10B are mounted on the second conductive member 42B. Thus, the first semiconductor elements 10A can efficiently dissipate heat through the first conductive member 42A, and the second semiconductor elements 10B can efficiently dissipate heat through the second conductive member 42B.

(1-8) The first semiconductor elements 10A are accommodated in the first substrate openings 61A of the conductive substrate 60, and the second semiconductor elements 10B are accommodated in the second substrate openings 61B of the conductive substrate 60. With this configuration, the semiconductor elements 10A and 10B and the conductive substrate 60 can be overlapped in the width direction X and the length direction Y. This allows the semiconductor device 1A to be reduced in size in the width direction X and the length direction Y.

(1-9) The first wiring region 70A extends on the conductive substrate 60 from the first semiconductor elements 10A to the first control leads 84A and 85A, the first control power leads 86A and 86B, and the first short-circuiting detection lead 87A. This shortens the wire length of the first surge reduction circuit 4A, which is arranged in the first wiring region 70A, and decreases the inductance of the first surge reduction circuit 4A. Further, the wire length of the first short-circuiting detection circuit 3A, which is arranged in the first wiring region 70A, is shortened. This decreases the inductance of the first short-circuiting detection circuit 3A.

The second wiring region 70B extends on the conductive substrate 60 from the second semiconductor elements 10B to the second control leads 84B and 85B, the second control power leads 86C and 86D, and the second short-circuiting detection lead 87B. This shortens the wire length of the second surge reduction circuit 4B, which is arranged in the second wiring region 70B, and decreases the inductance of the second surge reduction circuit 4B.

(1-10) The first control side opening 58A and the second control side opening 58B are arranged in the width direction X in a state spaced apart from each other. With this configuration, the first control side opening 58A exposes the first low-voltage diodes 32A and 32B and the first capacitors 33A and 33B of the first surge reduction circuit 4A, and the second control side opening 58B exposes the second low-voltage diodes 34A and 34B and the second capacitors 35A and 35B of the second surge reduction circuit 4B. The portion of the semiconductor device 1A between the first surge reduction circuit 4A and the second surge reduction circuit 4B in the width direction X is not exposed. Thus, the first control side opening 58A exposes only the portion of the first surge reduction circuit 4A required to adjust the electrical characteristics, and the second control side opening 58B exposes only the portion of the second surge reduction circuit 4B required to adjust the electrical characteristics. This impedes the entry of foreign matter into the semiconductor device 1A.

(1-11) The conductive substrate 60 is a multilayer conductive substrate. With this configuration, wires for connecting the semiconductor elements 10A and 10B to the leads 80 can be formed over multiple layers. Thus, in comparison with a conductive substrate including only one layer, the conductive substrate 60 can be reduced in size in the width direction X and the length direction Y. This allows the semiconductor device 1A to be reduced in size in the width direction X and the length direction Y.

(1-12) The first drive wire 62A of the first short-circuiting detection circuit 3A is formed in the fifth substrate layer 60F, which is the outermost layer of the conductive substrate 60, and the second drive wire 62B of the second short-circuiting detection circuit 3B is formed in the fifth substrate layer 60G, which is the outermost layer of the conductive substrate 60. With this configuration, the first high-voltage diodes 30A and 30B are mounted on the fifth substrate layer 60F, and the second high-voltage diodes 31A and 31B are mounted on the fifth substrate layer 60G. Thus, the first high-voltage diodes 30A and 30B and the second high-voltage diodes 31A and 31B can each be readily changed. This facilitates adjustment of the electrical characteristics of the first short-circuiting detection circuit 3A and the second short-circuiting detection circuit 3B.

The first control wires 63A and 64A and the first control power wires 65A and 66A of the first surge reduction circuit 4A are each formed in the fifth substrate layer 60F, and the second control wires 63B and 64B and the second control power wires 65B and 66B of the second surge reduction circuit 4B are each formed in the fifth substrate layer 60G. With this configuration, the first low-voltage diodes 32A and 32B and the first capacitors 33A and 33B are mounted on the fifth substrate layer 60F, and the second low-voltage diodes 34A and 34B and the second capacitors 35A and 35B are mounted on the fifth substrate layer 60G. Thus, the low-voltage diodes 32A, 32B, 34A, and 34B and the capacitors 33A, 33B, 35A, and 35B can each be readily changed. This facilitates adjustment of the electrical characteristics of the first surge reduction circuit 4A and the second surge reduction circuit 4B.

- (1-13) The first high-voltage diodes 30A and 30B are mounted on the conductive substrate 60 so that the anode electrodes and cathode electrodes of the first high-voltage diodes 30A and 30B are arranged in the width direction X. This allows the conductive substrate 60 to be reduced in size in the length direction Y, which, in turn, allows the semiconductor device 1A to be reduced in size in the length direction Y.

Further, the second high-voltage diodes 31A and 31B are mounted on the conductive substrate 60 so that the anode electrodes and the cathode electrodes of the second high-voltage diodes 31A and 31B are arranged in the width direction X. This allows the conductive substrate 60 to be reduced in size in the length direction Y, which, in turn, allows the semiconductor device 1A to be reduced in size in the length direction Y.

- (1-14) The first low-voltage diodes 32A and 32B are mounted on the conductive substrate 60 so that the anode electrodes and cathode electrodes of the first low-voltage diodes 32A and 32B are arranged in the width direction X. This allows the conductive substrate 60 to be reduced in size in the length direction Y, which, in turn, allows the semiconductor device 1A to be reduced in size in the length direction Y.

Further, the second low-voltage diodes 34A and 34B are mounted on the conductive substrate 60 so that the anode electrodes and the cathode electrodes of the second low-voltage diodes 34A and 34B are arranged in the width direction X. This allows the conductive substrate 60 to be reduced in size in the length direction Y, which, in turn, allows the semiconductor device 1A to be reduced in size in the length direction Y.

- (1-15) The first capacitors 33A and 33B are mounted on the conductive substrate 60 so that the first ends and the second ends of the first capacitors 33A and 33B are arranged in the width direction X. This allows the conductive substrate 60 to be reduced in size in the length direction Y, which, in turn, allows the semiconductor device 1A to be reduced in size in the length direction Y.

Further, the second capacitors 35A and 35A are mounted on the conductive substrate 60 so that their first ends and second ends are arranged in the width direction X. This allows the conductive substrate 60 to be reduced in size in the length direction Y, which, in turn, allows the semiconductor device 1A to be reduced in size in the length direction Y.

- (1-16) The pad portion 84$p$ of the first control lead 84A, the pad portion 85$p$ of the first control lead 85A, the pad portion 86$p$ of the first control power lead 86A, the pad portion 86$p$ of the first control power lead 86B, and the pad portion 87$p$ of the first short-circuiting detection lead 87A are each arranged adjacent to the fifth substrate layer 60F in the length direction Y. Further, the first drive wire 62A, the first control wires 63A and 64A, and the first control power wires 65A and 66A each extend to the end of the fifth substrate layer 60F that is located toward the third resin side surface 53 of the resin member 50. Thus, the first short-circuiting detection connection member 97A, which connects the first drive wire 62A and the pad portion 87$p$ of the first short-circuiting detection lead 87A, can be shortened in length. The first control lead connection member 94A, which connects the first control wire 63A and the pad portion 84$p$ of the first control lead 84A, can be shortened in length. The first control lead connection member 95A, which connects the first control wire 64A and the pad portion 85$p$ of the first control lead 85A, can be shortened in length. The first control power connection member 96A, which connects the first control power wire 65A and the pad portion 86$p$ of the first control power lead 86A, can be shortened in length. The first control power connection member 96B, which connects the first control power wire 66A and the pad portion 86$p$ of the first control power lead 86B, can be shortened in length. Accordingly, inductance caused by each of the connection members 94A, 95A, 96A, 96B, and 97A can be reduced.

Further, the pad portion 84$p$ of the second control lead 84B, the pad portion 85$p$ of the second control lead 85B, the pad portion 86$p$ of the second control power lead 86C, the pad portion 86$p$ of the second control power lead 86D, and the pad portion 87$p$ of the second short-circuiting detection lead 87B are each arranged adjacent to the fifth substrate layer 60G in the length direction Y. Further, the second drive wire 62B, the second control wires 63B and 64B, and the second control power wires 65B and 66B each extend to the end of the fifth substrate layer 60G that is located toward the third resin side surface 53 of the resin member 50. Thus, the second short-circuiting detection connection member 97B, which connects the second drive wire 62B and the pad portion 87$p$ of the second short-circuiting detection lead 87B, can be shortened in length. The second control lead connection member 94B, which connects the second control wire 63B and the pad portion 84$p$ of the second control lead 84B, can be shortened in length. The second control lead connection member 95B, which connects the second control wire 64B and the pad portion 85$p$ of the second control lead 85B, can be shortened in length. The second control power connection member 96C, which connects the second control power wire 65B and the pad portion 86$p$ of the second control power lead 86C, can be shortened in length. The second control power connection member 96D, which connects the second control power wire 66B and the pad portion 86$p$ of the second control power lead 86D, can be shortened in length. Accordingly, inductance caused by each of the connection members 94B, 95B, 96C, 96D, and 97B can be reduced.

Second Embodiment

With reference to FIGS. 15 to 19, a semiconductor device 1B in accordance with a second embodiment will now be described. The semiconductor device 1B of the present embodiment differs from the semiconductor device 1A of the first embodiment in the configuration of the conductive substrate 60 and the configuration of some of the leads 80. In the description hereafter, same reference numerals are given to those components that are the same as the corresponding components of the semiconductor device 1A in the first embodiment. Such components will not be described in detail.

Configuration of Semiconductor Device

Figure 16:
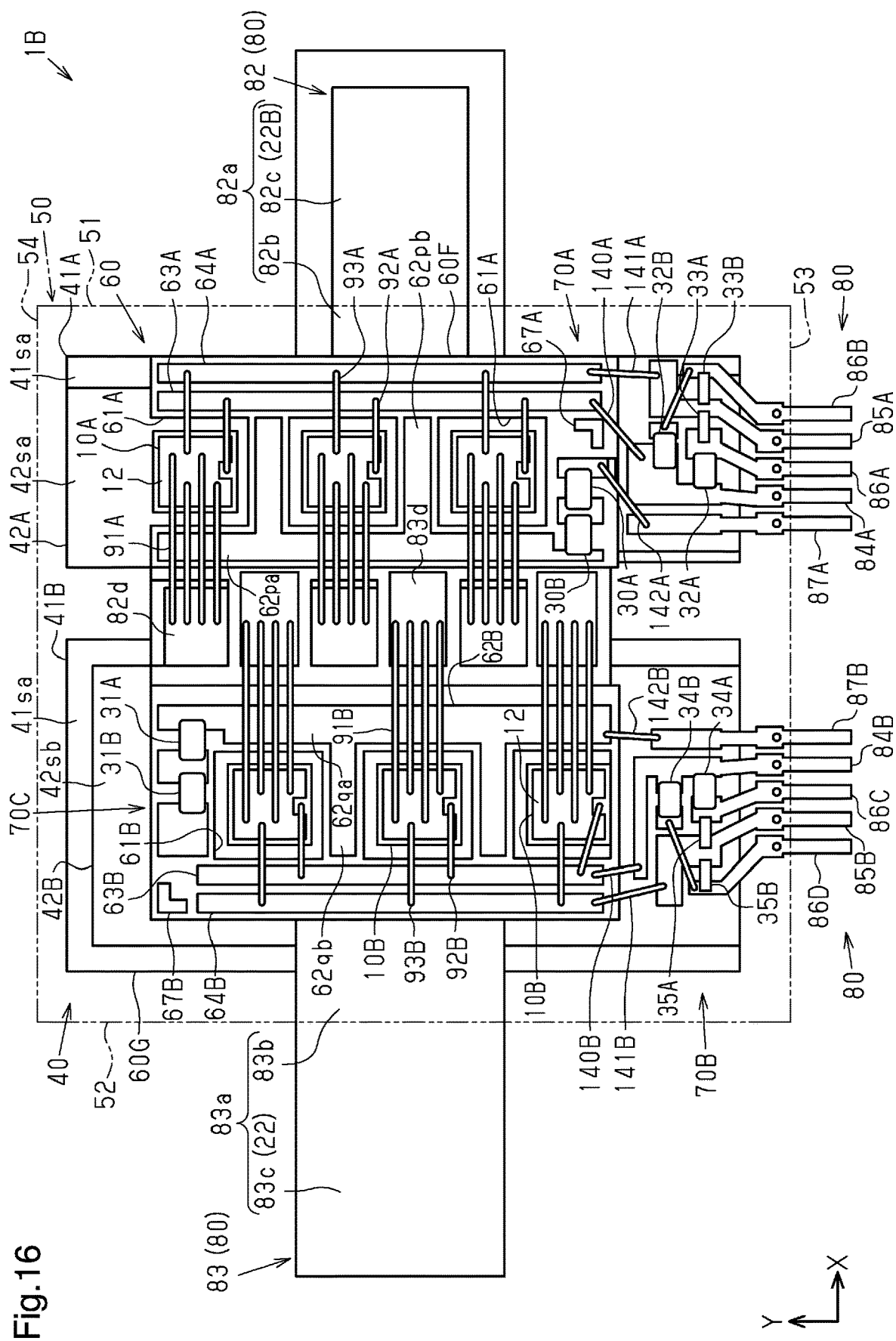
FIG. 16 is a plan view showing the semiconductor device in accordance with the second embodiment in a state in which a resin member is removed from the semiconductor device.

With reference to FIG. 16, the conductive substrate 60 of the present embodiment is shorter in length in the length direction Y than the conductive substrate 60 of the first embodiment. More specifically, in the conductive substrate 60 of the present embodiment, the second wiring region 70B and part of the first wiring region 70A is omitted from the conductive substrate 60 of the first embodiment. In the present embodiment, the part of the first wiring region 70A omitted from the conductive substrate 60 is the region in which the first surge reduction circuit 4A is formed. In other words, the region in which the first surge reduction circuit 4A is formed, or the part of the first wiring region 70A, is located outside the conductive substrate 60. The part of the first wiring region 70A in which the first short-circuiting detection circuit 3A is formed is located on the conductive substrate 60. The second wiring region 70B is located outside the conductive substrate 60. With such a configuration of the conductive substrate 60, the first conductive member 42A projects from the conductive substrate 60 toward the third resin side surface 53 of the resin member 50. The first surge reduction circuit 4A is formed in the projecting portion that is part of the first wiring region 70A. Further, the second conductive member 42B projects from the conductive substrate 60 toward the third resin side surface 53. The second wiring region 70B is formed in the projecting portion.

Figure 17:
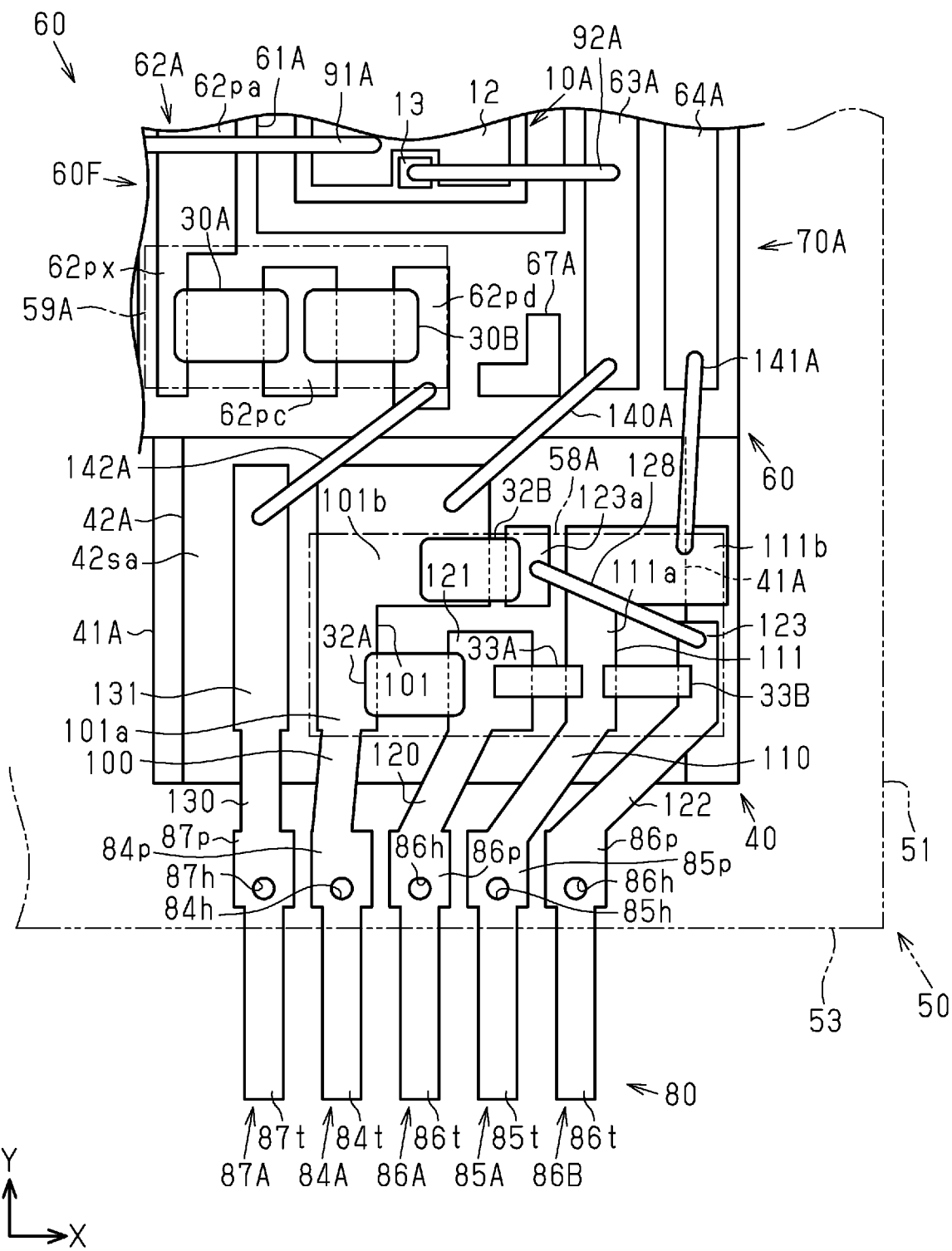
FIG. 17 is an enlarged view of a first wiring region in the semiconductor device shown in FIG. 16.

As shown in FIG. 17, the first drive wire 62A, which is formed in the fifth substrate layer 60F of the conductive substrate 60, differs from the first drive wire 62A of the first embodiment in the shape of the fourth wire portion 62*pd*. More specifically, the fourth wire portion 62*pd* of the present embodiment does not include the second part 62*pz* of the fourth wire portion 62*pd* of the first embodiment. The fourth wire portion 62*pd* of the present embodiment extends in the length direction Y. The length of the fourth wire portion 62*pd* in the length direction Y is greater than the length of the third wire portion 62*pc* in the length direction Y. As described above, the first surge reduction circuit 4A is arranged outside the conductive substrate 60. Thus, the low-voltage diodes 32A, 32B, 34A, and 34B and the capacitors 33A, 33B, 35A, and 35B are not mounted on the conductive substrate 60. That is, the low-voltage diodes 32A, 32B, 34A, and 34B and the capacitors 33A, 33B, 35A, and 35B are located outside the conductive substrate 60.

The first control wires 63A and 64A, which are formed in the fifth substrate layer 60F, differ from the first control wires 63A and 64A of the first embodiment.

More specifically, as shown in FIGS. 16 and 17, the first control wire 63A of the present embodiment does not include the second wire portion 63*pb* and the third wire portion 63*pc* of the first control wire 63A. The first control wire 63A of the present embodiment is arranged next to the first semiconductor elements 10A and toward the first resin side surface 51 of the resin member 50 from the first semiconductor elements 10A in the width direction X. The first control wire 63A extends in the length direction Y. The first control wire 63A extends further toward the third resin side surface 53 of the resin member 50 from the one of the first semiconductor elements 10A that is the closest to the third resin side surface 53 in the length direction Y.

The first control wire 64A of the present embodiment does not include the second wire portion 64*pb* and the third wire portion 64*pc* of the first control wire 64A. The first control wire 64A of the present embodiment is arranged next to the first control wire 63A at the side of the first control wire 63A opposite to the first semiconductor elements 10A in the width direction X. The first control wire 64A extends in the length direction Y. The length of the first control wire 64A in the length direction Y is equal to the length of the first control wire 63A in the length direction Y. The width of the first control wire 64A in the width direction X is equal to the width of the first control wire 63A in the width direction X.

Figure 18:
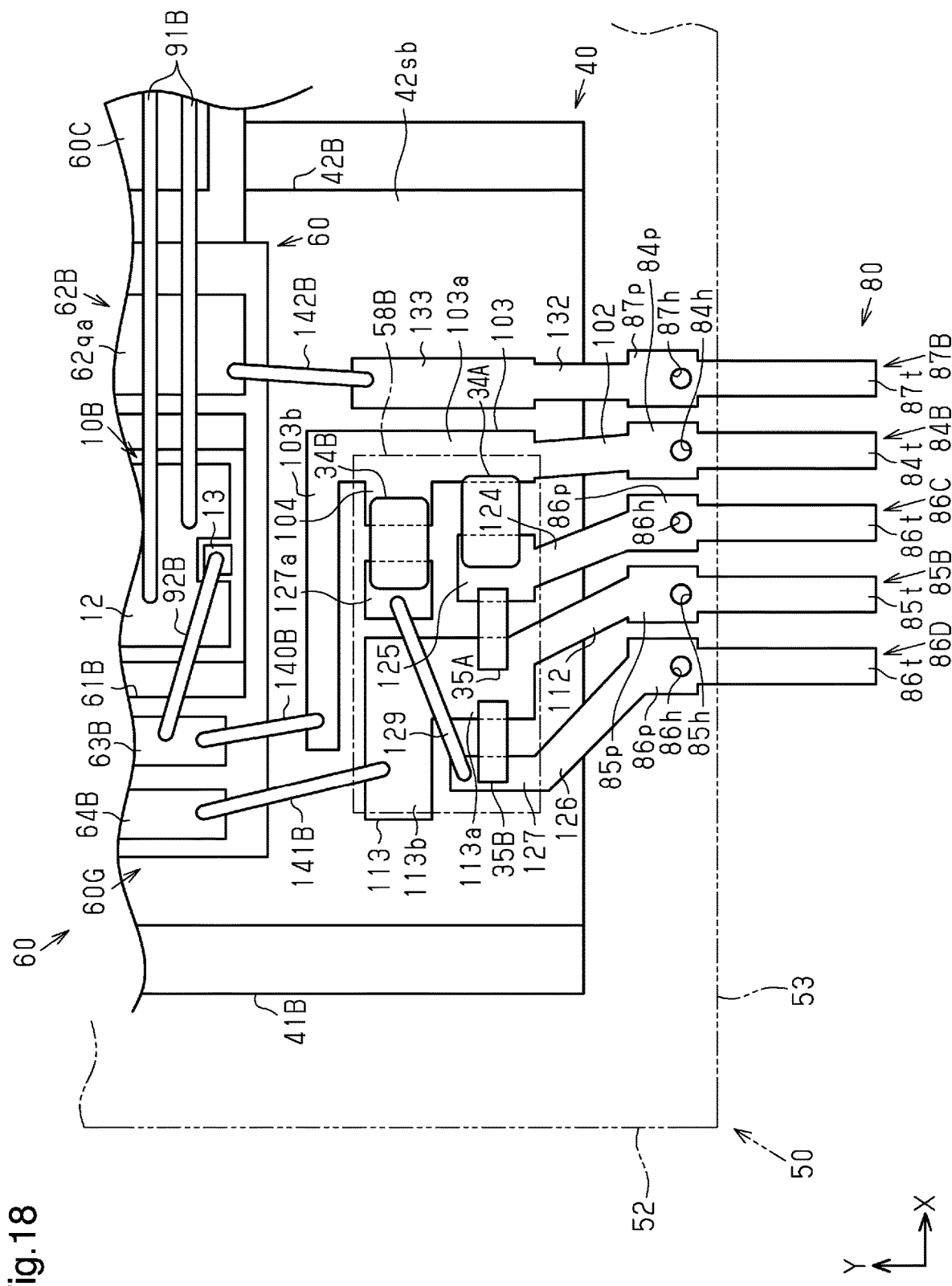
FIG. 18 is an enlarged view of a second wiring region in the semiconductor device shown in FIG. 16.

As shown in FIGS. 16 and 18, the second drive wire 62B, which is formed in the fifth substrate layer 60G of the conductive substrate 60, differs from the second drive wire 62B of the first embodiment in that the first wire portion 62*qa* is shortened in the length direction Y.

The second control wires 63B and 64B, which are formed in the fifth substrate layer 60G, differs from the second control wires 63B and 64B of the first embodiment.

More specifically, the second control wire 63B of the present embodiment does not include the second wire portion 63*qb* and the third wire portion 63*qc* of the second control wire 63B of the present embodiment. The second control wire 63B of the present embodiment is arranged next to the second semiconductor elements 10B and toward the second resin side surface 52 of the resin member 50 from the second semiconductor elements 10B in the width direction X. The second control wire 63B extends in the length direction Y. The second control wire 63B extends in the length direction Y further from a position corresponding to the one of the second semiconductor elements 10B that is the closest to the fourth resin side surface 54 to a position corresponding to the one of the second semiconductor elements 10B that is the closest to the third resin side surface 53.

The second control wire 64B of the present embodiment does not include the second wire portion 64*qb* and the third wire portion 64*qc* of the second control wire 64B of the present embodiment. The second control wire 64B of the present embodiment is arranged next to the second control wire 63B at the side of the second control wire 63B opposite to the second semiconductor elements 10B in the width direction X. The second control wire 64B extends in the length direction Y. The length of the second control wire 64B in the length direction Y is equal to the length of the second control wire 63B in the length direction Y. The width of the second control wire 64B in the width direction X is equal to the width of the second control wire 63B in the width direction X.

In this manner, the control wires 63A, 63B, 64A, and 64B are changed in shape to change the positional relationship of the control wires 63A, 63B, 64A, and 64B relative to the pad portions 84*p* and 85*p* of the control leads 84A, 84B, 85A, and 85B, the pad portions 86*p* of the control power leads 86A to 86D, and the pad portions 87*p* of the short-circuiting detection leads 87A and 87B. More specifically, as shown in FIG. 17, the pad portion 84*p* of the first control lead 84A, the pad portion 85*p* of the first control lead 85A, the pad portion 86*p* of the first control power lead 86A, the pad portion 86*p* of the first control power lead 86B, and the pad portion 87*p* of the first short-circuiting detection lead 87A are each located toward the second resin side surface 52 from the first control wires 63A and 64A in the width direction X. Further, as shown in FIG. 18, the pad portion 84*p* of the second control lead 84B, the pad portion 85p of the second control lead 85B, the pad portion 86p of the second control power lead 86C, the pad portion 86p of the second control power lead 86D, and the pad portion 87p of the second short-circuiting detection lead 87B are each located toward the first resin side surface 51 (refer to FIG. 16) from the second control wires 63B and 64B in the width direction X.

As shown in FIGS. 15 to 19, the control leads 84A, 84B, 85A, and 85B, the control power leads 86A to 86D, and the short-circuiting detection leads 87A and 87B of the present embodiment differ in configuration from the control leads 84A, 84B, 85A, and 85B, the control power leads 86A to 86D, and the short-circuiting detection leads 87A and 87B of the first embodiment. The control leads 84A, 84B, 85A, and 85B, the control power leads 86A to 86D, and the short-circuiting detection leads 87A and 87B of the present embodiment each include a wire section of a circuit formed in the first wiring region 70A and the second wiring region 70B. Thus, in the present embodiment, the control leads 84A, 84B, 85A, and 85B, the control power leads 86A to 86D, and the short-circuiting detection leads 87A and 87B each form a conductor. The portions of the first wiring region 70A and the second wiring region 70B where the control leads 84A, 84B, 85A, and 85B, the control power leads 86A to 86D, and the short-circuiting detection leads 87A and 87B are arranged serve as mounting regions on which electronic components are mounted. The circuit formed in the first wiring region 70A is the first surge reduction circuit 4A, and the circuit formed in the second wiring region 70B is the second surge reduction circuit 4B.

More specifically, as shown in FIG. 17, the first control lead 84A includes a first wire section 100 extending in the length direction Y from the pad portion 84p of the first control lead 84A toward the conductive substrate 60 and a second wire section 101 extending from the first wire section 100 toward the conductive substrate 60. In the present embodiment, the first control lead 84A is a single component in which the first wire section 100, the second wire section 101, the pad portion 84p, and the terminal portion 84t are formed integrally. The first wire section 100 extends from the pad portion 84p to the end of the main surface 42sa of the first conductive member 42A that is located toward the third resin side surface 53. The width of the first wire section 100 in the width direction X is less than the width of the pad portion 84p in the width direction X. The second wire section 101 is entirely arranged on the main surface 42sa of the first conductive member 42A. The second wire section 101 is L-shaped in a plan view. The second wire section 101 includes a first part 101a and a second part 101b. The first part 101a extends from the first wire section 100 in the length direction Y. The second part 101b extends from the first part 101a in the width direction X. The second part 101b extends in the width direction X toward the first resin side surface 51. The width of the second part 101b in the length direction Y is greater than the width of the first part 101a in the width direction X. The second part 101b is arranged overlapping the first semiconductor elements 10A as viewed in the length direction Y. The second part 101b is arranged overlapping the pad portion 86p of the first control power lead 86A as viewed in the length direction Y. The first control lead 84A is located toward the second resin side surface 52 from the first control wire 63A in the width direction X.

The first control lead 84A and the first control wire 63A are connected by a first control connection member 140A. More specifically, the first control connection member 140A is connected to the end of the second part 101b of the first control lead 84A located toward the conductive substrate 60 in the length direction Y and the end of the first control wire 63A located toward the third resin side surface 53 in the length direction Y. The first control connection member 140A is, for example, a wire formed through wire bonding.

The first control lead 85A includes a first wire section 110 extending from the pad portion 85p of the first control lead 85A toward the conductive substrate 60 in the length direction Y and a second wire section 111 extending from the first wire section 110 toward the conductive substrate 60. In the present embodiment, the first control lead 85A is a single component in which the first wire section 110, the second wire section 111, the pad portion 85p, and the terminal portion 85t are formed integrally. The first wire section 110 extends from the pad portion 85p to the end of the main surface 42sa of the first conductive member 42A that is located toward the third resin side surface 53. The first wire section 110 extends diagonally so that the conductive substrate 60 becomes closer as the first resin side surface 51 becomes closer. The second wire section 111 is arranged on the main surface 42sa of the first conductive member 42A. The second wire section 111 is L-shaped in a plan view. The second wire section 111 includes a first part 111a and a second part 111b. The first part 111a extends from the first wire section 110 in the length direction Y. The second part 111b extends from the first part 111a in the width direction X. The distal end of the second part 111b projects outward from the first conductive member 42A in the width direction X. The second part 111b is aligned with the second part 101b of the second wire section 101 of the first control lead 84A in the length direction Y and spaced apart from the second part 101b in the width direction X. The second part 111b is arranged next to the second part 101b of the first control lead 84A in the width direction X. The second part 111b is overlapped with the first control wire 63A and the first control wire 64A as viewed in the length direction Y.

The first control lead 85A and the first control wire 64A are connected by a first control connection member 141A. More specifically, the first control connection member 141A is connected to the distal end of the second part 111b of the first control lead 85A and the end of the first control wire 64A that is located toward the third resin side surface 53 in the length direction Y. The first control connection member 141A is, for example, a wire formed through wire bonding.

The first control power lead 86A includes a first wire section 120 extending from the pad portion 86p of the first control power lead 86A toward the conductive substrate 60 in the length direction Y and a second wire section 121 extending from the first wire section 120 toward the conductive substrate 60. In the present embodiment, the first control power lead 86A is a single component in which the first wire section 120, the second wire section 121, the pad portion 86p, and the terminal portion 86t are formed integrally. The first wire section 120 extends from the pad portion 86p to the end of the main surface 42sa of the first conductive member 42A that is located toward the third resin side surface 53. The first wire section 120 extends diagonally so that the conductive substrate 60 becomes closer as the first resin side surface 51 becomes closer. The second wire section 121 is entirely arranged on the main surface 42sa of the first conductive member 42A. The shape of the second wire section 121 in a plan view, although not particularly limited, is square. The second wire section 121 is located between the first wire section 100 of the first control lead 84A and the first wire section 110 of the first control lead 85A in the width direction X. The second wire section 121 is located toward the pad portion 86p from the second wire section 101 of the first control lead 84A in the length direction Y. The width of the second wire section 121 in the width direction X is greater than the width of the first wire section 120 (plan view dimension in direction orthogonal to direction in which first wire section 120 extends).

The first control power lead 86B includes a first wire section 122 extending from the pad portion 86p of the first control power lead 86B toward the conductive substrate 60 in the length direction Y and a second wire section 123 extending from the first wire section 122 toward the conductive substrate 60. In the present embodiment, the first control power lead 86B is a single component in which the first wire section 122, the second wire section 123, the pad portion 86p, and the terminal portion 86t are formed integrally. The first wire section 122 extends from the pad portion 86p to the end of the main surface 42sa of the first conductive member 42A that is located toward the third resin side surface 53. The first wire section 122 extends diagonally so that the conductive substrate 60 becomes closer as the first resin side surface 51 becomes closer. Part of the end of the first wire section 122 that is located toward the second wire section 123 projects outward from the first conductive member 42A toward the first resin side surface 51. The second wire section 123 extends from the first wire section 122 in the length direction Y The second wire section 123 is located toward the pad portion 86p from the second part 111b of the second wire section 111 of the first control lead 85A in the length direction Y.

The first short-circuiting detection lead 87A includes a first wire section 130 extending from the pad portion 87p of the first short-circuiting detection lead 87A toward the conductive substrate 60 in the length direction Y and a second wire section 131 extending from the first wire section 130 toward the conductive substrate 60. In the present embodiment, the first short-circuiting detection lead 87A is a single component in which the first wire section 130, the second wire section 131, the pad portion 87p, and the terminal portion 87t are formed integrally. The first wire section 130 and the second wire section 131 both extend in the length direction Y. The first wire section 130 extends from the pad portion 87p to the end of the main surface 42sa of the first conductive member 42A that is located toward the third resin side surface 53. The second wire section 131 is entirely arranged on the main surface 42sa of the first conductive member 42A. The width of the second wire section 131 in the width direction X is greater than the width of the first wire section 130 in the width direction X. The second wire section 131 is located toward the second resin side surface 52 (refer to FIG. 16) from the fourth wire portion 62pd of the first drive wire 62A in the width direction X. In the present embodiment, the second wire section 131 is overlapped with the first wire portion 62pa and the third wire portion 62pc of the first drive wire 62A as viewed in the length direction Y.

The first short-circuiting detection lead 87A and the first drive wire 62A are connected by a first short-circuiting detection connection member 142A. More specifically, the first short-circuiting detection connection member 142A is connected to the end of the second wire section 131 of the first short-circuiting detection lead 87A located toward the conductive substrate 60 and the end of the fourth wire portion 62pd of the first drive wire 62A located toward the third resin side surface 53. The first short-circuiting detection connection member 142A is, for example, a wire formed through wire bonding. The first short-circuiting detection connection member 142A is connected to a portion of the fourth wire portion 62pd located toward the third resin side surface 53 from the first high-voltage diode 30B.

The first low-voltage diodes 32A and 32B and the first capacitors 33A and 33B of the first surge reduction circuit 4A are mounted on the first control leads 84A and 85A and the first control power leads 86A and 86B. Thus, in the present embodiment, the first control leads 84A and 85A and the first control power leads 86A and 86B define a conductive path (wire section) of the first surge reduction circuit 4A.

The first low-voltage diode 32A is mounted on the first control lead 84A and the first control lead 85A. More specifically, a first end of the first low-voltage diode 32A is connected to the second part 101b of the second wire section 101 of the first control lead 84A. A second end of the first low-voltage diode 32A is connected to the second wire section 121 of the first control power lead 86A.

The first control lead 84A and the first control power lead 86A are electrically connected by the first low-voltage diode 32B. More specifically, the first control power lead 86A includes a land 123a, on which the first low-voltage diode 32B is mounted, and a wire connection member 128, which connects the land 123a and the second wire section 123 of the first control power lead 86A. The land 123a is separate from the second wire section 123. The land 123a is spaced apart from the second wire section 123. In further detail, the land 123a is located toward the fourth resin side surface 54 (toward first semiconductor elements 10A) from the second wire section 123 in the length direction Y The land 123a is arranged to overlap the second part 101b of the second wire section 101 of the first control lead 84A and the second part 111b of the second wire section 111 of the first control lead 85A as viewed in the width direction X. The land 123a is located between the second part 101b of the second wire section 101 of the first control lead 84A and the second part 111b of the second wire section 111 of the first control lead 85A in the width direction X. In a plan view, the wire connection member 128 extends diagonally so that the first resin side surface 51 becomes closer as the third resin side surface 53 becomes closer. The wire connection member 128 extends over the second wire section 111 of the first control lead 85A. The anode electrode of the first low-voltage diode 32B is connected to the second part 101b of the second wire section 101 of the first control lead 84A. The cathode electrode of the first low-voltage diode 32B is connected to the land 123a. In this manner, the first low-voltage diodes 32A and 32B are connected in series between the first control power lead 86A and the first control power lead 86B via the first control lead 84A.

The first capacitor 33A is mounted on the first control power lead 86A and the first control lead 85A. More specifically, the first terminal of the first capacitor 33A is connected to the second wire section 121 of the first control power lead 86A. The second terminal of the first capacitor 33A is connected to the first part 111a of the second wire section 111 of the first control lead 85A.

The first capacitor 33B is mounted on the first control lead 85A and the first control power lead 86B. More specifically, the first terminal of the first capacitor 33B is connected to the first part 111a of the second wire section 111 of the first control lead 85A. The second terminal of the first capacitor 33B is connected to the second wire section 123 of the first control power lead 86B. In this manner, the first capacitors 33A and 33B are connected in series between the first control power lead 86A and the first control power lead 86B via the first control lead 85A.

As shown in FIG. 18, the second control lead 84B includes a first wire section 102 extending in the length direction Y from the pad portion 84p of the second control lead 84B toward the conductive substrate 60, a second wire section 103 extending from the first wire section 102 toward the conductive substrate 60, and a third wire section 104 extending from the second wire section 103 in the width direction X. In the present embodiment, the second control lead 84B is a single component in which the first wire section 102, the second wire section 103, the third wire section 104, the pad portion 84p, and the terminal portion 84t are formed integrally. The first wire section 102 extends from the pad portion 84p to the end of the main surface 42sb of the second conductive member 42B that is located toward the third resin side surface 53. The first wire section 102 extends diagonally so that the conductive substrate 60 becomes closer as the second resin side surface 52 of the resin member 50 becomes closer. The width of the first wire section 102 (plan view dimension in direction orthogonal to direction in which first wire section 102 extends) is less than the width of the pad portion 84p in the width direction X. The second wire section 103 is entirely arranged on the main surface 42sb of the second conductive member 42B. The second wire section 103 is L-shaped in a plan view. The second wire section 103 includes a first part 103a and a second part 103b. The first part 103a extends from the first wire section 102 in the length direction Y. The second part 103b extends from the end of the first part 103a that is located toward the conductive substrate 60 in the width direction X. The second part 103b extends in the width direction X toward the second resin side surface 52. The width of the first part 103a in the width direction X is greater than the width of the second part 103b in the length direction Y. The second part 103b is overlapped with the second control wire 63B as viewed in the length direction Y. The third wire section 104 is located toward the pad portion 84p (third resin side surface 53) from the second part 103b of the second wire section 103 in the length direction Y. The third wire section 104 extends from the first part 103a of the second wire section 103 toward the second resin side surface 52 in the width direction X. The third wire section 104 is spaced apart from the second part 103b in the length direction Y and arranged adjacent to the second part 103b.

The second control lead 84B and the second control wire 63B are connected by a second control connection member 140B. More specifically, the second control connection member 140B is connected to the end of the second part 103b of the second wire section 103 of the second control lead 84B located toward the second resin side surface 52 and the end of the second control wire 63B located toward the third resin side surface 53 in the length direction Y. The second control connection member 140B is, for example, a wire formed through wire bonding.

The second control lead 85B includes a first wire section 112 extending from the pad portion 85p of the second control lead 85B toward the conductive substrate 60 in the length direction Y and a second wire section 113 extending from the first wire section 112 toward the conductive substrate 60. In the present embodiment, the first wire section 112, the second wire section 113, the pad portion 85p, and the terminal portion 85t are formed integrally as a single component. The first wire section 112 extends from the pad portion 85p to the end of the main surface 42sb of the second conductive member 42B that is located toward the third resin side surface 53. The first wire section 112 extends diagonally so that the conductive substrate 60 becomes closer as the second resin side surface 52 becomes closer.

The second wire section 113 is entirely arranged on the main surface 42sb of the second conductive member 42B. The second wire section 113 is L-shaped in a plan view. The second wire section 113 includes a first part 113a and a second part 113b. The first part 113a extends from the first wire section 112 in the length direction Y. The second part 113b extends from the first part 113a toward the second resin side surface 52 in the width direction X. The second part 113b is aligned with the third wire section 104 of the second control lead 84B in the length direction Y and spaced apart from the third wire section 104 in the width direction X. The second part 113b is arranged next to the third wire section 104 of the second control lead 84B in the width direction X. The second part 113b is overlapped with the second control wire 63B and the second control wire 64B in the length direction Y.

The second control lead 85B and the second control wire 64B are connected by a second control connection member 141B. More specifically, the second control connection member 141B is connected to the second part 113b of the second control lead 85B and the end of the second control wire 64B that is located toward the third resin side surface 53 in the length direction Y. The second control connection member 141B is, for example, a wire formed through wire bonding.

The second control power lead 86C includes a first wire section 124 extending from the pad portion 86p of the second control power lead 86C toward the conductive substrate 60 in the length direction Y and a second wire section 125 extending from the first wire section 124 toward the conductive substrate 60. In the present embodiment, the second control power lead 86C is a single component in which the first wire section 124, the second wire section 125, the pad portion 86p, and the terminal portion 86t are formed integrally. The first wire section 124 extends from the pad portion 86p to the end of the main surface 42sb of the second conductive member 42B that is located toward the third resin side surface 53. The first wire section 124 extends diagonally so that the conductive substrate 60 becomes closer as the second resin side surface 52 becomes closer. The second wire section 125 is entirely arranged on the main surface 42sb of the second conductive member 42B. The shape of the second wire section 125 in a plan view, although not particularly limited, is square. The second wire section 125 is located between the first wire section 102 of the second control lead 84B and the first wire section 112 of the second control lead 85B in the width direction X. The second wire section 125 is located toward the pad portion 86p from the third wire section 104 of the second control lead 84B in the length direction Y. The width of the second wire section 125 in the width direction X is greater than the width of the first wire section 124 (plan view dimension in direction orthogonal to direction in which first wire section 124 extends).

The second control power lead 86D includes a first wire section 126 extending from the pad portion 86p of the second control power lead 86D toward the conductive substrate 60 in the length direction Y and a second wire section 127 extending from the first wire section 126 toward the conductive substrate 60. In the present embodiment, the second control power lead 86D is a single component in which the first wire section 126, the second wire section 127, the pad portion 86p, and the terminal portion 86t are formed integrally. The first wire section 126 extends from the pad portion 86p to the end of the main surface 42sb of the second conductive member 42B that is located toward the third resin side surface 53. The first wire section 126 extends diagonally so that the conductive substrate 60 becomes closer as the second resin side surface 52 becomes closer. The second wire section 127 is entirely arranged on the main surface 42sb of the second conductive member 42B. The second wire section 127 extends from the first wire section 126 in the length direction Y. The second wire section 127 is located toward the pad portion 86p from the second part 113b of the second wire section 113 of the second control lead 85B in the length direction Y. The second wire section 127 is located toward the second resin side surface 52 from the first part 113a of the second wire section 113 of the second control lead 85B in the width direction X and spaced apart from the first part 113 from in the width direction X.

The second short-circuiting detection lead 87B includes a first wire section 132 extending from the pad portion 87p of the second short-circuiting detection lead 87B toward the conductive substrate 60 in the length direction Y and a second wire section 133 extending from the first wire section 132 toward the conductive substrate 60. In the present embodiment, the second short-circuiting detection lead 87B is a single component in which the first wire section 132, the second wire section 133, the pad portion 87p, and the terminal portion 87t are formed integrally. The first wire section 132 and the second wire section 133 both extend in the length direction Y. The first wire section 132 extends from the pad portion 8'7p to the end of the main surface 42sb of the second conductive member 42B that is located toward the third resin side surface 53. The second wire section 133 is entirely arranged on the main surface 42sb of the second conductive member 42B. The width of the second wire section 133 in the width direction X is greater than the width of the first wire section 132 in the width direction X. The second wire section 133 is arranged overlapping the first wire portion 62pa of the second drive wire 62B as viewed in the width direction X.

The second short-circuiting detection lead 87B and the second drive wire 62B are connected by a second short-circuiting detection connection member 142B. More specifically, the second short-circuiting detection connection member 142B is connected to the end of the second wire section 133 of the second short-circuiting detection lead 87B located toward the conductive substrate 60 and the end of the first wire portion 62pa of the second drive wire 62B located toward the third resin side surface 53. The second short-circuiting detection connection member 142B is, for example, a wire formed through wire bonding.

The second low-voltage diodes 34A and 34B and the second capacitors 35A and 35B of the second surge reduction circuit 4B are mounted on the second control leads 84B and 85B and the second control power leads 86C and 86D. Thus, in the present embodiment, the second control lead 84B, the second control lead 85B, and the second control power leads 86C and 86D define a conductive path (wire section) of the second surge reduction circuit 4B.

The second low-voltage diode 34A is mounted on the second control lead 84B and the second control power lead 86C. More specifically, the anode electrode of the second low-voltage diode 34A is connected to the first part 103a of the second wire section 103 of the second control lead 84B. The cathode electrode of the second low-voltage diode 34A is connected to the second wire section 125 of the second control power lead 86C.

The second control lead 84B and the second control power lead 86D are electrically connected to the second low-voltage diode 34B. More specifically, the second control power lead 86D includes a land 127a, on which the second low-voltage diode 34B is mounted, and a wire connection member 129, which connects the land 127a and the second wire section 127 of the second control power lead 86D. The land 127a is located toward the fourth resin side surface 54 (toward second semiconductor elements 10B) from the second wire section 127 in the length direction Y. The land 127a is arranged to overlap the third wire section 104 of the second control lead 84B and the second part 113b of the second wire section 113 of the second control lead 85B in the width direction X. The land 127a is located between the third wire section 104 of the second control lead 84B and the second part 113b of the second wire section 113 of the second control lead 85B in the width direction X. In a plan view, the wire connection member 129 extends diagonally so that the second resin side surface 52 becomes closer as the third resin side surface 53 becomes closer. The wire connection member 129 extends over the second wire section 113 of the second control lead 85B. The cathode electrode of the second low-voltage diode 34B is connected to the distal end of the third wire section 104 of the second control lead 84B. The anode electrode of the second low-voltage diode 34B is connected to the land 127a of the second control power lead 86D. In this manner, the second low-voltage diodes 34A and 34B are connected in series between the second control power lead 86C and the second control power lead 86D via the second control lead 84B.

The second capacitor 35A is mounted on the second control power lead 86C and the second control lead 85B. More specifically, the first terminal of the second capacitor 35A is connected to the second wire section 125 of the second control power lead 86C. the second terminal of the second capacitor 35A is connected to the first part 113a of the second wire section 113 of the second control lead 85B.

The second capacitor 35B is mounted on the second control lead 85B and the second control power lead 86D. More specifically, the first terminal of the second capacitor 35B is connected to the first part 113a of the second wire section 113 of the second control lead 85B. The second terminal of the second capacitor 35B is connected to the second wire section 127 of the second control power lead 86D. In this manner, the second capacitors 35A and 35B are connected in series between the second control power lead 86C and the second control power lead 86D via the second control lead 85B.

Figure 15:
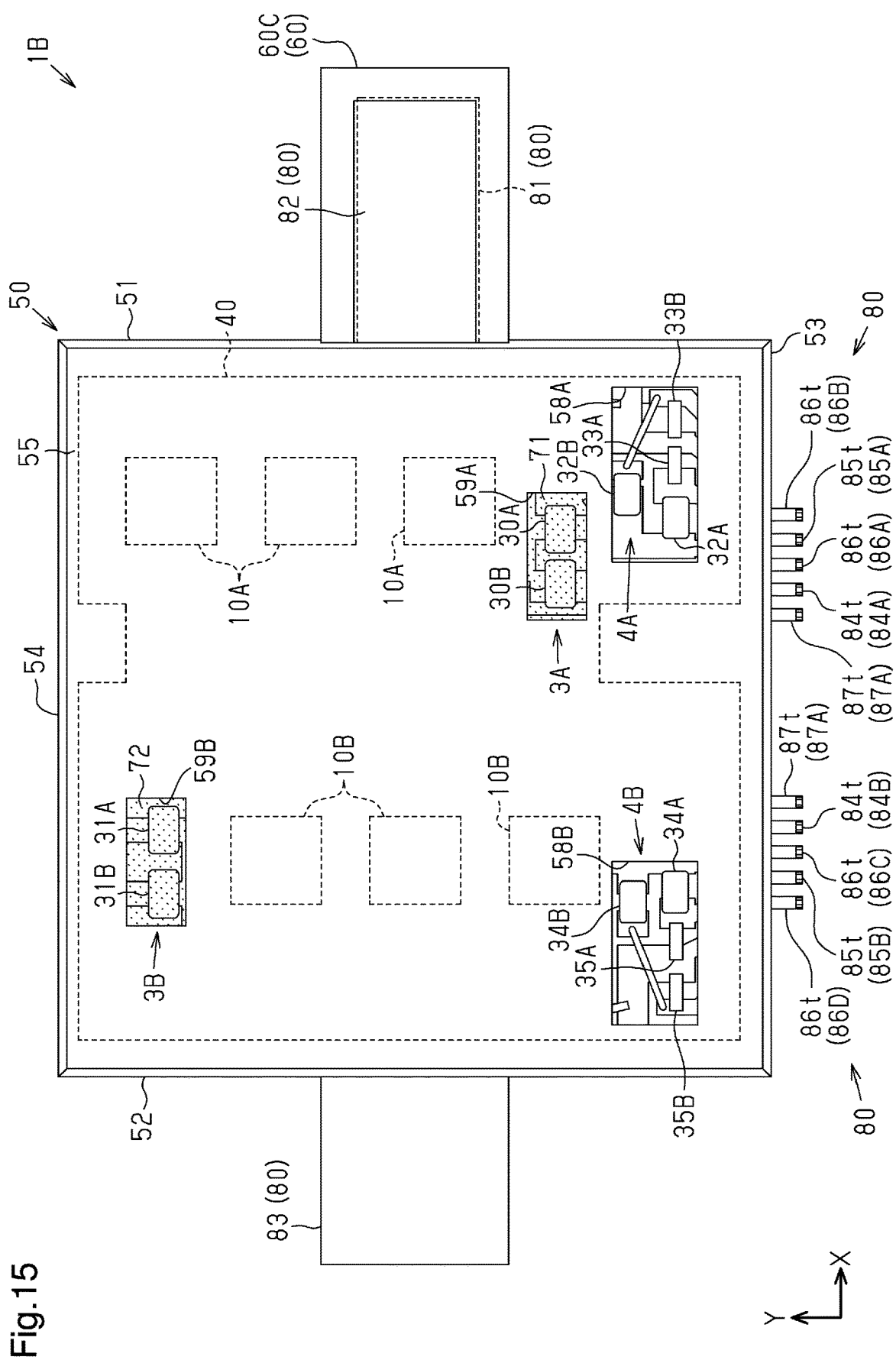
FIG. 15 is a plan view of a semiconductor device in accordance with a second embodiment.

As shown in FIG. 15, the first control side opening 58A, the second control side opening 58B, the first drive side opening 59A, and the second drive side opening 59B are formed in the resin member 50. The first drive side opening 59A and the second drive side opening 59B correspond to the first drive side opening 59A and the second drive side opening 59B of the first embodiment. The first control side opening 58A is separate from the second control side opening 58B. The first control side opening 58A and the second control side opening 58B are arranged along one side of the resin member 50 in a state spaced apart from each other in a plan view. The first control side opening 58A and the second control side opening 58B are arranged in the width direction X in a state spaced apart from each other.

The first control side opening 58A exposes a portion located toward the third resin side surface 53 from the conductive substrate 60 (fifth substrate layer 60F) in the length direction Y. The first control side opening 58A exposes a portion of the first conductive member 42A projecting out of the conductive substrate 60 toward the third resin side surface 53. In further detail, the first control side opening 58A exposes the first surge reduction circuit 4A, which is electrically connected to the first semiconductor elements 10A, in the same manner as the first control side opening 58A of the first embodiment. The first control side opening 58A exposes the first low-voltage diodes 32A and 32B, the first capacitors 33A and 33B, part of each of the first control leads 84A and 85A and the first control power leads 86A and 86B, and part of the first conductive member 42A. In the present embodiment, the first control side opening 58A does not expose the first short-circuiting detection lead 87A. The shape of the first control side opening 58A in a plan view, although not limited in particular, is rectangular so that the width direction X is the long-side direction and the length direction Y is the short-side direction. The interior of the first control side opening 58A is an open space.

The second control side opening 58B exposes a portion located toward the third resin side surface 53 from the conductive substrate 60 (fifth substrate layer 60G) in the length direction Y. The second control side opening 58B exposes a portion of the second conductive member 42B projecting out of the conductive substrate 60 toward the third resin side surface 53. In further detail, the second control side opening 58B exposes the second surge reduction circuit 4B, which is electrically connected to the second semiconductor elements 10B, in the same manner as the second control side opening 58B of the first embodiment. The second control side opening 58B exposes the second low-voltage diodes 34A and 34B, the second capacitors 35A and 35B, part of each of the second control leads 84B and 85B, the second control power leads 86C and 86D, and part of the second conductive member 42B. In the present embodiment, the second control side opening 58B does not expose the second short-circuiting detection lead 87B. The shape of the second control side opening 58B in a plan view, although not limited in particular, is rectangular so that the width direction X is the long-side direction and the length direction Y is the short-side direction. The interior of the second control side opening 58B is an open space.

Manufacturing Method

Figure 19:
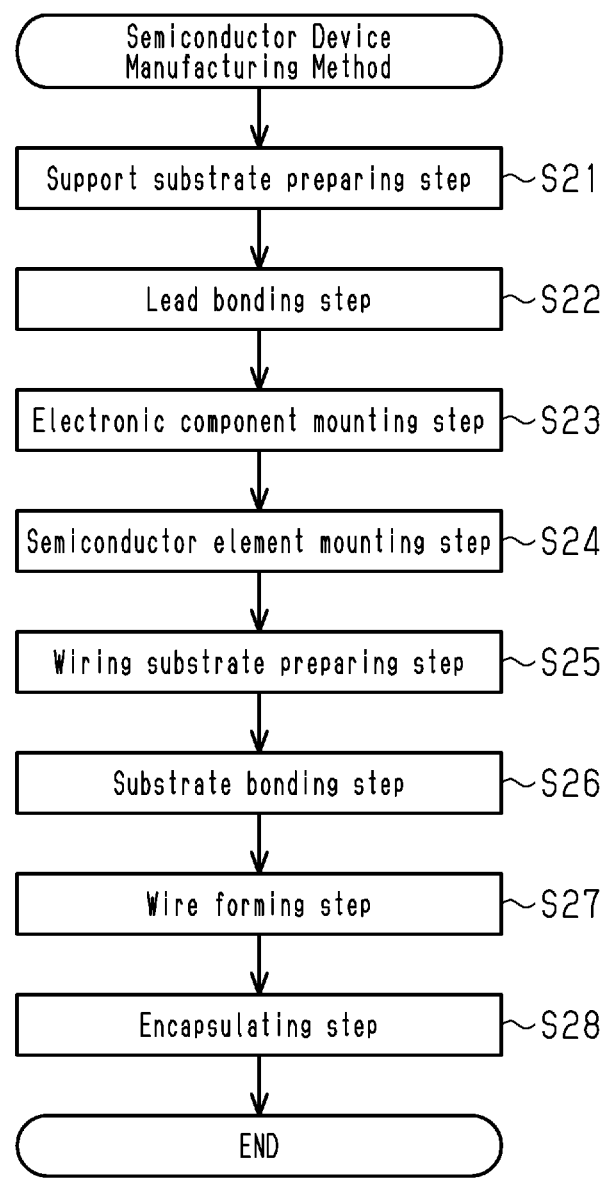
FIG. 19 is a flowchart illustrating a method for manufacturing the semiconductor device in accordance with the second embodiment.

As shown in FIG. 19, the method for manufacturing the semiconductor device 1B of the present embodiment includes a support substrate preparing step (step S21), a lead bonding step (step S22), an electronic component mounting step (step S23), a semiconductor element mounting step (step S24), a conductive substrate preparing step (step S25), a substrate bonding step (step S26), a wire forming step (step S27), and an encapsulating step (step S28). The support substrate preparing step, the lead bonding step, the electronic component mounting step, the semiconductor element mounting step, the conductive substrate preparing step, the substrate bonding step, the wire forming step, and the encapsulating step are sequentially performed to manufacture the semiconductor device 1B.

In the support substrate preparing step, in the same manner as the support substrate preparing step of the first embodiment, the first conductive member 42A is bonded to the first insulative substrate 41A, and the second conductive member 42B is bonded to the second insulative substrate 41B.

In the lead bonding step, a lead frame is bonded to the main surface 42sa of the first conductive member 42A and the main surface 42sb of the second conductive member 42B with, for example, an electrically insulative bonding material. The lead frame includes the control leads 84A, 84B, 85A, and 85B, the control power leads 86A to 86D, and the short-circuiting detection leads 87A and 87B.

In the electronic component mounting step, the low-voltage diodes 32A, 32B, 34A, and 34B and the capacitors 33A, 33B, 35A, and 35B are mounted on the control leads 84A, 84B, 85A, and 85B, the control power leads 86A to 86D, and the short-circuiting detection leads 87A and 87B with a conductive bonding material, such as silver paste or solder.

In the semiconductor element mounting step, in the same manner as the semiconductor element mounting step of the first embodiment, the drain electrode 11 of each first semiconductor element 10A is bonded to the main surface 42sa of the first conductive member 42A, and the drain electrode 11 of each second semiconductor element 10B is bonded to the main surface 42sb of the second conductive member 42B.

In the conductive substrate preparing step, in the same manner as the wire preparing step of the first embodiment, an assembly including the conductive substrate 60, the input leads 81 and 82, and the output lead 83 is produced. Then, the first high-voltage diodes 30A and 30B are mounted on the fifth substrate layer 60F of the conductive substrate 60, and the second high-voltage diodes 31A and 31B are mounted on the fifth substrate layer 60G. The conductive substrate preparing step differs from the wire preparing step of the first embodiment in that the low-voltage diodes 32A, 32B, 34A, and 34B and the capacitors 33A, 33B, 35A, and 35B are not mounted on the conductive substrate 60.

In the substrate bonding step, in the same manner as substrate bonding step of the first embodiment, the assembly of the conductive substrate 60, the input leads 81 and 82, and the output lead 83 is bonded to the first conductive member 42A and the second conductive member 42B.

In the wire forming step, in the same manner as the first embodiment, a bonding device forms the drive connection members 91A and 91B, the control connection members 92A and 92B, and the control connection members 93A and 93B.

In the wire forming step, the bonding device bonds a wire to the second part 111$b$ of the second wire section 111 of the first control lead 85A. Then, the bonding device moves, while extending the wire, to the first control wire 64A and bonds the wire to the first control wire 64A. This forms the first control connection member 141A connecting the first control lead 85A and the first control wire 64A.

The bonding device bonds a wire to the second part 101$b$ of the second wire section 101 of the first control lead 84A. Then, the bonding device moves, while extending the wire, to the first control wire 63A and bonds the wire to the first control wire 63A. This forms the first control connection member 140A connecting the first control lead 84A and the first control wire 63A.

The bonding device bonds a wire to the second wire section 131 of the first short-circuiting detection lead 87A. Then, the bonding device moves, while extending the wire, to the fourth wire portion 62$pd$ of the first drive wire 62A and bonds the wire to the fourth wire portion 62$pd$. This forms the first short-circuiting detection connection member 142A connecting the first short-circuiting detection lead 87A and the first drive wire 62A.

The bonding device bonds a wire to the second wire section 133 of the second short-circuiting detection lead 87B. Then, the bonding device moves, while extending the wire, to the first wire portion 62$qa$ of the second drive wire 62B and bonds the wire to the first wire portion 62$qa$. This forms the second short-circuiting detection connection member 142B connecting the second short-circuiting detection lead 87B and the second drive wire 62B.

The bonding device bonds a wire to the second part 103$b$ of the second wire section 103 of the second control lead 84B. Then, the bonding device moves, while extending the wire, to the second control wire 63B and bonds the wire to the second control wire 63B. This forms the second control connection member 140B connecting the second control lead 84B and the second control wire 63B.

Finally, the bonding device bonds a wire to the second part 113b of the second wire section 113 of the second control lead 85B. Then, the bonding device moves, while extending the wire, to the second control wire 64B and bonds the wire to the second control wire 64B. This forms the second control connection member 141B connecting the second control lead 85B and the second control wire 64B.

In the encapsulating step, the resin member 50 is formed in the same manner as the encapsulating step of the first embodiment. In this step, the control side openings 58A and 58B and the drive side openings 59A and 59B are formed. Afterwards, in the same manner as the first embodiment, the lead frame cutting step and lead forming step are performed. This produces the semiconductor device 1B.

In the wire forming step, the drive connection members 91A and 91B, the control connection members 92A, 92B, 93A, and 93B, the control connection members 140A, 140B, 141A, and 141B and the short-circuiting detection connection members 142A and 142B may be formed in any order.

In the present embodiment, the high-voltage diodes 30A, 30B, 31A, and 31B of the short-circuiting detection circuits 3A and 3B do not have to be mounted on the conductive substrate 60 in the conductive substrate preparing step. For example, the high-voltage diodes 30A, 30B, 31A, and 31B do not have to be mounted on the conductive substrate 60 in the conductive substrate preparing step. The high-voltage diodes 30A, 30B, 31A, and 31B may be mounted in the first drive side opening 59A and the second drive side opening 59B after the encapsulating step. In this case, the first drive side opening 59A is filled with the insulative material 71 after mounting the high-voltage diodes 30A and 30B on the conductive substrate 60. Further, the second drive side opening 59B is filled with the insulative material 72 after mounting the high-voltage diodes 31A and 31B on the conductive substrate 60. The semiconductor device 1B may be shipped out of a factory without the high-voltage diodes 30A, 30B, 31A, and 31B mounted on the conductive substrate 60. In this case, the user of the semiconductor device 1B mounts the high-voltage diodes 30A, 30B, 31A, and 31B through the first drive side opening 59A and the second drive side opening 59B on the conductive substrate 60.

The electronic component step does not have to be performed before the encapsulating step like in the present embodiment. For example, the electronic component step may be performed after the encapsulating step. Further, the electronic component step may be omitted from the method for manufacturing the semiconductor device 1B. In this case, the user of the semiconductor device 1B does not have to mount the low-voltage diodes 32A, 32B, 34A, and 34B and the capacitors 33A, 33B, 35A, and 35B on the conductive substrate 60 after the semiconductor device 1B is shipped out of the factory. The low-voltage diodes 32A, 32B, 34A, and 34B and the capacitors 33A, 33B, 35A, and 35B are mounted through the first control side opening 58A and the second control side opening 58B on the conductive substrate 60.

In addition to the advantages of the semiconductor device 1A in accordance with the first embodiment, the semiconductor device 1B in accordance with the first embodiment has the advantages described below.

(2-1) The first low-voltage diodes 32A and 32B and the first capacitors 33A and 33B are directly connected to the first control leads 84A and 85A and the first control power leads 86A and 86B. This configuration allows connection members (wires) connecting the first control power leads 86A and 86B to the conductive substrate 60 to be omitted. Accordingly, the number of connection members can be decreased. This reduces the inductance of the semiconductor device 1B that would be caused by connection members.

The second low-voltage diodes 34A and 34B and the second capacitors 35A and 35B are directly connected to the second control leads 84B and 85B, the second control power lead 86C, and the second control power lead 86D. This configuration allows connection members (wires) connecting the second control power lead 86C and the second control power lead 86D to the conductive substrate 60 to be omitted. Accordingly, the number of connection members can be decreased. This reduces the inductance of the semiconductor device 1B that would be caused by connection members.

(2-2) The first control connection member 140A is connected to the end of the first control wire 63A located toward the third resin side surface 53 of the resin member 50 and the end of the first control lead 84A located toward the conductive substrate 60. This shortens the first control connection member 140A and reduces inductance resulting from the first control connection member 140A.

The second control connection member 140B is connected to the end of the second control wire 63B located toward the third resin side surface 53 and the end of the second control lead 84B located toward the conductive substrate 60 and toward the second resin side surface 52. This shortens the second control connection member 140B and reduces inductance resulting from the second control connection member 140B.

(2-3) The first control connection member 141A is connected to the end of the first control wire 64A located toward the third resin side surface 53 and the end of the first control lead 85A located toward the conductive substrate 60. This shortens the first control connection member 141A and reduces inductance resulting from the first control connection member 141A.

The second control connection member 141B is connected to the end of the second control wire 64B located toward the third resin side surface 53 and the end of the second control lead 85B located toward the conductive substrate 60 and toward the second resin side surface 52. This shortens the second control connection member 141B and reduces inductance resulting from the second control connection member 141B.

(2-4) Each of the leads 84A, 84B, 85A, 85B, and 86A to 86D, which define a conductive path of the conductive path (wire section) of the surge reduction circuits 4A or 4B, is a single component, in which the wire section, the pad, and the terminal are formed integrally. This configuration reduces inductance between the terminal of each lead and the surge reduction circuits 4A and 4B as compared with a case in which, for example, a wire section and a pad are connected by a wire.

Third Embodiment

With reference to FIGS. 20 to 24, a semiconductor device 1C in accordance with a third embodiment will now be described. The semiconductor device 1C of the present embodiment differs from the semiconductor device 1A of the present embodiment in the terminals 20, the wire sections of the conductive substrate 60, and the circuit configuration. In the description hereafter, same reference numerals are given to those components that are the same as the corresponding components of the semiconductor device 1A in the first embodiment. Such components will not be described in detail.

Circuit Configuration of Semiconductor Device

Figure 24:
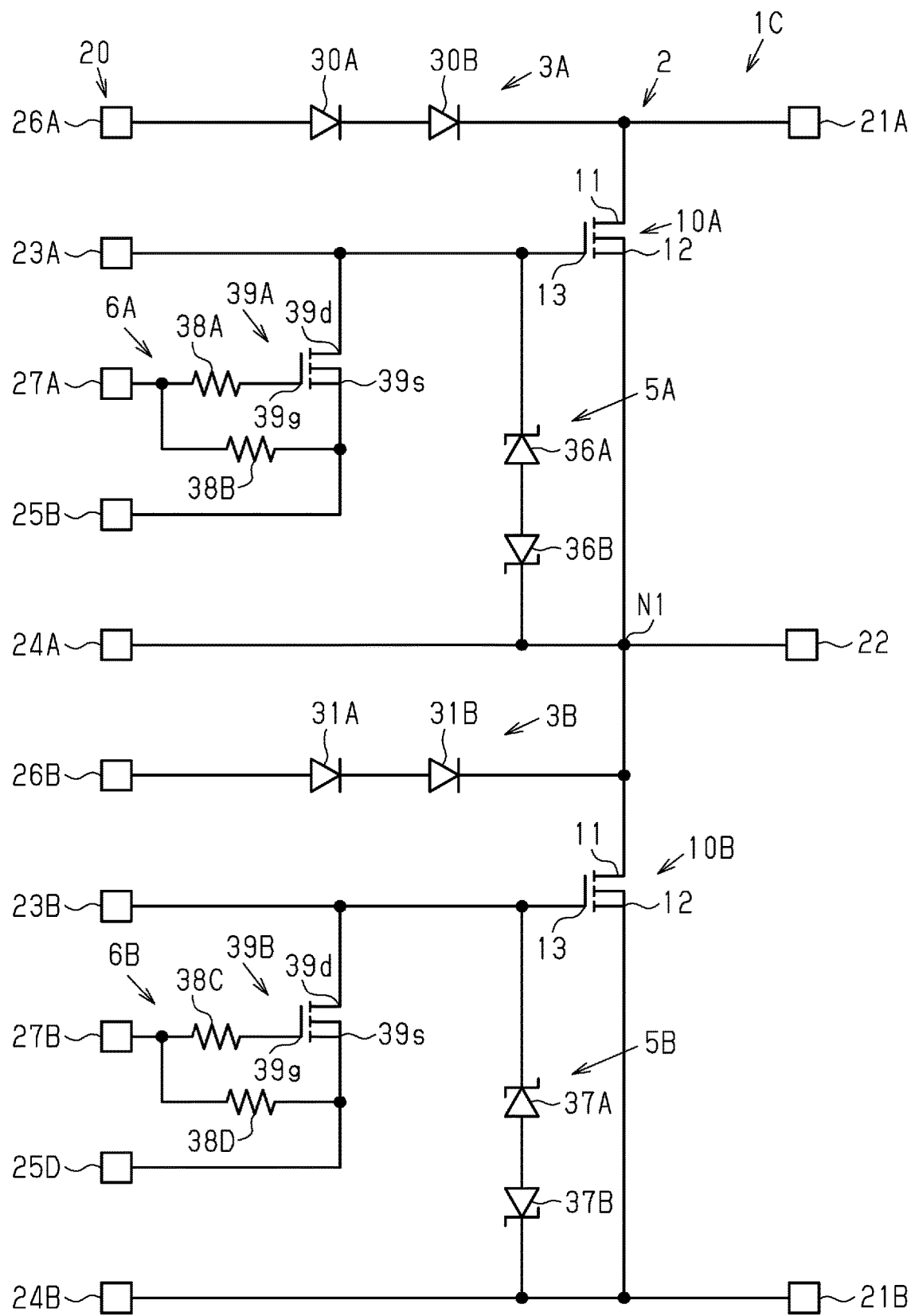
FIG. 24 is a circuit diagram of a semiconductor device in accordance with the third embodiment.

As shown in FIG. 24, the terminals 20 of the semiconductor device 1C differ from the terminals 20 of the semiconductor device 1A in accordance with the first embodiment in that a first interface terminal 27A is used instead of the first control power terminal 25A and a second interface terminal 27B is used instead of the second control power terminal 25C.

The first interface terminal 27A is provided with a signal from a gate drive circuit (not shown) arranged outside the semiconductor device 1C so that a control signal provided to the first control terminal 23A is held in an off state when a lower arm switching circuit is in an on state.

The second interface terminal 27B is provided with a signal from a gate drive circuit (not shown) arranged outside the semiconductor device 1C so that a control signal provided to the second control terminal 23B is held in an off state when an upper arm switching circuit is in an on state.

The configuration connecting the first semiconductor elements 10A and the second semiconductor elements 10B is the same as the configuration connecting the first semiconductor elements 10A and the second semiconductor elements 10B in the first embodiment. The semiconductor device 1C is configured to allow for mounting of first low-voltage diodes 36A and 36B, second low-voltage diodes 37A and 37B, a first resistor 38A, a first resistor 38B, a second resistor 38C, a second resistor 38D, a first switching element 39A, and a second switching element 39B instead of the high-voltage diodes 30A, 30B, 31A, and 31B, the low-voltage diodes 32A, 32B, 34A, and 34B, and the capacitors 33A, 33B, 35A, and 35B. The semiconductor device 1C in a state including the low-voltage diodes 36A, 36B, 37A, and 37B, the resistors 38A to 38D, and the switching elements 39A and 39B will now be described.

In the present embodiment, the first low-voltage diodes 36A and 36B, which are connected in anti-series to each other between the source and gate of each first semiconductor element 10A, form a first surge absorption circuit 5A that absorbs surge voltage generated at the gate electrode 13 of the first semiconductor element 10A. In further detail, the cathode electrode of the first low-voltage diode 36A is electrically connected to the gate electrode 13 of the first semiconductor element 10A. The anode electrode of the first low-voltage diode 36A is connected to the anode electrode of the first low-voltage diode 36B. The cathode electrode of the first low-voltage diode 36B is electrically connected to the source electrode 12 of the first semiconductor element 10A. Schottky barrier diodes are used as the first low-voltage diodes 36A and 36B.

Further, the first switching element 39A, which is electrically connected to the gate electrode 13 of the first semiconductor element 10A, the first resistor 38A, and the first resistor 38B form a first interface circuit 6A that drives the first semiconductor element 10A. In further detail, for example, a MOSFET is used as the first switching element 39A. The drain electrode 39d of the first switching element 39A is electrically connected to the gate electrode 13 of the first semiconductor element 10A. The source electrode 39S of the first switching element 39A is electrically connected to the first control power terminal 25B. The gate electrode 39g of the first switching element 39A is electrically connected to the first interface terminal 27A.

The first resistor 38A is arranged between the first interface terminal 27A and the gate electrode 39g of the first switching element 39A. The first resistor 38A includes a first terminal connected to the first interface terminal 27A and a second terminal connected the gate electrode 39g of the first switching element 39A. The first resistor 38B is arranged between the gate and source of the first switching element 39A. The first resistor 38B includes a first terminal connected to the first interface terminal 27A and the first terminal of the first resistor 38A and a second terminal connected to the source electrode 39S of the first switching element 39A.

In the present embodiment, the second low-voltage diodes 34A and 34B, which are connected in anti-series to each other between the gate and source of each second semiconductor element 10B, form a second surge absorption circuit 5B that absorbs surge voltage generated at the gate electrode 13 of the second semiconductor element 10B. In further detail, the cathode electrode of the second low-voltage diode 34A is electrically connected to the gate electrode 13 of the second semiconductor element 10B. The anode electrode of the second low-voltage diode 34A is electrically connected to the anode electrode of the second low-voltage diode 34B. The cathode electrode of the second low-voltage diode 34B is electrically connected to the source electrode 12 of the second semiconductor element 10B. Schottky barrier diodes are used as the second low-voltage diodes 34A and 34B.

Further, the second switching element 39B, which is electrically connected to the gate electrode 13 of the second semiconductor element 10B, the second resistor 38C, and the second resistor 38D, form a second interface circuit 6B that drives the second semiconductor element 10B. In further detail, for example, a MOSFET is used as the second switching element 39B. The drain electrode 39d of the second switching element 39B is electrically connected to the gate electrode 13 of the second semiconductor element 10B. The source electrode 39S of the second switching element 39B is electrically connected to the second control power terminal 25D. The gate electrode 39g of the second switching element 39B is electrically connected to the second interface terminal 27B.

The second resistor 38C is arranged between the second interface terminal 27B and the gate electrode 39g of the second switching element 39B. The second resistor 38C includes a first terminal connected to the second interface terminal 27B and a second terminal connected to the gate electrode 39g of the second switching element 39B. The second resistor 38D is arranged between the gate and source of the second switching element 39B. The second resistor 38D includes a first terminal, connected to the second interface terminal 27B and the first terminal of the second resistor 38C, and a second terminal, connected to the source electrode 39S of the second switching element 39B.

Configuration of Semiconductor Device

As shown in FIGS. 20 to 23, the semiconductor device 1C of the present embodiment differs from the semiconductor device 1A of the first embodiment in the layout of the leads 80. Further, the second wiring region 70B and part of the first wiring region 70A is different.

As the leads 80 arranged adjacent to the first wiring region 70A in the length direction Y, the semiconductor device 1C includes the first control lead 84A, the first control lead 85A, the first control power lead 86B, a first interface lead 88A, and the first short-circuiting detection lead 87A. The first control lead 85A, the first control lead 84A, the first interface lead 88A, the first control power lead 86B, and the first short-circuiting detection lead 87A are disposed in order from the input leads 81 and 82 toward the output lead 83 in the width direction X. The first interface lead 88A is identical in shape to, for example, the first control lead 85A. The first interface lead 88A includes a pad portion 88*p* and a terminal portion 88*t*. In the present embodiment, the first interface lead 88A is a single component in which the pad portion 88*p* and the terminal portion 88*t* are formed integrally. The pad portion 88*p* includes a through hole 88*h* extending through the pad portion 88*p* in the thickness direction Z. Part of the resin member 50 is included in the through hole 88*h*.

As the leads 80 arranged adjacent to the second wiring region 70B in the length direction Y, the semiconductor device 1C includes the second control lead 84B, the second control lead 85B, the second control power lead 86D, a second interface lead 88B, and the second short-circuiting detection lead 87B. The second control lead 85B, the second control lead 84B, the second control power lead 86D, the second interface lead 88B, and the second short-circuiting detection lead 87B are disposed in order from the output lead 83 to the input leads 81 and 82 in the width direction X. The second interface lead 88B is identical in shape to, for example, the second control lead 85B. The second interface lead 88B includes a pad portion 88*p* and a terminal portion 88*t*. In the present embodiment, the second interface lead 88B is a single component in which the pad portion 88*p* and the terminal portion 88*t* are formed integrally. The pad portion 88*p* includes a through hole 88*h* extending through the pad portion 88*p* in the thickness direction Z. Part of the resin member 50 is included in the through hole 88*h*.

In the first drive wire 62A, the first wire portion 62*pa*, the second wire portions 62*pb*, the third wire portion 62*pc*, and the first part 62*py* of the fourth wire portion 62*pd* are the same as the first drive wire 62A of the first embodiment. The first drive wire 62A differs from the first drive wire 62A of the first embodiment in the second part 62*pz* of the fourth wire portion 62*pd*. More specifically, the length in the width direction X of the portion of the second part 62*pz* extending in the width direction X is greater than the length in the width direction X of the portion of the second part 62*pz* of the first embodiment extending in the width direction X. The portion of the second part 62*pz* extending in the length direction Y is arranged on the end of the fifth substrate layer 60F located toward the output lead 83 in the width direction X. The portion of the second part 62*pz* extending in the length direction Y is arranged overlapping the first wire portion 62*pa* of the first drive wire 62A as viewed in the length direction Y.

The first drive wire 62A and the first short-circuiting detection lead 87A are electrically connected to the first short-circuiting detection connection member 97A. The first short-circuiting detection connection member 97A connects the end of the second part 62*pz* of the fourth wire portion 62*pd* of the first drive wire 62A located toward the third resin side surface 53 in the length direction Y and the pad portion 87*p* of the first short-circuiting detection lead 87A.

The first wire portion 63*pa* and the second wire portion 63*pb* of the first control wire 63A are the same as the first control wire 63A of the first embodiment. The third wire portion 63*pc* of the first control wire 63A differs from the first control wire 63A of the first embodiment. More specifically, the third wire portion 63*pc* extends from the second wire portion 63*pb* in the length direction Y toward the third resin side surface 53.

The first control wire 63A and the first control lead 84A are electrically connected by the first control lead connection member 94A. The first control lead connection member 94A is connected to the end of the third wire portion 63*pc* of the first control wire 63A located toward the third resin side surface 53 in the length direction Y and the pad portion 84*p* of the first control lead 84A.

In contrast to the first control wire 64A of the first embodiment, the first control wire 64A does not include the second wire portion 64*pb* and the third wire portion 64*pc*. The first control wire 64A extends in the length direction Y The length of the first control wire 64A in the length direction Y is greater than the length of the first wire portion 64*pa* of the first control wire 64A of the first embodiment in the length direction Y.

The first control wire 64A and the first control lead 85A are electrically connected by the first control lead connection member 95A. The first control lead connection member 95A is connected to the end of the first control wire 64A located toward the third resin side surface 53 in the length direction Y and the pad portion 85*p* of the first control lead 85A.

The first control power wire 66A is L-shaped in a plan view. The second control power wire 66B includes the first wire portion 66*pa* and the second wire portion 66*pb*. The first wire portion 66*pa* extends from the end of the fifth substrate layer 60F that is located toward the third resin side surface 53 in the length direction Y toward the first semiconductor elements 10A in the length direction Y. The first wire portion 66*pa* is arranged toward the first resin side surface 51 from the second part 62*pz* of the fourth wire portion 62*pd* of the first drive wire 62A. The second wire portion 66*pb* extends in the width direction X from the end of the first wire portion 66*pa* that is located toward the first semiconductor elements 10A in the length direction Y. The second wire portion 66*pb* extends toward the first resin side surface 51. The second wire portion 66*pb* is arranged toward the third resin side surface 53 from the first part 62*py* of the fourth wire portion 62*pd* of the first drive wire 62A in the width direction X. The distal end of the second wire portion 66*pb* is proximate to the third wire portion 63*pc* of the first control wire 63A as viewed in the width direction X.

The first control power wire 66A and the first control power lead 86B are electrically connected by the first control power connection member 96B. The first control power connection member 96B connects the end of the first wire portion 66*pa* of the first control power wire 66A located toward the third resin side surface 53 in the length direction Y to the pad portion 86*p* of the first control power lead 86B.

A first interface wire 68A is located between the first wire portion 66*pa* of the first control power wire 66A and the third wire portion 63*pc* of the first control wire 63A in the width direction X. The first interface wire 68A is arranged toward the third resin side surface 53 from the second wire portion 66*pb* of the first control power wire 66A in the length direction Y. The first interface wire 68A extends in the length direction Y.

The first interface wire 68A and the first interface lead 88A are connected by a first interface connection member 98A. The first interface connection member 98A is connected to the end of the first interface wire 68A located toward the third resin side surface 53 in the length direction Y and the pad portion 88*p* of the first interface lead 88A. The first interface connection member 98A is, for example, a wire formed through wire bonding.

A first relay wire 69A is arranged between the third wire portion 63*pc* of the first control wire 63A and the first control wire 64A in the width direction X. The first relay wire 69A extends in the length direction Y.

A second relay wire 69B is arranged between the third wire portion 63*pc* of the first control wire 63A and the second control power wire 66B in the width direction X. The second relay wire 69B is L-shaped in a plan view. The second relay wire 69B includes a first wire part 69*pa* extending in the length direction Y and a second wire part 69*pb* extending in the width direction X. The second wire part 69*pb* extends toward the output lead 83 from the end of the first wire part 69*pa* that is located toward the first semiconductor elements 10A in the length direction Y.

The first low-voltage diodes 36A and 36B, which form the first surge absorption circuit 5A, are mounted on the first control wire 63A, the first control wire 64A, and the first relay wire 69A.

The first low-voltage diodes 36A and 36B are connected in anti-series between the first control wire 63A and the first control wire 64A via the first relay wire 69A. In further detail, the cathode electrode of the first low-voltage diode 36A is connected to the third wire portion 63*pc* of the first control wire 63A. The anode electrode of the first low-voltage diode 36A is connected to the first relay wire 69A. The anode electrode of the first low-voltage diode 36B is connected to the first relay wire 69A. The cathode electrode of the first low-voltage diode 36B is connected to the first control wire 64A.

In the present embodiment, the first low-voltage diode 36A is positioned so that its anode electrode and cathode electrode are arranged in the width direction X. Further, the first low-voltage diode 36B is positioned so that its anode electrode and cathode electrode are arranged in the width direction X. Moreover, the first low-voltage diode 36A and the first low-voltage diode 36B are arranged to align with each other in the length direction Y and spaced apart in the width direction X.

The first resistors 38A and 38B and the first switching element 39A, which form the first interface circuit 6A, are mounted on the first control wire 63A, the second control power wire 66B, the first interface wire 68A, and the second relay wire 69B.

The first switching element 39A is electrically connected to the first control wire 63A, the second control power wire 66B, and the second relay wire 69B. In further detail, the drain electrode 39*d* of the first switching element 39A is connected to the third wire portion 63*pc* of the first control wire 63A. The source electrode 39S of the first switching element 39A is connected to the second wire portion 66*pb* of the second control power wire 66B. The gate electrode 39*g* of the first switching element 39A is connected to the second relay wire 69B. In the present embodiment, the first switching element 39A is located toward the first semiconductor elements 10A from the first low-voltage diodes 36A and 36B, the first resistor 38A, and the first resistor 38B.

The first resistor 38A and the first resistor 38B are connected between the second control power wire 66B and the second relay wire 69B via the first interface wire 68A. The first terminal of the first resistor 38A is connected to the second relay wire 69B. The second terminal of the first resistor 38A is connected to the first interface wire 68A. The first terminal of the first resistor 38B is connected to the first interface wire 68A. The second terminal of the first resistor 38B is connected to the first wire portion 66*pa* of the second control power wire 66B.

In the present embodiment, the first resistor 38A is positioned so that its first terminal and second terminal are arranged in the width direction X. Further, the first resistor 38B is positioned so that its first terminal and second terminal are arranged in the width direction X. Moreover, the first resistor 38A and the first resistor 38B are arranged to align with each other in the length direction Y and spaced apart in the width direction X.

The second drive wire 62B is the same as the second drive wire 62B of the first embodiment. In the same manner as the first embodiment, the second short-circuiting detection connection member 97B is connected to the second drive wire 62B and the second short-circuiting detection lead 87B.

The first wire portion 63*qa* of the second control wire 63B is the same as the first control wire 63A of the first embodiment. In the second control wire 63B of the present embodiment, the second wire portion 63*qb* and the third wire portion 63*qc* are omitted from the first control wire 63A, and a fourth wire portion 63*qd* is added instead. The fourth wire portion 63*qd* is L-shaped in a plan view. The fourth wire portion 63*qd* includes a first part 63*qv* and a second part 63*qw*. The first part 63*qv* extends in the width direction X toward the input leads 81 and 82 from the end of the first wire portion 63*qa* that is located toward the third resin side surface 53 in the length direction Y. The second part 63*qw* extends in the length direction Y toward the third resin side surface 53 from the end of the first part 63*qv* located toward the input leads 81 and 82 in the width direction X.

The second control wire 63B and the second control lead 84B are electrically connected by the second control lead connection member 94B. The second control lead connection member 94B is connected to the end of the second part 63*qw* of the fourth wire portion 63*qd* of the second control wire 63B located toward the third resin side surface 53 in the length direction Y and the pad portion 84*p* of the second control lead 84B.

The second control wire 64B differs from the second control wire 64B of the first embodiment in that it does not include the second wire portion 64*qb* and the third wire portion 64*qc*. The second control wire 64B extends in the length direction Y. The length of the second control wire 64B in the length direction Y is greater than the length of the first wire portion 64*qa* of the second control wire 64B in the length direction Y.

The second control wire 64B and the second control lead 85B are electrically connected by the second control lead connection member 95B. The second control lead connection member 95B is connected to the end of the second control wire 64B located toward the third resin side surface 53 in the length direction Y and the pad portion 85*p* of the second control lead 85B.

A second control power wire 66D and a second interface wire 68B are each located between the first wire portion 62*qa* of the second drive wire 62B and the second part 63*qw* of the fourth wire portion 63*qd* of the second control wire 63B in the width direction X. The second control power wire 66D is located toward the second part 63*qw* of the second control wire 63 in the width direction X. The second interface wire 68B is located toward the first wire portion 62*qa* of the second drive wire 62B in the width direction X. The second control power wire 66D and the second interface wire 68B each extend in the length direction Y.

The second control power wire 66D and the second control power lead 86D are electrically connected by the second control power connection member 96D. The second control power connection member 96D is connected to the end of the second control power wire 66D located toward the third resin side surface 53 in the length direction Y and the pad portion 86*p* of the second control power lead 86D.

The second interface wire 68B and the second interface lead 88B are electrically connected by a second interface connection member 98B. The second interface connection member 98B is connected to the end of the second interface wire 68B located toward the third resin side surface 53 in the length direction Y and the pad portion 88p of the second interface lead 88B. The second interface connection member 98B is, for example, a wire formed through wire bonding.

A third relay wire 69C is arranged between the second semiconductor elements 10B and the second control power wire 66D and second interface wire 68B in the length direction Y The third relay wire 69C extends in the width direction X. The third relay wire 69C is overlapped with the second control power wire 66D and the second interface wire 68B as viewed in the length direction Y.

A fourth relay wire 69D is arranged between the second part 63qw of the fourth wire portion 63qd of the second control wire 63B and the second control wire 64B in the length direction Y. The fourth relay wire 69D extends in the length direction Y. The fourth relay wire 69D is located toward the third resin side surface 53 in the length direction Y from the first part 63qv of the fourth wire portion 63qd of the second control wire 63B.

The second low-voltage diodes 37A and 37B, which form the second surge absorption circuit 5B, are mounted on the second control wire 63B, the second control wire 64B, and the fourth relay wire 69D.

The second low-voltage diodes 37A and 37B are connected in anti-series between the second control wire 63B and the second control wire 64B via the fourth relay wire 69D. In further detail, the cathode electrode of the second low-voltage diode 37A is connected to the second part 63qw of the second control wire 63B of the fourth wire portion 63qd. The anode electrode of the second low-voltage diode 37B is connected to the fourth relay wire 69D. The anode electrode of the second low-voltage diode 37B is connected to the fourth relay wire 69D. The cathode electrode of the second low-voltage diode 37B is connected to the second control wire 64B.

In the present embodiment, the second low-voltage diode 37A is positioned so that its anode electrode and cathode electrode are arranged in the width direction X. Further, the second low-voltage diode 37B is positioned so that its anode electrode and cathode electrode are arranged in the width direction X. Moreover, the second low-voltage diode 37A and the second low-voltage diode 37B are arranged to align with each other in the length direction Y and spaced apart in the width direction X.

The second resistors 38C and 38D and the second switching element 39B, which form the second interface circuit 6B, are mounted on the second control wire 63B, the second control power wire 66D, the second interface wire 68B, and the third relay wire 69C.

The second switching element 39B is electrically connected to the second control wire 63B, the second control power wire 66D, and the third relay wire 69C. In further detail, the drain electrode 39d of the second switching element 39B is connected to the fourth wire portion 63qd of the second control wire 63B. The source electrode 39S of the second switching element 39B is connected to the second control power wire 66D. The gate electrode 39g of the second switching element 39B is connected to the third relay wire 69C.

In the present embodiment, the second switching element 39B is located toward the second semiconductor elements 10B from the second low-voltage diodes 37A and 37B and the second resistor 38D. The second switching element 39B is overlapped with the second resistor 38C as viewed in the width direction X.

The second resistors 38C and 38D are connected to the second control power wire 66D, the third relay wire 69C, and the second interface wire 68B. The first terminal of the second resistor 38C is connected to the third relay wire 69C. The second terminal of the second resistor 38C is connected to the second interface wire 68B. The first terminal of the second resistor 38D is connected to the second interface wire 68B. The second terminal of the second resistor 38D is connected to the second control power wire 66D.

In the present embodiment, the second resistor 38C is positioned so that its first terminal and second terminal are arranged in the length direction Y. Further, the second resistor 38D is positioned so that its first terminal and second terminal are arranged in the width direction X. The second resistor 38C is located toward the second semiconductor elements 10B from the second resistor 38D. The second resistor 38C is partially overlapped with the second resistor 38D as viewed in the length direction Y.

Figure 20:
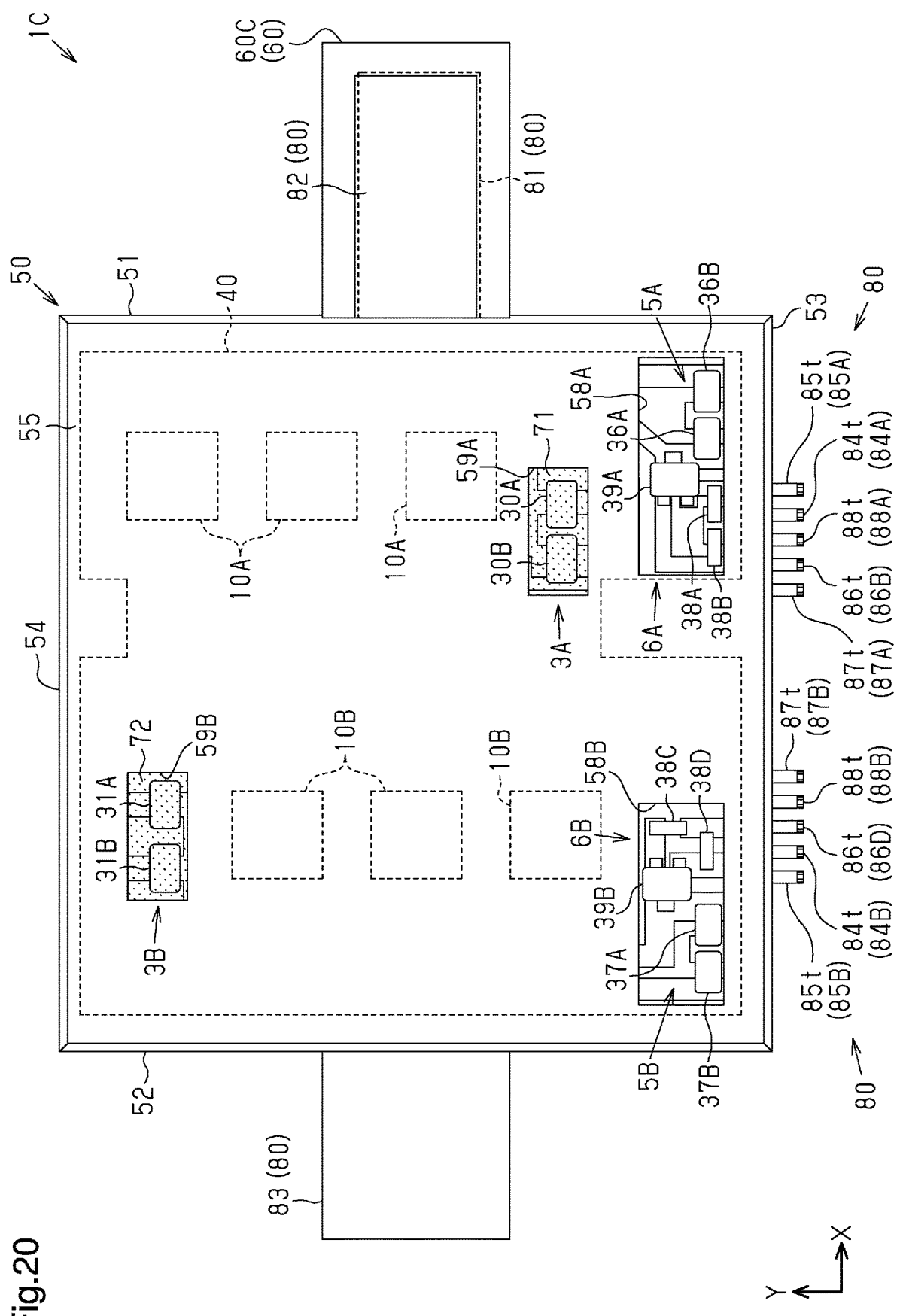
FIG. 20 is a plan view of a semiconductor device in accordance with a third embodiment.
Figure 21:
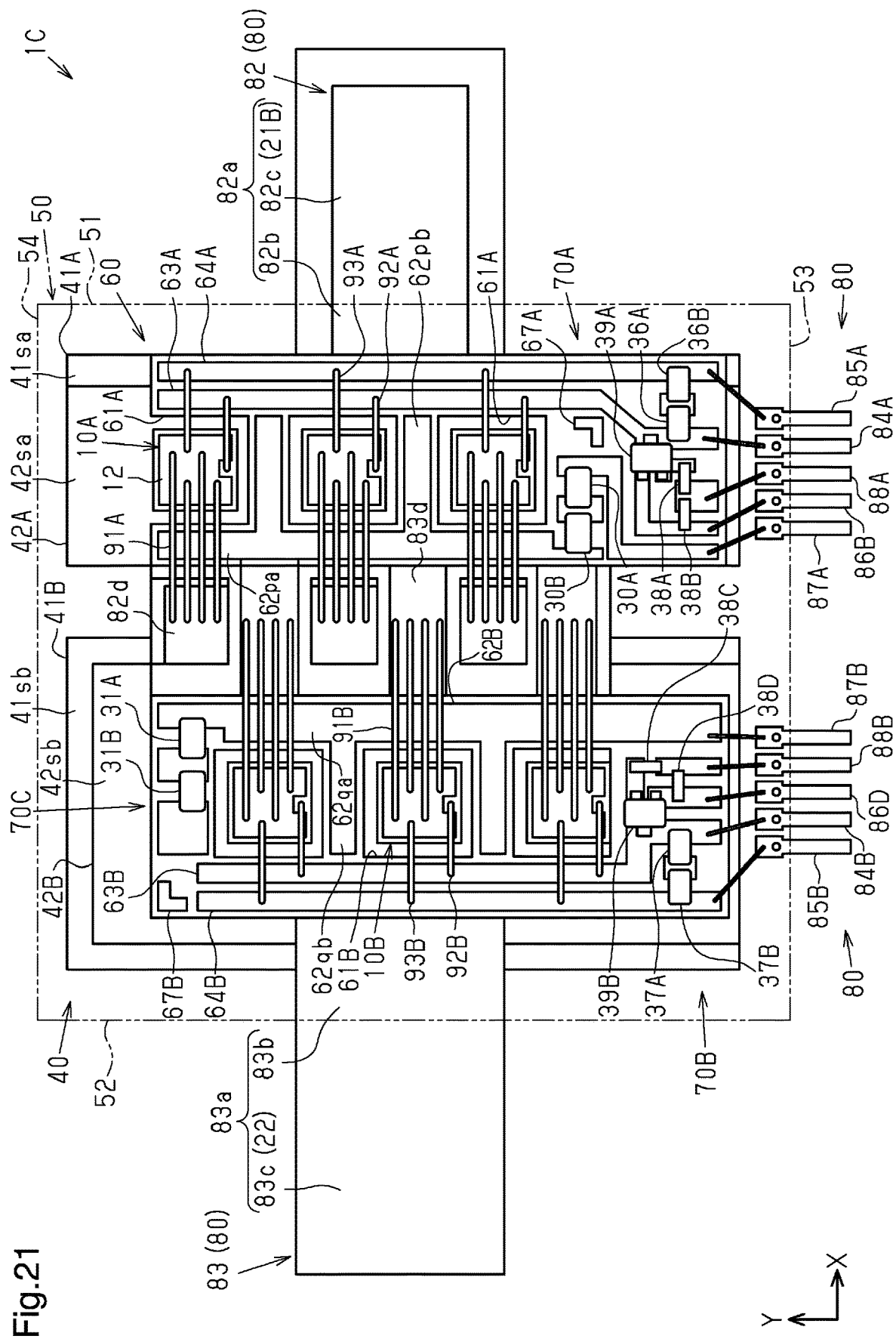
FIG. 21 is a plan view of the semiconductor device shown in FIG. 20 without a resin member.
Figure 22:
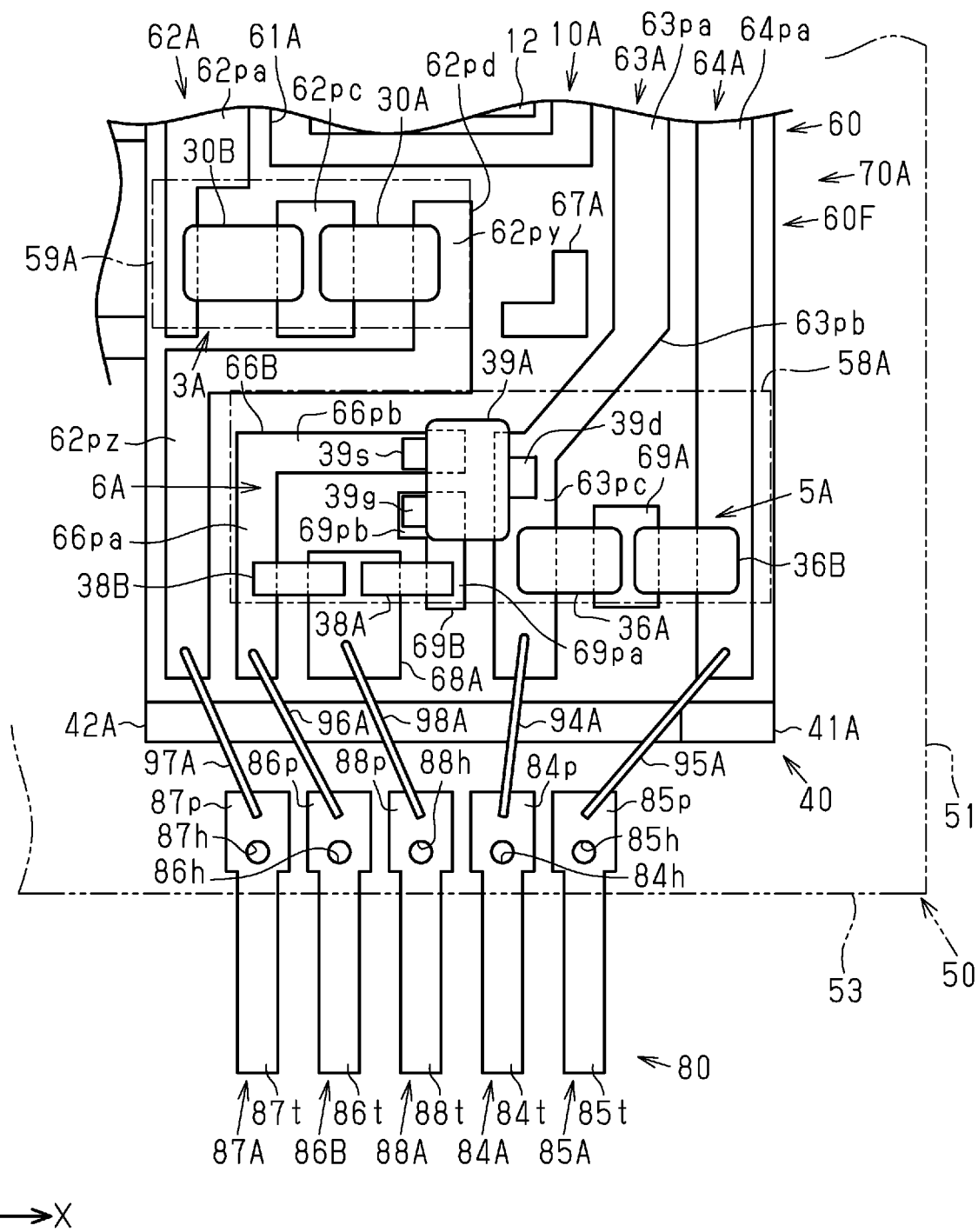
FIG. 22 is an enlarged view of a first wiring region in the semiconductor device shown in FIG. 21.
Figure 23:
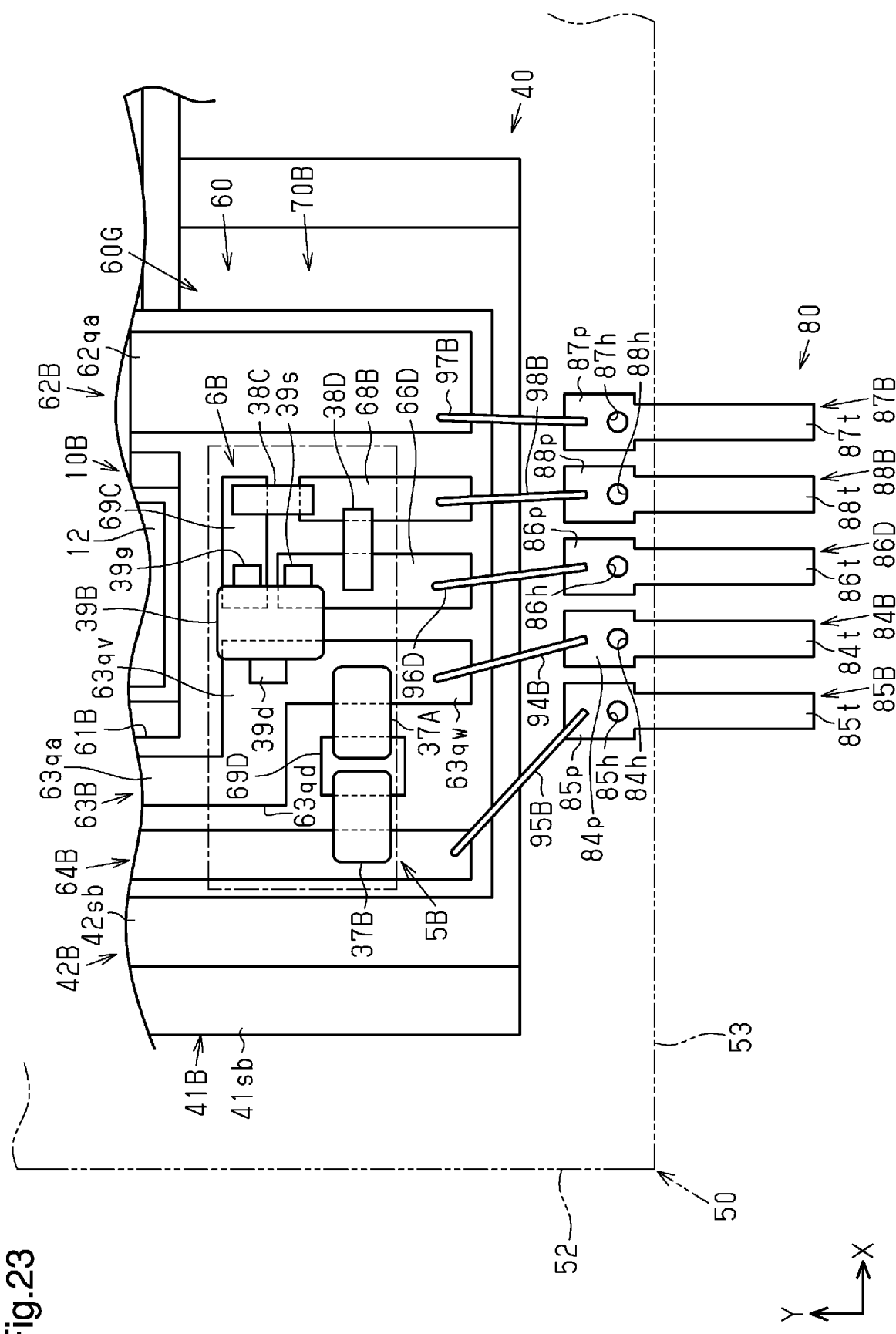
FIG. 23 is an enlarged view of a second wiring region in the semiconductor device shown in FIG. 21.

As shown in FIG. 20, the first control side opening 58A, the second control side opening 58B, the first drive side opening 59A, and the second drive side opening 59B are formed in the resin member 50 of the semiconductor device 1C. The first drive side opening 59A and the second drive side opening 59B correspond to the first drive side opening 59A and the second drive side opening 59B of the first embodiment. The first control side opening 58A is separate from the second control side opening 58B. The first control side opening 58A and the second control side opening 58B are arranged along one side of the resin member 50 in a state spaced apart from each other in a plan view. The first control side opening 58A and the second control side opening 58B are arranged in the width direction X in a state spaced apart from each other.

The first control side opening 58A exposes part of the first wiring region 70A of the conductive substrate 60. The first control side opening 58A exposes two types of circuits that are electrically connected to the first semiconductor elements 10A. In the present embodiment, the first control side opening 58A exposes the first interface circuit 6A and the first surge absorption circuit 5A. In further detail, the first control side opening 58A exposes part of the first control wire 63A, part of the first control wire 64A, the first relay wire 69A, part of the second control power wire 66B, part of the first interface wire 68A, the second relay wire 69B, the first low-voltage diodes 36A and 36B, the first resistor 38A, the first resistor 38B, and the first switching element 39A. In the present embodiment, the first control side opening 58A does not expose the first drive wire 62A. The shape of the first control side opening 58A in a plan view, although not limited in particular, is rectangular so that the width direction X is the long-side direction and the length direction Y is the short-side direction. The interior of the first control side opening 58A is an open space.

The second control side opening 58B exposes part of the second wiring region 70B of the conductive substrate 60. The second control side opening 58B exposes two types of circuits that are electrically connected to the first semiconductor elements 10B. In the present embodiment, the second control side opening 58B exposes the second interface circuit 6B and the second surge absorption circuit 5B. In further detail, the second control side opening 58B exposes part of the second control wire 63B, part of the second control wire 64B, the fourth relay wire 69D, part of the second control power wire 66D, part of the second interface wire 68B, the fourth relay wire 69D, the second low-voltage diodes 37A and 37B, the second resistor 38C, the second resistor 38D, and the second switching element 39B. In the present embodiment, the second control side opening 58B does not expose the second drive wire 62B. The shape of the second control side opening 58B in a plan view, although not limited in particular, is rectangular so that the width direction X is the long-side direction and the length direction Y is the short-side direction. The interior of the second control side opening 58B is an open space.

The semiconductor device 1C of the present embodiment has the advantages described below.

(3-1) The semiconductor device 1C includes the first interface circuit 6A and the second interface circuit 6B. With this configuration, the first switching element 39A of the first interface circuit 6A is on-off controlled so that the first semiconductor elements 10A are not erroneously activated by the effect of surge (noise) when a lower arm switching circuit is activated. Further, the second switching element 39B of the second interface circuit 6B is on-off controlled so that the second semiconductor elements 10B are not erroneously activated by the effect of surge (noise) when an upper arm switching circuit is activated.

(3-2) The semiconductor device 1C includes the first surge absorption circuit 5A and the second surge absorption circuit 5B. With this configuration, the first low-voltage diodes 36A and 36B of the first surge absorption circuit 5A absorb surge voltage from the voltage applied to the gate electrode 13 of the first semiconductor element 10A. Further, the second low-voltage diodes 37A and 37B of the second surge absorption circuit 5B absorb surge voltage from the gate electrode 13 of the second semiconductor element 10B.

Fourth Embodiment

With reference to FIGS. 25 to 29, a semiconductor device 1D in accordance with a fourth embodiment will now be described. The semiconductor device 1D in accordance with the present embodiment mainly differs from the semiconductor device 1A in accordance with the first embodiment in that a first current detection circuit 7A and a second current detection circuit 7B are used instead of the first short-circuiting detection circuit 3A and the second short-circuiting detection circuit 3B. In the description hereafter, same reference numerals are given to those components that are the same as the corresponding components of the semiconductor device 1A in the first embodiment. Such components will not be described in detail.

Circuit Configuration of Semiconductor Device

Figure 29:
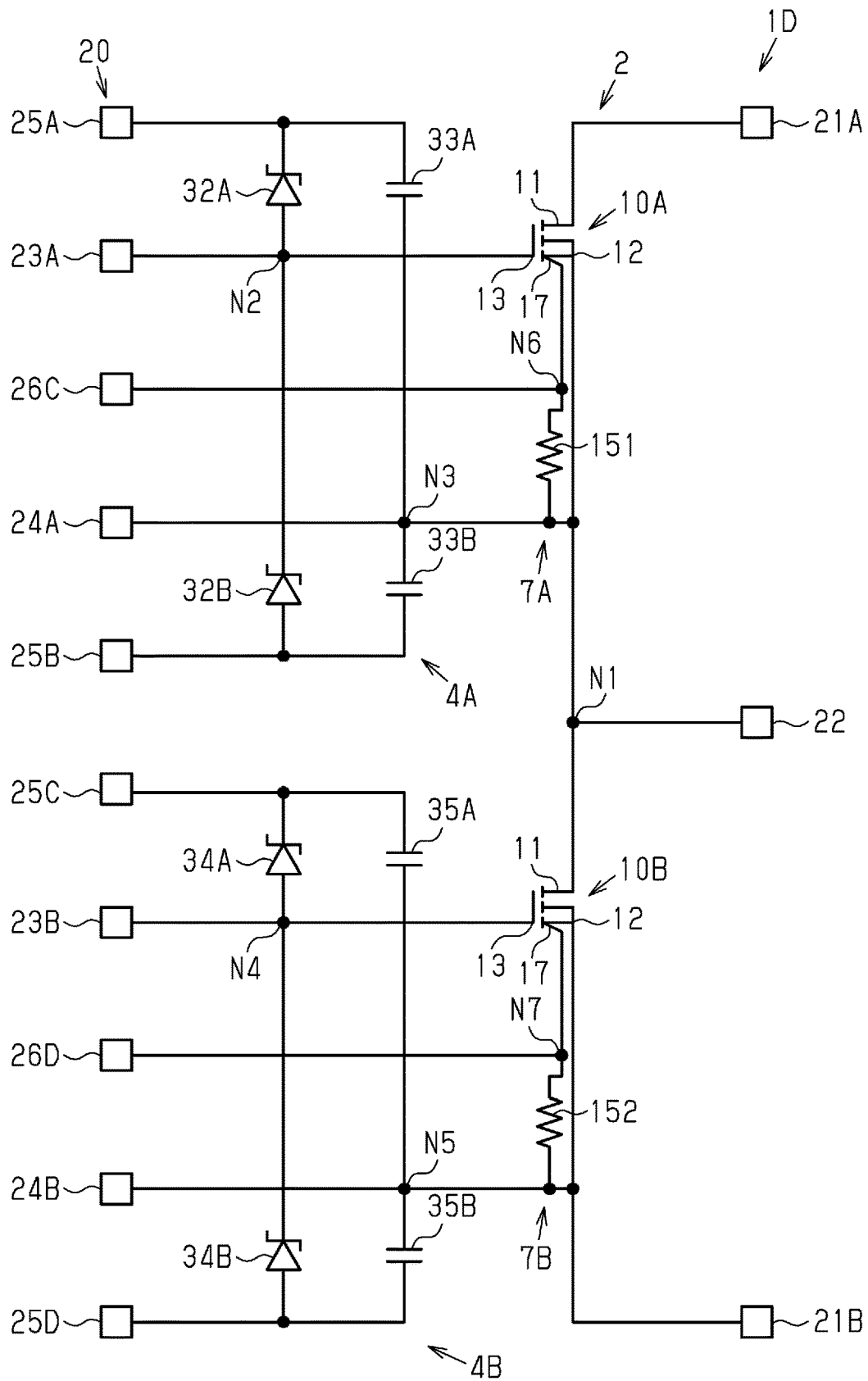
FIG. 29 is a circuit diagram of the semiconductor device shown in FIG. 26A.

As shown in FIG. 29, the terminals 20 includes a first overcurrent detection terminal 26C and a second overcurrent detection terminal 26D instead of the first short-circuiting detection terminal 26A and the second short-circuiting detection terminal 26B. The first overcurrent detection terminal 26C, which is for detecting whether overcurrent is flowing to the first semiconductor element 10A, is electrically connected to a current sensing electrode 17 of the first semiconductor element 10A. The second overcurrent detection terminal 26D, which is for detecting whether overcurrent is flowing to the second semiconductor element 10B, is electrically connected to the current sensing electrode 17 of the second semiconductor element 10B.

The first current detection circuit 7A, which detects the current flowing to the first semiconductor element 10A, includes a first resistor 151. The first resistor 151 includes a first terminal connected to the current sensing electrode 17 of the first semiconductor element 10A. The first resistor 151 includes a second terminal connected to the node N3 between the first capacitor 33A and the first capacitor 33B. The first overcurrent detection terminal 26C is electrically connected to a node N6 between the current sensing electrode 17 of the first semiconductor element 10A and the first terminal of the first resistor 151.

The second current detection circuit 7B detects the current flowing to the second semiconductor element 10B and includes a second resistor 152. The second resistor 152 includes a first terminal electrically connected to the current sensing electrode 17 of the second semiconductor element 10B. The second resistor 152 includes a second terminal electrically connected to the node N5 between the second capacitor 35A and the second capacitor 35B. The second overcurrent detection terminal 26D is electrically connected to a node N7 between the current sensing electrode 17 of the second semiconductor element 10B and the first terminal of the second resistor 152.

Configuration of Semiconductor Device

Figure 26A:
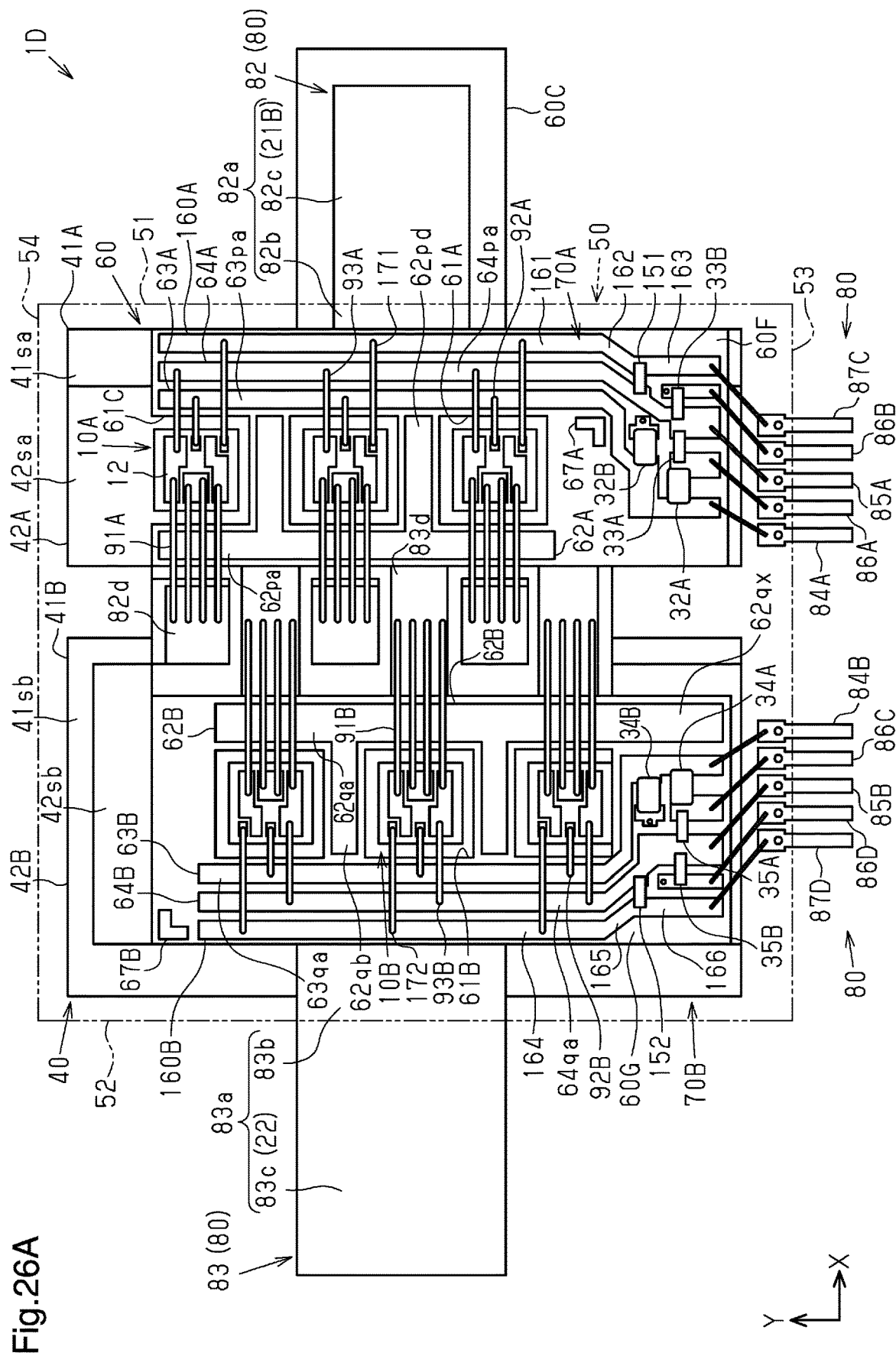
FIG. 26A is a plan view showing the semiconductor device in accordance with the fourth embodiment in a state in which a resin member is removed from the semiconductor device.

As shown in FIG. 26A, the semiconductor device 1D includes a first overcurrent detection wire 160A and a second overcurrent detection wire 160B. The first overcurrent detection wire 160A is formed in the fifth substrate layer 60F, and the second overcurrent detection wire 160B is formed in the fifth substrate layer 60G. Further, the semiconductor device 1D includes a first overcurrent detection lead 87C, instead of the first short-circuiting detection lead 87A, and a second overcurrent detection lead 87D, instead of the second short-circuiting detection lead 87B. The first overcurrent detection lead 87C forms the first overcurrent detection terminal 26C shown in FIG. 29, and the second overcurrent detection lead 87D forms the second overcurrent detection terminal 26D shown in FIG. 29.

Figure 26B:
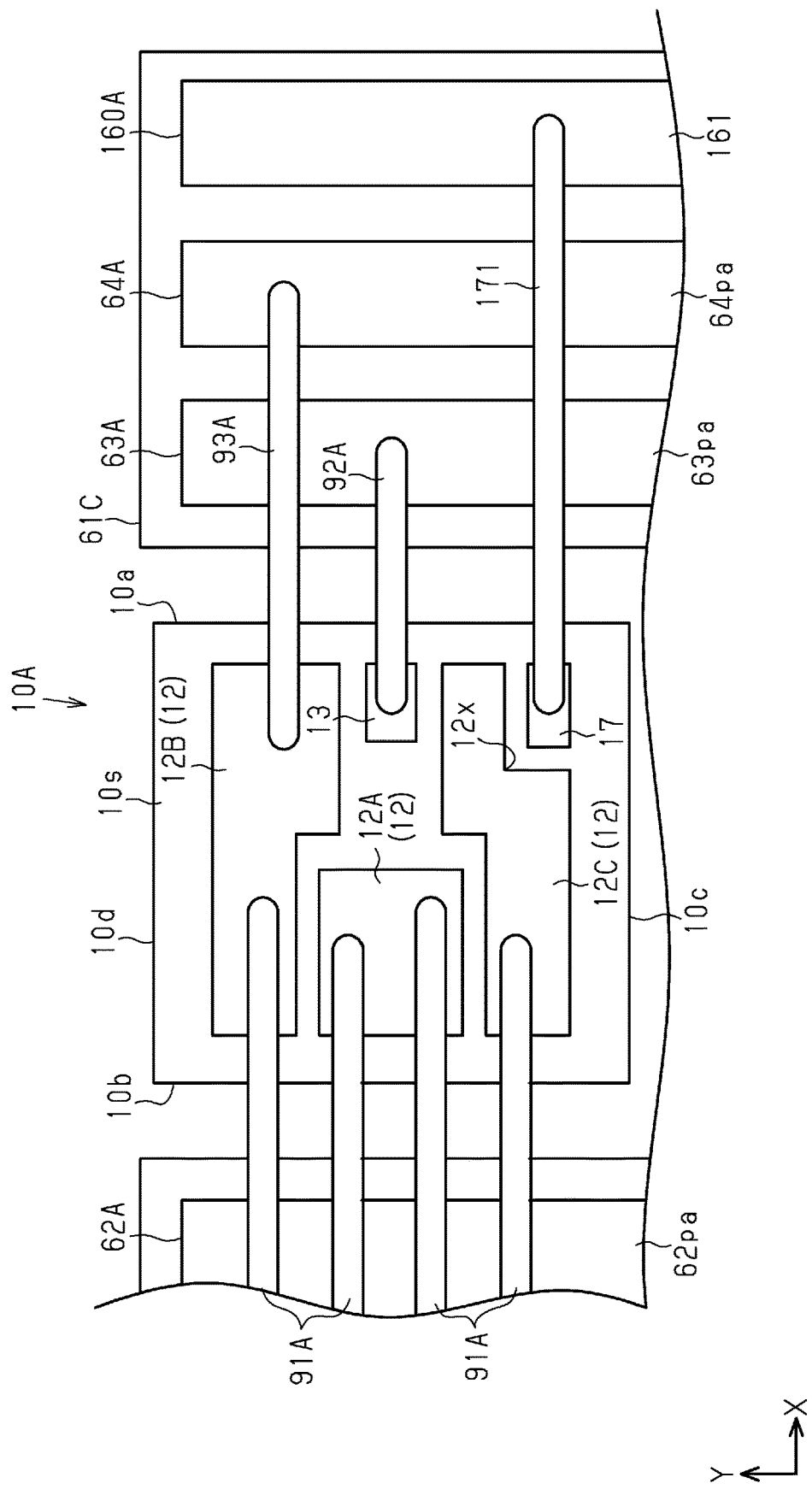
FIG. 26B is an enlarged view of a semiconductor element shown in FIG. 26A.

As shown in FIGS. 26A and 26B, the electrode configuration on the element main surface 10s of each of the semiconductor elements 10A and 10B differs from the electrode configuration on the element main surface 10s of each of the semiconductor elements 10A and 10B. The electrode configuration on the element main surface 10s of each of the semiconductor elements 10A and 10B in the present embodiment will now be described. The electrode configuration on the element main surface 10s is the same in each of the semiconductor elements 10A and 10B. Thus, the electrode configuration on the element main surface 10s of the first semiconductor element 10A will be described and the electrode configuration on the element main surface 10s of the second semiconductor element 10B will not be described.

As shown in FIG. 26B, the first semiconductor elements 10A of the present embodiment each include four element side surfaces 10a to 10d. The four element side surfaces 10a to 10d are each located between the element main surface 10s and the element back surface 10r (refer to FIG. 11B) of the first semiconductor element 10A in the thickness direction Z and extend in a direction intersecting the element main surface 10s and the element back surface 10r. The element side surface 10a and the element side surface 10b are spaced apart from each other in the width direction X and faced toward opposite directions in the width direction X. The element side surface 10a is located toward the first control wire 63A from the element side surface 10b. The element side surface 10c and the element side surface 10d are spaced apart from each other in the length direction Y and faced toward opposite directions in the length direction Y.

The source electrode 12, the gate electrode 13, and the current sensing electrode 17 are formed on the element main surface 10s. The source electrode 12 includes a first source electrode 12A, a second source electrode 12B, and a third source electrode 12C. The first source electrode 12A is located toward the element side surface 10b in the width direction X from the central portion of the element main surface 10s in the width direction X. Further, the first source electrode 12A is located in the central portion of the element main surface 10s in the length direction Y. The shape of the first source electrode 12A in a plan view is rectangular so that the width direction X is the long-side direction and the length direction Y is the short-side direction. The second source electrode 12B is located toward the element side surface 10d from the first source electrode 12A in the length direction Y. The third source electrode 12C is located toward the element side surface 10c from the first source electrode 12A in the length direction Y. Thus, the first source electrode 12A is located between the second source electrode 12B and the third source electrode 12C in the length direction Y. The second source electrode 12B is L-shaped in a plan view so as to enclose the first source electrode 12A from the side of the element side surface 10d and the side of the element side surface 10a. The third source electrode 12C is generally L-shaped so as to enclose the first source electrode 12A from the side of the element side surface 10c and the side of the element side surface 10a. A cutout 12x is formed in the third source electrode 12C at the end located toward the element side surface 10a and the element side surface 10c. The current sensing electrode 17 is arranged in the cutout 12x. The current sensing electrode 17 is for detecting the current flowing to the source electrode 12 and arranged in the corner of the element main surface 10s located toward the element side surface 10a and the element side surface 10c.

The gate electrode 13 is arranged between the second source electrode 12B and the third source electrode 12C in the length direction Y. The gate electrode 13 is located in the central portion of the element main surface 10s in the length direction Y. The gate electrode 13 is located on the element main surface 10s toward the element side surface 10a in the width direction X. Thus, the gate electrode 13 is spaced apart from the first source electrode 12A in the width direction X.

The first drive connection members 91A are connected to the source electrodes 12A to 12C, respectively. The first drive connection member 91A connected to the second source electrode 12B is connected to a portion of the second source electrode 12B located toward the element side surface 10b in the width direction X. The first drive connection member 91A connected to the third source electrode 12C is connected to a portion of the third source electrode 12C located toward the element side surface 10b in the width direction X. The first control connection member 93A is connected to a portion of the second source electrode 12B located toward the element side surface 10a. The first control connection member 92A is connected to the gate electrode 13. A first drive detection connection member 171 is connected to the current sensing electrode 17.

As shown in FIG. 26A, the direction in which the first semiconductor elements 10A are arranged is opposite to the direction in which the second semiconductor elements 10B are arranged in the width direction X. In further detail, each of the first semiconductor elements 10A is arranged so that the current sensing electrode 17 and the gate electrode 13 are located toward the first control wire 63A (toward first resin side surface 51 of resin member 50), and each of the second semiconductor elements 10B is arranged so that the current sensing electrode 17 and the gate electrode 13 are located toward the second control wire 63B (toward second resin side surface 52 of the resin member 50).

The leads 80 electrically connected to the fifth substrate layer 60F include the first control lead 84A, the first control lead 85A, the first control power lead 86A, the first control power lead 86B, and the first overcurrent detection lead 87C. In the present embodiment, the first overcurrent detection lead 87C, the first control power lead 86B, the first control lead 85A, the first control power lead 86A, and the first control lead 84A are disposed in order from the first resin side surface 51 toward the second resin side surface 52.

The leads 80 electrically connected to the fifth substrate layer 60G include the second control lead 84B, the second control lead 85B, the second control power lead 86C, the second control power lead 86D, and the second overcurrent detection lead 87D. In the present embodiment, the second overcurrent detection lead 87D, the second control power lead 86D, the second control lead 85B, the second control power lead 86C, and the second control lead 84B are disposed in order from the second resin side surface 52 toward the first resin side surface 51.

The first overcurrent detection wire 160A electrically connects the current sensing electrode 17 of each first semiconductor element 10A to the first overcurrent detection lead 87C. The first overcurrent detection wire 160A is arranged in the fifth substrate layer 60F at the end located toward the first resin side surface 51 in the width direction X. The first overcurrent detection wire 160A is arranged at the side of the first control wire 64A opposite to the first control wire 63A in the width direction X. The first overcurrent detection wire 160A is arranged next to the first control wire 64A in the width direction X.

The first overcurrent detection wire 160A is formed in the fifth substrate layer 60F extending from the end located toward the fourth resin side surface 54 to the end located toward the third resin side surface 53. Thus, the first overcurrent detection wire 160A is formed overlapping the first semiconductor elements 10A as viewed in the width direction X.

Figure 27:
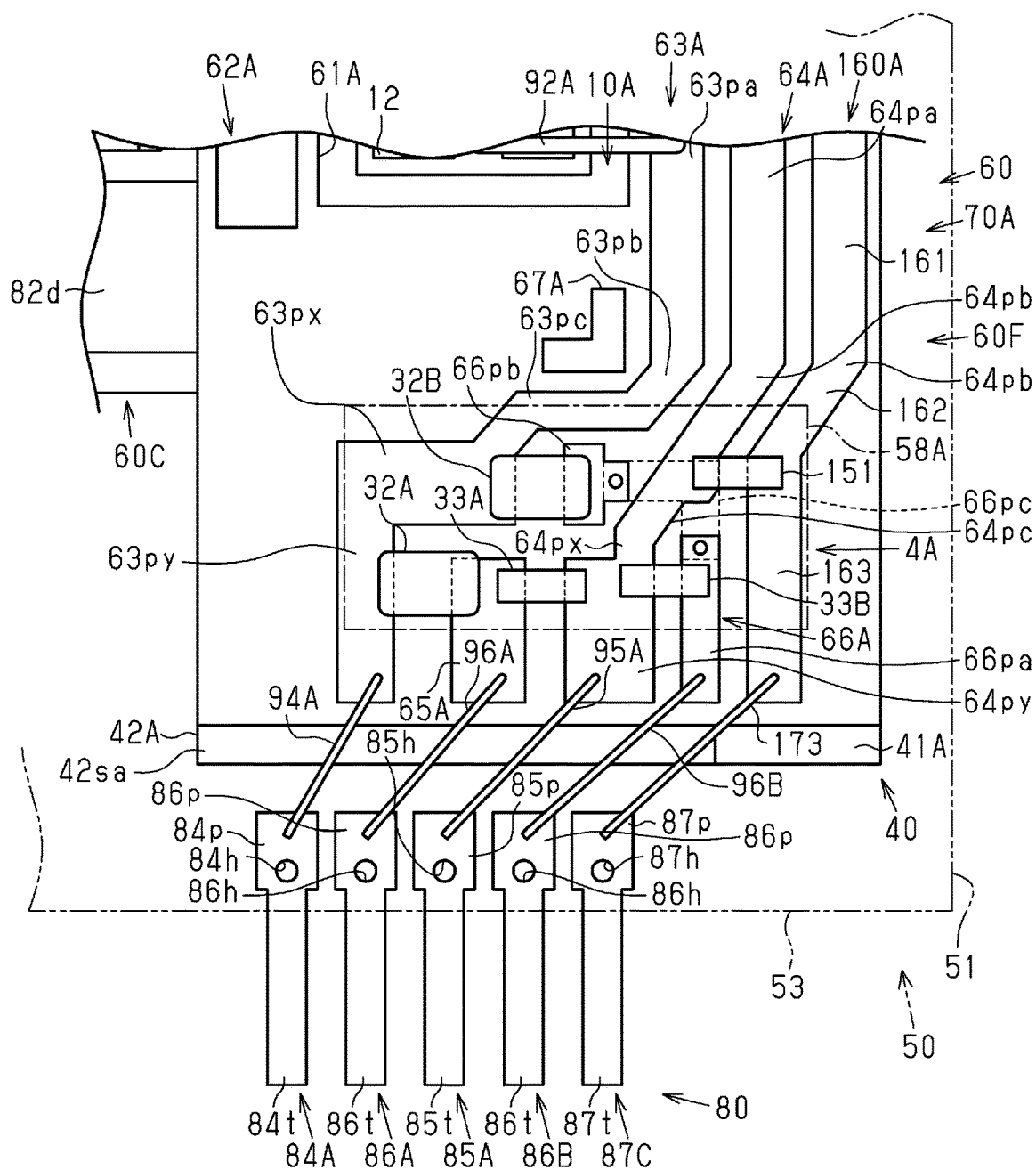
FIG. 27 is an enlarged view of a first wiring region in the semiconductor device shown in FIG. 26A.

As shown in FIGS. 26A and 27, the first overcurrent detection wire 160A includes a first wire portion 161, a second wire portion 162, and a third wire portion 163. In the present embodiment, the first overcurrent detection wire 160A is a single component in which the first wire portion 161, the second wire portion 162, and the third wire portion 163 are formed integrally.

The first wire portion 161 extends in the length direction Y. The first wire portion 161 extends overlapping the first semiconductor elements 10A as viewed in the width direction X. The first wire portion 161 is arranged next to the first wire portion 64pa of the first control wire 64A in the width direction X. The first wire portion 161 extends in the length direction Y from outside the first wiring region 70A to inside the first wiring region 70A. The first drive detection connection members 171, which are electrically connected to the current sensing electrodes 17 of the first semiconductor elements 10A, are formed on the first wire portion 161. The first drive detection connection members 171 are, for example, wires formed through wire bonding. Each first drive detection connection member 171 extends in the width direction X in a plan view.

The second wire portion 162 and the third wire portion 163 are each arranged in the first wiring region 70A. That is, in a plan view, the second wire portion 162 and the third wire portion 163 are each arranged between the first semiconductor elements 10A and the first control lead 84A in the length direction Y. Further, in a plan view, the second wire portion 162 and the third wire portion 163 are each arranged between the first semiconductor elements 10A and the first control lead 85A in the length direction Y. Thus, in a plan view, the second wire portion 162 and the third wire portion 163 are each arranged between the first semiconductor elements 10A and the leads 80.

The second wire portion 162 extends diagonally so that the third resin side surface 53 becomes closer as the second resin side surface 52 becomes closer. The second wire portion 162 is formed overlapping the second wire portion 64pb of the first control wire 64A as viewed in the width direction X. The first resistor 151 is mounted on the second wire portion 162 and the second wire portion 64pb. More specifically, the first terminal of the first resistor 151 is connected to the second wire portion 162, and the second terminal of the first resistor 151 is connected to the second wire portion 64pb.

The third wire portion 163 extends in the length direction Y. The third wire portion 163 is arranged toward the first resin side surface 51 from the first control power wire 66A. The third wire portion 163 is arranged next to the first wire portion 66pa of the first control power wire 66A in the width direction X. A first overcurrent detection connection member 173 that is electrically connected to the first overcurrent detection lead 87C is formed on the third wire portion 163. The first overcurrent detection connection member 173 is, for example, a wire formed through wire bonding.

As shown in FIG. 26A, the second overcurrent detection wire 160B electrically connects the current sensing electrode 17 of each second semiconductor element 10B to the second overcurrent detection lead 87D. The second overcurrent detection wire 160B is arranged in the fifth substrate layer 60G at the end located toward the second resin side surface 52 in the width direction X. The second overcurrent detection wire 160B is arranged at the side of the second control wire 64B opposite to the second control wire 63B in the width direction X. The second overcurrent detection wire 160B is arranged next to the second control wire 64B in the width direction X.

The second overcurrent detection wire 160B is formed in the fifth substrate layer 60G extending from the end located toward the fourth resin side surface 54 to the end located toward the third resin side surface 53. Thus, the second overcurrent detection wire 160B is formed overlapping the second semiconductor elements 10B as viewed in the width direction X.

Figure 28:
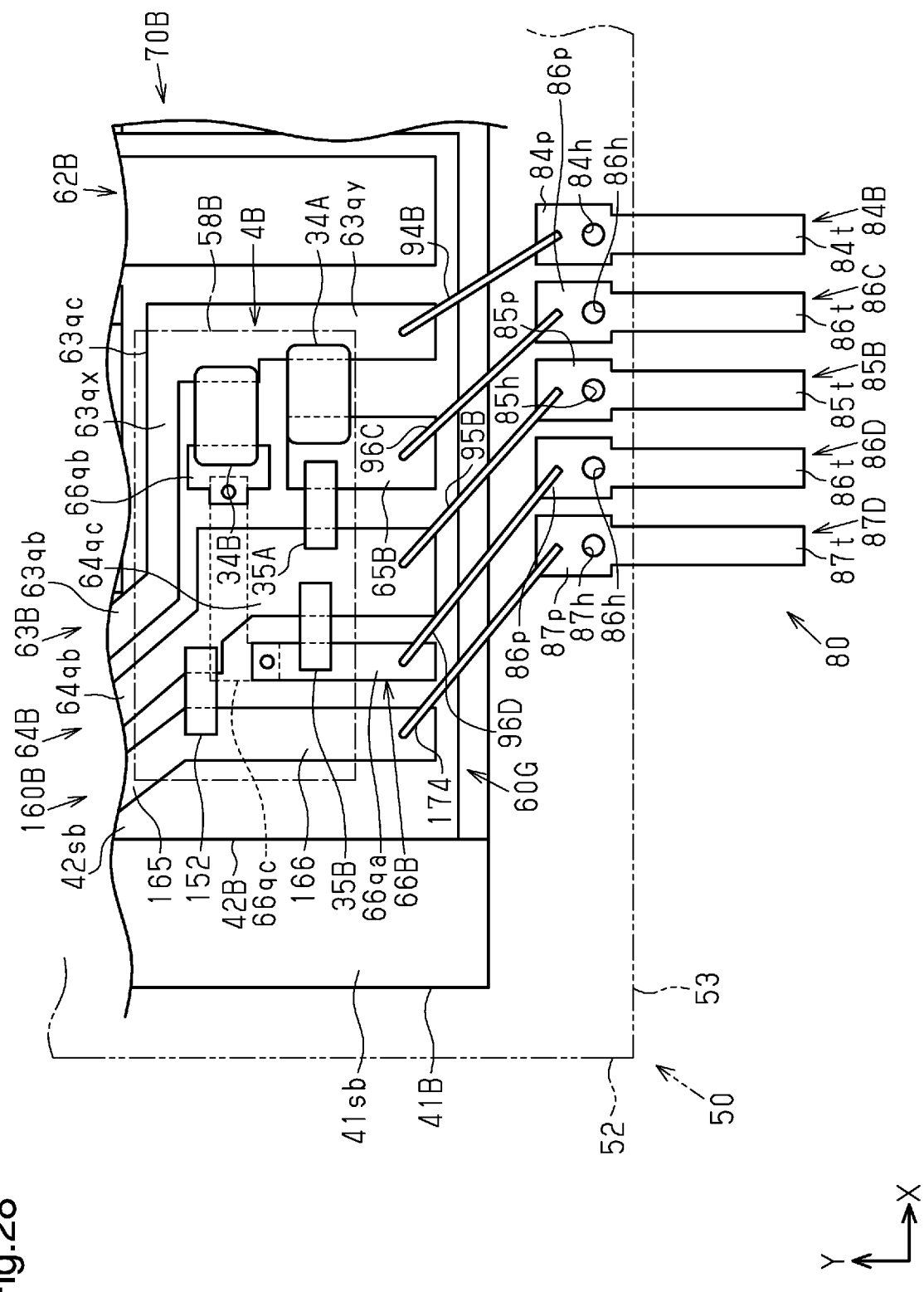
FIG. 28 is an enlarged view of a second wiring region in the semiconductor device shown in FIG. 26A.

As shown in FIGS. 26A and 28, the second overcurrent detection wire 160B includes a first wire portion 164, a second wire portion 165, and a third wire portion 166. In the present embodiment, the second overcurrent detection wire 160B is a single component in which the first wire portion 164, the second wire portion 165, and the third wire portion 166 are formed integrally.

The first wire portion 164 extends in the length direction Y. The first wire portion 164 extends overlapping the second semiconductor elements 10B in the width direction X. The first wire portion 164 is arranged next to the first wire portion 64qa of the second control wire 64B in the width direction X. The first wire portion 164 extends in the length direction Y from outside the second wiring region 70B to inside the second wiring region 70B. Second drive detection connection members 172, which are electrically connected to the current sensing electrodes 17 of the second semiconductor elements 10B, are formed in the first wire portion 164. The second drive detection connection members 172 are, for example, wires formed through wire bonding. Each second drive detection connection member 172 extends in the width direction X in a plan view.

The second wire portion 165 and the third wire portion 166 are each arranged in the second wiring region 70B. That is, in a plan view, the second wire portion 165 and the third wire portion 166 are each arranged between the second semiconductor elements 10B and the second control lead 84B in the length direction Y. Further, in a plan view, the second wire portion 165 and the third wire portion 166 are each arranged between the second semiconductor elements 10B and the second control lead 85B in the length direction Y. Thus, in a plan view, the second wire portion 165 and the third wire portion 166 are each arranged between the second semiconductor elements 10B and the leads 80 in the length direction Y.

The second wire portion 165 extends diagonally so that the third resin side surface 53 becomes closer as the first resin side surface 51 becomes closer. The second wire portion 165 is formed overlapping the second wire portion 64qb of the second control wire 64B in the width direction X.

The third wire portion 166 extends in the length direction Y. The third wire portion 166 is arranged toward the second resin side surface 52 from the second control power wire 66B. The third wire portion 166 is arranged next to the first wire portion 66qa of the second control power wire 66B in the width direction X. The second resistor 152 is mounted on the third wire portion 166 and the second wire portion 64qb. More specifically, the first terminal of the second resistor 152 is connected to the third wire portion 166 and the second terminal of the second resistor 152 is connected to the second wire portion 64qb. A second overcurrent detection connection member 174 that is electrically connected to the second overcurrent detection lead 87D is formed on the third wire portion 166. The second overcurrent detection connection member 174, is, for example, a wire formed through wire bonding.

The detection connection members 171 and 172 and the overcurrent detection connection members 173 and 174 are each formed from copper (Cu) or aluminum (Al). In the present embodiment, the detection connection members 171 and 172 and the overcurrent detection connection members 173 and 174 are formed from the same material as the drive connection members 91A and 91B, the control connection members 92A, 92B, 93A, and 93B, the control lead connection members 94A, 94B, 95A, and 95B, and the control power connection members 96A to 96D. Further, the detection connection members 171 and 172 have equal diameters. The overcurrent detection connection members 173 and 174 have equal diameters. The diameters of the detection connection members 171 and 172 are equal to the diameters of the overcurrent detection connection members 173 and 174. In the present embodiment, the diameters of the detection connection members 171 and 172 and the overcurrent detection connection members 173 and 174 are equal to the diameters of the drive connection members 91A and 91B, the control connection members 92A, 92B, 93A, and 93B, the control lead connection members 94A, 94B, 95A, and 95B, and the control power connection members 96A to 96D.

Figure 25:
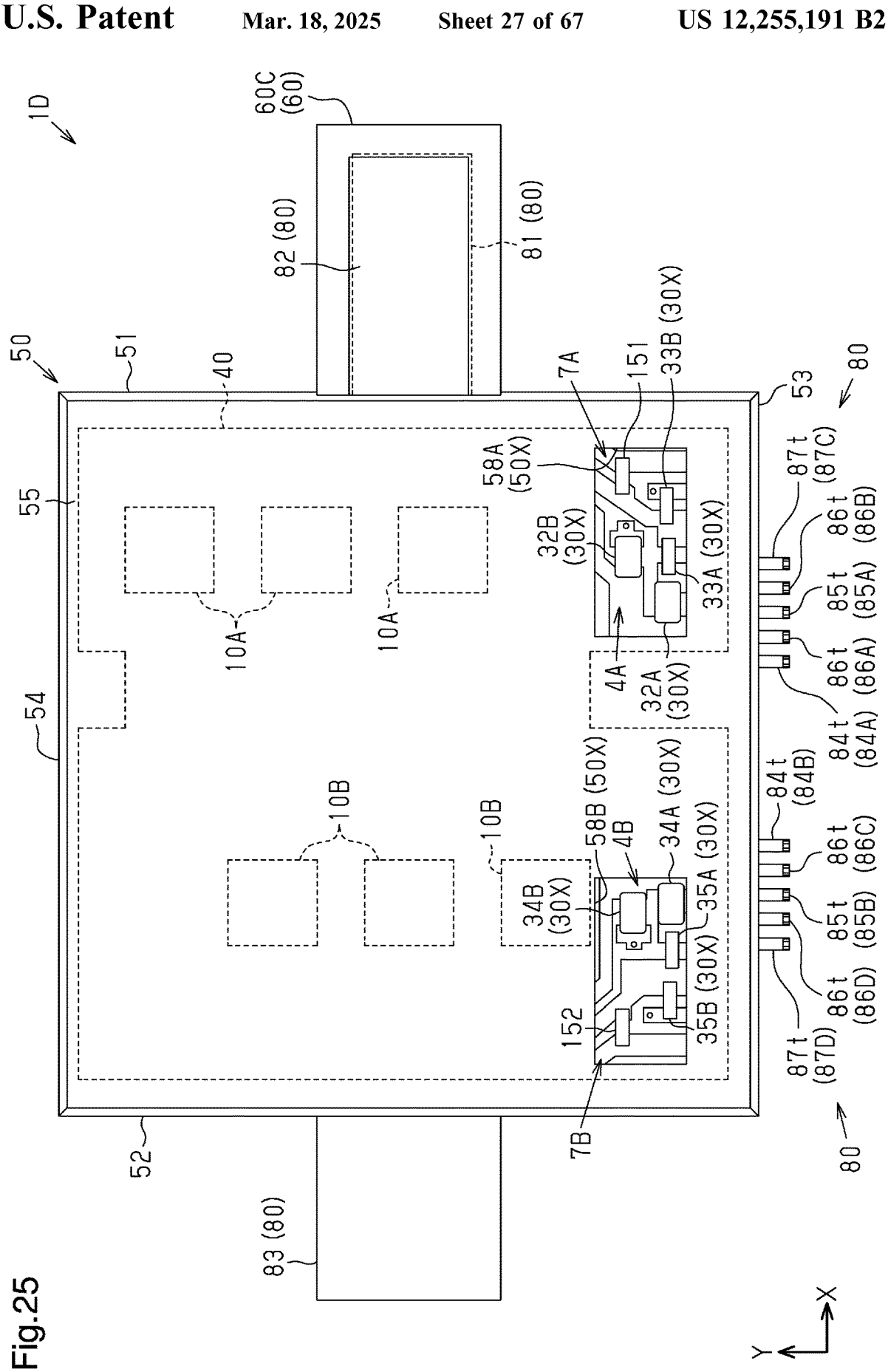
FIG. 25 is a plan view of a semiconductor device in accordance with a fourth embodiment.

As shown in FIG. 25, the resin member 50 includes two resin openings that expose the conductive substrate 60 from the top resin surface 55, namely, the first control side opening 58A and the second control side opening 58B. As shown in FIG. 25, the first control side opening 58A is separate from the second control side opening 58B.

The first control side opening 58A is located at a position overlapping the first semiconductor elements 10A as viewed in the length direction Y and toward the third resin side surface 53 from the first semiconductor elements 10A. The second control side opening 58B is located at a position overlapping the second semiconductor elements 10B as viewed in the length direction Y and toward the third resin side surface 53 from the second semiconductor elements 10B. In this manner, the first control side opening 58A and the second control side opening 58B are arranged along one side of the resin member 50 in a state spaced apart from each other in a plan view. That is, in a plan view, the first control side opening 58A and the second control side opening 58B are arranged to align with each other in the length direction Y and spaced apart in the width direction X. In a plan view, the control side openings 58A and 58B are arranged in the top resin surface 55 at the end located toward the third resin side surface 53. The first control side opening 58A is located toward the first resin side surface 51 from the second control side opening 58B.

In a plan view, the first control side opening 58A is located between the first semiconductor elements 10A and the terminal portion 84t of the first control lead 84A in the length direction Y. In the present embodiment, as shown in FIG. 27, in a plan view, the first control side opening 58A is located between the first semiconductor elements 10A and the pad portion 84p of the first control lead 84A in the length direction Y. Further, in a plan view, the first control side opening 58A is located between the first semiconductor elements 10A and the terminal portion 85t of the first control lead 85A in the length direction Y. In the present embodiment, the first control side opening 58A is located between the first semiconductor elements 10A and the pad portion 85p of the first control lead 85A in the length direction Y.

As shown in FIG. 27, the first control side opening 58A exposes part of the first wiring region 70A of the conductive substrate 60. Thus, the first control side opening 58A exposes part of a mounting region in the conductive substrate 60 (fifth substrate layer 60F) on which electronic components other than the first semiconductor elements 10A are mounted. The first control side opening 58A exposes an area of the first wiring region 70A located toward the third resin side surface 53. In the present embodiment, the first control side opening 58A exposes the first surge reduction circuit 4A and the first current detection circuit 7A, which are electrically connected to the first semiconductor elements 10A. In further detail, as shown in FIG. 27, the first control side opening 58A exposes the first low-voltage diodes 32A and 32B, the first capacitors 33A and 33B, the third wire portion 63pc of the first control wire 63A, the third wire portion 64pc of the first control wire 64A, the first control power wire 65A, and the first control power wire 66A. Further, the first control side opening 58A exposes the first resistor 151 and the second wire portion 162 and third wire portion 163 of the first overcurrent detection wire 160A. In the present embodiment, the first control side opening 58A does not expose the first control lead connection members 94A and 95A, the first control power connection members 96A and 96B, and the first overcurrent detection connection member 173. The shape of the first control side opening 58A in a plan view, although not limited in particular, is rectangular so that the width direction X is the long-side direction and the length direction Y is the short-side direction. The interior of the first control side opening 58A is an open space.

In a plan view, the second control side opening 58B is located between the second semiconductor elements 10B and the terminal portion 84t of the second control lead 84B in the length direction Y. In the present embodiment, as shown in FIG. 28, the second control side opening 58B is located between the second semiconductor elements 10B and the pad portion 84p of the second control lead 84B in the length direction Y in a plan view. Further, in a plan view, the second control side opening 58B is located between the second semiconductor elements 10B and the terminal portion 85t of the second control lead 85B in the length direction Y. In the present embodiment, the second control side opening 58B is located between the second semiconductor elements 10B and the pad portion 85p of the second control lead 85B in the length direction Y in a plan view.

As shown in FIG. 28, the second control side opening 58B exposes part of the second wiring region 70B of the conductive substrate 60. Thus, the second control side opening 58B exposes part of a mounting region in the conductive substrate 60 (fifth substrate layer 60G) on which electronic components other than the second semiconductor elements 10B are mounted. The second control side opening 58B exposes an area of the second wiring region 70B located toward the third resin side surface 53. In the present embodiment, the second control side opening 58B exposes the second surge reduction circuit 4B and second current detection circuit 7B, which are electrically connected to the second semiconductor elements 10B. In further detail, the second control side opening 58B exposes the second low-voltage diodes 34A and 34B, the second capacitors 35A and 35B, the third wire portion 63pc of the second control wire 63B, the third wire portion 64qc of the second control wire 64B, the second control power wire 65B, and the second control power wire 66B. Further, the second control side opening 58B exposes the second resistor 152 and the second wire portion 165 and third wire portion 166 of the second overcurrent detection wire 160B. In the present embodiment, the second control side opening 58B does not expose the second control lead connection members 94B and 95B, the second control power connection members 96C and 96D, and the second overcurrent detection connection member 174. The shape of the second control side opening 58B in a plan view, although not limited in particular, is rectangular so that the width direction X is the long-side direction and the length direction Y is the short-side direction. The interior of the second control side opening 58B is an open space.

In addition to the advantages of the semiconductor device 1A in accordance with the first embodiment, the semiconductor device 1D in accordance with the present embodiment has the advantage described below.

(4-1) The semiconductor device 1D includes the first current detection circuit 7A and the second current detection circuit 7B. With this configuration, by detecting the current flowing to the first semiconductor elements 10A and the second semiconductor elements 10B, the first semiconductor elements 10A and the second semiconductor elements 10B may be controlled to be deactivated or the like when overcurrent flows to the first semiconductor elements 10A and the second semiconductor elements 10B. This avoids the occurrence of defects in the first semiconductor elements 10A and the second semiconductor elements 10B.

Fifth Embodiment

With reference to FIGS. 30 to 34, a semiconductor device 1E in accordance with a fifth embodiment will now be described. The semiconductor device 1E in accordance with the present embodiment mainly differs from the semiconductor device 1C in accordance with the third embodiment in that the current detection circuits 7A and 7B are used instead of the short-circuiting detection circuits 3A and 3B and in that the semiconductor elements 10A and 10B of the fourth embodiment are used. In the description hereafter, same reference numerals are given to those components that are the same as the corresponding components of the semiconductor device 1C in the third embodiment. Such components will not be described in detail.

Circuit Configuration of Semiconductor Device

Figure 34:
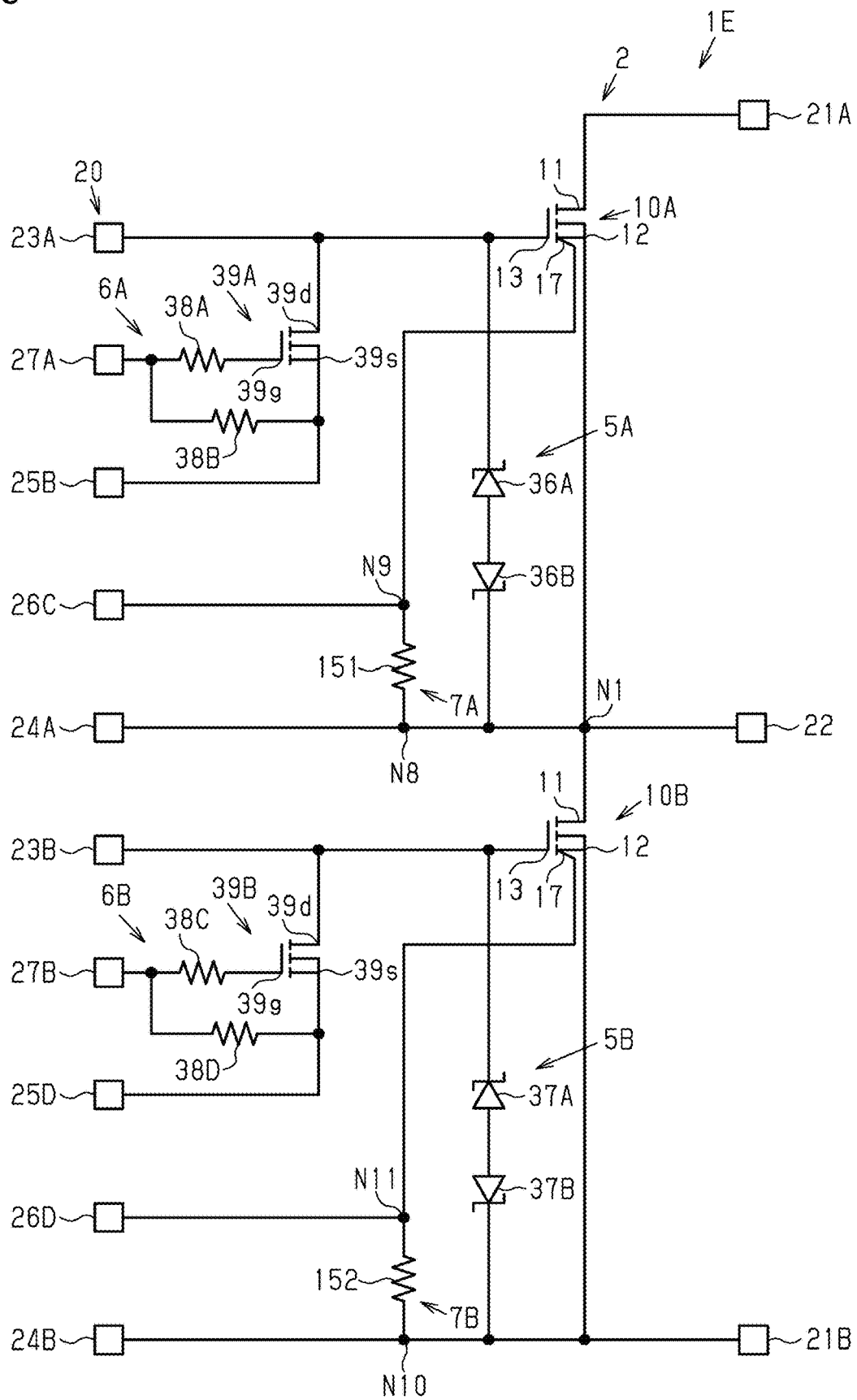
FIG. 34 is a circuit diagram of the semiconductor device shown in FIG. 30.

As shown in FIG. 34, the terminals 20 include the first overcurrent detection terminal 26C and the second overcurrent detection terminal 26D instead of the first short-circuiting detection terminal 26A and the second short-circuiting detection terminal 26B. The first overcurrent detection terminal 26C, which is for detecting whether overcurrent is flowing to the first semiconductor element 10A, is electrically connected to the current sensing electrode 17 of the first semiconductor element 10A. The second overcurrent detection terminal 26D, which is for detecting whether overcurrent is flowing to the second semiconductor element 10B, is electrically connected to the current sensing electrode 17 of the second semiconductor element 10B.

The first current detection circuit 7A, which detects the current flowing to the first semiconductor element 10A, includes the first resistor 151. The first terminal of the first resistor 151 is connected to the current sensing electrode 17 of the first semiconductor element 10A. The second terminal of the first resistor 151 is electrically connected to a node N8 between the cathode electrode of the second low-voltage diode 37A and the first source terminal 24A. The first overcurrent detection terminal 26C is electrically connected to a node N9 between the current sensing electrode 17 of the first semiconductor element 10A and the first terminal of the first resistor 151.

The second current detection circuit 7B detects the current flowing to the second semiconductor element 10B and includes a second resistor 152. The first terminal of the second resistor 152 is electrically connected to the current sensing electrode 17 of the second semiconductor element 10B. The second terminal of the second resistor 152 is electrically connected to a node N10 between the cathode electrode of the second low-voltage diode 37B and the second source terminal 24B. The second overcurrent detection terminal 26D is electrically connected to a node N11 between the current sensing electrode 17 of the second semiconductor element 10B and the first terminal of the second resistor 152.

Configuration of Semiconductor Device

Figure 31:
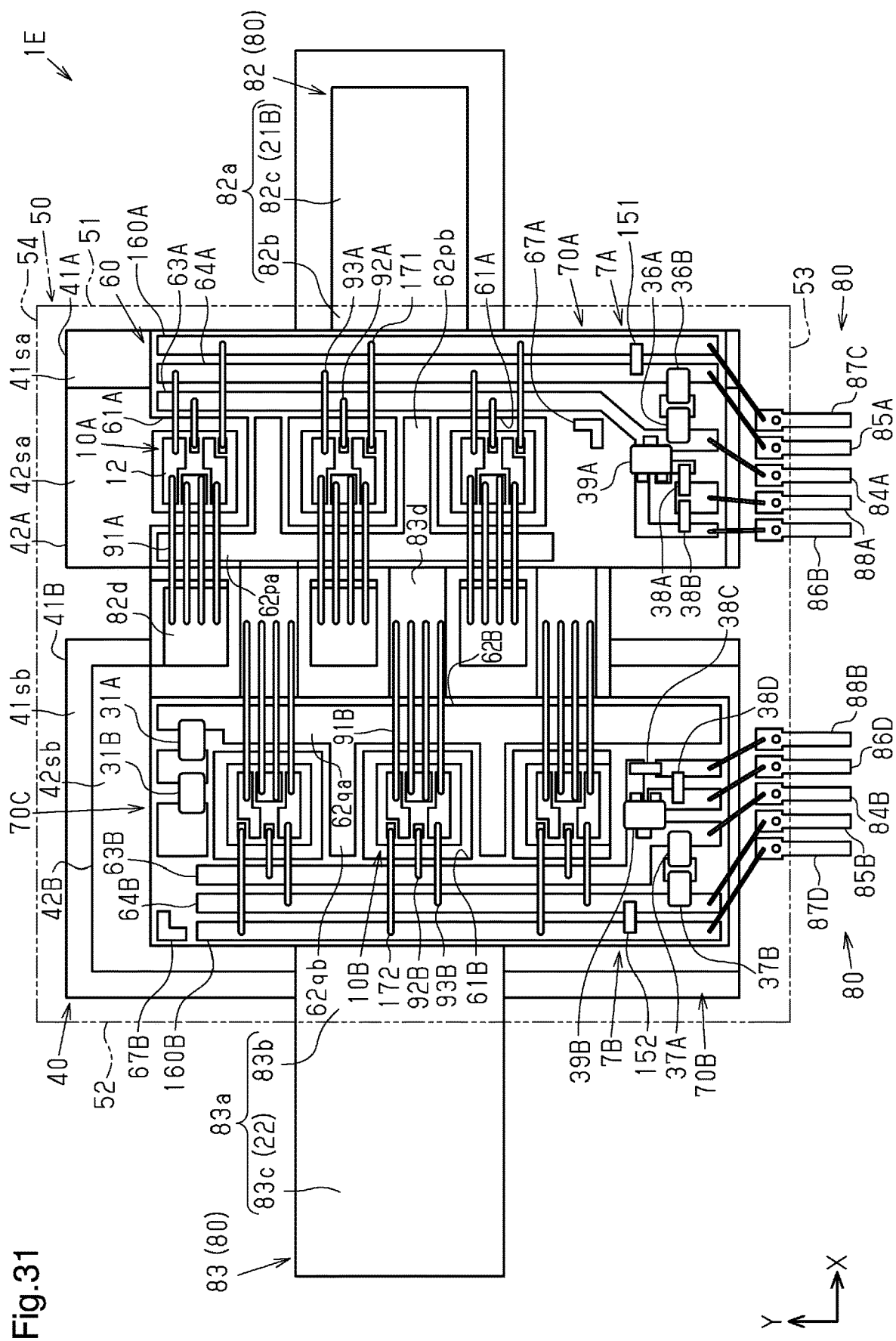
FIG. 31 is a plan view showing the semiconductor device in accordance with the fifth embodiment in a state in which a resin member is removed from the semiconductor device.

As shown in FIG. 31, the semiconductor device 1E includes the first overcurrent detection wire 160A and the second overcurrent detection wire 160B. The first overcurrent detection wire 160A is formed in the fifth substrate layer 60F, and the second overcurrent detection wire 160B is formed in the fifth substrate layer 60G. Further, the semiconductor device 1E includes the first overcurrent detection lead 87C, instead of the first short-circuiting detection lead 87A, and the second overcurrent detection lead 87D, instead of the second short-circuiting detection lead 87B. The first overcurrent detection lead 87C forms the first overcurrent detection terminal 26C shown in FIG. 34, and the second overcurrent detection lead 87D forms the second overcurrent detection terminal 26D shown in FIG. 34.

The leads 80 electrically connected to the fifth substrate layer 60F include the first control lead 84A, the first control lead 85A, the first control power lead 86B, the first interface lead 88A, and the first overcurrent detection lead 87C. In the present embodiment, the first overcurrent detection lead 87C, the first control lead 85A, the first control lead 84A, the first interface lead 88A, and the first control power lead 86B are disposed in order from the first resin side surface 51 toward the second resin side surface 52.

The leads 80 electrically connected to the fifth substrate layer 60G include the second control lead 84B, the second control lead 85B, the second control power lead 86D, the second interface lead 88B, and the second overcurrent detection lead 87D. In the present embodiment, the second overcurrent detection lead 87D, the second control lead 85B, the second control lead 84B, the second control power lead 86D, and the second interface lead 88B are disposed in order from the second resin side surface 52 toward the first resin side surface 51.

The first overcurrent detection wire 160A electrically connects the current sensing electrode 17 of each first semiconductor element 10A to the first overcurrent detection lead 87C. The first overcurrent detection wire 160A is arranged in the fifth substrate layer 60F at the end located toward the first resin side surface 51 in the width direction X. The first overcurrent detection wire 160A is arranged at the side of the first control wire 64A opposite to the first control wire 63A in the width direction X. the first overcurrent detection wire 160A is arranged next to the first control wire 64A in the width direction X.

The first overcurrent detection wire 160A is formed in the fifth substrate layer 60F extending from the end located toward the fourth resin side surface 54 to the end located toward the third resin side surface 53. Thus, the first overcurrent detection wire 160A is formed overlapping the first semiconductor elements 10A as viewed in the width direction X. Further, the first overcurrent detection wire 160A extends in the length direction Y from outside the first wiring region 70A to inside the first wiring region 70A.

The first drive detection connection members 171, which are electrically connected to the current sensing electrodes 17 of the first semiconductor elements 10A, are formed in the portion of the first overcurrent detection wire 160A opposing the first semiconductor elements 10A in the width direction X. The first drive detection connection members 171 are, for example, wires formed through wire bonding. Each first drive detection connection member 171 extends in the width direction X in a plan view.

The first resistor 151 is mounted on the first overcurrent detection wire 160A, at a portion corresponding to the first wiring region 70A, and the first control wire 64A, at a portion corresponding to the first wiring region 70A. The first terminal of the first resistor 151 is connected to the first overcurrent detection wire 160A, and the second terminal of the first resistor 151 is connected to the first control wire 64A. The first resistor 151 is located toward the fourth resin side surface 54 (toward first semiconductor elements 10A) from the low-voltage diodes 36A and 36B in the length direction Y. The first resistor 151 is overlapped with the first switching element 39A as viewed in the width direction X. The first resistor 151 is located toward the first resin side surface 51 from the first low-voltage diode 36B in the width direction X.

The first overcurrent detection connection member 173, which is electrically connected to the first overcurrent detection lead 87C, is formed on the end of the first overcurrent detection wire 160A that is located toward the third resin side surface 53 in the length direction Y. The first overcurrent detection connection member 173 is, for example, a wire formed through wire bonding.

Figure 33:
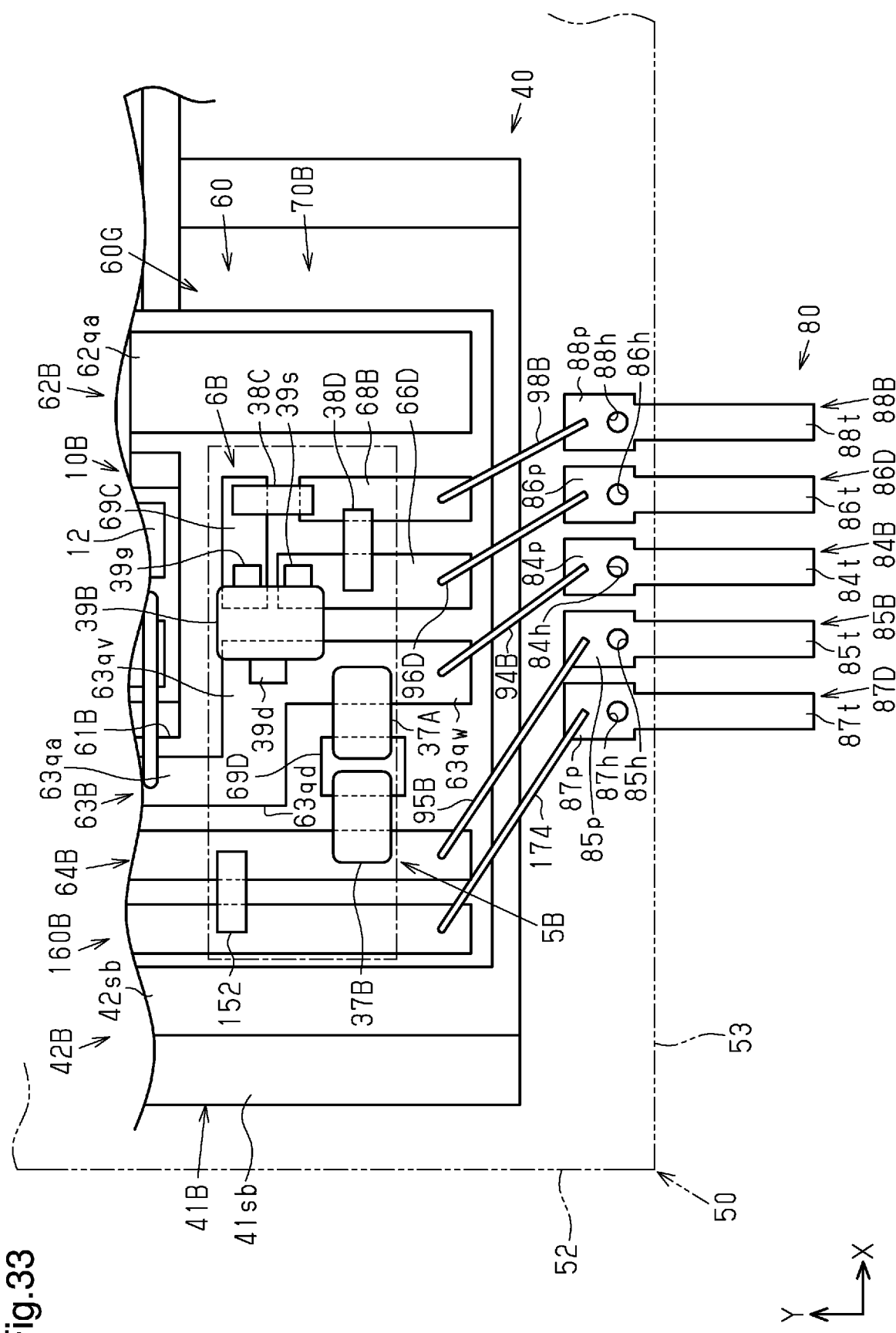
FIG. 33 is an enlarged view of a second wiring region in the semiconductor device shown in FIG. 32.

As shown in FIG. 33, the second overcurrent detection wire 160B electrically connects the current sensing electrode 17 of each second semiconductor element 10B to the second overcurrent detection lead 87D. The second overcurrent detection wire 160B is arranged in the fifth substrate layer 60G at the end located toward the second resin side surface 52 in the width direction X. The second overcurrent detection wire 160B is arranged at the side of the second control wire 64B opposite to the second control wire 63B in the width direction X. The second overcurrent detection wire 160B is arranged next to the second control wire 64B in the width direction X.

The second overcurrent detection wire 160B is formed in the fifth substrate layer 60G extending from the end located toward the fourth resin side surface 54 to the end located toward the third resin side surface 53. Thus, the second overcurrent detection wire 160B is formed overlapping the second semiconductor elements 10B as viewed in the width direction X. Further, the second overcurrent detection wire 160B extends in the length direction Y from outside the second wiring region 70B to inside the second wiring region 70B.

The second drive detection connection members 172, which are electrically connected to the current sensing electrodes 17 of the second semiconductor elements 10B, are formed in the portion of the second overcurrent detection wire 160B opposing the second semiconductor elements 10B in the width direction X. The second drive detection connection members 172 are, for example, wires formed through wire bonding. Each second drive detection connection member 172 extends in the width direction X in a plan view.

The second resistor 152 is mounted on the second overcurrent detection wire 160B, at a portion corresponding to the second wiring region 70B, and the second control wire 64B, at a portion corresponding to the second wiring region 70B. The first terminal of the second resistor 152 is connected to the second overcurrent detection wire 160B, and the second terminal of the second resistor 152 is connected to the second control wire 64B. The second resistor 152 is located toward the fourth resin side surface 54 (toward second semiconductor elements 10B) from the low-voltage diodes 37A and 37B in the length direction Y. The second resistor 152 is overlapped with the second switching element 39B and the second resistor 38C as viewed in the width direction X. The first resistor 151 is located toward the first resin side surface 51 from the second low-voltage diode 37B in the width direction X.

The second overcurrent detection connection member 174, which is electrically connected to the second overcurrent detection lead 87D, is formed on the end of the second overcurrent detection wire 160B that is located toward the third resin side surface 53 in the length direction Y. The second overcurrent detection connection member 174, is, for example, a wire formed through wire bonding.

The detection connection members 171 and 172 and the overcurrent detection connection members 173 and 174 are each formed from copper (Cu) or aluminum (Al). In the present embodiment, the detection connection members 171 and 172 and the overcurrent detection connection members 173 and 174 are formed from the same material as the drive connection members 91A and 91B, the control connection members 92A, 92B, 93A, and 93B, the control lead connection members 94A, 94B, 95A, and 95B, and the control power connection members 96A to 96D. Further, the detection connection members 171 and 172 have equal diameters. The overcurrent detection connection members 173 and 174 have equal diameters. The diameters of the detection connection members 171 and 172 are equal to the diameters of the overcurrent detection connection members 173 and 174.

In the present embodiment, the diameters of the detection connection members 171 and 172 and the overcurrent detection connection members 173 and 174 are equal to the diameters of the drive connection members 91A and 91B, the control connection members 92A, 92B, 93A, and 93B, the control lead connection members 94A, 94B, 95A, and 95B, and the control power connection members 96A to 96D.

Figure 30:
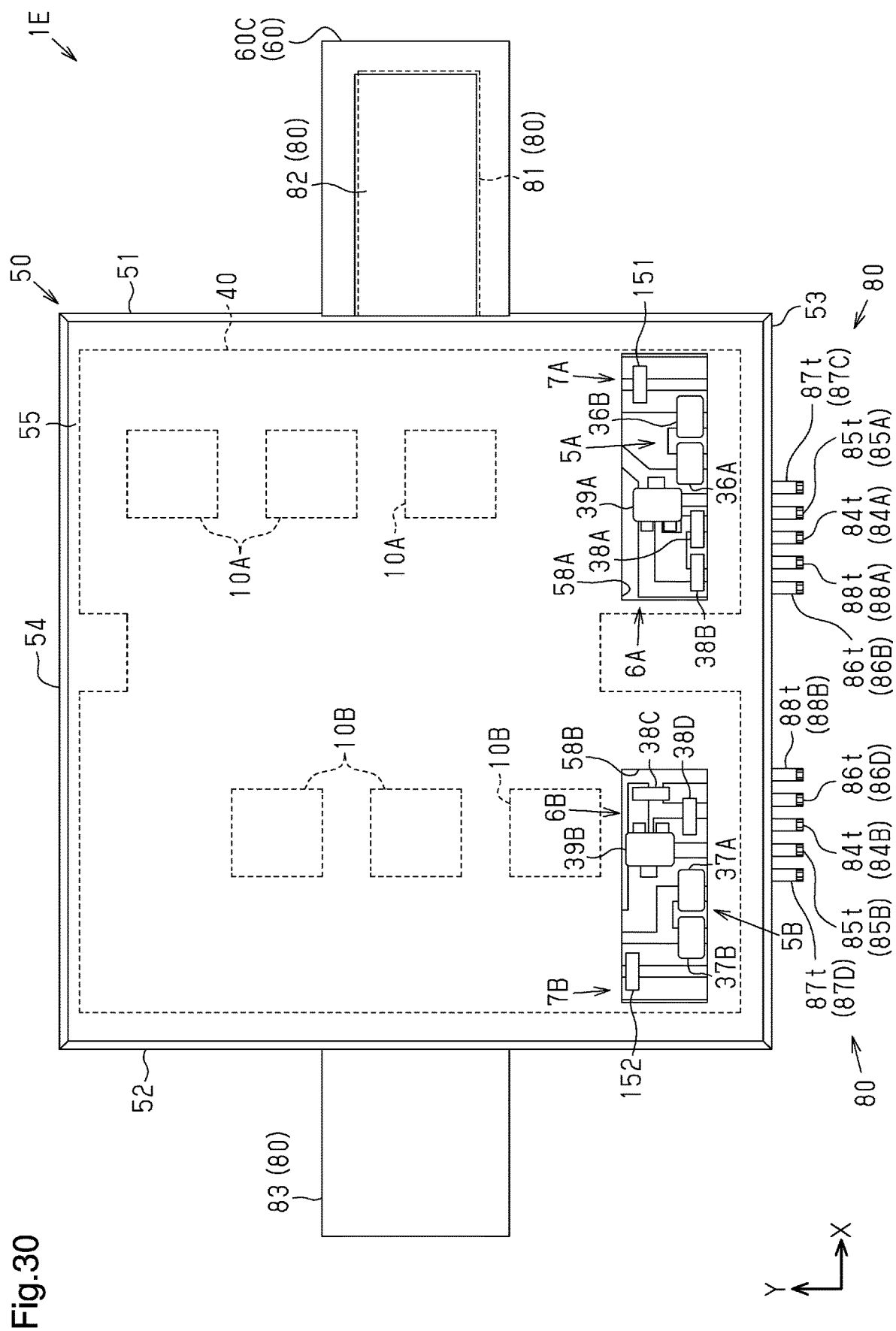
FIG. 30 is a plan view of a semiconductor device in accordance with a fifth embodiment.

As shown in FIG. 30, the resin member 50 includes two resin openings that expose the conductive substrate 60 from the top resin surface 55, namely, the first control side opening 58A and the second control side opening 58B. As shown in FIG. 30, the first control side opening 58A is separate from the second control side opening 58B.

The first control side opening 58A is located at a position overlapping the first semiconductor elements 10A as viewed in the length direction Y and toward the third resin side surface 53 from the first semiconductor elements 10A. The second control side opening 58B is located at a position overlapping the second semiconductor elements 10B as viewed in the length direction Y and toward the third resin side surface 53 from the second semiconductor elements 10B. In this manner, the first control side opening 58A and the second control side opening 58B are arranged along one side of the resin member 50 in a state spaced apart from each other in a plan view. That is, in a plan view, the first control side opening 58A and the second control side opening 58B are arranged to align with each other in the length direction Y and spaced apart in the width direction X. In a plan view, the control side openings 58A and 58B are arranged in the top resin surface 55 at the end located toward the third resin side surface 53. The first control side opening 58A is located toward the first resin side surface 51 from the second control side opening 58B.

Figure 32:
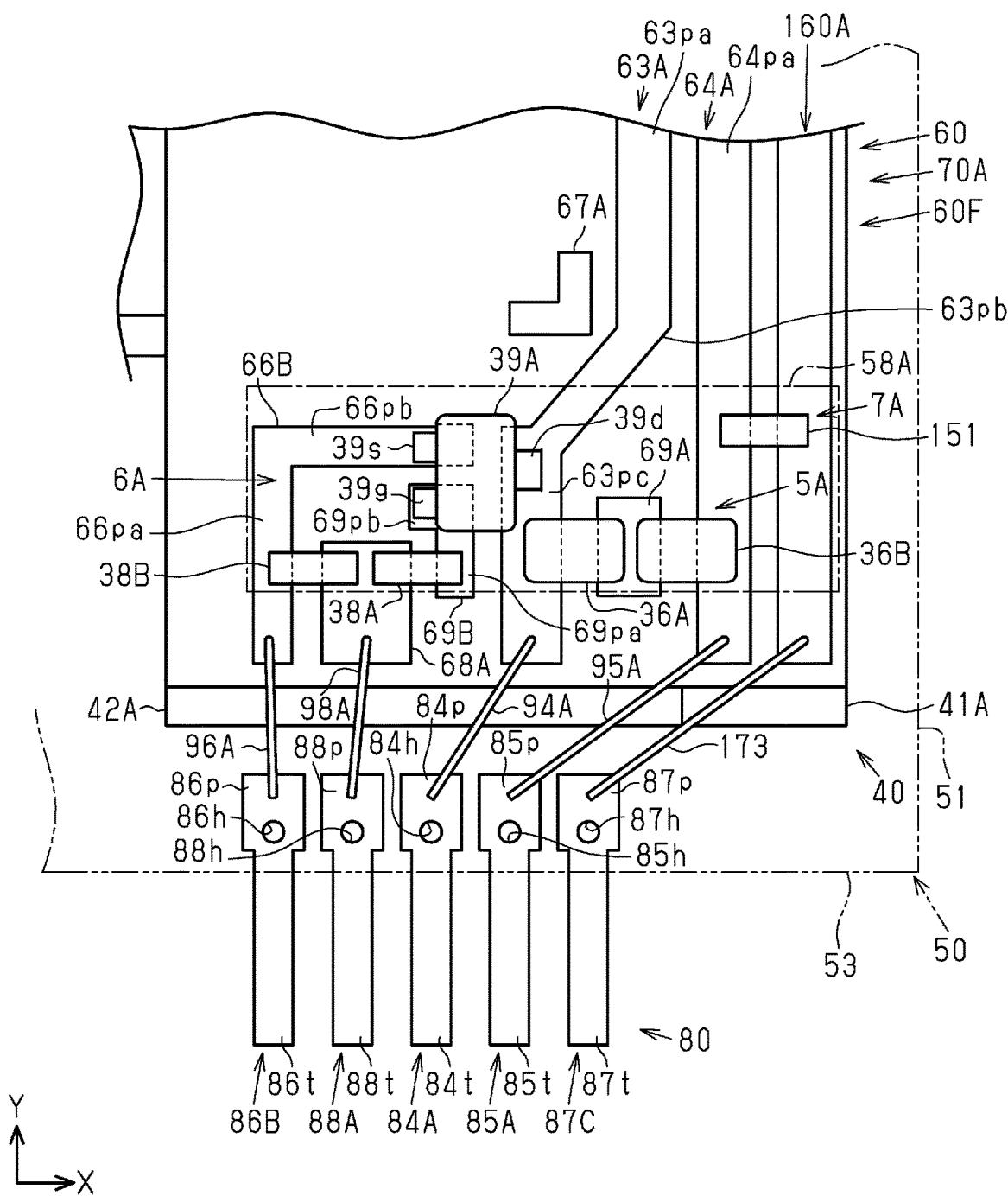
FIG. 32 is an enlarged view of a first wiring region in the semiconductor device shown in FIG. 31.

In a plan view, the first control side opening 58A is located between the first semiconductor elements 10A and the terminal portion 84*t* of the first control lead 84A in the length direction Y. In the present embodiment, as shown in FIG. 32, in a plan view, the first control side opening 58A is located between the first semiconductor elements 10A and the pad portion 84*p* of the first control lead 84A in the length direction Y. Further, in a plan view, the first control side opening 58A is located between the first semiconductor elements 10A and the terminal portion 85*t* of the first control lead 85A in the length direction Y. In the present embodiment, the first control side opening 58A is located between the first semiconductor elements 10A and the pad portion 85*p* of the first control lead 85A in the length direction Y.

The first control side opening 58A exposes part of the first wiring region 70A of the conductive substrate 60. Thus, the first control side opening 58A exposes part of a mounting region in the conductive substrate 60 (fifth substrate layer 60F) on which electronic components other than the first semiconductor elements 10A are mounted. The first control side opening 58A exposes an area of the first wiring region 70A located toward the third resin side surface 53. In the present embodiment, the first control side opening 58A exposes the first interface circuit 6A, the first surge absorption circuit 5A, and the first current detection circuit 7A. In further detail, as shown in FIG. 32, the first control side opening 58A exposes part of the first control wire 63A, part of the first control wire 64A, the first relay wire 69A, part of the second control power wire 66B, part of the first interface wire 68A, the second relay wire 69B, the first low-voltage diodes 36A and 36B, the first resistor 38A, the first resistor 38B, and the first switching element 39A. Further, the first control side opening 58A exposes the first resistor 151 and the first overcurrent detection wire 160A. In the present embodiment, the first control side opening 58A does not expose the first drive wire 62A. The shape of the first control side opening 58A in a plan view, although not limited in particular, is rectangular so that the width direction X is the long-side direction and the length direction Y is the short-side direction. The interior of the first control side opening 58A is an open space.

In a plan view, the second control side opening 58B is located between the second semiconductor elements 10B and the terminal portion 84t of the second control lead 84B in the length direction Y. In the present embodiment, as shown in FIG. 33, the second control side opening 58B is located between the second semiconductor elements 10B and the pad portion 84p of the second control lead 84B in the length direction Y in a plan view. Further, in a plan view, the second control side opening 58B is located between the second semiconductor elements 10B and the terminal portion 85t of the second control lead 85B in the length direction Y. In the present embodiment, the second control side opening 58B is located between the second semiconductor elements 10B and the pad portion 85p of the second control lead 85B in the length direction Y in a plan view.

The second control side opening 58B exposes part of the second wiring region 70B of the conductive substrate 60. The second control side opening 58B exposes two types of circuits that are electrically connected to the first semiconductor elements 10B. In the present embodiment, the second control side opening 58B exposes the second interface circuit 6B, the second surge absorption circuit 5B, and the second current detection circuit 7B. In further detail, the second control side opening 58B exposes part of the second control wire 63B, part of the second control wire 64B, the fourth relay wire 69D, part of the second control power wire 66D, part of the second interface wire 68B, the fourth relay wire 69D, the second low-voltage diodes 37A and 37B, the second resistor 38C, the second resistor 38D, and the second switching element 39B. Further, the second control side opening 58B exposes the second resistor 152 and the second overcurrent detection wire 160B. In the present embodiment, the second control side opening 58B does not expose the second drive wire 62B. The shape of the second control side opening 58B in a plan view, although not limited in particular, is rectangular so that the width direction X is the long-side direction and the length direction Y is the short-side direction. The interior of the second control side opening 58B is an open space.

In addition to the advantages of the semiconductor device 1C in accordance with the third embodiment, the semiconductor device 1E in accordance with the present embodiment has the advantage described below.

(5-1) The semiconductor device 1E includes the first current detection circuit 7A and the second current detection circuit 7B. With this configuration, by detecting the current flowing to the first semiconductor elements 10A and the second semiconductor elements 10B, the first semiconductor elements 10A and the second semiconductor elements 10B may be controlled to be deactivated or the like when overcurrent flows to the first semiconductor elements 10A and the second semiconductor elements 10B. This avoids the occurrence of defects in the first semiconductor elements 10A and the second semiconductor elements 10B.

Sixth Embodiment

With reference to FIGS. 35 to 43, a semiconductor device 1F in accordance with a sixth embodiment will now be described. The semiconductor device 1F of the present embodiment differs from the semiconductor device 1A of the first embodiment mainly in the structure of the conductive substrate and how the semiconductor elements 10A and 10B are mounted on the conductive substrate. In the description hereafter, same reference numerals are given to those components that are the same as the corresponding components of the semiconductor device 1A in the first embodiment. Such components will not be described in detail.

Figure 36:
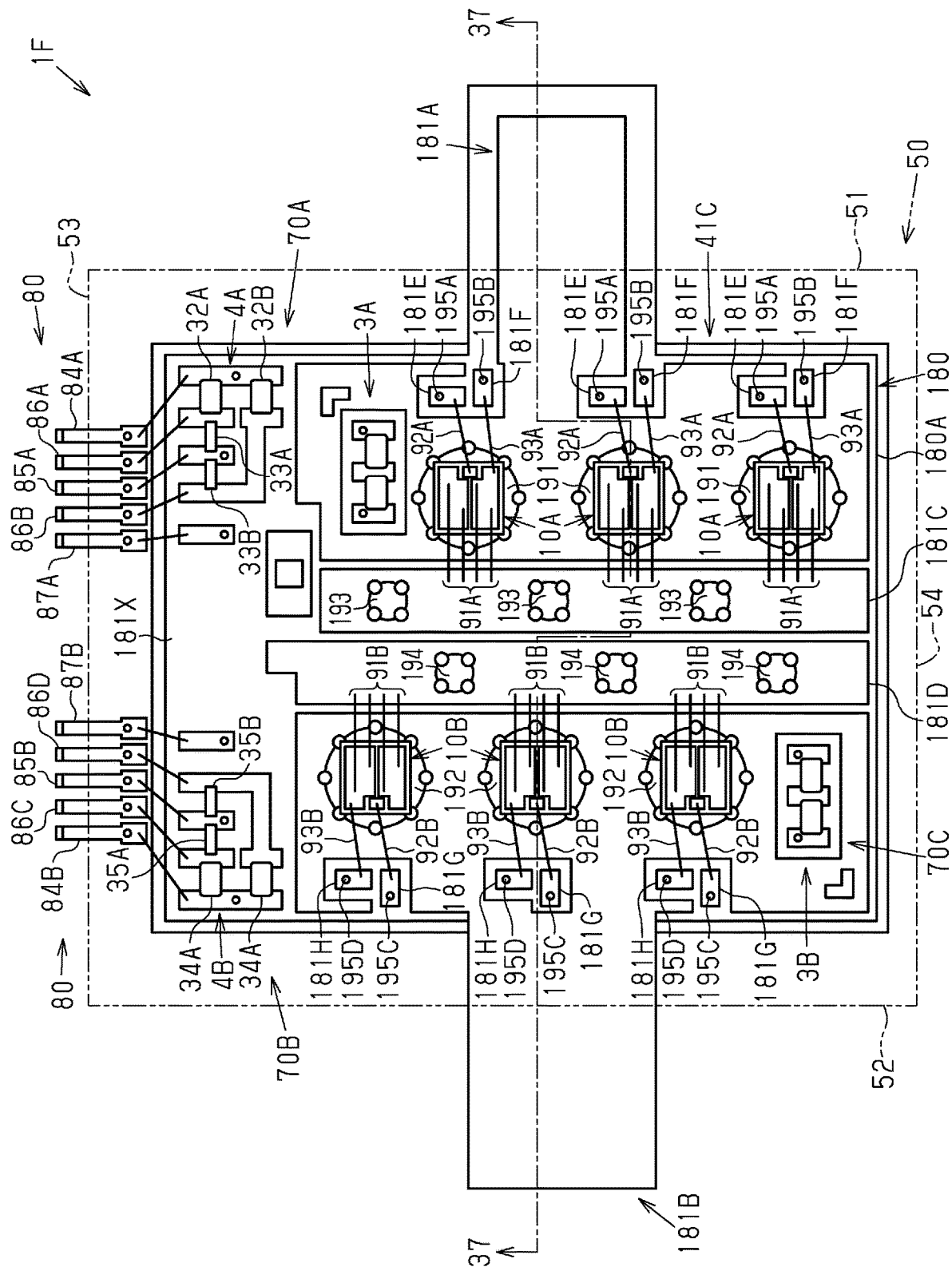
FIG. 36 is a plan view showing the semiconductor device in accordance with the sixth embodiment in a state in which a resin member is removed from the semiconductor device.
Figure 39:
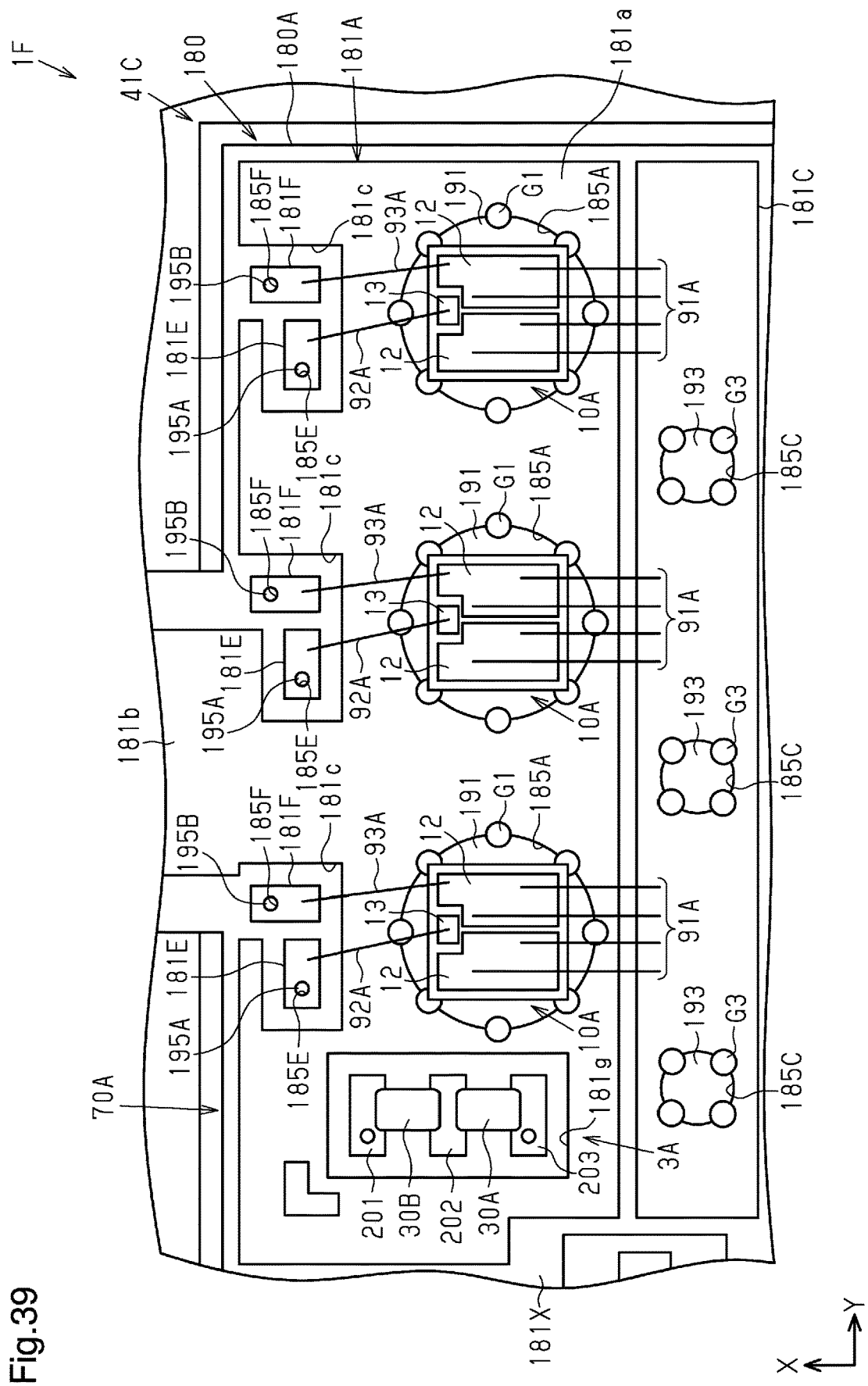
FIG. 39 is an enlarged view of a first semiconductor element shown in FIG. 36.
Figure 40:
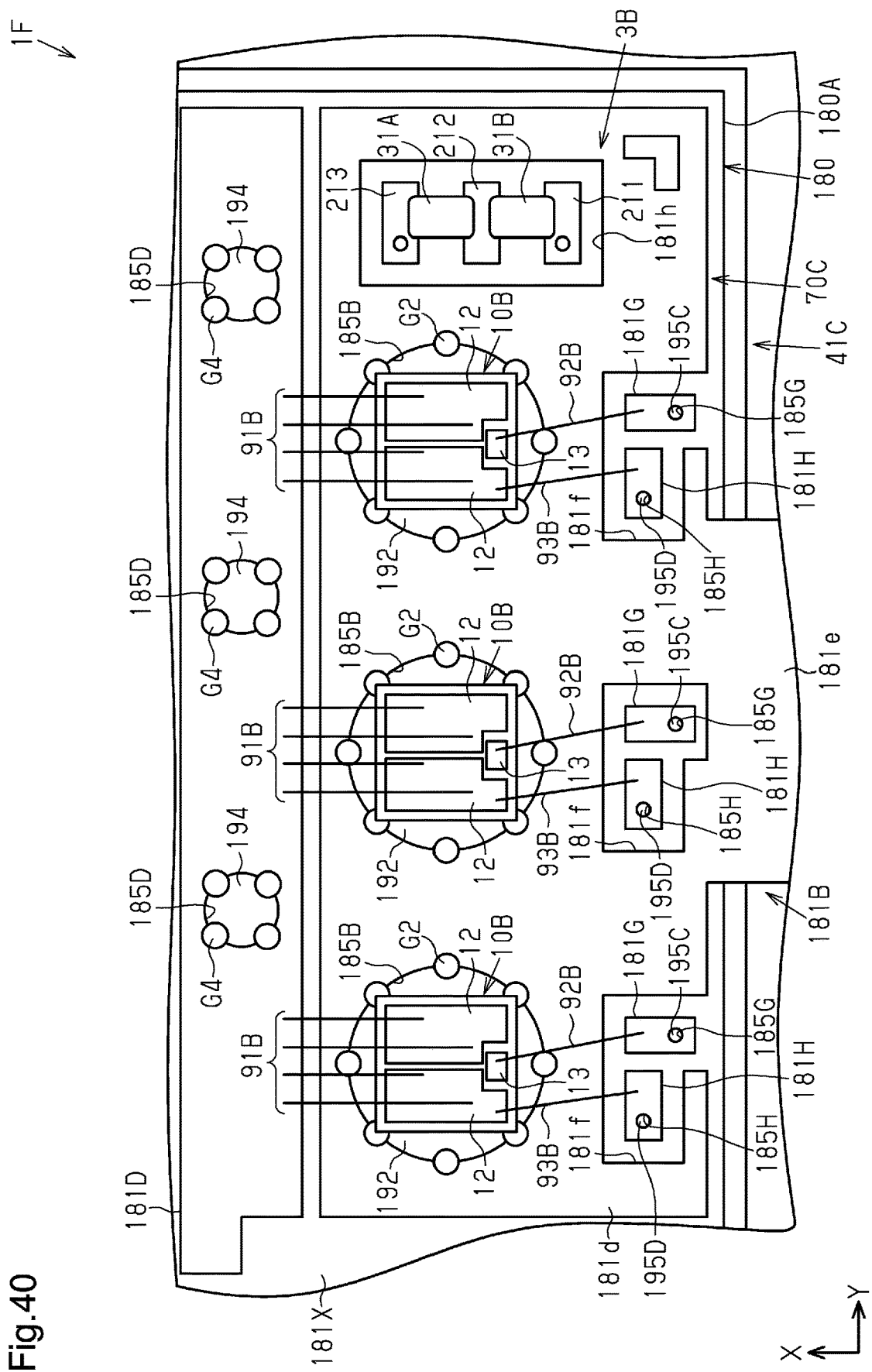
FIG. 40 is an enlarged view of a second semiconductor element shown in FIG. 36.

As shown in FIG. 36, the semiconductor device 1F of the present embodiment includes an insulative substrate 41C, instead of the insulative substrates 41A and 41B, and a conductive substrate 180, instead of the conductive substrate 60. As shown in FIGS. 39 and 40, the semiconductor device 1F includes metal members 191, metal members 192, insertion members 193, insertion members 194, and the through-electrodes 195A to 195D.

As shown in FIG. 36, the insulative substrate 41C is a single substrate supporting the metal members 191, the metal members 192, the insertion members 193, the insertion members 194, the through-electrodes 195A to 195D (refer to FIGS. 39 and 40), and the conductive substrate 180. The insulative substrate 41C is formed from, for example, a ceramic having excellent thermal conductivity. An example of such a ceramic is AlN. In the present embodiment, the shape of the insulative substrate 41C in a plan view is rectangular so that the length direction Y is the long-side direction and the width direction X is the short-side direction. The structure of the insulative substrate 41C is not limited to the example shown in FIG. 36 and may be changed in shape, size, and quantity in accordance with the product specification of the semiconductor device 1F.

Figure 37:
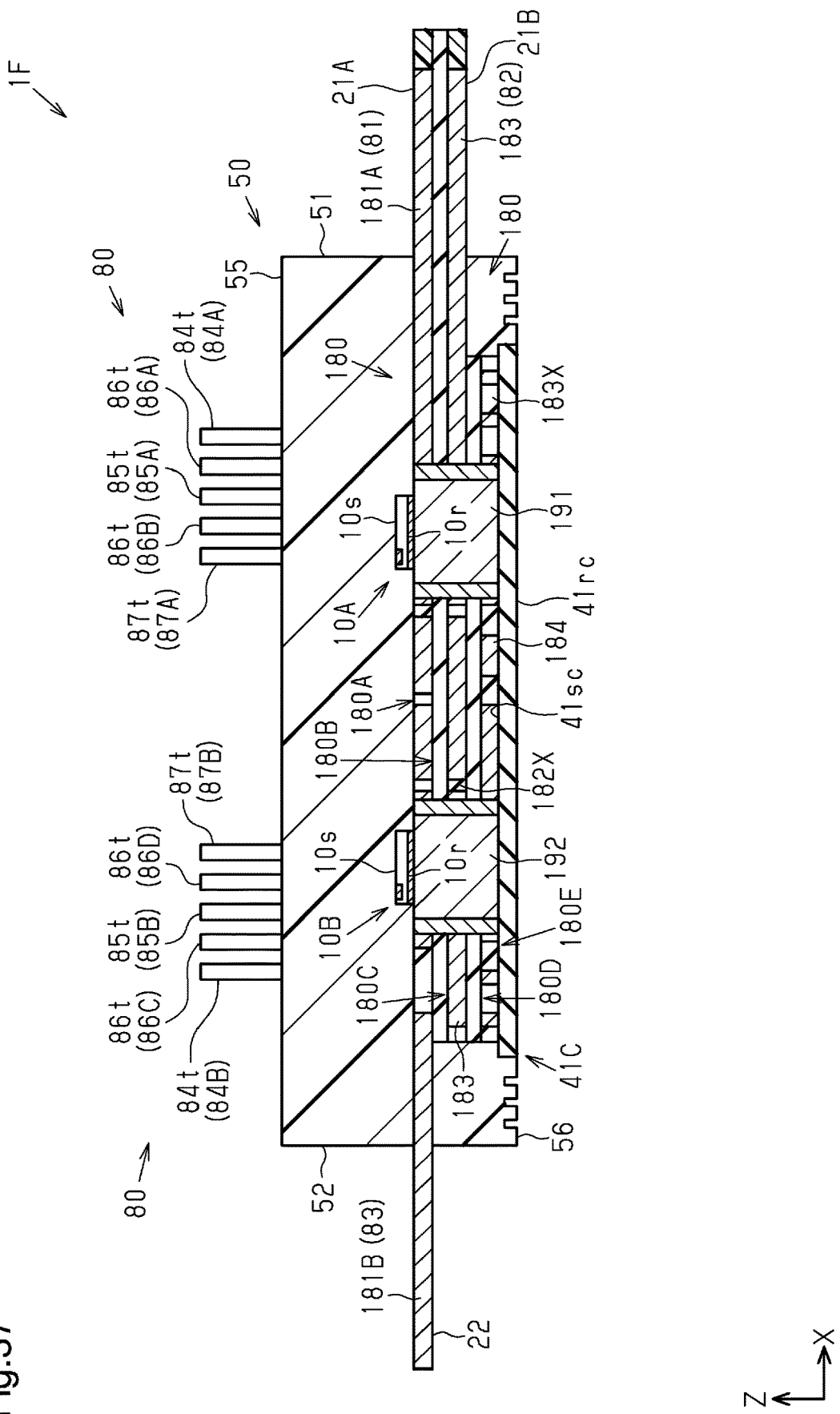
FIG. 37 is a cross-sectional view taken along line 37-37 in FIG. 36.

As shown in FIG. 37, the insulative substrate 41C includes a substrate main surface 41sc and a substrate back surface 41sc that are faced away from each other in the thickness direction Z. The substrate main surface 41sc and the substrate back surface 41sc are spaced apart in the thickness direction Z. The substrate back surface 41sc is exposed from the resin member 50. The substrate back surface 41sc may be connected to a cooling device such as a heat sink (not shown).

The conductive substrate 180 forms the internal wiring of the semiconductor device 1F. The conductive substrate 180 is arranged on the substrate main surface 41sc of the insulative substrate 41C and bonded by a bonding material (not shown) to the insulative substrate 41C. The bonding material may be formed from a conductive material or an insulative material.

The conductive substrate 180 is a laminated substrate in which wiring layers and insulating layers are stacked alternately in the thickness direction Z. In the present embodiment, the conductive substrate 180 includes three wiring layers 180A, 180C, and 180E and two insulating layers 180B and 180D. The number of wiring layers and the number of insulating layers are not limited as described above and may be changed in accordance with the product specification of the semiconductor device 1F. The wiring layer 180A, the insulating layer 180B, the wiring layer 180C, the insulating layer 180D, and the wiring layer 180E are stacked in the conductive substrate 180 in order from the side opposite to the insulative substrate 41C toward the insulative substrate 41C in the thickness direction Z. Thus, the insulating layer 180B insulates the wiring layer 180A from the wiring layer 180C, and the insulating layer 180D insulates the wiring layer 180C from the wiring layer 180E. The wiring layer 180E is arranged on the substrate main surface 41sc of the insulative substrate 41C.

As shown in FIG. 36, the wiring layer 180A includes the conductive portions 181A to 181H and an insulative portion 181X. In a plan view, the conductive portions 181A to 181H are spaced apart from one another and insulated by the insulative portion 181X from one another. The insulative portion 181X may be omitted from the wiring layer 180A. Nevertheless, it is preferable that the insulative portion 181X be included to avoid unintentional short-circuiting of the conductive portions 181A to 181H.

As shown in FIG. 37, the wiring layer 180C includes conductive portions 183 and an insulative portion 182X. The conductive portions 183 are spaced apart from one another and insulated by the insulative portion 182X from one another. The insulative portion 182X may be omitted from the wiring layer 180C. Nevertheless, it is preferable that the insulative portion 182X be included to avoid unintentional short-circuiting of the conductive portions 183.

The wiring layer 180E includes conductive portions 184 and the insulative portion 183X. The conductive portions 183 are spaced apart from one another and insulated by the insulative portion 183X from one another. The insulative portion 183X may be omitted from the wiring layer 180E. Nevertheless, it is preferable that the insulative portion 183X be included to avoid unintentional short-circuiting of the conductive portions 184.

As shown in FIGS. 36 and 37, each of the conductive portions 181A to 181H, the conductive portions 183, and the conductive portions 184 are plate-like members (thick copper plates) formed from a metal including, for example, copper (Cu). Each of the insulative portions 181X, 182X, and 183X is formed from a pre-preg. The dimension in the thickness direction Z of each of the conductive portions 181A to 181H is equal to the dimension in the thickness direction Z of each of the conductive portions 183 and the dimension in the thickness direction Z of each of the conductive portions 184. The dimension in the thickness direction Z of each of the conductive portions 181A to 181H, the dimension in the thickness direction Z of each of the conductive portions 183, and the dimension in the thickness direction Z of each of the conductive portions 184 are greater than, for example, 125 μm, which is the thickness (Cu thickness) of a wiring pattern in a typical printed board). Preferably, the dimension in the thickness direction Z of each of the conductive portions 181A to 181H, the dimension in the thickness direction Z of each of the conductive portions 183, and the dimension in the thickness direction Z of each of the conductive portions 184 is greater than the dimension in the thickness direction Z of each of the semiconductor elements 10A and 10B and the dimension in the thickness direction Z of each of the insulating layers 180B and 180D. That is, the dimension in the thickness direction Z of each of the wiring layers 180A, 180C, and 180E is greater than the dimension in the thickness direction Z of each of the semiconductor elements 10A and 10B and the dimension in the thickness direction Z of each of the insulating layers 180B and 180D. The dimension in the thickness direction Z of each of the conductive portions 181A to 181H, the dimension in the thickness direction Z of each of the conductive portions 183, and the dimension in the thickness direction Z of each of the conductive portions 184 may be less than or equal to the dimension in the thickness direction Z of each of the insulating layers 180B and 180D.

The structure of the conductive substrate 180 is not limited to the example shown in FIGS. 36 and 37. The conductive portions 181A to 181H, the conductive portions 183, and the conductive portions 184 may be changed in shape, size, and location in accordance with the specification of the semiconductor device 1F.

As shown in FIG. 37, the conductive substrate 180 includes the first input lead 81, the second input lead 82, and the output lead 83. The first input lead 81 and the output lead 83 are arranged in the wiring layer 180A. Thus, one of the conductive portions 181A to 181H forms the first input lead 81 and another one forms the output lead 83. In further detail, the conductive portion 181A forms the first input lead 81, and the conductive portion 181B forms the output lead 83. The part of the conductive portion 181A projecting out of the resin member 50 forms the first power terminal 21A. The part of the conductive portion 181B projecting out of the resin member 50 forms the output terminal 22. The conductive portion 181A (first input lead 81) and the conductive portion 183 that forms the second input lead 82 are overlapped with each other in a plan view.

The second input lead 82 is arranged in the wiring layer 180C. That is, one of the conductive portions 183 in the wiring layer 180C forms the second input lead 82. The part of the conductive portion 183 forming the second input lead 82 and projecting out of the resin member 50 forms the second power terminal 21B.

The insulating layer 180B is located between the conductive portion 181A (first input lead 81) and the conductive portion 183 (second input lead 82) in the thickness direction Z. The surface of the part of the conductive portion 181A forming the first power terminal 21A at the side opposite to the insulating layer 180B in the thickness direction Z, and the surface of the part of the conductive portion 183 forming the second input lead 82 and the second power terminal 21B at the side opposite to the insulating layer 180B are exposed to the outside of the semiconductor device 1F. The surface of the part of the conductive portion 181A forming the first power terminal 21A at the side of the insulating layer 180B in the thickness direction Z and the surface of the part of the conductive portion 183 forming the second input lead 82 and the second power terminal 21B at the side of the insulating layer 180B each contact the insulating layer 180B. That is, the first input lead 81 and the second input lead 82 are insulated by the insulating layer 180B. Thus, the first power terminal 21A and the second power terminal 21B are insulated by the insulating layer 180B.

The conductive portion 181A and the conductive portion 181B are arranged at opposite sides in the width direction X. In further detail, the conductive portion 181A is arranged on the conductive substrate 180 at the end located toward the first resin side surface 51. The conductive portion 181B is arranged on the conductive substrate 180 at the end located toward the second resin side surface 52. A conductive portion 181C and a conductive portion 181D are arranged between the conductive portion 181A and the conductive portion 181B in the width direction X.

Figure 38:
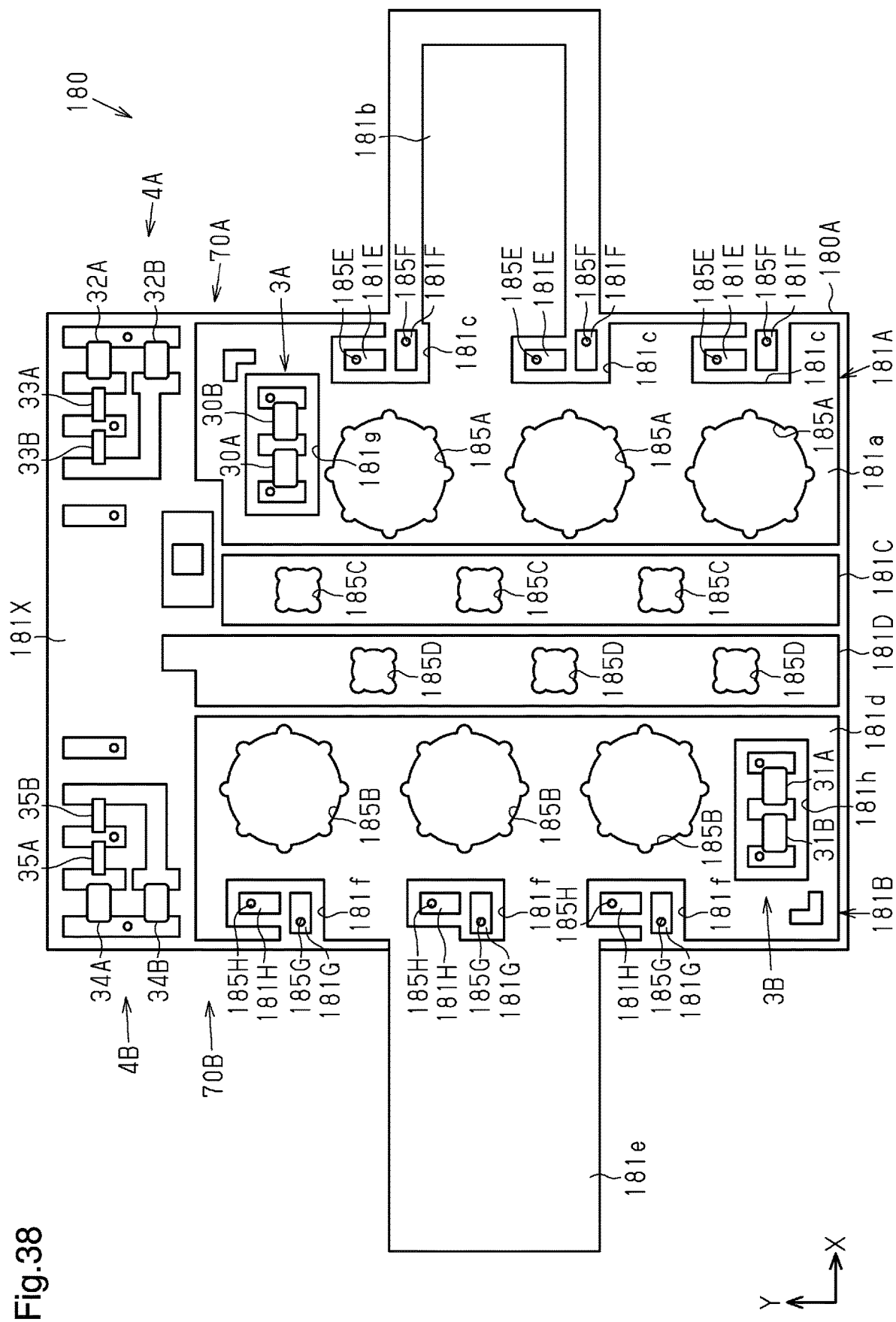
FIG. 38 is a plan view showing a conductive substrate in a state without electronic components.

As shown in FIG. 38, the conductive portion 181A is substantially T-shaped in a plan view. The conductive portion 181A includes a base 181a extending in the length direction Y and a projection 181b extending from the base 181a in the width direction X. In the present embodiment, the conductive portion 181A is a single component in which the base 181a and the projection 181b are formed integrally. The base 181a is arranged in the resin member 50. The distal end of the projection 181b projects out of the resin member 50. The part (distal end) of the projection 181b projecting out of the resin member 50 forms the first power terminal 21A.

The base 181a includes a plurality of (three in the present embodiment) openings 181c. The openings 181c are each arranged in the end of the base 181a located toward the first resin side surface 51 (refer to FIG. 36) in the width direction X. The openings 181c are spaced apart from one another in the length direction Y. A conductive portion 181E and a conductive portion 181F are arranged in each of the openings 181c. The conductive portion 181E and the conductive portion 181F are spaced apart in the length direction Y in each opening 181c. The conductive portion 181E is arranged in each opening 181c located toward the third resin side surface 53 (refer to FIG. 36) from the conductive portion 181F in the length direction Y. The shape of the conductive portion 181E in a plan view is rectangular so that the length direction Y is the long-side direction and the width direction X is the short-side direction. The shape of the conductive portion 181F in a plan view is rectangular so that the width direction X is the long-side direction and the length direction Y is the short-side direction.

The conductive portion 181C is arranged next to the base 181a of the conductive portion 181A in the width direction X. The conductive portion 181C extends in the length direction Y. The shape of the conductive portion 181C in a plan view is rectangular so that the length direction Y is the long-side direction and the width direction X is the short-side direction.

The conductive portion 181B is substantially T-shaped in a plan view. The conductive portion 181B includes a base 181d extending in the length direction Y and a projection 181e extending from the base 181d in the width direction X. In the present embodiment, the conductive portion 181B is a single component in which the base 181d and the projection 181e are formed integrally. The base 181d is arranged in the resin member 50. The distal end of the projection 181e projects out of the resin member 50. The part (distal end) of the projection 181e projecting out of the resin member 50 forms the second power terminal 21B.

The base 181d includes a plurality of (three in the present embodiment) openings 181f. The openings 181f are each arranged in the end of the base 181d located toward the second resin side surface 52 (refer to FIG. 36) in the width direction X. The openings 181f are spaced apart from one another in the length direction Y. A conductive portion 181G and a conductive portion 181H are arranged in each of the openings 181f.

The conductive portion 181D is arranged next to the base 181d of the conductive portion 181B in the width direction X. The conductive portion 181D is arranged between the conductive portion 181B and the conductive portion 181C in the width direction X. That is, the conductive portion 181C is located between the conductive portion 181D and the conductive portion 181A. The conductive portion 181D extends in the length direction Y. The shape of the conductive portion 181D in a plan view is rectangular so that the length direction Y is the long-side direction and the width direction X is the short-side direction. In the present embodiment, the length of the conductive portion 181D in the length direction Y is greater than the length of the conductive portion 181C in the length direction Y. The width of the conductive portion 181D (dimension of conductive portion 181D in width direction X) is equal to the width of the conductive portion 181C (dimension of conductive portion 181C in width direction X).

As shown in FIGS. 38 to 40, the conductive substrate 180 includes a plurality of the through holes 185A to 185H. Each of the through holes 185A to 185H extend through the conductive substrate 180 in the thickness direction Z. That is, the through holes 185A to 185H each extend through the wiring layers 180A, 180C, and 180E and the insulating layers 180B and 180D in the thickness direction Z.

The through holes 185A (three in the present embodiment) are located in the part of the conductive substrate 180 where the base 181a of the conductive portion 181A is formed. The through holes 185A are arranged aligned with one another in the width direction X and spaced apart in the length direction Y. Each through hole 185A is, for example, substantially circular in a plan view. Recesses are formed in the wall of each through hole 185A. The number of recesses can be changed freely.

As shown in FIG. 39, one metal member 191 is inserted in each of the through holes 185A. Each of the metal members 191 is a cylindrical conductive member. In the present embodiment, each of the metal members 191 has a substantially circular cross section that is orthogonal to the thickness direction Z. That is, the metal members 191 are cylindrical. In a plan view, recesses are formed in the periphery of each metal member 191. There is particularly no limitation to the number of the recesses. The cross section does not have to be substantially circular and may be substantially elliptical or substantially polygonal. The material of the metal members 191 is, for example, Cu or a Cu alloy. The metal members 191 are in contact with the insulative substrate 41C (refer to FIG. 37).

In the present embodiment, the diameter of each through hole 185A at the circular portion excluding the recesses is substantially greater than or equal to the diameter of each of the metal members 191. In the present embodiment, each metal member 191 is inserted (fitted) into the corresponding through hole 185A through, for example, press-fitting.

As shown in FIG. 39, in a state in which each metal member 191 is inserted into the corresponding through hole 185A, the recesses formed in the wall of the through hole 185A and the recesses formed in the side wall of the metal member 191 define non-contact voids G1. Each non-contact void G1, which is circular in a plan view, is an open space extending through the conductive substrate 180 in the thickness direction Z. Each non-contact void G1 is filled with, for example, solder. The non-contact voids G1 are filled with solder to increase the strength bonding the conductive substrate 180 and the metal members 191 and electrically connect the metal members 191 and the wiring layers 180A and 180E. When the metal members 191 and the through holes 185A are designed to have the same diameter, gaps would not be formed at portions excluding the recesses. However, slight gaps are actually formed because of manufacturing errors. Further, to facilitate the insertion of the metal members 191, the diameter of the through holes 185A in a plan view may be increased to be greater than the diameter of the metal members 191 in a plan view and form slight gaps. However, such slight gaps will lower the bonding strength and cause connection defects. In this respect, when the non-contact voids G1 are provided, the non-contact voids G1 are filled with solder. When filling the non-contact voids G1 with solder, the solder enters such gaps. By filling such gas with solder, decreases are limited in the strength bonding the metal members 191 and the conductive substrate 180, and defects will be limited in the connection of the metal members 191 and the wiring layers 180A and 180E. The metal members 191 are not electrically connected to the wiring layer 180C. That is, the metal members 191 do not contact the conductive portions 183 because of the non-contact voids G1 formed between the conductive portions 183 and the insulative portion 182X of the wiring layer 180C.

As shown in FIG. 40, the through holes 185B (three in the present embodiment) are located in the part of the conductive substrate 180 where the base 181*d* of the conductive portion 181B is formed. The through holes 185B are arranged to align with one another in the width direction X and spaced apart in the length direction Y. The through holes 185B and the through holes 185A are arranged at different positions in the width direction X. Each through hole 185B is, for example, substantially circular in a plan view. Recesses are formed in the wall of each through hole 185B. The number of recesses can be changed freely.

One metal member 192 is inserted in each of the through holes 185B. Each of the metal members 192 is a cylindrical conductive member. In the present embodiment, each of the metal members 192 has a substantially circular cross section that is orthogonal to the thickness direction Z. That is, the metal members 192 are cylindrical. In a plan view, recesses are formed in the periphery of each metal member 192. There is particularly no limitation to the number of the recesses. The cross section does not have to be substantially circular and may be substantially elliptical or substantially polygonal. The material of the metal members 192 is, for example, Cu or a Cu alloy. The metal members 192 are in contact with the insulative substrate 41C (refer to FIG. 37).

In the present embodiment, the diameter of each through hole 185B at the circular portion excluding the recesses is substantially greater than or equal to the diameter of each of the metal members 192. In the present embodiment, each metal member 192 is inserted (fitted) into the corresponding through hole 185A through, for example, press-fitting.

In a state in which each metal member 192 is inserted into the corresponding through hole 185B, the recesses formed in the wall of the through hole 185B and the recesses formed in the side wall of the metal member 192 define non-contact voids G2. Each non-contact void G2, which is circular in a plan view, is an open space extending through the conductive substrate 180 in the thickness direction Z. Each non-contact void G2 is filled with, for example, solder. The non-contact voids G2 are filled with solder to increase the strength bonding the conductive substrate 180 and the metal members 192 and electrically connect the metal members 192 and the wiring layers 180A, 180C, and 180E.

As shown in FIG. 39, the through holes 185C (three in the present embodiment) are located in the part of the conductive substrate 180 where the conductive portion 181C is formed. The through holes 185C are arranged to align with one another in the width direction X and spaced apart in the length direction Y. Further, the through holes 185C are arranged to align with the through holes 185B in the length direction Y and spaced apart from the through holes 185B in the width direction X. In other words, the through holes 185C and the through holes 185A are arranged at different positions in the length direction Y.

Each through hole 185C is, for example, substantially circular in a plan view. Recesses are formed in the wall of each through hole 185C. The number of recesses can be changed freely. The area of each of the through holes 185C in a plan view is smaller than the area of each of the through holes 185A and 185B in a plan view.

One insertion member 193 is inserted in each of the through holes 185C. Each of the insertion members 193 is a cylindrical conductive member. In the present embodiment, each of the insertion members 193 has a substantially circular cross section that is orthogonal to the thickness direction Z. That is, the insertion members 193 are cylindrical. In a plan view, recesses are formed in the periphery of each insertion member 193. There is particularly no limitation to the number of the recesses. The cross section does not have to be substantially circular and may be substantially elliptical or substantially polygonal. The material of the insertion members 193 is, for example, Cu or a Cu alloy. The insertion members 193 are in contact with the insulative substrate 41C.

In the present embodiment, the diameter of each through hole 185C at the circular portion excluding the recesses is substantially greater than or equal to the diameter of each of the insertion members 193. In the present embodiment, each insertion member 193 is inserted (fitted) into the corresponding through hole 185C through, for example, press-fitting.

In a state in which each insertion member 193 is inserted into the corresponding through hole 185C, the recesses formed in the wall of the through hole 185C and the recesses formed in the side wall of the insertion member 193 define non-contact voids G3. Each non-contact void G3, which is circular in a plan view, is an open space extending through the conductive substrate 180 in the thickness direction Z. Each non-contact void G3 is filled with, for example, solder. The non-contact voids G3 are filled with solder to increase the strength bonding the conductive substrate 180 and the insertion members 193 and electrically connect the insertion members 193 and the wiring layers 180A and 180E. The insertion members 193 are not electrically connected to the wiring layer 180C. That is, the insertion members 193 do not contact the conductive portions 183 because of the non-contact voids G3 formed between the conductive portions 183 and the insulative portion 182X of the wiring layer 180C.

As shown in FIG. 40, the through holes 185D (three in the present embodiment) are located in the part of the conductive substrate 180 where the conductive portion 181D is formed. The through holes 185D are arranged to align with one another in the width direction X and spaced apart in the length direction Y. Further, the through holes 185D are arranged to align with the through holes 185A in the length direction Y and spaced apart from the through holes 185A in the width direction X. In other words, the through holes 185D and the through holes 185B are arranged at different positions in the length direction Y.

Each through hole 185D is, for example, substantially circular in a plan view. Recesses are formed in the wall of each through hole 185D. The number of recesses can be changed freely. The area of each of the through holes 185D in a plan view is smaller than the area of each of the through holes 185A and 185B in a plan view. The area of each of the through holes 185D in a plan view is equal to the area of each of the through holes 185C in a plan view.

One insertion member 194 is inserted in each of the through holes 185D. Each of the insertion members 194 is a cylindrical conductive member. In the present embodiment, each of the insertion members 194 has a substantially circular cross section that is orthogonal to the thickness direction Z. That is, the insertion members 194 are cylindrical. In a plan view, recesses are formed in the periphery of each insertion member 194. There is particularly no limitation to the number of the recesses. The cross section does not have to be substantially circular and may be substantially elliptical or substantially polygonal. The material of the insertion members 194 is, for example, Cu or a Cu alloy. The insertion members 194 are in contact with the insulative substrate 41C.

In the present embodiment, the diameter of each through hole 185D at the circular portion excluding the recesses is substantially greater than or equal to the diameter of each of the insertion members 194. In the present embodiment, each insertion member 194 is inserted (fitted) into the corresponding through hole 185D through, for example, press-fitting.

In a state in which each insertion member 194 is inserted into the corresponding through hole 185D, the recesses formed in the wall of the through hole 185C and the recesses formed in the side wall of the insertion member 194 define non-contact voids G4. Each non-contact void G4, which is circular in a plan view, is an open space extending through the conductive substrate 180 in the thickness direction Z. Each non-contact void G4 is filled with, for example, solder. The non-contact voids G4 are filled with solder to increase the strength bonding the conductive substrate 180 and the insertion members 194 and electrically connect the insertion members 194 and the wiring layers 180A and 180C. The insertion members 194 are not electrically connected to the wiring layer 180E. That is, the insertion members 194 do not contact the conductive portions 184 because of the non-contact voids G4 formed between the conductive portions 184 and the insulative portion 183X of the wiring layer 180E.

As shown in FIG. 39, the through holes 185E (three in the present embodiment) are respectively located in the parts of the conductive substrate 180 where the conductive portions 181E are formed. The through holes 185F (three in the present embodiment) are respectively located in the parts of the conductive substrate 180 where the conductive portion 181F are formed. The through holes 185F and the through holes 185E are arranged at different positions in the width direction X.

As shown in FIG. 40, the through holes 185G (three in the present embodiment) are respectively located in the parts of the conductive substrate 180 where the conductive portions 181G are formed. The through holes 185H (three in the present embodiment) are respectively located in the parts of the conductive substrate 180 where the conductive portion 181H are formed. The through holes 185H and the through holes 185G are arranged at different positions in the width direction X.

With reference to FIGS. 39 and 40, the through-electrodes 195A to 195D are formed from a conductive material, for example, Cu or a Cu alloy. Each of the through-electrodes 195A to 195D is, for example, circular in a plan view. The area of each of the through-electrodes 195A to 195D in a plan view is smaller than the area of each of the insertion members 193 and 194 in a plan view.

As shown in FIG. 39, each through hole 185E is filled with one through-electrode 195A. Each through-electrode 195A may be a tubular member covering the wall of the corresponding through hole 185E instead of filling the through hole 185E.

Each through hole 185F is filled with one through-electrode 195B. Each through-electrode 195B may be a tubular member covering the wall of the corresponding through hole 185F instead of filling the through hole 185F.

As shown in FIG. 40, each through hole 185G is filled with one through-electrode 195C. Each through-electrode 195C may be a tubular member covering the wall of the corresponding through hole 185G instead of filling the through hole 185G.

Each through hole 185H is filled with one through-electrode 195D. Each through-electrode 195D may be a tubular member covering the wall of the corresponding through hole 185H instead of filling the through hole 185H.

As shown in FIGS. 39 and 40, the through-electrodes 195A to 195D each electrically connect the wiring layers 180A and 180E (refer to FIG. 37). In other words, the through-electrodes 195A to 195D are not electrically connected to the wiring layer 180C. Although not shown in the drawings, in the wiring layer 180E, the through-electrodes 195A electrically connect the conductive portions 181E, and the through-electrodes 195B electrically connect the conductive portions 181F. Further, in the wiring layer 180E, the through-electrodes 195C electrically connect the conductive portions 181G, and the through-electrodes 195D electrically connect the conductive portions 181H.

As shown in FIG. 39, the first semiconductor elements 10A are arranged on the end surfaces of the metal members 191 at the side opposite to the insulative substrate 41C in the thickness direction Z. In further detail, as shown in FIG. 37, the first semiconductor elements 10A are arranged on the end surfaces of the metal members 191 with the element back surface 10r of each first semiconductor element 10A facing the end surface of the corresponding metal member 191. The first semiconductor elements 10A are bonded by, for example, a conductive bonding material, such as silver paste or solder, to the end surfaces of the metal members 191. In this manner, the drain electrode 11 formed on the element back surface 10r of each first semiconductor element 10A is electrically connected to the corresponding metal member 191.

As shown in FIG. 39. the source electrode 12 of each first semiconductor element 10A is electrically connected to the conductive portion 181C. In further detail, the source electrode 12 of each first semiconductor element 10A is connected to the conductive portion 181C by the first drive connection members 91A. The first drive connection members 91A are, for example, wires formed through wire bonding.

Further, the source electrodes 12 of the first semiconductor elements 10A are electrically connected to the conductive portions 181F. That is, the source electrode 12 of a predetermined first semiconductor element 10A is electrically connected to the conductive portion 181F corresponding to the predetermined first semiconductor element 10A. The conductive portion 181F corresponding to the predetermined first semiconductor element 10A is the conductive portion 181F that is the closest to the predetermined first semiconductor element 10A. In the present embodiment, the conductive portion 181F corresponding to the predetermined first semiconductor element 10A overlaps the predetermined first semiconductor element 10A as viewed in the width direction X.

The source electrode 12 of each first semiconductor element 10A is connected to the corresponding conductive portion 181F by the first control connection member 93A. The first control connection members 93A are, for example, wires formed through wire bonding.

The gate electrodes 13 of the first semiconductor elements 10A are electrically connected to the conductive portions 181E. That is, the gate electrode 13 of a predetermined first semiconductor element 10A is electrically connected to the conductive portion 181E corresponding to the predetermined first semiconductor element 10A. The conductive portion 181E corresponding to the predetermined first semiconductor element 10A is the conductive portion 181E that is the closest to the predetermined first semiconductor element 10A. In the present embodiment, the conductive portion 181E corresponding to the predetermined first semiconductor element 10A overlaps the predetermined first semiconductor element 10A as viewed in the width direction X.

The gate electrode 13 of each first semiconductor element 10A is connected to the corresponding conductive portion 181E by the first control connection member 92A. The first control connection member 92A is, for example, a wire formed through wire bonding.

As shown in FIG. 40, the second semiconductor elements 10B are arranged on the end surfaces of the metal members 192 at the side opposite to the insulative substrate 41C in the thickness direction Z. In further detail, as shown in FIG. 37, the second semiconductor elements 10B are arranged on the end surfaces of the metal members 192 with the element back surface 10r of each second semiconductor element 10B facing the end surface of the corresponding metal member 192. The second semiconductor elements 10B are bonded by, for example, a conductive bonding material, such as silver paste or solder, to the end surfaces of the metal members 192. In this manner, the drain electrode 11 formed on the element back surface 10r of each second semiconductor element 10B is electrically connected to the corresponding metal member 192.

As shown in FIG. 40, the source electrode 12 of each second semiconductor element 10B is electrically connected to the conductive portion 181D. In further detail, the source electrode 12 of each second semiconductor element 10B is connected to the conductive portion 181D by the second drive connection members 91B. The second drive connection members 91B are, for example, wires formed through wire bonding.

Further, the source electrodes 12 of the second semiconductor elements 10B are electrically connected to the conductive portions 181H. That is, the source electrode 12 of a predetermined second semiconductor element 10B is electrically connected to the conductive portion 181H corresponding to the predetermined second semiconductor element 10B. The conductive portion 181H corresponding to the predetermined second semiconductor element 10B is the conductive portion 181H that is the closest to the predetermined second semiconductor element 10B. In the present embodiment, the conductive portion 181H corresponding to the predetermined second semiconductor element 10B overlaps the predetermined second semiconductor element 10B as viewed in the width direction X.

The source electrode 12 of each second semiconductor element 10B is connected to the corresponding conductive portion 181H by the second control connection member 93B. The second control connection member 93B is, for example, a wire formed through wire bonding.

The gate electrode 13 of the second semiconductor elements 10B are electrically connected to the conductive portions 181G. That is, the gate electrode 13 of a predetermined second semiconductor element 10B is electrically connected to the conductive portion 181G corresponding to the predetermined second semiconductor element 10B. The conductive portion 181G corresponding to the predetermined second semiconductor element 10B is the conductive portion 181G that is the closest to the predetermined second semiconductor element 10B. In the present embodiment, the conductive portion 181G corresponding to the predetermined second semiconductor element 10B overlaps the predetermined second semiconductor element 10B as viewed in the width direction X.

The gate electrode 13 of each second semiconductor element 10B is connected to the corresponding conductive portion 181G by the second control connection member 92B. The second control connection member 92B is, for example, a wire formed through wire bonding.

As shown in FIG. 36, the conductive substrate 180 includes the first wiring region 70A, the second wiring region 70B, and the third wiring region 70C. Further, in the same manner as the first embodiment, the conductive substrate 180 includes the first short-circuiting detection circuit 3A, the second short-circuiting detection circuit 3B, the first surge reduction circuit 4A, and the second surge reduction circuit 4B.

The first wiring region 70A is a region formed in the conductive substrate 180 by a portion located toward the third resin side surface 53 from the first semiconductor elements 10A in the length direction Y and toward the first resin side surface 51 from the central portion of the conductive substrate 180 in the width direction X.

The second wiring region 70B is a region formed in the conductive substrate 180 by a portion located toward the third resin side surface 53 from the second semiconductor elements 10B in the length direction Y and toward the second resin side surface 52 from the conductive substrate 180 in the width direction X.

The third wiring region 70C is a region formed in the conductive substrate 180 by a portion located toward the fourth resin side surface 54 from the second semiconductor elements 10B in the width direction X and toward the second resin side surface 52 from the central portion of the conductive substrate 180 in the width direction X.

Figure 41:
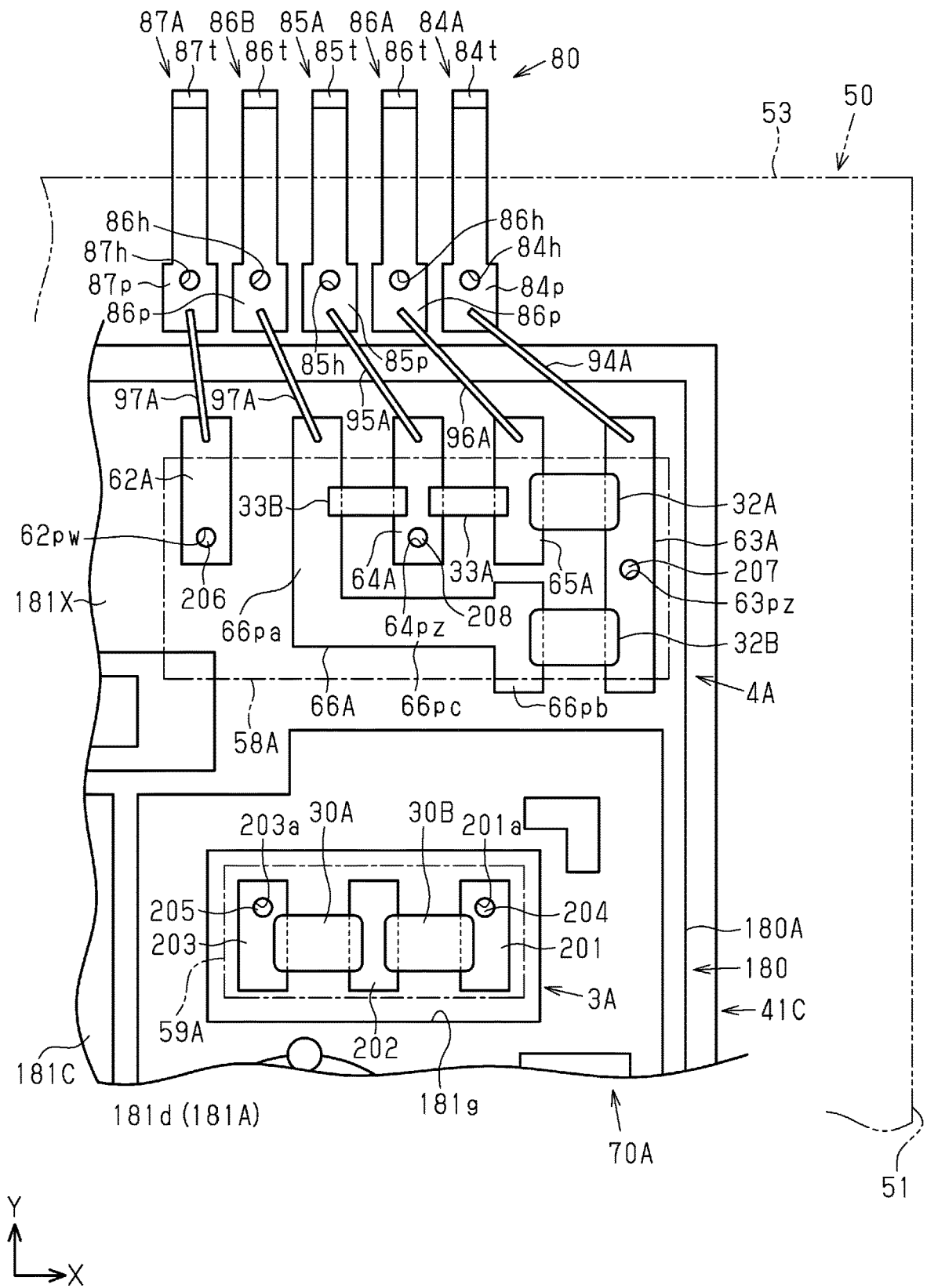
FIG. 41 is an enlarged view of a first wiring region in the semiconductor device shown in FIG. 36.

As shown in FIG. 41, the first wiring region 70A includes the first short-circuiting detection circuit 3A and the first surge reduction circuit 4A. FIG. 41 shows one wiring configuration example of the first short-circuiting detection circuit 3A and the first surge reduction circuit 4A. The wiring configuration of the first short-circuiting detection circuit 3A and the first surge reduction circuit 4A is not limited to the wiring configuration shown in FIG. 41 and may be changed in any manner.

The first short-circuiting detection circuit 3A is arranged at an inner side of the conductive portion 181A in a plan view. More specifically, the first short-circuiting detection circuit 3A is arranged inside an opening 181g formed in the conductive portion 181A. The opening 181g is arranged next to the one of the first semiconductor elements 10A that is the closest to the third resin side surface 53 in the length direction Y.

A first wire section 201, a second wire section 202, and a third wire section 203 are arranged in the opening 181g. The first wire section 201, the second wire section 202, and the third wire section 203 are arranged aligned with one another in the length direction Y and spaced apart in the width direction X. The second wire section 202 is located between the first wire section 201 and the third wire section 203 in the width direction X. The first wire section 201 is located toward the first resin side surface 51 from the second wire section 202 in the width direction X, and the third wire section 203 is located toward the second resin side surface 52 from the second wire section 202 in the width direction X. The shape of each of the wire sections 201 to 203 in a plan view is rectangular so that the length direction Y is the long-side direction and the width direction X is the short-side direction.

The first wire section 201 is electrically connected to the drain electrode 11 of each first semiconductor element 10A. The first wire section 201 includes a through hole 201a. The through hole 201a extends through the conductive substrate 180 in the thickness direction Z. The through hole 201a is filled with a through-electrode 204. The through electrode 204 may be a tubular member covering the wall of the through hole 201a instead of filling the through hole 201a. The through-electrode 204 electrically connects the wiring layers 180A and 180E. Although not shown in the drawings, the wiring layer 180E electrically connects the through-electrode 204 to the drain electrode 11 of each first semiconductor element 10A.

The third wire section 203 is electrically connected to the first short-circuiting detection lead 87A. The third wire section 203 includes a through hole 203*a*. The through hole 203*a* extends through the conductive substrate 180 in the thickness direction Z. The through hole 203*a* is filled with a through-electrode 205. The through-electrode 205 may be a tubular member covering the wall of the through hole 203*a* instead of filling the through hole 203*a*. The through-electrode 205 electrically connects the wiring layers 180A and 180E. Although not shown in the drawings, the wiring layer 180E electrically connects the through-electrode 205 to the first short-circuiting detection lead 87A.

The first short-circuiting detection circuit 3A includes the first high-voltage diodes 30A and 30B in the same manner as the first short-circuiting detection circuit 3A of the first embodiment.

The first high-voltage diode 30A is connected to the second wire section 202 and the third wire section 203. More specifically, the cathode electrode of the first high-voltage diode 30A is connected to the third wire section 203, and the anode electrode of the first high-voltage diode 30A is connected to the second wire section 202. The first high-voltage diode 30B is connected to the first wire section 201 and the second wire section 202. More specifically, the cathode electrode of the first high-voltage diode 30B is connected to the first wire section 201, and the anode electrode of the first high-voltage diode 30B is connected to the second wire section 202. In this manner, the first wire section 201, the second wire section 202, and the third wire section 203 connect the first high-voltage diode 30A and the first high-voltage diode 30B in series.

In the present embodiment, the first high-voltage diode 30A is positioned so that its anode electrode and cathode electrode are arranged in the width direction X. Further, the first high-voltage diode 30B is positioned so that its anode electrode and cathode electrode are arranged in the width direction X. Moreover, the first high-voltage diode 30A and the first high-voltage diode 30B are arranged to align with each other in the length direction Y and spaced apart in the width direction X.

The first surge reduction circuit 4A is arranged in a portion of the first wiring region 70A between the conductive portion 181A and the leads 80 in the length direction Y. The first drive wire 62A, the first control wire 63A, the first control wire 64A, the first control power wire 65A, and the first control power wire 66A are arranged in this portion in the same manner as the first embodiment. The first drive wire 62A, the first control wire 63A, the first control wire 64A, the first control power wire 65A, and the first control power wire 66A of the present embodiment are laid out and shaped differently from the first drive wire 62A, the first control wire 63A, the first control wire 64A, the first control power wire 65A, and the first control power wire 66A of the first embodiment.

The first drive wire 62A is located toward the second resin side surface 52 from the first control wire 63A, the first control wire 64A, the first control power wire 65A, and the first control power wire 66A in the width direction X. The first drive wire 62A extends in the length direction Y. The shape of the first drive wire 62A in a plan view is rectangular so that the length direction Y is the long-side direction and the width direction X is the short-side direction. The first drive wire 62A includes a through hole 62*pw*. The through hole 62*pw* extends through the conductive substrate 180 in the thickness direction Z. The through hole 62*pw* is filled with a through-electrode 206. The through-electrode 206 may be a tubular member covering the wall of the through hole 62*pw* instead of filling the through hole 62*pw*. The through-electrode 206 electrically connects the wiring layers 180A and 180E. Although not shown in the drawings, the first drive wire 62A is electrically connected through the wiring layer 180E via the through-electrodes 205 and 206 to the third wire section 203 in the first short-circuiting detection circuit 3A.

The first control wire 63A is located toward the first resin side surface 51 from the first drive wire 62A, the first control wire 64A, the first control power wire 65A, and the first control power wire 66A in the width direction X. The first control wire 63A extends in the length direction Y. The length of the first control wire 63A in the length direction Y is greater than the length of the first drive wire 62A in the length direction Y. The shape of the first control wire 63A in a plan view is rectangular so that the length direction Y is the long-side direction and the width direction X is the short-side direction. The first control wire 63A includes a through hole 63*pz*. The through hole 63*pz* extends through the conductive substrate 180 in the thickness direction Z. The through hole 63*pz* is filled with a through-electrode 207. The through-electrode 207 may be a tubular member covering the wall of the through hole 63*pz* instead of filling the through hole 63*pz*. The through-electrode 207 electrically connects the wiring layers 180A and 180E. Although not shown in the drawings, the first control wire 63A is electrically connected via the through-electrodes 195A (refer to FIG. 39) and 207 in the wiring layer 180E to the conductive portions 181E.

The first control wire 64A is located between the first drive wire 62A and the first control wire 63A in the width direction X. The first control wire 64A extends in the length direction Y. The shape of the first control wire 64A in a plan view is rectangular so that the length direction Y is the long-side direction and the width direction X is the short-side direction. The length of the first control wire 64A in the length direction Y is less than the length of the first control wire 63A in the length direction Y. The first control wire 64A includes a through hole 64*pz*. the through hole 64*pz* extends through the conductive substrate 180 in the thickness direction Z. The through hole 64*pz* is filled with a through-electrode 208. The through-electrode 208 may be a tubular member covering the wall of the through hole 64*pz* instead of filling the through hole 64*pz*. The through-electrode 208 electrically connects the wiring layers 180A and 180E. Although not shown in the drawings, the first control wire 64A is electrically connected via the through-electrodes 195B (refer to FIG. 39) and 208 in the wiring layer 180E to the conductive portions 181F.

The first control power wire 65A is arranged next to the first control wire 64A in the width direction X. The first control power wire 65A is located between the first control wire 64A and the first control wire 63A in the width direction X. The first control power wire 65A extends in the length direction Y. The shape of the first control power wire 65A in a plan view is rectangular so that the length direction Y is the long-side direction and the width direction X is the short-side direction.

In the same manner as the first embodiment, the first control power wire 66A includes the first wire portion 66*pa* extending in the length direction Y, the second wire portion 66*pb* spaced apart from the first wire portion 66*pa* and extending in the length direction Y, and the third wire portion 66*pc* connecting the first wire portion 66*pa* and the second wire portion 66*pb*. The first wire portion 66*pa* is arranged next to the first control wire 64A in the width direction X. More specifically, the first wire portion 66*pa* is arranged at the side of the first control wire 64A opposite to the first control power wire 65A in the width direction X. The first wire portion 66*pa* is located between the first drive wire 62A and the first control wire 64A in the width direction X. The first wire portion 66*pa* is arranged overlapping the first control wire 64A and the first control power wire 65A as viewed in the width direction X. The first wire portion 66*pa* and the first control power lead 86B are connected by the first control power connection member 96B. The first control power connection member 96B is, for example, a wire formed through wire bonding.

The second wire portion 66*pb* is located toward the first resin side surface 51 from the first control wire 64A in the width direction X. The second wire portion 66*pb* is located toward the fourth resin side surface 54 (toward conductive portion 181A) from the first wire portion 66*pa* in the length direction Y. The second wire portion 66*pb* is arranged overlapping the first control power wire 65A as viewed the length direction Y. The second wire portion 66*pb* is arranged overlapping the first control wire 63A in the width direction X.

The third wire portion 66*pc* connects the first wire portion 66*pa* and the second wire portion 66*pb*. The third wire portion 66*pc* is, for example, L-shaped in a plan view. The third wire portion 66*pc* does not have to be L-shaped in a plan view and may be shaped to extend diagonally so that the second resin side surface 52 becomes closer as the third resin side surface 53 becomes closer.

The first low-voltage diodes 32A and 32B and the first capacitors 33A and 33B of the first surge reduction circuit 4A are connected to the first control wires 63A and 64A, the first control power wire 65A, and the first control power wire 66A in the same manner as the first embodiment.

The first low-voltage diode 32A is connected to the first control wire 63A and the first control power wire 65A. More specifically, the anode electrode of the first low-voltage diode 32A is connected to the part of the first control wire 63A located toward the first control lead 84A. The cathode electrode of the first low-voltage diode 32A is connected to the first control power wire 65A.

The first low-voltage diode 32B is connected to the first control wire 63A and the first control power wire 66A. More specifically, the cathode electrode of the first low-voltage diode 32B is connected to the part of the first control wire 63A located toward the conductive portion 181A. The anode electrode of the first low-voltage diode 32B is connected to the second wire portion 66*pb* of the first control power wire 66A. In this manner, the first low-voltage diodes 32A and 32B are connected in series between the first control power wire 66A and the first control power wire 65A by the first control wire 63A.

In the present embodiment, the first low-voltage diode 32A is positioned so that its anode electrode and cathode electrode are arranged in the width direction X. Further, the first low-voltage diode 32B is positioned so that its anode electrode and cathode electrode are arranged in the width direction X. Moreover, the first low-voltage diode 32A and the first low-voltage diode 32B are arranged aligned with each other in the width direction X and spaced apart in the length direction Y. The first low-voltage diode 32A is located toward the third resin side surface 53 from the first low-voltage diode 32B in the length direction Y.

The first capacitor 33A is connected to the first control power wire 65A and the first control wire 64A. Specifically, the first terminal of the first capacitor 33A is connected to the first control power wire 65A. The second terminal of the first capacitor 33A is connected to the first control wire 64A.

The first capacitor 33B is connected to the first control power wire 66A and the first control wire 64A. Specifically, the first terminal of the first capacitor 33B is connected to the first wire portion 66*pa* of the first control power wire 66A. The second terminal of the first capacitor 33B is connected to the first control wire 64A. In this manner, the first capacitors 33A and 33B are connected in series between the first control power wire 65A and the first control power wire 66A by the first control wire 64A.

In the present embodiment, the first capacitor 33A is positioned so that its first terminal and second terminal are arranged in the width direction X. Further, the first capacitor 33B is positioned so that its first terminal and second terminal are arranged in the width direction X. Moreover, the first capacitor 33A and the first capacitor 33B are arranged to align with each other in the length direction Y and spaced apart in the width direction X. The capacitors 33A and 33B are arranged overlapping the first low-voltage diode 32A as viewed in the width direction X. The capacitors 33A and 33B are located toward the second resin side surface 52 from the low-voltage diodes 32A and 32B as viewed in the length direction Y.

Figure 42:
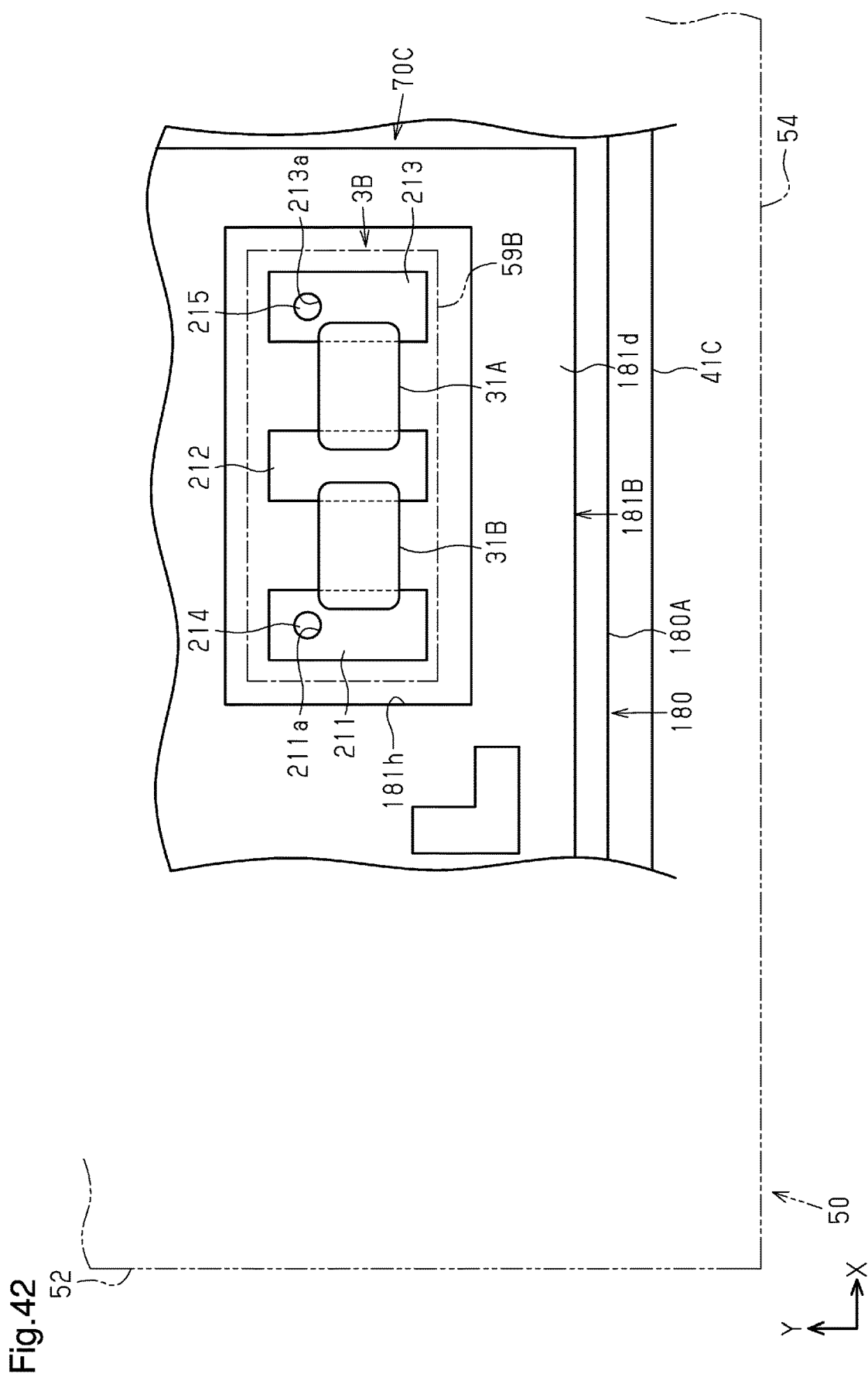
FIG. 42 is an enlarged view of a third wiring region in the semiconductor device shown in FIG. 36.

As shown in FIG. 42, the third wiring region 70C includes the second short-circuiting detection circuit 3B. FIG. 42 shows one wiring configuration of the first short-circuiting detection circuit 3A. The wiring configuration of the first short-circuiting detection circuit 3A is not limited to the wiring configuration shown in FIG. 42 and may be changed in any manner.

The second short-circuiting detection circuit 3B is arranged at an inner side of the conductive portion 181B in a plan view. More specifically, the second short-circuiting detection circuit 3B is arranged inside an opening 181*h* formed in the conductive portion 181B. The opening 181*h* is arranged next to the one of the second semiconductor elements 10B that is the closest to the fourth resin side surface 54 in the length direction Y.

A first wire portion 211, a second wire portion 212, and a third wire portion 213 are arranged in the opening 181*h*. The first wire portion 211, the second wire portion 212, and the third wire portion 213 are arranged to align with one another in the length direction Y and spaced apart in the width direction X. The second wire portion 212 is located between the first wire portion 211 and the third wire portion 213 in the width direction X. The first wire portion 211 is located toward the second resin side surface 52 from the second wire portion 212 in the width direction X, and the third wire portion 213 is located toward the first resin side surface 51 from the second wire portion 212 in the width direction X. The shape of each of the wire sections 211 to 213 in a plan view is rectangular so that the length direction Y is the long-side direction and the width direction X is the short-side direction.

The first wire portion 211 is electrically connected to the drain electrode 11 of each second semiconductor element 10B. The first wire portion 211 includes a through hole 211*a*. The through hole 211*a* extends through the conductive substrate 180 in the thickness direction Z. The through hole 211*a* is filled with a through-electrode 214. The through-electrode 214 may be a tubular member covering the wall of the through hole 211*a* instead of filling the through hole 211*a*. The through-electrode 214 electrically connects the wiring layers 180A and 180E. Although not shown in the drawings, the wiring layer 180E electrically connects the through-electrode 214 to the drain electrode 11 of the second semiconductor element 10.

The third wire portion 213 is electrically connected to the first short-circuiting detection lead 87A. The third wire portion 213 includes a through hole 213a. The through hole 213a extends through the conductive substrate 180 in the thickness direction Z. The through hole 213a is filled with a through-electrode 215. The through-electrode 215 may be a tubular member covering the wall of the through hole 213a instead of filling the through hole 213a. The through-electrode 215 electrically connects the wiring layers 180A and 180E. Although not shown in the drawings, the wiring layer 180E electrically connects the through-electrode 215 to the first short-circuiting detection lead 87A.

The second short-circuiting detection circuit 3B includes the second high-voltage diodes 31A and 31B in the same manner as the second short-circuiting detection circuit 3B of the first embodiment.

The second high-voltage diode 31A is connected to the second wire portion 212 and the third wire portion 213. More specifically, the cathode electrode of the second high-voltage diode 31A is connected to the third wire portion 213, and the anode electrode of the second high-voltage diode 31A is connected to the second wire portion 212. The second high-voltage diode 31B is connected to the first wire portion 211 and the second wire portion 212. More specifically, the cathode electrode of the second high-voltage diode 31B is connected to the first wire portion 211, and the anode electrode of the second high-voltage diode 31B is connected to the second wire portion 212. In this manner, the first wire portion 211, the second wire portion 212, and the third wire portion 213 connect the second high-voltage diode 31A and the second high-voltage diode 31B in series.

In the present embodiment, the second high-voltage diode 31A is positioned so that its anode electrode and cathode electrode are arranged in the width direction X. Further, the second high-voltage diode 31B is positioned so that its anode electrode and cathode electrode are arranged in the width direction X. Moreover, the second high-voltage diode 31A and the second high-voltage diode 31B are arranged to align with each other in the length direction Y and spaced apart in the width direction X.

Figure 43:
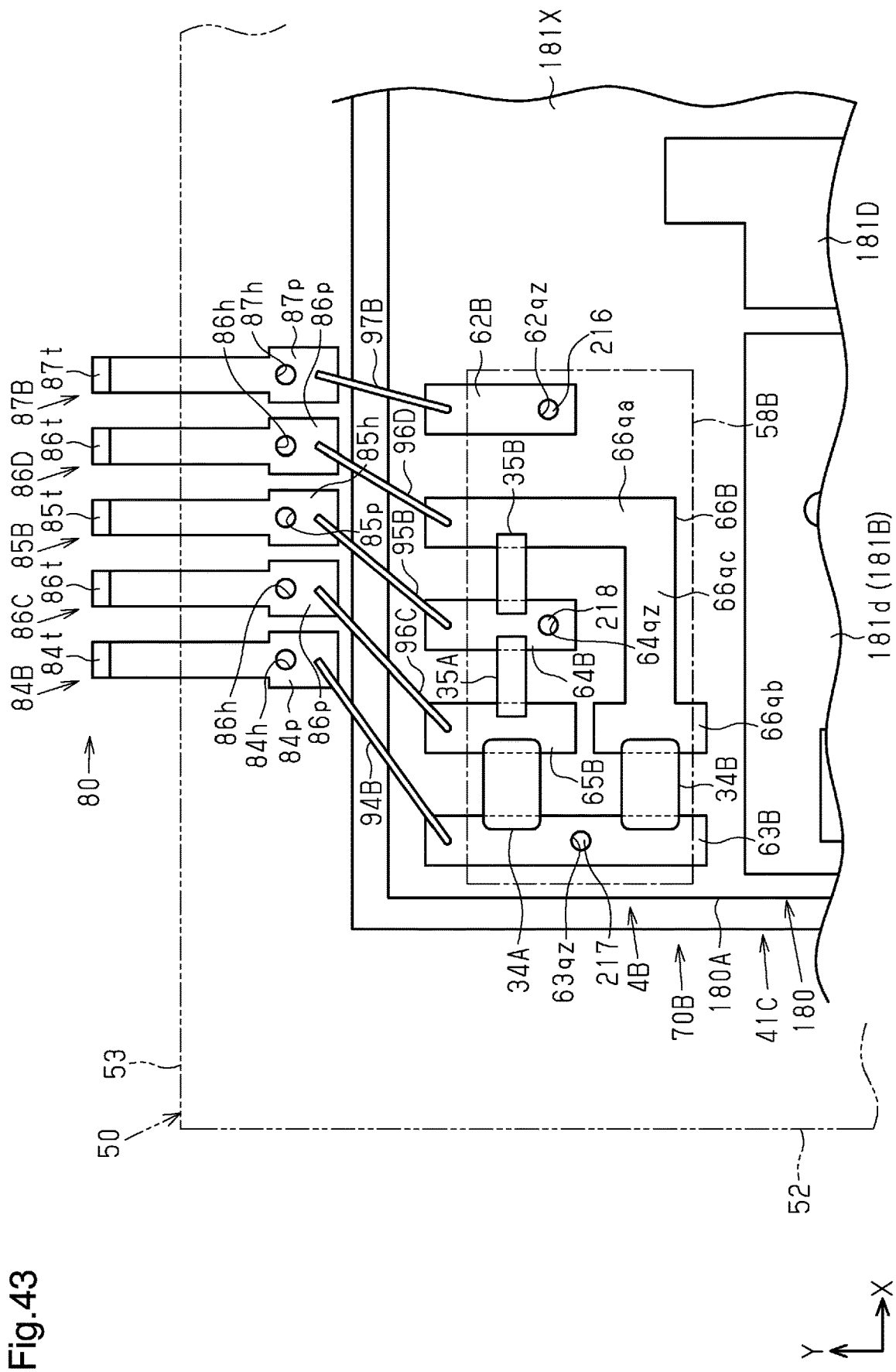
FIG. 43 is an enlarged view of a second wiring region in the semiconductor device shown in FIG. 36.

As shown in FIG. 43, the second wiring region 70B includes the second surge reduction circuit 4B. FIG. 43 shows one wiring configuration example of the second surge reduction circuit 4B. The wiring configuration of the second surge reduction circuit 4B is not limited to the wiring configuration shown in FIG. 43 and may be changed in any manner.

The second surge reduction circuit 4B is arranged in a portion of the second wiring region 70B between the conductive portion 181B and the leads 80 in the length direction Y. The second drive wire 62B, the second control wire 63B, the second control wire 64B, the second control power wire 65B, and the second control power wire 66B are arranged in this portion in the same manner as the first embodiment. The second drive wire 62B, the second control wire 63B, the second control wire 64B, the second control power wire 65B, and the second control power wire 66B of the present embodiment are laid out and shaped differently from the second drive wire 62B, the second control wire 63B, the second control wire 64B, the second control power wire 65B, and the second control power wire 66B of the first embodiment.

The second drive wire 62B is located toward the first resin side surface 51 from the second control wire 63B, the second control wire 64B, the second control power wire 65B, and the second control power wire 66D in the width direction X. The second drive wire 62B extends in the length direction Y. The shape of the second drive wire 62B in a plan view is rectangular so that the length direction Y is the long-side direction and the width direction X is the short-side direction. The second drive wire 62B includes a through hole 62qz. The through hole 62qz extends through the conductive substrate 180 in the thickness direction Z. The through hole 62qz is filled with a through-electrode 216. The through-electrode 216 may be a tubular member covering the wall of the through hole 62qz instead of filling the through hole 62qz. The through-electrode 216 electrically connects the wiring layers 180A and 180E. Although not shown in the drawings, the second drive wire 62B is electrically connected through the wiring layer 180E via the through-electrodes 215 and 216 to the third wire portion 213 in the second short-circuiting detection circuit 3B.

The second control wire 63B is arranged toward the second resin side surface 52 from the second drive wire 62B, the second control wire 64B, the second control power wire 65B, and the second control power wire 66B in the width direction X. The second control wire 63B extends in the length direction Y. The length of the second control wire 63B in the length direction Y is greater than the length of the second drive wire 62B in the length direction Y. The shape of the second control wire 63B in a plan view is rectangular so that the length direction Y is the long-side direction and the width direction X is the short-side direction. The second control wire 63B includes a through hole 63qz. The through hole 63qz extends through the conductive substrate 180 in the thickness direction Z. The through hole 63qz is filled with a through-electrode 217. The through-electrode 217 may be a tubular member covering the wall of the through hole 63qz instead of filling the through hole 63qz. The through-electrode 217 electrically connects the wiring layers 180A and 180E. Although not shown in the drawings, the second control wire 63B is electrically connected via the through-electrodes 195C (refer to FIG. 40) and 217 in the wiring layer 180E to the conductive portions 181G.

The second control wire 64B is located between the second drive wire 62B and the second control wire 63B in the width direction X. The second control wire 64B extends in the length direction Y. The shape of the second control wire 64B in a plan view is rectangular so that the length direction Y is the long-side direction and the width direction X is the short-side direction. The length of the second control wire 64B in the length direction Y is less than the length of the second control wire 63B in the length direction Y. The second control wire 64B includes a through hole 64qz. The through hole 64qz extends through the conductive substrate 180 in the thickness direction Z. The through hole 64qz is filled with a through-electrode 218. The through-electrode 218 may be a tubular member covering the wall of the through hole 64qz instead of filling the through hole 64qz. The through-electrode 218 electrically connects the wiring layers 180A and 180E. Although not shown in the drawings, the second control wire 64B is electrically connected via the through-electrodes 195D (refer to FIG. 40) and 218 in the wiring layer 180E to the conductive portion 181H.

The second control power wire 65B is arranged next to the second control wire 64B in the width direction X. The second control power wire 65B is located between the second control wire 63B and the second control wire 64B in the width direction X. The second control power wire 65B extends in the length direction Y. The shape of the second control power wire 65B in a plan view is rectangular so that the length direction Y is the long-side direction and the width direction X is the short-side direction.

In the same manner as the first embodiment, the second control power wire 66B includes the first wire portion 66qa extending in the length direction Y, the second wire portion 66qb spaced apart from the first wire portion 66qa in the length direction Y, and the third wire portion 66qc connecting the first wire portion 66qa and the second wire portion 66qb. The first wire portion 66q is arranged next to the second control wire 64B in the width direction X. More specifically, the first wire portion 66qa is arranged at the side of the second control wire 64B opposite to the second control power wire 65B in the width direction X. The first wire portion 66qa is located between the second control wire 64B and the second drive wire 62B in the width direction X. The first wire portion 66qa is arranged overlapping the second control wire 64B and the second control power wire 65B as viewed in the width direction X. The first wire portion 66qa and the second control power lead 86D are connected by the second control power connection member 96D. The second control power connection member 96D is, for example, a wire formed through wire bonding.

The second wire portion 66qb is arranged toward the second resin side surface 52 from the second control wire 64B and the second control power wire 65B in the width direction X. The second wire portion 66qb is located toward the fourth resin side surface 54 (toward conductive portion 181B) from the first wire portion 66qa in the length direction Y. The second wire portion 66qb is arranged overlapping the second control power wire 65B as viewed in the length direction Y. The second wire portion 66qb is arranged overlapping the second control wire 63B in the width direction X.

The third wire portion 66qc connects the first wire portion 66qa and the second wire portion 66qb. The third wire portion 66qc is, for example, L-shaped in a plan view. The third wire portion 66qc does not have to be L-shaped in a plan view and may be shaped to extend diagonally so that the first resin side surface 51 becomes closer as the third resin side surface 53 becomes closer.

In the same manner as the first embodiment, the second low-voltage diodes 34A and 34B and the second capacitors 35A and 35B of the second surge reduction circuit 4B are connected to the second control wires 63B and 64B, the second control power wire 65B, and the second control power wire 66B.

The second low-voltage diode 34A is connected to the second control wire 63B and the second control power wire 65B. More specifically, the anode electrode of the second low-voltage diode 34A is connected to the part of the second control wire 63B located toward the second control lead 84B. The cathode electrode of the second low-voltage diode 34A is connected to the second control power wire 65B.

The second low-voltage diode 34B is connected to the second control wire 63B and the second control power wire 66B. More specifically, the cathode electrode of the second low-voltage diode 34B is connected to the second control wire 63B located toward the conductive portion 181B. The anode electrode of the second low-voltage diode 34B is connected to the second wire portion 66qb of the second control power wire 66B. In this manner, the second low-voltage diodes 34A and 34B are connected in series between the second control power wire 66B and the second control power wire 65B by the second control wire 63B.

In the present embodiment, the second low-voltage diode 34A is positioned so that its anode electrode and cathode electrode are arranged in the width direction X. Further, the second low-voltage diode 34B is positioned so that its anode electrode and cathode electrode are arranged in the width direction X. Moreover, the second low-voltage diode 34A and the second low-voltage diode 34B are arranged to align with each other in the width direction X and spaced apart in the length direction Y. The second low-voltage diode 34A is located toward the third resin side surface 53 from the second low-voltage diode 34B in the length direction Y.

The second capacitor 35A is connected to the second control power wire 65B and the second control wire 64B. Specifically, the first terminal of the second capacitor 35A is connected to the second control power wire 65B. The second terminal of the second capacitor 35A is connected to the second control wire 64B.

The second capacitor 35B is connected to the second control power wire 66B and the second control wire 64B. Specifically, the first terminal of the second capacitor 35B is connected to the first wire portion 66qa of the second control power wire 66B. The second terminal of the second capacitor 35B is connected to the second control wire 64B. In this manner, the second capacitors 35A and 35B are connected in series between the second control power wire 65B and the second control power wire 66B by the second control wire 64B.

In the present embodiment, the second capacitor 35A is positioned so that its first terminal and second terminal are arranged in the width direction X. Further, the second capacitor 35B is positioned so that its first terminal and second terminal are arranged in the width direction X. Moreover, the second capacitor 35A and the second capacitor 35B are arranged to align with each other in the length direction Y and spaced apart in the width direction X. The capacitors 35A and 35B overlap the second low-voltage diode 34A in the width direction X. The capacitors 35A and 35B are located toward the first resin side surface 51 from the low-voltage diodes 34A and 34B as viewed in the length direction Y.

Figure 35:
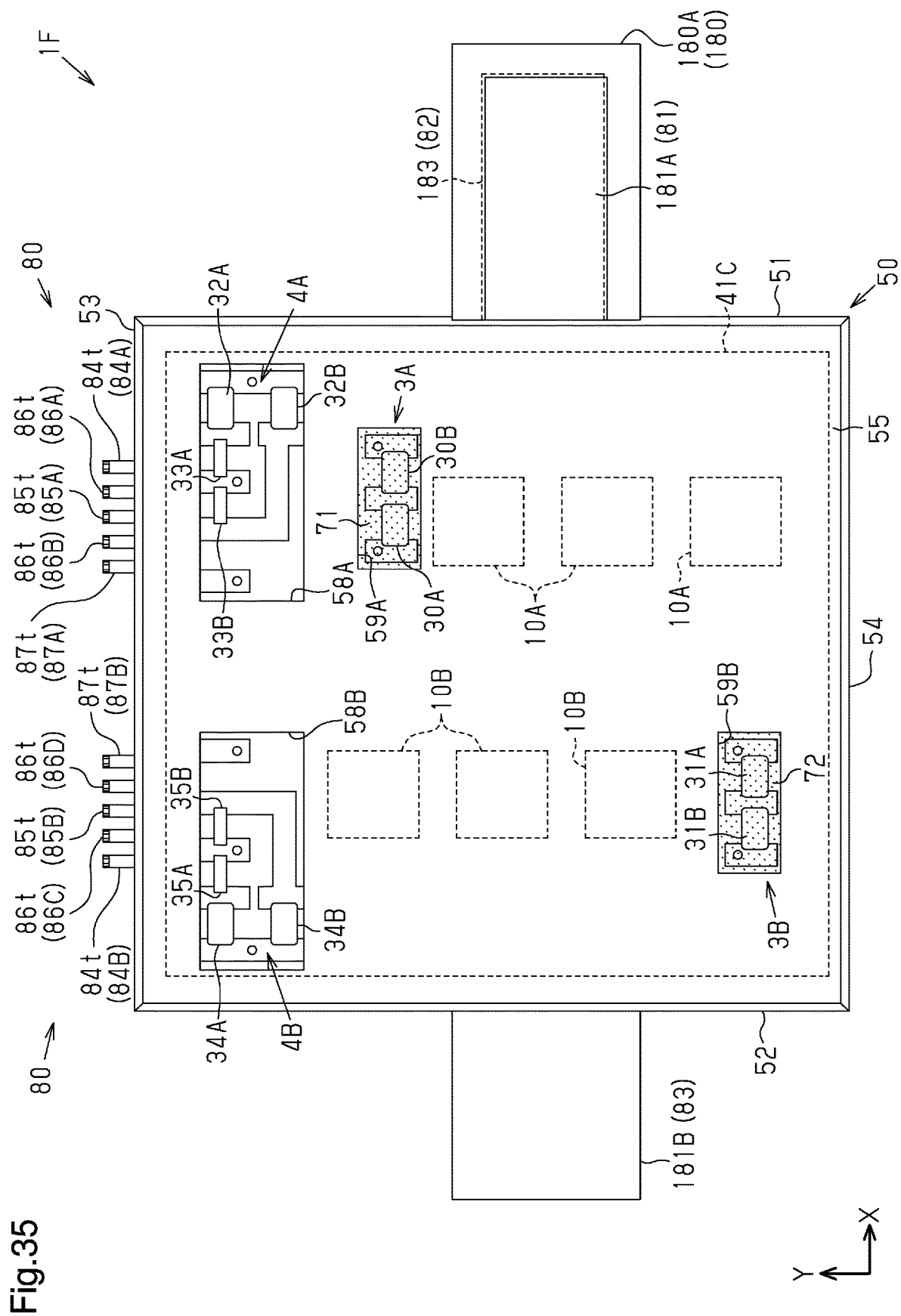
FIG. 35 is a plan view of a semiconductor device in accordance with a sixth embodiment.

As shown in FIG. 35, in the same manner as the first embodiment, the resin member 50 includes four resin openings that expose the conductive substrate 180 from the top resin surface 55, namely, the first control side opening 58A, the second control side opening 58B, the first drive side opening 59A, and the second drive side opening 59B. As shown in FIG. 35, the first control side opening 58A is separate from the first drive side opening 59A. The second control side opening 58B is separate from the second drive side opening 59B. The first control side opening 58A is separate from the second control side opening 58B.

The first control side opening 58A is located at a position overlapping the first semiconductor elements 10A as viewed in the length direction Y and toward the third resin side surface 53 from the first semiconductor elements 10A. The second control side opening 58B is located at a position overlapping the second semiconductor elements 10B as viewed in the length direction Y and toward the third resin side surface 53 from the second semiconductor elements 10B. In this manner, the first control side opening 58A and the second control side opening 58B are arranged along one side of the resin member 50 in a state spaced apart from each other in a plan view. That is, in a plan view, the first control side opening 58A and the second control side opening 58B are arranged to align with each other in the length direction Y and spaced apart in the width direction X. In a plan view, the control side openings 58A and 58B are arranged in the top resin surface 55 at the end located toward the third resin side surface 53. The first control side opening 58A is located toward the first resin side surface 51 from the second control side opening 58B.

As shown in FIG. 41, in a plan view, the first control side opening 58A is located between the first semiconductor elements 10A and the terminal portion 84t of the first control lead 84A in the length direction Y. In the present embodiment, the first control side opening 58A is located between the first semiconductor elements 10A and the pad portion 84p of the first control lead 84A in the length direction Y in a plan view. Further, in a plan view, the first control side opening 58A is located between the first semiconductor elements 10A and the terminal portion 85t of the first control lead 85A in the length direction Y In the present embodiment, the first control side opening 58A is located between the first semiconductor elements 10A and the pad portion 85p of the first control lead 85A in the length direction Y.

As shown in FIG. 43, in a plan view, the second control side opening 58B is located between the second semiconductor elements 10B and the terminal portion 84t of the second control lead 84B in the length direction Y. In the present embodiment, the second control side opening 58B is located between the second semiconductor elements 10B and the pad portion 84p of the second control lead 84B in the length direction Y. Further, in a plan view, the second control side opening 58B is located between the second semiconductor elements 10B and the terminal portion 85t of the second control lead 85B in the length direction Y. In the present embodiment, the second control side opening 58B is located between the second semiconductor elements 10B and the pad portion 85p of the second control lead 85B in the length direction Y in a plan view.

As shown in FIG. 35, the first drive side opening 59A is located at a position overlapping the first semiconductor elements 10A as viewed in the length direction Y and toward the third resin side surface 53 from the first semiconductor elements 10A. Further, the first drive side opening 59A is located toward the first semiconductor elements 10A from the first control side opening 58A in the length direction Y. Thus, the first drive side opening 59A is located between the first semiconductor elements 10A and the terminal portion 84t of the first control lead 84A in the length direction Y in a plan view. The first drive side opening 59A is located between the first semiconductor elements 10A and the terminal portion 85t of the first control lead 85A in the length direction Y. In the present embodiment, the first drive side opening 59A is located between the first semiconductor elements 10A and the first control side opening 58A in the length direction Y in a plan view.

As shown in FIG. 35, the second drive side opening 59B is located at a position overlapping the second semiconductor elements 10B as viewed in the length direction Y and toward the fourth resin side surface 54 from the second semiconductor elements 10B. Thus, in a plan view, the first drive side opening 59A is located toward the first resin side surface 51 from the second control side opening 58B and the second drive side opening 59B. The first drive side opening 59A is located toward the second resin side surface 52 from the first control side opening 58A. The first drive side opening 59A is located closer to the first control side opening 58A than the second control side opening 58B and the second drive side opening 59B. In a plan view, the second drive side opening 59B is arranged in the top resin surface 55 at the end located toward the fourth resin side surface 54. The second drive side opening 59B is located toward the first resin side surface 51 from the second control side opening 58B. The area of each of the drive side openings 59A and 59B in a plan view is smaller than the area of each of the control side openings 58A and 58B in a plan view.

As shown in FIG. 41, the first control side opening 58A exposes part of the first wiring region 70A of the conductive substrate 180. Thus, the first control side opening 58A exposes part of a mounting region in the conductive substrate 180 on which electronic components other than the first semiconductor elements 10A are mounted. The first control side opening 58A exposes an area of the first wiring region 70A located toward the third resin side surface 53. In the present embodiment, the first control side opening 58A exposes the first surge reduction circuit 4A, which is electrically connected to the first semiconductor elements 10A. In further detail, as shown in FIG. 41, the first control side opening 58A exposes the first low-voltage diodes 32A and 32B, the first capacitors 33A and 33B, the first control wire 63A, the first control wire 64A, the first control power wire 65A, and the first wire portion 66pa and second wire portion 66pb of the first control power wire 66A. In the present embodiment, the first control side opening 58A does not expose the first control lead connection members 94A and 95A, the first control power connection members 96A and 96B, and the first short-circuiting detection connection member 97A. The shape of the first control side opening 58A in a plan view, although not limited in particular, is rectangular so that the width direction X is the long-side direction and the length direction Y is the short-side direction. The interior of the first control side opening 58A is an open space.

As shown in FIG. 43, the second control side opening 58B exposes part of the second wiring region 70B of the conductive substrate 180. Thus, the second control side opening 58B exposes part of a mounting region of the conductive substrate 180 on which electronic components other than the second semiconductor elements 10B are mounted. The second control side opening 58B exposes an area of the second wiring region 70B located toward the third resin side surface 53. In the present embodiment, the second control side opening 58B exposes the second surge reduction circuit 4B, which is electrically connected to the second semiconductor elements 10B. In further detail, the second control side opening 58B exposes the second low-voltage diodes 34A and 34B, the second capacitors 35A and 35B, the second control wire 63B, the second control wire 64B, the second control power wire 65B, and the first wire portion 66qa and second wire portion 66qb of the second control power wire 66B. In the present embodiment, the second control side opening 58B does not expose the second control lead connection members 94B and 95B, the second control power connection members 96C and 96D, and the second short-circuiting detection connection member 97B. The shape of the second control side opening 58B in a plan view, although not limited in particular, is rectangular so that the width direction X is the long-side direction and the length direction Y is the short-side direction. The interior of the second control side opening 58B is an open space.

As shown in FIG. 41, the first drive side opening 59A exposes an area of the first wiring region 70A that differs from the area exposed by the first control side opening 58A. In other words, the first drive side opening 59A exposes part of a mounting region in the conductive substrate 180 on which electronic components other than the first semiconductor elements 10A. The exposed part differs from the part exposed from the first control side opening 58A. The first drive side opening 59A exposes an area of the first wiring region 70A located toward the first semiconductor elements 10A. In the present embodiment, the first drive side opening 59A exposes the first short-circuiting detection circuit 3A, which is connected to the drain electrode 11 of the first semiconductor element 10A. In further detail, as shown in FIG. 41, the first drive side opening 59A exposes the first high-voltage diodes 30A and 30B, the first wire section 201, the second wire section 202, and the third wire section 203. In the present embodiment, the first drive side opening 59A does not expose the first semiconductor elements 10A. The shape of the first drive side opening 59A in a plan view, although not limited in particular, is rectangular so that the width direction X is the long-side direction and the length direction Y is the short-side direction. Further, the first drive side opening 59A is filled with the insulative material 71, which is electrically insulative, in the same manner as the first embodiment. One example of the insulative material 71 is silicone resin.

As shown in FIG. 35, the second drive side opening 59B exposes part of the third wiring region 70C of the conductive substrate 180. Thus, the second drive side opening 59B exposes part of a mounting region in the conductive substrate 180 on which components other than the second semiconductor elements 10B are mounted. The exposed part differs from the part exposed from the second control side opening 58B. The second drive side opening 59B exposes the second short-circuiting detection circuit 3B, which is connected to the drain electrode 11 of each second semiconductor element 10B. In further detail, as shown in FIG. 42, the second drive side opening 59B exposes the second high-voltage diodes 31A and 31B, the first wire portion 211, the second wire portion 212, and the third wire portion 213. In the present embodiment, the second drive side opening 59B does not expose the second semiconductor elements 10B. The shape of the second drive side opening 59B in a plan view, although not limited in particular, is rectangular so that the width direction X is the long-side direction, and the length direction Y is the short-side direction. Further, the second drive side opening 59B is filled with the insulative material 72, which is electrically insulative, in the same manner as the first embodiment. One example of the insulative material 72 is silicone resin.

The semiconductor device 1F of the present embodiment has the advantages described below.

(6-1) The semiconductor device 1F includes the metal members 191 and the metal members 192 that extend through the conductive substrate 180 in the thickness direction Z. The first semiconductor elements 10A are respectively mounted on the metal members 191, and the metal members 192 are respectively mounted on the second semiconductor elements 10B. This configuration efficiently releases heat from the semiconductor elements 10A and 10B when the semiconductor elements 10A and 10B are activated. Accordingly, the semiconductor device 1F minimizes increases in the junction temperature of the semiconductor elements 10A and 10B and avoids thermal destruction of the semiconductor elements 10A and 10B.

(6-2) The area of each of the insertion members 193 and 194 in a plan view is larger than the area of each of the through-electrodes 204 to 208 and 214 to 218 in a plan view. With this configuration, the parasitic resistance and parasitic inductance of the insertion members 193 and 194 becomes less than the parasitic resistance and parasitic inductance of the through-electrodes 204 to 208 and 214 to 218. Each of the insertion members 193 and 194 is part of a current path in which the semiconductor device 1F performs power conversion, and each of the through-electrodes 204 to 208 and 214 to 218 is part of a signal path in which the semiconductor device 1F performs power conversion. Thus, parasitic resistance and parasitic inductance is reduced in the insertion members 193 and 194, through which relatively large current flows, and conductance loss is minimized in the insertion members 193 and 194. A current of, for example, 400 A or greater and 600 A or less flows through the current path.

(6-3) The area of each of the metal members 191 and 192 in a plan view is larger than the area of each of the insertion members 193 and 194 in a plan view. With this configuration, the thermal conductivity of the metal members 191 and 192 is greater than that of the insertion members 193 and 194. Accordingly, the semiconductor device 1F obtains suitable conductivity and improved conductivity at the metal members 191 and 192.

Seventh Embodiment

With reference to FIGS. 44 to 47, a semiconductor device 1G in accordance with a seventh embodiment will now be described. The semiconductor device 1G of the present embodiment mainly differs from the semiconductor device 1F of the sixth embodiment in the mounting mode of the first wiring region 70A and the second wiring region 70B. In the description hereafter, same reference numerals are given to those components that are the same as the corresponding components of the semiconductor device 1F in accordance with the sixth embodiment. Such components will not be described in detail.

Figure 45:
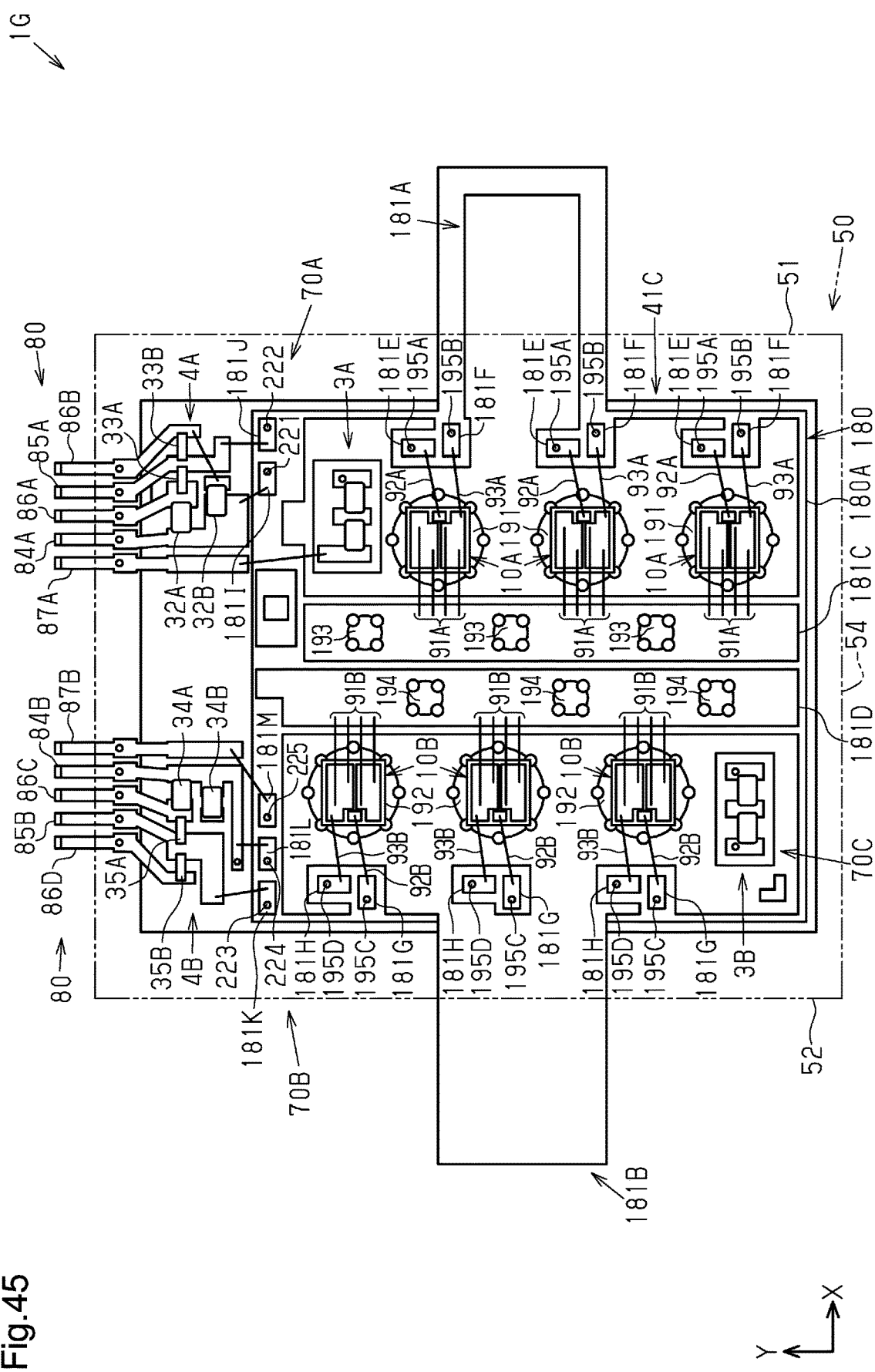
FIG. 45 is a plan view showing the semiconductor device in accordance with the seventh embodiment in a state in which a resin member is removed from the semiconductor device.

As shown in FIG. 45, the semiconductor device 1G of the present embodiment includes the short-circuiting detection circuits 3A and 3B and the surge reduction circuits 4A and 4B in the insulative substrate 41C outside the conductive substrate 180. The length in the length direction Y of the conductive substrate 180 in the present embodiment is decreased from the length in the length direction Y of the conductive substrate 180 in the sixth embodiment, and space is obtained for the short-circuiting detection circuits 3A and 3B and the surge reduction circuits 4A and 4B. The conductive substrate 180 does not include the first wiring region 70A and the second wiring region 70B of the conductive substrate 180 in the sixth embodiment and is shorter accordingly in the length direction Y.

Figure 44:
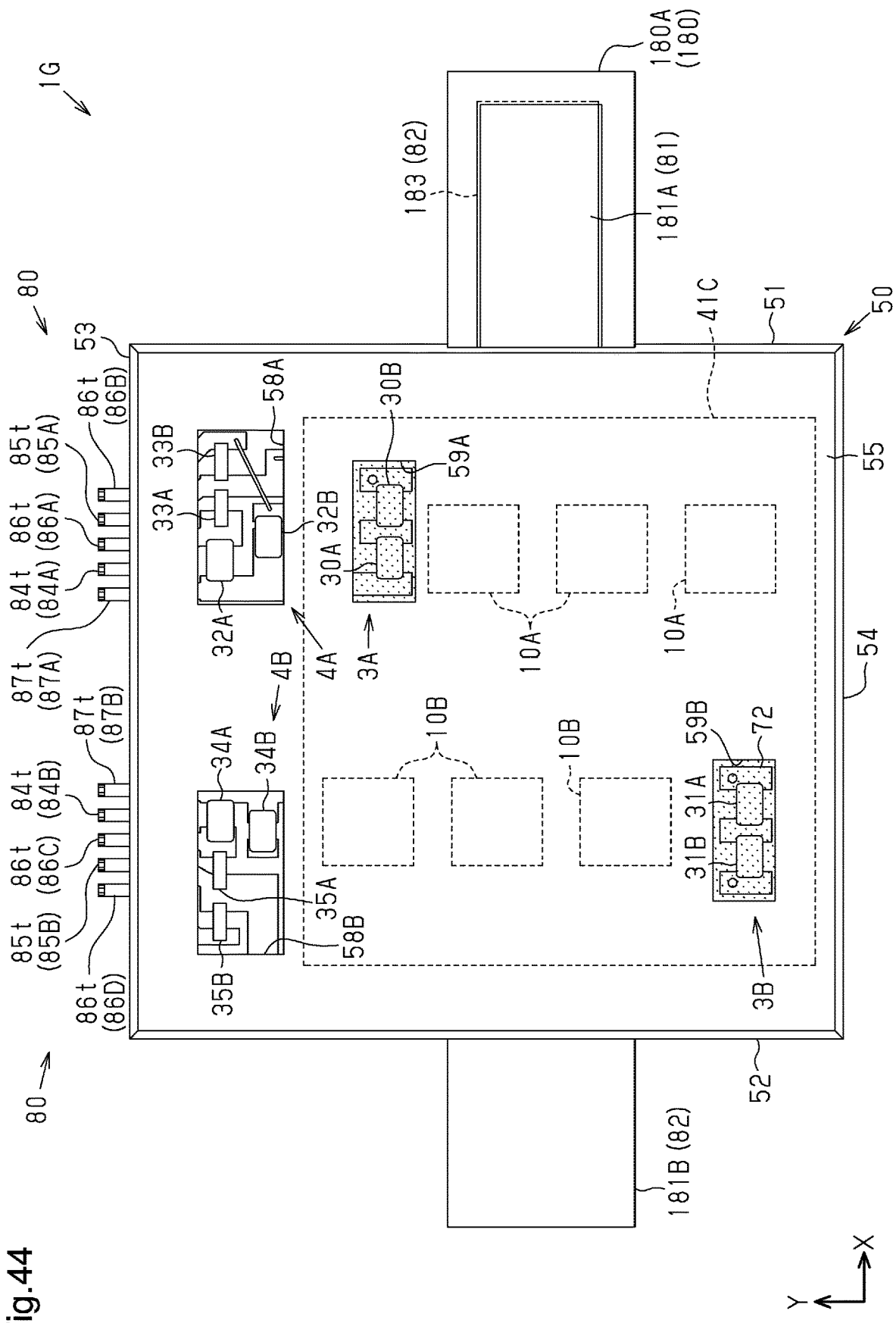
FIG. 44 is a plan view of a semiconductor device in accordance with a seventh embodiment.

Further, the semiconductor device 1G of the present embodiment differs from the semiconductor device 1F of the sixth embodiment in the layout of the leads 80. As shown in FIG. 44, the layout of the leads 80 in the semiconductor device 1G is the same as the layout of the leads 80 in the semiconductor device 1B of the second embodiment (refer to FIG. 16).

As shown in FIG. 45, in the semiconductor device 1G of the present embodiment, a conductive portion 181I and a conductive portion 181I are arranged on the insulative portion 181X at the end located toward the third resin side surface 53 and the first resin side surface 51. The conductive portion 181I and the conductive portion 181J are each located toward the third resin side surface 53 from the conductive portion 181A. The conductive portion 181I and the conductive portion 181J are each arranged next to the conductive portion 181A in the length direction Y. The conductive portion 181I and the conductive portion 181I are arranged to align with one another in the length direction Y and spaced apart in the width direction X. The conductive portion 181J is located toward the first resin side surface 51 from the conductive portion 181I. The shape of each of the conductive portion 181I and the conductive portion 181J in a plan view is rectangular so that the width direction X is the long-side direction and the length direction Y is the short-side direction.

Figure 46:
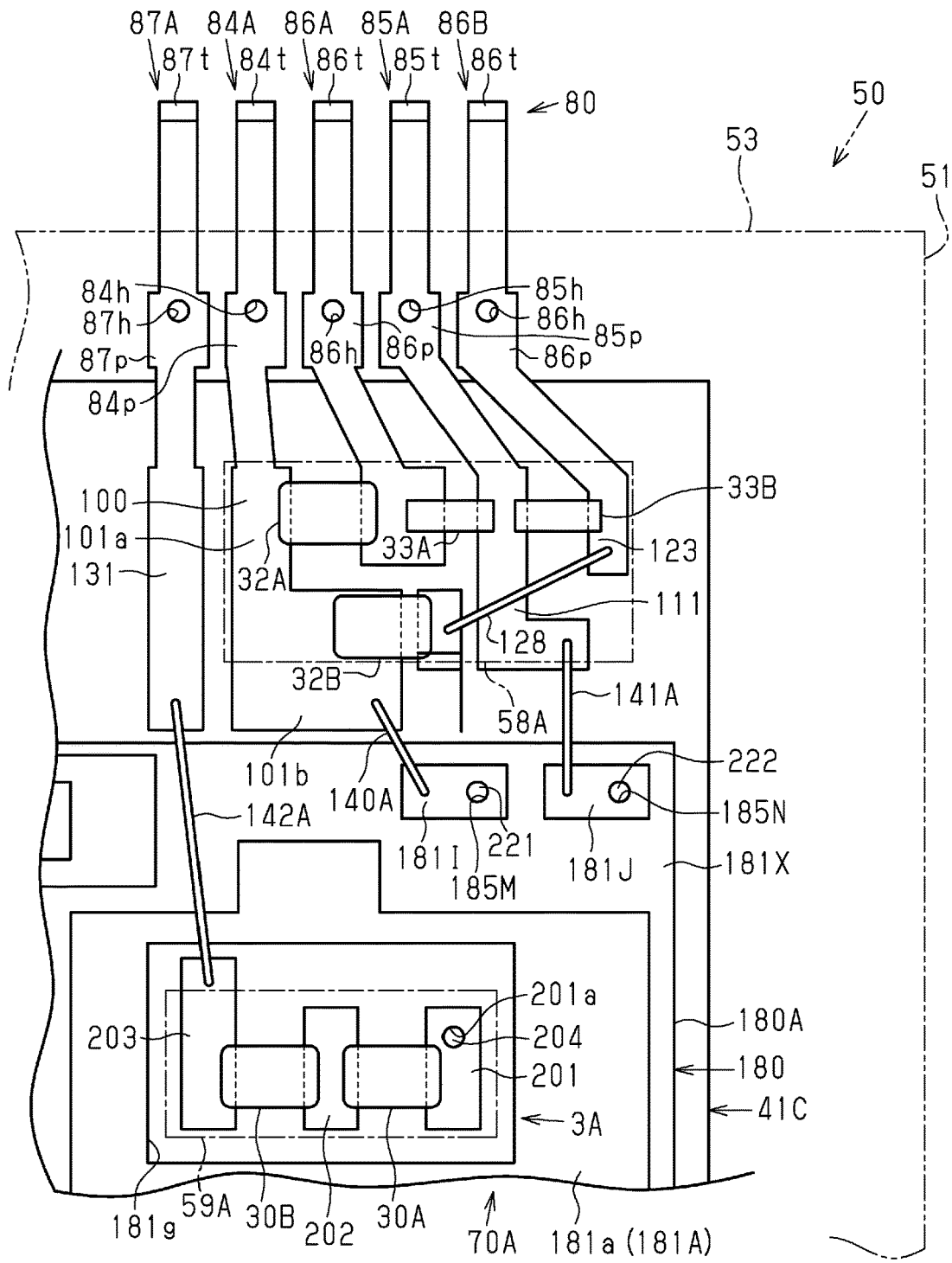
FIG. 46 is an enlarged view of a first wiring region in the semiconductor device shown in FIG. 45.

As shown in FIG. 46, the conductive portion 181I is electrically connected to the conductive portions 181E. The conductive portion 181I includes a through hole 185M. The through hole 185M extends through the conductive substrate 180 in the thickness direction Z. The through hole 185M is filled with a through-electrode 221. The through-electrode 221 may be a tubular member covering the wall of the through hole 185M instead of filling the through hole 185M. The through-electrode 221 electrically connects the wiring layers 180A and 180E. Although not shown in the drawings, the conductive portion 181I is electrically connected via the through-electrodes 195A (refer to FIG. 45) and 221 in the wiring layer 180E to the conductive portions 181E.

The conductive portion 181J is electrically connected to the conductive portions 181F. The conductive portion 181J includes a through hole 185N. The through hole 185N extends through the conductive substrate 180 in the thickness direction Z. The through hole 185N is filled with a through-electrode 222. The through-electrode 222 may be a tubular member covering the wall of the through hole 185N instead of filling the through hole 185N. The through-electrode 222 electrically connects the wiring layers 180A and 180E. Although not shown in the drawings, the conductive portion 181J is electrically connected via the through-electrodes 195B (refer to FIG. 45) and 222 in the wiring layer 180E to the conductive portion 181F.

As shown in FIG. 45, a conductive portion 181K, a conductive portion 181L, and a conductive portion 181M are arranged on the insulative portion 181X at the end located toward the third resin side surface 53 and the second resin side surface 52. The conductive portions 181K, 181L, and 181M are each located toward the third resin side surface 53 from the conductive portion 181B. The conductive portions 181K, 181L, and 181M are each arranged next to the conductive portion 181B in the length direction Y. the conductive portions 181K, 181L, and 181M are arranged to align with one another in the length direction Y and spaced apart in the width direction X. The conductive portions 181K, 181L, and 181M are aligned with the conductive portion 181I and the conductive portion 181I in the length direction Y. The conductive portion 181L is located between the conductive portion 181K and the conductive portion 181M in the width direction X. The conductive portion 181K is located toward the second resin side surface 52 from the conductive portion 181L, and the conductive portion 181M is located toward the first resin side surface 51 from the conductive portion 181L. The shape of each of the conductive portions 181K, 181L, and 181M in a plan view is rectangular so that the width direction X is the long-side direction and the length direction Y is the short-side direction.

Figure 47:
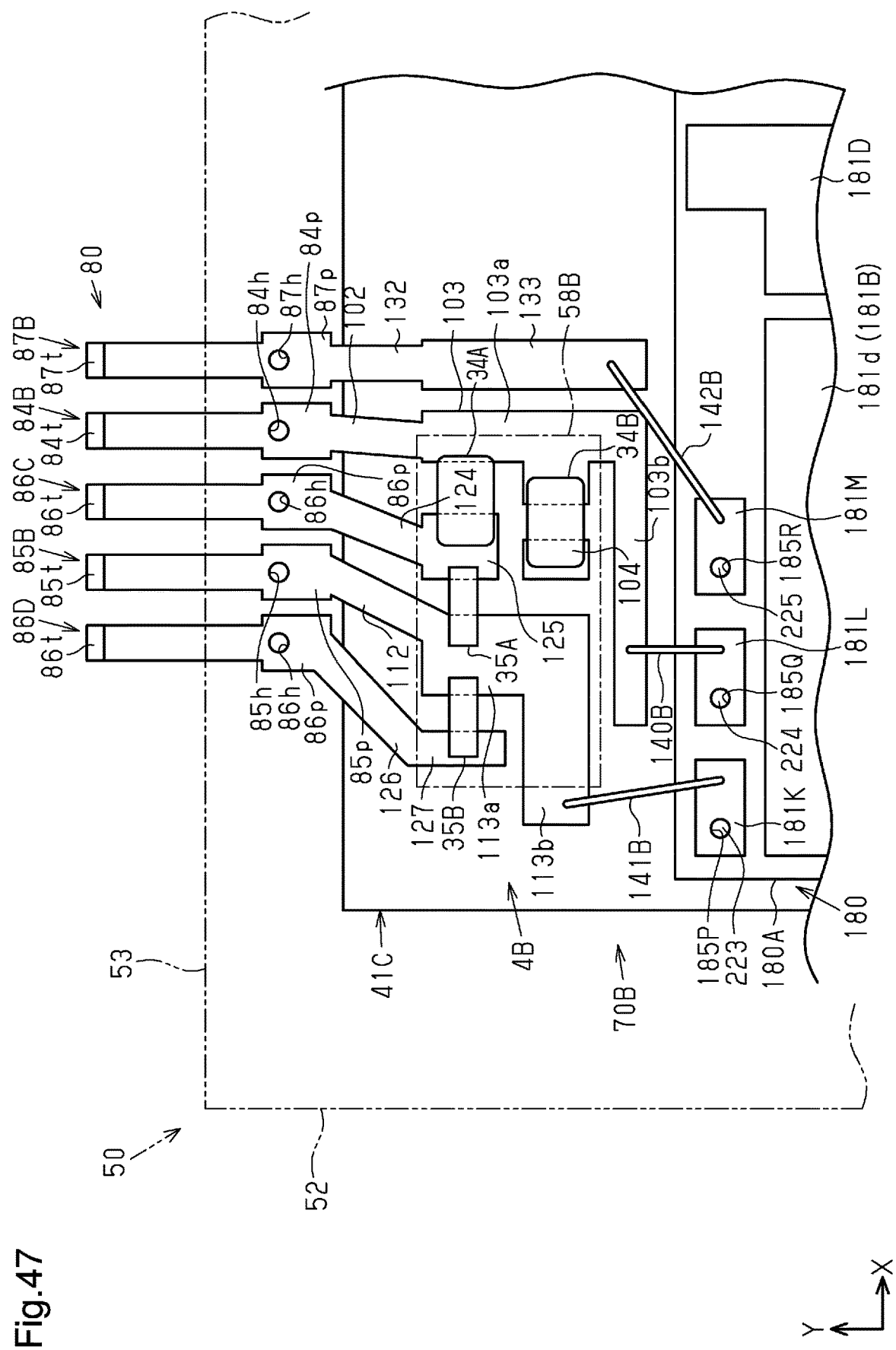
FIG. 47 is an enlarged view of a second wiring region in the semiconductor device shown in FIG. 45.

As shown in FIG. 47, the conductive portion 181K is electrically connected to the conductive portions 181G. The conductive portion 181K includes a through hole 185P. The through hole 185P extends through the conductive substrate 180 in the thickness direction Z. The through hole 185P is filled with a through-electrode 223. The through-electrode 223 may be a tubular member covering the wall of the through hole 185P instead of filling the through hole 185P. The through-electrode 223 electrically connects the wiring layers 180A and 180E. Although not shown in the drawings, the conductive portion 181K is electrically connected via the through-electrodes 195C and 223 in the wiring layer 180E to the conductive portion 181G.

The conductive portion 181L is electrically connected to the conductive portions 181H. The conductive portion 181L includes a through hole 185Q. The through hole 185Q extends through the conductive substrate 180 in the thickness direction Z. The through hole 185Q is filled with a through-electrode 224. The through-electrode 224 may be a tubular member covering the wall of the through hole 185Q instead of filling the through hole 185Q. The through-electrode 224 electrically connects the wiring layers 180A and 180E. Although not shown in the drawings, the conductive portion 181L is electrically connected via the through-electrodes 195D and 224 in the wiring layer 180E to the conductive portion 181H.

The conductive portion 181M is electrically connected to the drain electrode 11 of each second semiconductor element 10B. The conductive portion 181M includes a through hole 185R. The through hole 185R extends through the conductive substrate 180 in the thickness direction Z. The through hole 185R is filled with a through-electrode 225. The through-electrode 225 may be a tubular member covering the wall of the through hole 185R instead of filling the through hole 185R. The through-electrode 225 electrically connects the wiring layers 180A and 180E. Although not shown in the drawings, the conductive portion 181M is electrically connected via the through-electrode 225 in the wiring layer 180E to the drain electrode 11 of each second semiconductor element 10B.

As shown in FIGS. 46 and 47, the control leads 84A, 84B, 85A, and 85B, the control power leads 86A to 86D, and the short-circuiting detection leads 87A and 87B of the present embodiment differ in configuration from the control leads 84A, 84B, 85A, and 85B, the control power leads 86A to 86D, and the short-circuiting detection leads 87A and 87B of the sixth embodiment. The control leads 84A, 84B, 85A, and 85B, the control power leads 86A to 86D, and the short-circuiting detection leads 87A and 87B of the present embodiment each include a wire section of a circuit formed in the first wiring region 70A and the second wiring region 70B. Thus, in the present embodiment, the control leads 84A, 84B, 85A, and 85B, the control power leads 86A to 86D, and the short-circuiting detection leads 87A and 87B each form a conductor. The portions of the first wiring region 70A and the second wiring region 70B where the control leads 84A, 84B, 85A, and 85B, the control power leads 86A to 86D, and the short-circuiting detection leads 87A and 87B are arranged serve as mounting regions on which electronic components are mounted. The circuit formed in the first wiring region 70A is the first surge reduction circuit 4A, and the circuit formed in the second wiring region 70B is the second surge reduction circuit 4B.

As shown in FIG. 46, the first control lead 84A, the first control lead 85A, the first control power lead 86A, the first control power lead 86B, and the first short-circuiting detection lead 87A have the same configuration as the first control lead 84A, the first control lead 85A, the first control power lead 86A, the first control power lead 86B, and the first short-circuiting detection lead 87A that are shown in FIG. 17. Further, the first low-voltage diodes 32A and 32B and the first capacitors 33A and 33B are mounted on the first control lead 84A, the first control lead 85A, the first control power lead 86A, the first control power lead 86B, and the first short-circuiting detection lead 87A in the same manner as the first low-voltage diodes 32A and 32B and the first capacitors 33A and 33B mounted on the first control lead 84A, the first control lead 85A, the first control power lead 86A, the first control power lead 86B, and the first short-circuiting detection lead 87A in the second embodiment.

The first control connection member 140A, the first control connection member 141A, and the first short-circuiting detection connection member 142A are connected differently from the first control connection member 140A, the first control connection member 141A, and the first short-circuiting detection connection member 142A in the second embodiment shown in FIG. 17.

In further detail, the first control connection member 140A connects the second part 101b of the second wire section 101 in the first control lead 84A to the conductive portion 181I. The first control connection member 141A connects the second part 111b of the second wire section 111 in the first control lead 85A to the conductive portion 181J. The first short-circuiting detection connection member 142A connects the second wire section 131 of the first short-circuiting detection lead 87A to the third wire section 203 of the first short-circuiting detection circuit 3A. In the present embodiment, the length of the second wire section 131 in the length direction Y is greater than the length of the second wire section 131 of the sixth embodiment in the length direction Y to obtain a region for connection of the first short-circuiting detection connection member 142A.

As shown in FIG. 47, the second control lead 84B, the second control lead 85B, the second control power lead 86C, the second control power lead 86D, and the second short-circuiting detection lead 87B have the same configuration as the second control lead 84B, the second control lead 85B, the second control power lead 86C, the second control power lead 86D, and the second short-circuiting detection lead 87B that are shown in FIG. 18. Further, the second low-voltage diodes 34A and 34B and the second capacitors 35A and 35B are mounted on the second control lead 84B, the second control lead 85B, the second control power lead 86C, the second control power lead 86D, and the second short-circuiting detection lead 87B in the same manner as the second low-voltage diodes 34A and 34B and the second capacitors 35A and 35B mounted on the second control lead 84B, the second control lead 85B, the second control power lead 86C, the second control power lead 86D, and the second short-circuiting detection lead 87B in the second embodiment.

The second control connection member 140B, the second control connection member 141B, and the second short-circuiting detection connection member 142B are connected differently from the second control connection member 140B, the second control connection member 141B, and the second short-circuiting detection connection member 142B in the second embodiment shown in FIG. 18.

In further detail, the second control connection member 140B connects the second part 103b of the second wire section 103 located toward the second resin side surface 52 in the second control lead 84B to the conductive portion 181L. The second control connection member 141B connects the second part 113b of the second control lead 85B to the conductive portion 181K. The second short-circuiting detection connection member 142B connects the second wire section 133 of the second short-circuiting detection lead 87B to the conductive portion 181M.

As shown in FIG. 44, in the same manner as the sixth embodiment, the first control side opening 58A, the second control side opening 58B, the first drive side opening 59A, and the second drive side opening 59B are formed in the resin member 50. The first drive side opening 59A and the second drive side opening 59B correspond to the first drive side opening 59A and the second drive side opening 59B of the sixth embodiment.

The first control side opening 58A exposes a portion located toward the third resin side surface 53 from the conductive substrate 180 in the length direction Y and toward the first resin side surface 51 from the central portion of the insulative substrate 41C in the width direction X. The first control side opening 58A exposes a portion of the insulative substrate 41C projecting from the conductive substrate 180 toward the third resin side surface 53 and located toward the first resin side surface 51 from the central portion in the width direction X. In further detail, the first control side opening 58A exposes the first surge reduction circuit 4A, which is electrically connected to the first semiconductor elements 10A, in the same manner as the first control side opening 58A of the first embodiment. As shown in FIG. 46, the first control side opening 58A exposes part of each of the first control leads 84A and 85A, part of each of the first control power leads 86A and 86B, the first low-voltage diodes 32A and 32B, the first capacitors 33A and 33B, and part of the insulative substrate 41C. In the present embodiment, the first control side opening 58A does not expose the first short-circuiting detection lead 87A. The shape of the first control side opening 58A in a plan view, although not limited in particular, is rectangular so that the width direction X is the long-side direction and the length direction Y is the short-side direction. The interior of the first control side opening 58A is an open space.

As shown in FIG. 44, the second control side opening 58B exposes a portion located toward the third resin side surface 53 from the conductive substrate 180 in the length direction Y and toward the second resin side surface 52 from the central portion of the insulative substrate 41C in the width direction X. The second control side opening 58B exposes a portion of the insulative substrate 41C projecting from the conductive substrate 180 toward the third resin side surface 53 and located toward the second resin side surface 52 from the central portion in the width direction X. In further detail, the second control side opening 58B exposes the second surge reduction circuit 4B, which is electrically connected to the second semiconductor elements 10B, in the same manner as the second control side opening 58B of the first embodiment. As shown in FIG. 47, the second control side opening 58B exposes part of each of the second control leads 84B and 85B, part of each of the second control power leads 86C and 86D, the second low-voltage diodes 34A and 34B, the second capacitors 35A and 35B, and part of the second conductive member 42B. In the present embodiment, the second control side opening 58B does not expose the second short-circuiting detection lead 87B. The shape of the second control side opening 58B in a plan view, although not limited in particular, is rectangular so that the width direction X is the long-side direction and the length direction Y is the short-side direction. The interior of the second control side opening 58B is an open space. The semiconductor device 1G in accordance with the present embodiment has the same advantages as the semiconductor device 1F in accordance with the sixth embodiment and the semiconductor device 1B of the second embodiment.

Eighth Embodiment

With reference to FIGS. 48 to 51, a semiconductor device 1H in accordance with an eighth embodiment will now be described. The semiconductor device 1H in accordance with the present embodiment differs from the semiconductor device 1F in accordance with the sixth embodiment in the mounting mode of the first wiring region 70A and the second wiring region 70B. Further, the semiconductor device 1H in accordance with the present embodiment uses the semiconductor elements 10A and 10B of the fourth embodiment. In the description hereafter, same reference numerals are given to those components that are the same as the corresponding components of the semiconductor device 1F in accordance with the sixth embodiment. Such components will not be described in detail.

The semiconductor device 1H in accordance with the present embodiment differs from the semiconductor device 1F in accordance with the sixth embodiment in that the first surge absorption circuit 5A and the first interface circuit 6A of the third embodiment are used instead of the first surge reduction circuit 4A and the second surge absorption circuit 5B and the second interface circuit 6B of the third embodiment are used instead of the second surge reduction circuit 4B. Further, in the semiconductor device 1H in accordance with the present embodiment, the configuration of the leads 80 in the semiconductor device 1F in accordance with the sixth embodiment is changed to the configuration of the leads 80 in the semiconductor device 1C in accordance with the third embodiment. More specifically, as the leads 80 arranged adjacent to the first wiring region 70A in the length direction Y, the semiconductor device 1H includes the first control lead 84A, the first control lead 85A, the first control power lead 86B, the first interface lead 88A, and the first short-circuiting detection lead 87A. The first control lead 85A, the first control lead 84A, the first interface lead 88A, the first control power lead 86B, and the first short-circuiting detection lead 87A are disposed in order from the input leads 81 and 82 toward the output lead 83 in the width direction X.

As the leads 80 arranged adjacent to the second wiring region 70B in the length direction Y, the semiconductor device 1H includes the second control lead 84B, the second control lead 85B, the second control power lead 86D, the second interface lead 88B, and the second short-circuiting detection lead 87B. The second control lead 85B, the second control lead 84B, the second control power lead 86D, the second interface lead 88B, and the second short-circuiting detection lead 87B are disposed in order from the output lead 83 to the input leads 81 and 82 in the width direction X.

Figure 50:
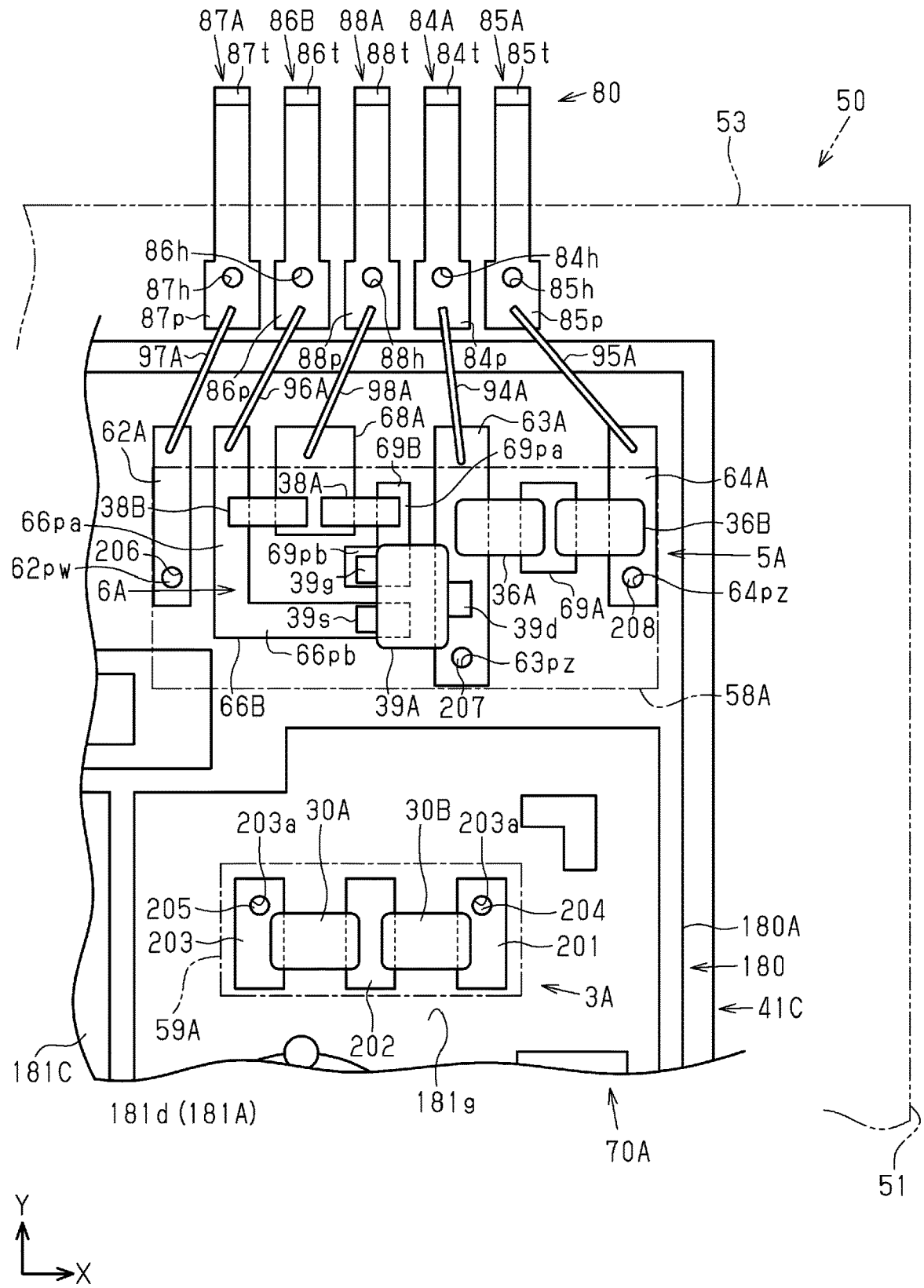
FIG. 50 is an enlarged view of a first wiring region in the semiconductor device shown in FIG. 49.

As shown in FIG. 50, among the first control wire 63A, the first control wire 64A, the second control power wire 66B, the first interface wire 68A, the first relay wire 69A, and the second relay wire 69B that form the wiring of the first surge absorption circuit 5A and the first interface circuit 6A in the first wiring region 70A, the first control wire 63A and the first control wire 64A have different configurations.

The first control wire 63A extends in the length direction Y The shape of the first control wire 63A in a plan view is rectangular so that the length direction Y is the long-side direction and the width direction X is the short-side direction. The first control wire 63A includes the through hole 63pz. The through hole 63pz extends through the conductive substrate 180 in the thickness direction Z. The through hole 63pz is filled with the through-electrode 207. The through-electrode 207 may be a tubular member covering the wall of the through hole 63pz instead of filling the through hole 63pz. The through-electrode 207 electrically connects the wiring layers 180A and 180E. Although not shown in the drawings, the first control wire 63A is electrically connected via the through-electrodes 195A (refer to FIG. 49) and 207 in the wiring layer 180E to the conductive portions 181E.

The first control wire 64A extends in the length direction Y The shape of the first control wire 64A in a plan view is rectangular so that the length direction Y is the long-side direction and the width direction X is the short-side direction. The first control wire 64A includes the through hole 64pz. The through hole 64pz extends through the conductive substrate 180 in the thickness direction Z. The through hole 64pz is filled with the through-electrode 208. The through-electrode 208 may be a tubular member covering the wall of the through hole 64pz instead of filling the through hole 64pz. The through-electrode 208 electrically connects the wiring layers 180A and 180E. Although not shown in the drawings, the first control wire 64A is electrically connected via the through-electrodes 195B (refer to FIG. 49) and 208 in the wiring layer 180E to the conductive portions 181F.

The first low-voltage diodes 36A and 36B, which form the first surge absorption circuit 5A, are mounted on the first control wire 63A, the first control wire 64A, and the first relay wire 69A.

The first low-voltage diodes 36A and 36B are connected in anti-series between the first control wire 63A and the first control wire 64A via the first relay wire 69A. In further detail, the cathode electrode of the first low-voltage diode 36A is connected to the first control wire 63A. The anode electrode of the first low-voltage diode 36A is connected to the first relay wire 69A. The anode electrode of the first low-voltage diode 36B is connected to the first relay wire 69A. The cathode electrode of the first low-voltage diode 36B is connected to the first control wire 64A.

In the present embodiment, the first low-voltage diode 36A is positioned so that its anode electrode and cathode electrode are arranged in the width direction X. Further, the first low-voltage diode 36B is positioned so that its anode electrode and cathode electrode are arranged in the width direction X. Moreover, the first low-voltage diode 36A and the first low-voltage diode 36B are arranged to align with each other in the length direction Y and spaced apart in the width direction X.

The first resistors 38A and 38B and the first switching element 39A, which form the first interface circuit 6A, are mounted on the first control wire 63A, the second control power wire 66B, the first interface wire 68A, and the second relay wire 69B.

The first switching element 39A is electrically connected to the first control wire 63A, the second control power wire 66B, and the second relay wire 69B. In further detail, the drain electrode 39d of the first switching element 39A is connected to the first control wire 63A. The source electrode 39S of the first switching element 39A is connected to the second wire portion 66pb of the second control power wire 66B. The gate electrode 39g of the first switching element 39A is connected to the second relay wire 69B. In the present embodiment, the first switching element 39A is located toward the first semiconductor elements 10A from the first low-voltage diodes 36A and 36B, the first resistor 38A, and the first resistor 38B.

The first resistor 38A and the first resistor 38B are connected between the second control power wire 66B and the second relay wire 69B via the first interface wire 68A. The first terminal of the first resistor 38A is connected to the second relay wire 69B. The second terminal of the first resistor 38A is connected to the first interface wire 68A. The first terminal of the first resistor 38B is connected to the first interface wire 68A. The second terminal of the first resistor 38B is connected to the first wire portion 66pa of the second control power wire 66B.

In the present embodiment, the first resistor 38A is positioned so that its first terminal and second terminal are arranged in the width direction X. Further, the first resistor 38B is positioned so that its first terminal and second terminal are arranged in the width direction X. Moreover, the first resistor 38A and the first resistor 38B are arranged aligned with each other in the length direction Y and spaced apart in the width direction X.

Figure 51:
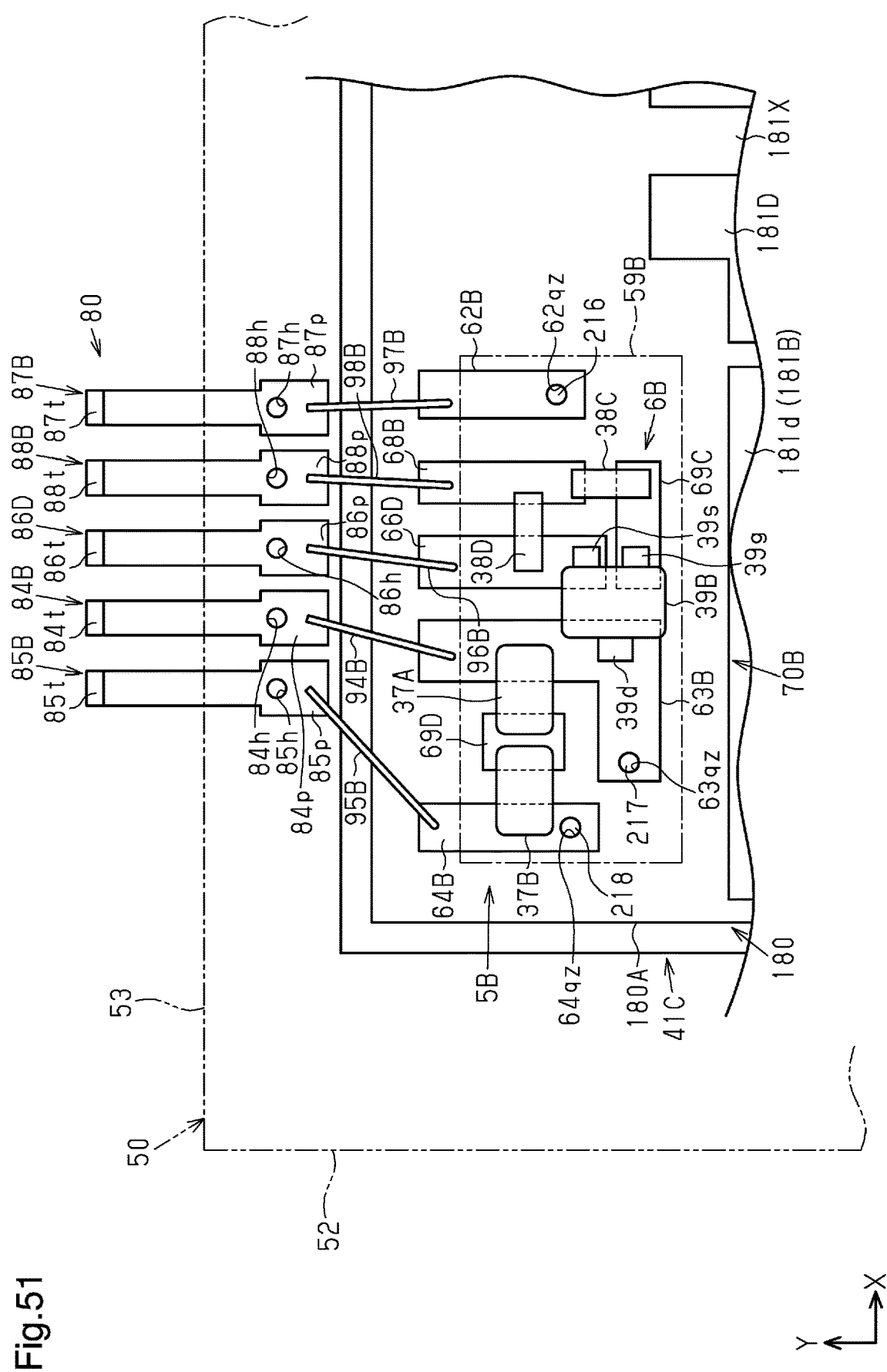
FIG. 51 is an enlarged view of a second wiring region in the semiconductor device shown in FIG. 49.

As shown in FIG. 51, among the second control wire 63B, the second control wire 64B, the second control power wire 66D, the second interface wire 68B, the third relay wire 69C, and the fourth relay wire 69D that form the wiring of the second surge absorption circuit 5B and the second interface circuit 6B in the second wiring region 70B, the second control wire 63B and the second control wire 64B have different configurations.

The second control wire 63B is L-shaped in a plan view. The second control wire 63B includes the through hole 63$qz$. The through hole 63$qz$ extends through the conductive substrate 180 in the thickness direction Z. The through hole 63$qz$ is filled with the through-electrode 217. The through-electrode 217 may be a tubular member covering the wall of the through hole 63$qz$ instead of filling the through hole 63$qz$. The through-electrode 217 electrically connects the wiring layers 180A and 180E. Although not shown in the drawings, the second control wire 63B is electrically connected via the through-electrodes 195C (refer to FIG. 49) and 217 in the wiring layer 180E to the conductive portions 181G.

The second control wire 64B extends in the length direction Y. The shape of the second control wire 64B in a plan view is rectangular so that the length direction Y is the long-side direction and the width direction X is the short-side direction. The second control wire 64B includes the through hole 64$qz$. The through hole 64$qz$ extends through the conductive substrate 180 in the thickness direction Z. The through hole 64$qz$ is filled with the through-electrode 218. The through-electrode 218 may be a tubular member covering the wall of the through hole 64$qz$ instead of filling the through hole 64$qz$. The through-electrode 218 electrically connects the wiring layers 180A and 180E. Although not shown in the drawings, the second control wire 64B is electrically connected via the through-electrodes 195D (refer to FIG. 49) and 218 in the wiring layer 180E to the conductive portions 181H.

The second low-voltage diodes 37A and 37B, which form the second surge absorption circuit 5B, are mounted on the second control wire 63B, the second control wire 64B, and the fourth relay wire 69D.

The second low-voltage diodes 37A and 37B are connected in anti-series between the second control wire 63B and the second control wire 64B via the fourth relay wire 69D. In further detail, the cathode electrode of the second low-voltage diode 37A is connected to the second control wire 63B. The anode electrode of the second low-voltage diode 37B is connected to the fourth relay wire 69D. The anode electrode of the second low-voltage diode 37B is connected to the fourth relay wire 69D. The cathode electrode of the second low-voltage diode 37B is connected to the second control wire 64B.

In the present embodiment, the second low-voltage diode 37A is positioned so that its anode electrode and cathode electrode are arranged in the width direction X. Further, the second low-voltage diode 37B is positioned so that its anode electrode and cathode electrode are arranged in the width direction X. Moreover, the second low-voltage diode 37A and the second low-voltage diode 37B are arranged to align with each other in the length direction Y and spaced apart in the width direction X.

The second resistors 38C and 38D and the second switching element 39B, which form the second interface circuit 6B, are mounted on the second control wire 63B, the second control power wire 66D, the second interface wire 68B, and the third relay wire 69C.

The second switching element 39B is electrically connected to the second control wire 63B, the second control power wire 66D, and the third relay wire 69C. In further detail, the drain electrode 39$d$ of the second switching element 39B is connected to the second control wire 63B. The source electrode 39S of the second switching element 39B is connected to the second control power wire 66D. The gate electrode 39$g$ of the second switching element 39B is connected to the third relay wire 69C.

In the present embodiment, the second switching element 39B is located toward the second semiconductor elements 10B from the second low-voltage diodes 37A and 37B and the second resistor 38D. The second switching element 39B is overlapped with the second resistor 38C as viewed in the width direction X.

The second resistors 38C and 38D are connected to the second control power wire 66D, the third relay wire 69C, and the second interface wire 68B. The first terminal of the second resistor 38C is connected to the third relay wire 69C. The second terminal of the second resistor 38C is connected to the second interface wire 68B. The first terminal of the second resistor 38D is connected to the second interface wire 68B. The second terminal of the second resistor 38D is connected to the second control power wire 66D.

In the present embodiment, the second resistor 38C is positioned so that its first terminal and second terminal are arranged in the length direction Y. Further, the second resistor 38D is positioned so that its first terminal and second terminal are arranged in the width direction X. The second resistor 38C is located toward the second semiconductor elements 10B from the second resistor 38D. The second resistor 38C is partially overlapped with the second resistor 38D as viewed in the length direction Y.

Figure 48:
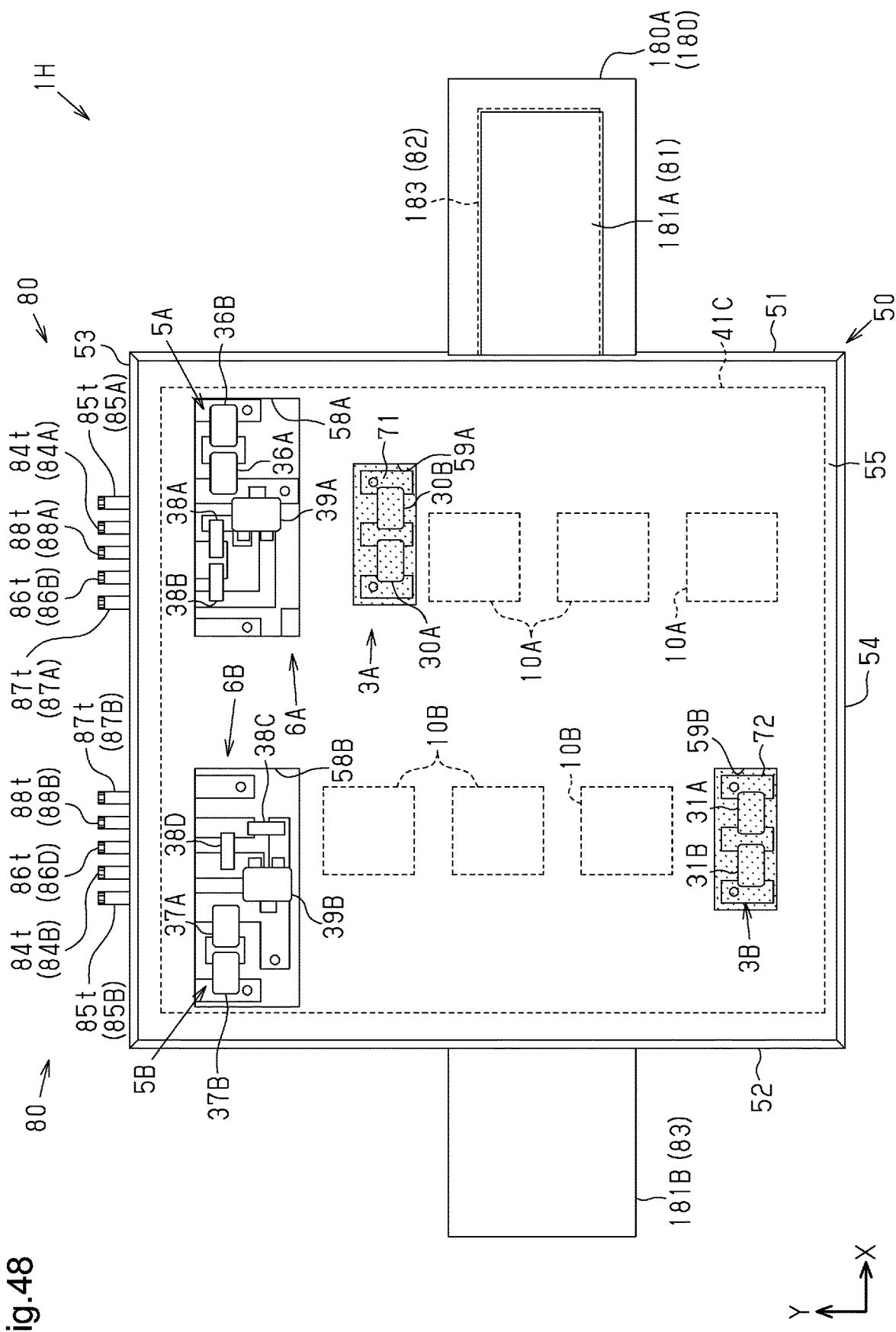
FIG. 48 is a plan view of a semiconductor device in accordance with an eighth embodiment.
Figure 49:
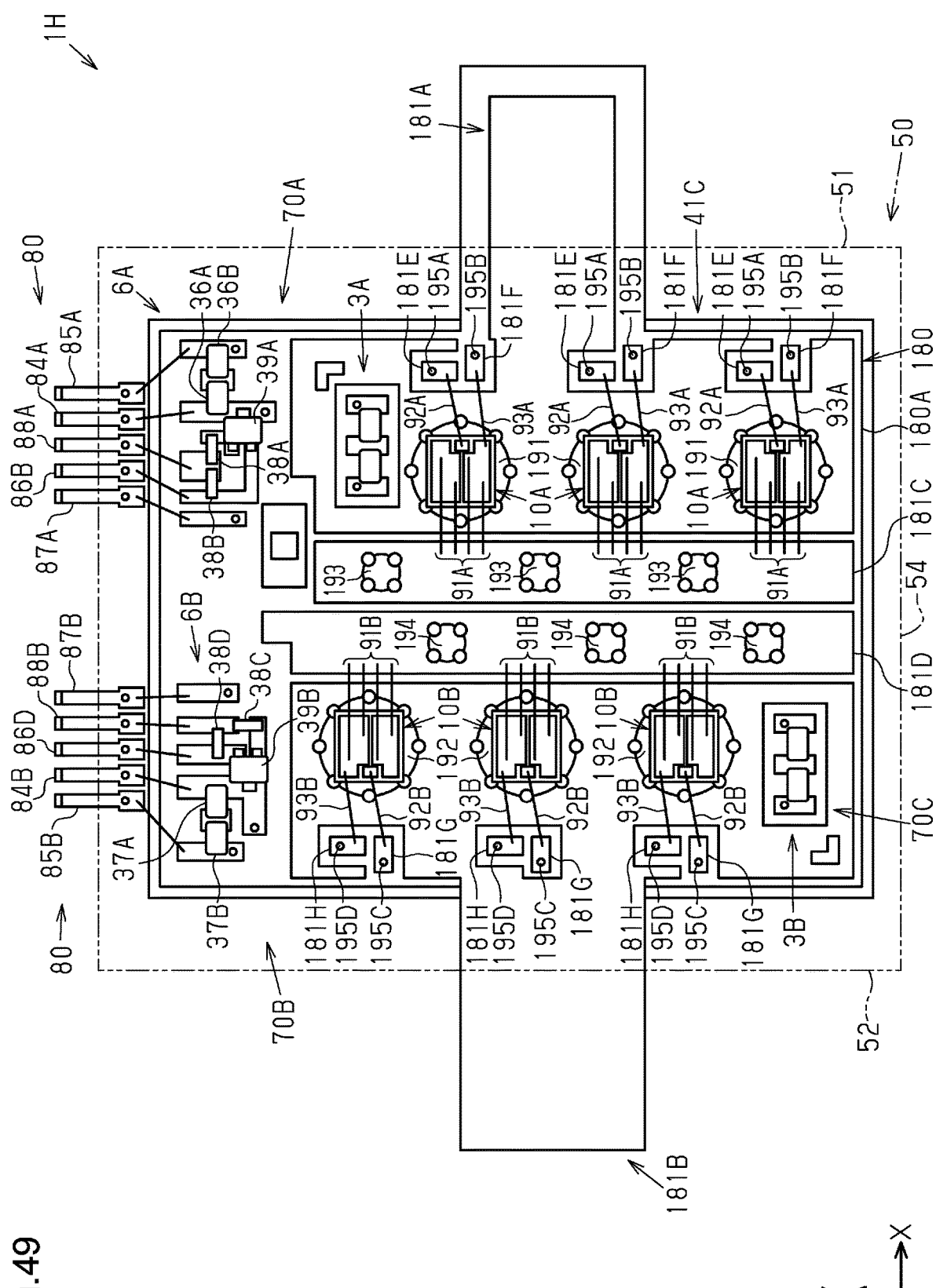
FIG. 49 is a plan view showing the semiconductor device in accordance with the eighth embodiment in a state in which a resin member is removed from the semiconductor device.

As shown in FIG. 48, in the same manner as the semiconductor device 1F in accordance with the sixth embodiment, the resin member 50 of the semiconductor device 1H includes the first control side opening 58A, the second control side opening 58B, the first drive side opening 59A, and the second drive side opening 59B. The first drive side opening 59A and the second drive side opening 59B correspond to the first drive side opening 59A and the second drive side opening 59B of the sixth embodiment. The first control side opening 58A is separate from the second control side opening 58B. The first control side opening 58A and the second control side opening 58B are arranged along one side of the resin member 50 in a state spaced apart from each other in a plan view. The first control side opening 58A and the second control side opening 58B are arranged in the width direction X in a state spaced apart from each other.

The first control side opening 58A exposes part of the first wiring region 70A of the conductive substrate 180. The first control side opening 58A exposes two types of circuits that are electrically connected to the first semiconductor elements 10A. In the present embodiment, the first control side opening 58A exposes the first interface circuit 6A and the first surge absorption circuit 5A. In further detail, as shown in FIG. 50, the first control side opening 58A exposes part of the first control wire 63A, part of the first control wire 64A, the first relay wire 69A, part of the second control power wire 66B, part of the first interface wire 68A, the second relay wire 69B, the first low-voltage diodes 36A and 36B, the first resistor 38A, the first resistor 38B, and the first switching element 39A. In the present embodiment, the first control side opening 58A does not expose the first drive wire 62A. The shape of the first control side opening 58A in a plan view, although not limited in particular, is rectangular so that the width direction X is the long-side direction and the length direction Y is the short-side direction. The interior of the first control side opening 58A is an open space.

The second control side opening 58B exposes part of the second wiring region 70B of the conductive substrate 180. The second control side opening 58B exposes two types of circuits that are electrically connected to the first semiconductor elements 10B. In the present embodiment, the second control side opening 58B exposes the second interface circuit 6B and the second surge absorption circuit 5B. In further detail, as shown in FIG. 51, the second control side opening 58B exposes part of the second control wire 63B, part of the second control wire 64B, the fourth relay wire 69D, part of the second control power wire 66D, part of the second interface wire 68B, the fourth relay wire 69D, the second low-voltage diodes 37A and 37B, the second resistor 38C, the second resistor 38D, and the second switching element 39B. In the present embodiment, the second control side opening 58B does not expose the second drive wire 62B. The shape of the second control side opening 58B in a plan view, although not limited in particular, is rectangular so that the width direction X is the long-side direction and the length direction Y is the short-side direction. The interior of the second control side opening 58B is an open space. The semiconductor device 1G in accordance with the present embodiment has the same advantages as the semiconductor device 1F in accordance with the sixth embodiment and the semiconductor device 1C in accordance with the third embodiment.

Ninth Embodiment

With reference to FIGS. 52 to 57, a semiconductor device 1J in accordance with a ninth embodiment will now be described. The semiconductor device 1J in accordance with the present embodiment differs from the semiconductor device 1F in accordance with the sixth embodiment in the mounting mode of the first wiring region 70A and the second wiring region 70B. In the description hereafter, same reference numerals are given to those components that are the same as the corresponding components of the semiconductor device 1F in accordance with the sixth embodiment. Such components will not be described in detail.

The semiconductor device 1J in accordance with the present embodiment differs from the semiconductor device 1F in accordance with the sixth embodiment in that the first current detection circuit 7A is used instead of the first short-circuiting detection circuit 3A and the second current detection circuit 7B is used instead of the second short-circuiting detection circuit 3B. The first current detection circuit 7A detects the current flowing to the first semiconductor elements 10A, and the second current detection circuit 7B detects the current flowing to the second semiconductor elements 10B. The current detection circuits 7A and 7B are identical in configuration to the current detection circuits 7A and 7B of the fourth embodiment shown in FIG. 29. In this manner, the semiconductor device 1J in accordance with the present embodiment is formed by combining the semiconductor device 1F in accordance with the sixth embodiment with the current detection circuits 7A and 7B of the semiconductor device 1D in accordance with the fourth embodiment.

As shown in FIGS. 53 to 57, the semiconductor device 1J includes conductive portions 181N and 181Q that form the first overcurrent detection wire 160A of the fourth embodiment and conductive portions 181P and 181R that form the second overcurrent detection wire 160B. The conductive portions 181N and 181Q and the conductive portions 181P and 181R are all formed on the wiring layer 180A. Further, in the same manner as the semiconductor device 1D in accordance with the fourth embodiment, the semiconductor device 1J includes the first overcurrent detection lead 87C, instead of the first short-circuiting detection lead 87A, and the second overcurrent detection lead 87D, instead of the second short-circuiting detection lead 87B.

Figure 53:
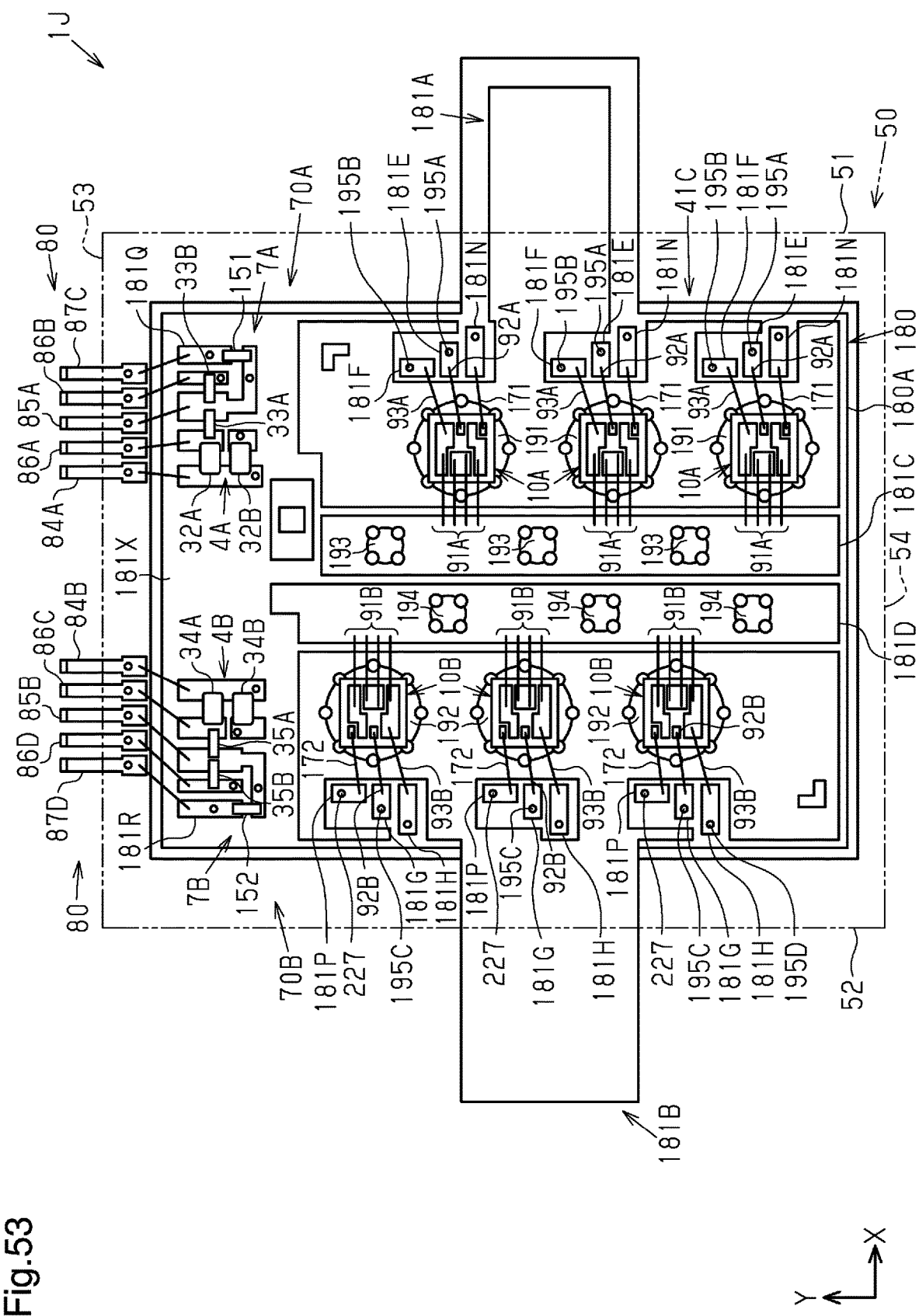
FIG. 53 is a plan view showing the semiconductor device in accordance with the ninth embodiment in a state in which a resin member is removed from the semiconductor device.

As shown in FIG. 53, the leads 80, which are electrically connected to the first semiconductor elements 10A, include the first control lead 84A, the first control lead 85A, the first control power lead 86A, the first control power lead 86B, and the first overcurrent detection lead 87C. In the present embodiment, the first overcurrent detection lead 87C, the first control power lead 86B, the first control lead 85A, the first control power lead 86A, and the first control lead 84A are disposed in order from the first resin side surface 51 toward the second resin side surface 52.

The leads 80, which are electrically connected to the second semiconductor elements 10B, include the second control lead 84B, the second control lead 85B, the second control power lead 86C, the second control power lead 86D, and the second overcurrent detection lead 87D. In the present embodiment, the first overcurrent detection lead 87D, the second control power lead 86D, the second control lead 85B, the second control power lead 86C, and the second control lead 84B are disposed in order from the second resin side surface 52 toward the first resin side surface 51.

The conductive portions 181N electrically connect the current sensing electrodes 17 of the first semiconductor elements 10A (refer to FIG. 54) to the first overcurrent detection lead 87C. In the present embodiment, there are three conductive portions 181N arranged in the three openings 181c, respectively. In each opening 181c, the conductive portion 181N is arranged next to the conductive portion 181E in the length direction Y. In further detail, the conductive portion 181N is arranged at the side of the conductive portion 181E opposite to the conductive portion 181F in the length direction Y. The conductive portion 181N is located toward the fourth resin side surface 54 from the conductive portion 181E in the length direction Y.

Figure 54:
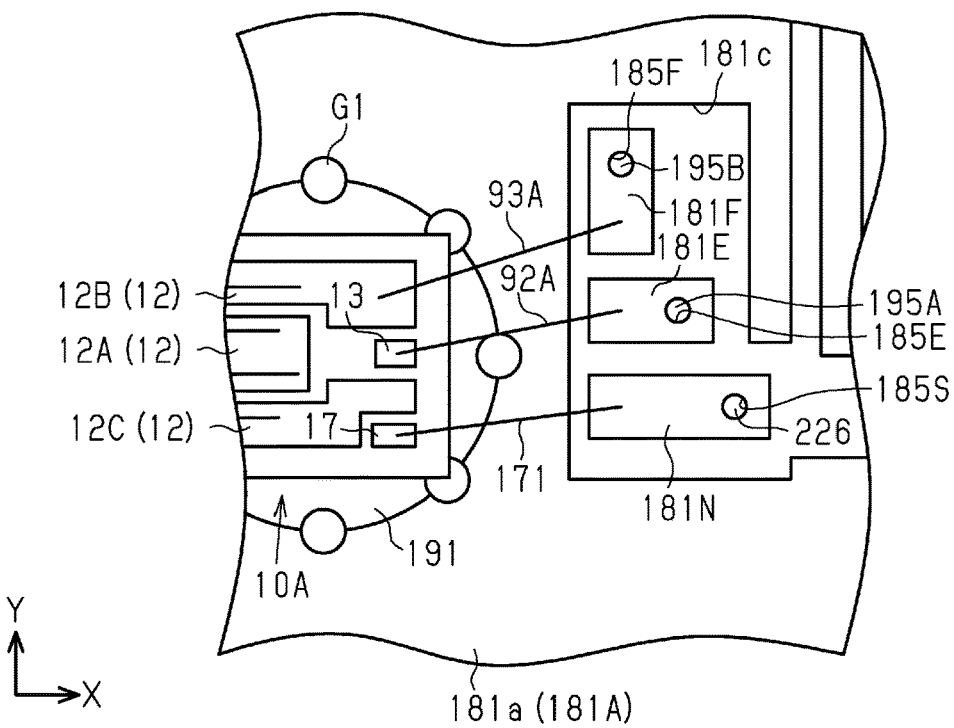
FIG. 54 is an enlarged view of a first semiconductor element in the semiconductor device shown in FIG. 53.

As shown in FIG. 54, each conductive portion 181N extends in the width direction X. The shape of the conductive portion 181N in a plan view is rectangular so that the width direction X is the long-side direction and the length direction Y is the short-side direction. The conductive portion 181N includes a through hole 185S. The through hole 185S extends through the conductive substrate 180 in the thickness direction Z. The through hole 185S is filled with a through-electrode 226. The through-electrode 226 may be a tubular member covering the wall of the through hole 185S instead of filling the through hole 185S. The through-electrode 226 electrically connects the wiring layers 180A and 180E. Although not shown in the drawings, the three conductive portions 181N are electrically connected to one another by the through-electrodes 226 in the wiring layer 180E. The first drive detection connection members 171 are formed on the conductive portions 181N and electrically connected to the current sensing electrodes 17 of the first semiconductor elements 10A, respectively. The first drive detection connection members 171 are, for example, wires formed through wire bonding.

Further, in the present embodiment, the conductive portion 181E and the conductive portion 181F differ in positional relationship and shape from the conductive portion 181E and the conductive portion 181F of the sixth embodiment. More specifically, in each opening 181c, the conductive portion 181F is located toward the third resin side surface 53 from the conductive portion 181E in the length direction Y. The conductive portion 181E extends in the width direction X. The shape of the conductive portion 181E in a plan view is rectangular so that the width direction X is the long-side direction and the length direction Y is the short-side direction. The conductive portion 181F extends in the length direction Y. The shape of the conductive portion 181F in a plan view is rectangular so that the length direction Y is the long-side direction and the width direction X is the short-side direction. Further, the length of the conductive portion 181E in the width direction X is less than the length of the conductive portion 181N in the width direction X. In other words, the length of the conductive portion 181N in the width direction X is greater than the length of the conductive portion 181E in the width direction X.

As shown in FIG. 53, in the present embodiment, the conductive portions 181P electrically connect the current sensing electrodes 17 of the second semiconductor elements 10B (refer to FIG. 55) to the second overcurrent detection lead 87D. In the present embodiment, there are three conductive portions 181P arranged in the three openings 181f, respectively. Each conductive portion 181P is arranged next to the corresponding conductive portion 181G in the length direction Y. The conductive portion 181P is located toward the third resin side surface 53 from the conductive portion 181G in the length direction Y.

Figure 55:
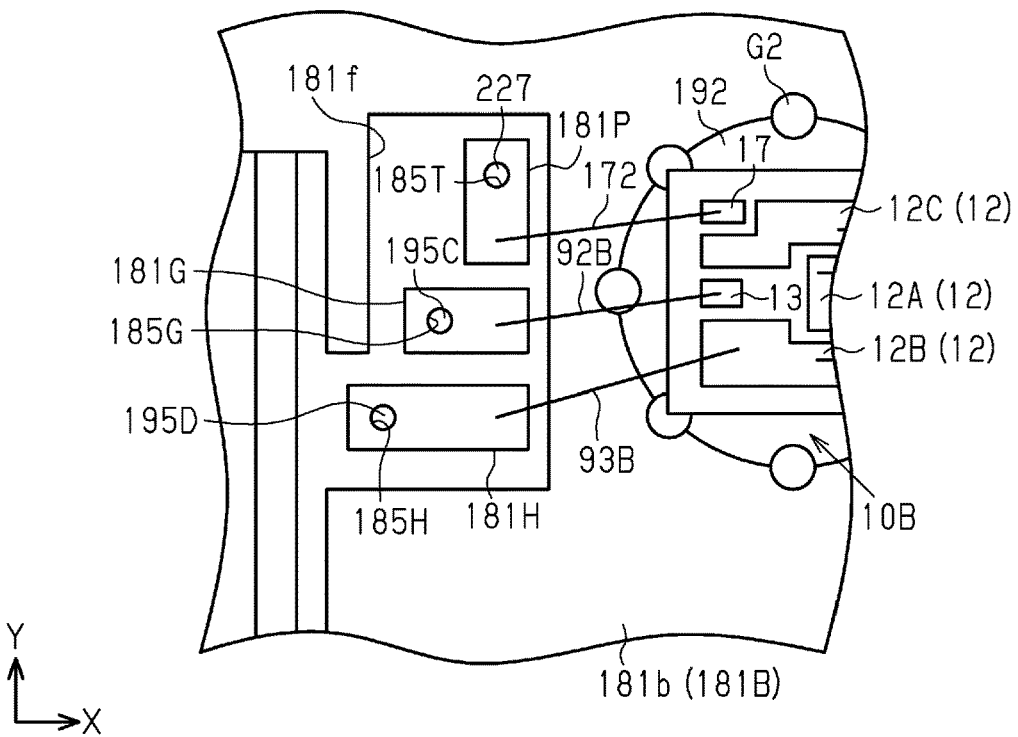
FIG. 55 is an enlarged view of a second semiconductor element in the semiconductor device shown in FIG. 53.

As shown in FIG. 55, each conductive portion 181P extends in the length direction Y. The shape of the conductive portion 181P in a plan view is rectangular so that the length direction Y is the long-side direction and the width direction X is the short-side direction. The conductive portion 181P includes a through hole 185T. The through hole 185T extends through the conductive substrate 180 in the thickness direction Z. The through hole 185T is filled with a through-electrode 227. The through-electrode 227 may be a tubular member covering the wall of the through hole 185T instead of filling the through hole 185T. The through-electrode 227 electrically connects the wiring layers 180A and 180E. Although not shown in the drawings, the three conductive portions 181P are electrically connected to one another by the through-electrodes 227 in the wiring layer 180E. The second drive detection connection members 172 are formed on the conductive portions 181P and electrically connected to the current sensing electrodes 17 of the second semiconductor elements 10B, respectively. The second drive detection connection members 172 are, for example, wires formed through wire bonding.

Further, in the present embodiment, the conductive portion 181G and the conductive portion 181H differ in positional relationship and shape from the conductive portion 181G and the conductive portion 181H of the sixth embodiment. More specifically, in each opening 181f, the conductive portion 181H is arranged at the side of the conductive portion 181G opposite to the conductive portion 181P in the length direction Y. Each conductive portion 181H of the present embodiment extends in the width direction X. The shape of the conductive portion 181H in a plan view is rectangular so that the width direction X is the long-side direction and the length direction Y is the short-side direction. The shape of the conductive portion 181G in a plan view is rectangular so that the width direction X is the long-side direction and the length direction Y is the short-side direction. The length of the conductive portion 181G in the width direction X is less than the length of the conductive portion 181H in the width direction X. In other words, the length of the conductive portion 181H in the width direction X is greater than the length of the conductive portion 181G in the width direction X.

Figure 56:
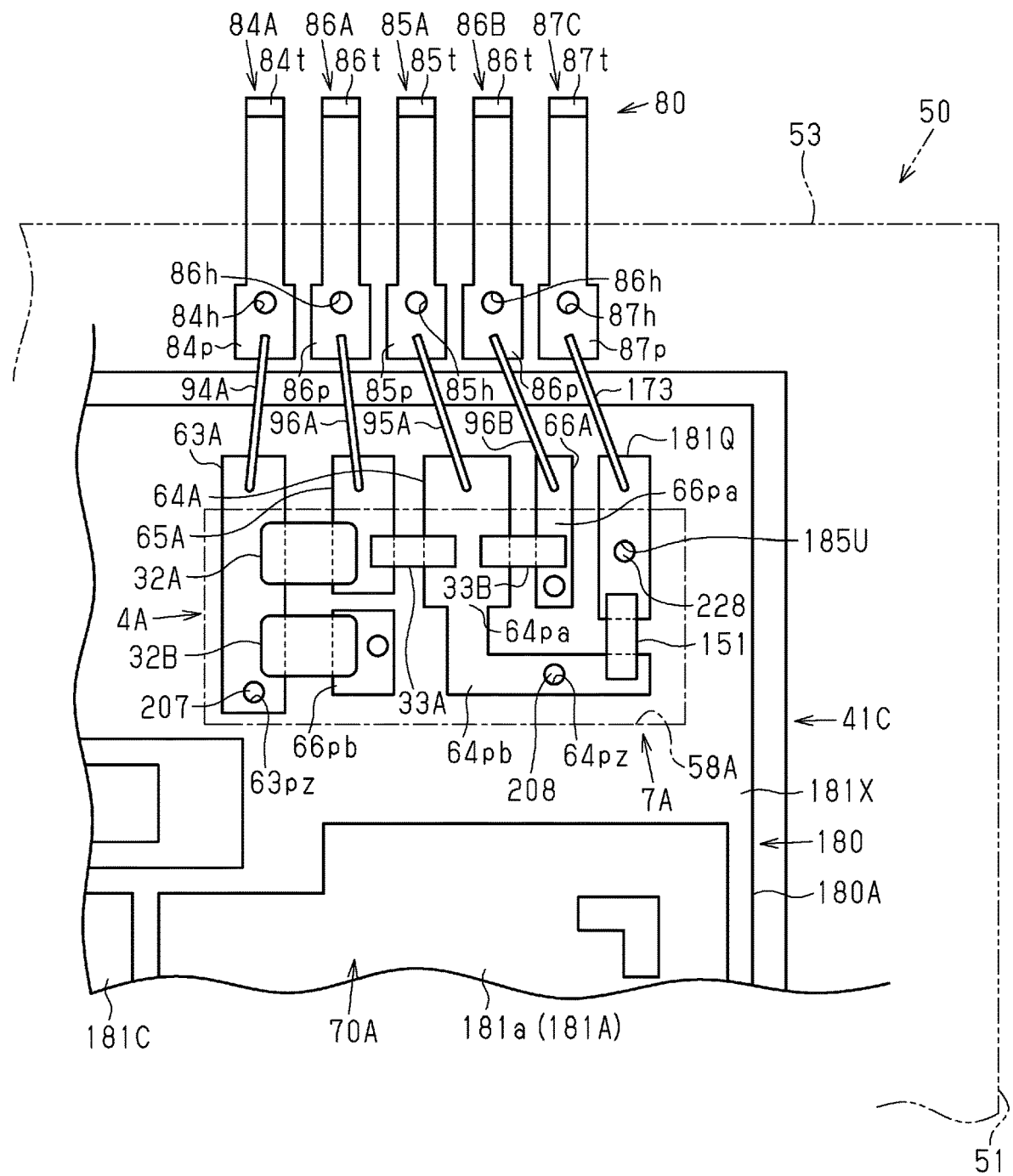
FIG. 56 is an enlarged view of a first wiring region in the semiconductor device shown in FIG. 53.

As shown in FIG. 56, the conductive portion 181Q is arranged in the first wiring region 70A. In further detail, the conductive portion 181Q is arranged on the insulative portion 181X at the end located toward the first resin side surface 51 in the width direction X. The conductive portion 181Q is arranged next to the first control power wire 66A in the width direction X.

The conductive portion 181Q extends in the length direction Y. The shape of the conductive portion 181Q in a plan view is rectangular so that the length direction Y is the long-side direction and the width direction X is the short-side direction. The conductive portion 181Q includes a through hole 185U. The through hole 185U extends through the conductive substrate 180 in the thickness direction Z. The through hole 185U is filled with a through-electrode 228. The through-electrode 228 may be a normal member covering the wall of the through hole 185U instead of filling the through hole 185U. The through-electrode 228 electrically connects the wiring layers 180A and 180E. Although not shown in the drawings, the conductive portions 181N are electrically connected to the conductive portion 181Q (refer to FIG. 54) via the through-electrodes 228 and 226 (refer to FIG. 54) in the wiring layer 180E. In this manner, the conductive portion 181Q and the conductive portions 181N form the first overcurrent detection wire 160A of the fourth embodiment.

The first overcurrent detection connection member 173 that is electrically connected to the first overcurrent detection lead 87C is formed on the conductive portion 181Q. The first overcurrent detection connection member 173 is, for example, a wire formed through wire bonding.

Figure 57:
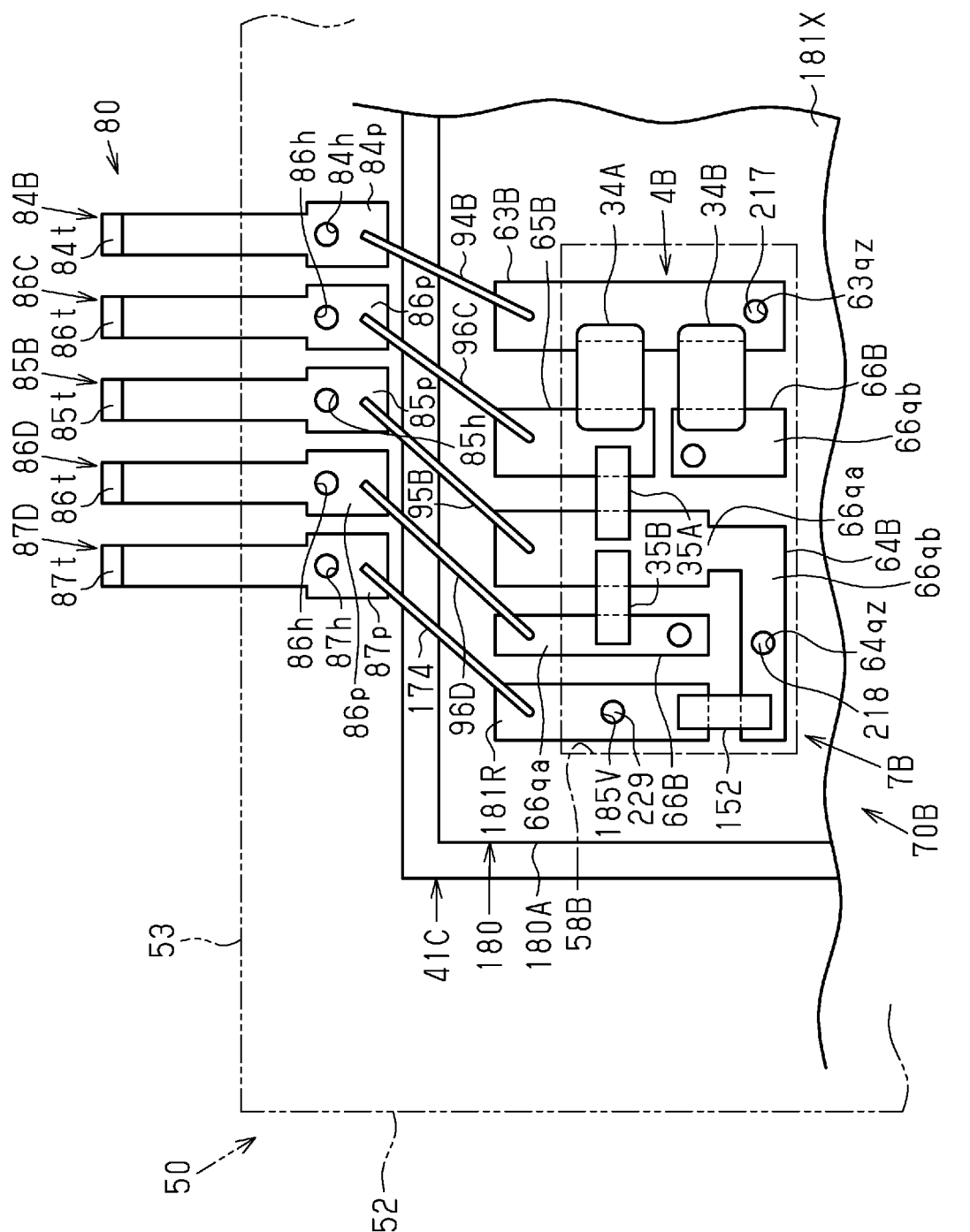
FIG. 57 is an enlarged view of a second wiring region in the semiconductor device shown in FIG. 53.

As shown in FIG. 57, the conductive portion 181R is arranged in the second wiring region 70B. In further detail, the conductive portion 181R is arranged on the insulative portion 181X at the end located toward the second resin side surface 52 in the width direction X. The conductive portion 181R is arranged next to the second control power wire 66B in the width direction X.

The conductive portion 181R extends in the length direction Y. The shape of the conductive portion 181R in a plan view is rectangular so that the length direction Y is the long-side direction and the width direction X is the short-side direction. The conductive portion 181R includes a through hole 185V. The through hole 185V extends through the conductive substrate 180 in the thickness direction Z. The through hole 185V is filled with a through-electrode 229. The through-electrode 229 may be a normal member covering the wall of the through hole 185V instead of filling the through hole 185V. The through-electrode 229 electrically connects the wiring layers 180A and 180E. Although not shown in the drawings, the conductive portions 181P are electrically connected to the conductive portion 181R (refer to FIG. 55) via the through-electrode 229 and 227 (refer to FIG. 55) in the wiring layer 180E. In this manner, the conductive portions 181P and the conductive portion 181R form the second overcurrent detection wire 160B of the fourth embodiment.

The second overcurrent detection connection member 174 that is electrically connected to the second overcurrent detection lead 87D is formed on the conductive portion 181R. The second overcurrent detection connection member 174 is, for example, a wire formed through wire bonding.

The detection connection members 171 and 172 and the overcurrent detection connection members 173 and 174 are respectively the same as the detection connection members 171 and 172 and the overcurrent detection connection members 173 and 174 of the fourth embodiment.

As shown in FIG. 56, in the present embodiment, the first control wire 64A has a different shape in a plan view. In further detail, the first control wire 64A is substantially L-shaped in a plan view. The first control wire 64A includes the first wire portion 64pa, which extends in the length direction Y, and the second wire portion 64pb, which extends in the width direction X. The first wire portion 64pa is located between the first control power wire 65A and the first control power wire 66A in the width direction X. The first capacitors 33A and 33B are mounted on the first wire portion 64pa. The second wire portion 64pb is located toward the fourth resin side surface 54 (toward conductive portion 181A) from the first control power wires 65A and 66A. The second wire portion 64pb extends from the first wire portion 64pa toward the first resin side surface 51. The second wire portion 64pb includes the through hole 64pz. The through hole 64pz extends through the conductive substrate 180 in the thickness direction Z. The through hole 64pz is filled with the through-electrode 208. The through-electrode 208 may be a tubular member covering the wall of the through hole 64pz instead of filling the through hole 64pz. The through-electrode 208 electrically connects the wiring layers 180A and 180E. Although not shown in the drawings, the first control wire 64A is electrically connected via the through-electrodes 195B (refer to FIG. 54) and 208 in the wiring layer 180E to the conductive portions 181F (refer to FIG. 54). The second wire portion 64pb has a distal end overlapped with the conductive portion 181Q as viewed in the length direction Y. The first resistor 151 is connected to the second wire portion 64pb and the conductive portion 181Q. In the present embodiment, the first resistor 151 is positioned so that its first terminal and second terminal are arranged in the length direction Y.

As shown in FIG. 57, In the present embodiment, the second control wire 64B has a different shape in a plan view. In further detail, the second control wire 64B is substantially L-shaped in a plan view. The second control wire 64B includes the first wire portion 64qa, which extends in the length direction Y, and the second wire portion 64qb, which extends in the width direction X. The first wire portion 64qa is located between the second control power wire 65B and the second control power wire 66B in the width direction X. The second capacitors 35A and 35B are mounted on the first wire portion 64qa. The second wire portion 64qb is located toward the fourth resin side surface 54 (toward conductive portion 181B) from the second control power wires 65B and 66B. The second wire portion 64qb extends from the first wire portion 64qa toward the second resin side surface 52. The second wire portion 64qb includes the through hole 64qz. The through hole 64qz extends through the conductive substrate 180 in the thickness direction Z. The through hole 64qz is filled with the through-electrode 218. The through-electrode 218 may be a tubular member covering the wall of the through hole 64qz instead of filling the through hole 64qz. The through-electrode 218 electrically connects the wiring layers 180A and 180E. Although not shown in the drawings, the second control wire 64B is electrically connected via the through-electrodes 195D (refer to FIG. 55) and 218 in the wiring layer 180E to the conductive portion 181H (refer to FIG. 55). The second wire portion 64qb has a distal end overlapped with the conductive portion 181R in the length direction Y. The second resistor 152 is connected to the second wire portion 64qb and the conductive portion 181R. In the present embodiment, the second resistor 152 is positioned so that its first terminal and second terminal are arranged in the length direction Y.

Figure 52:
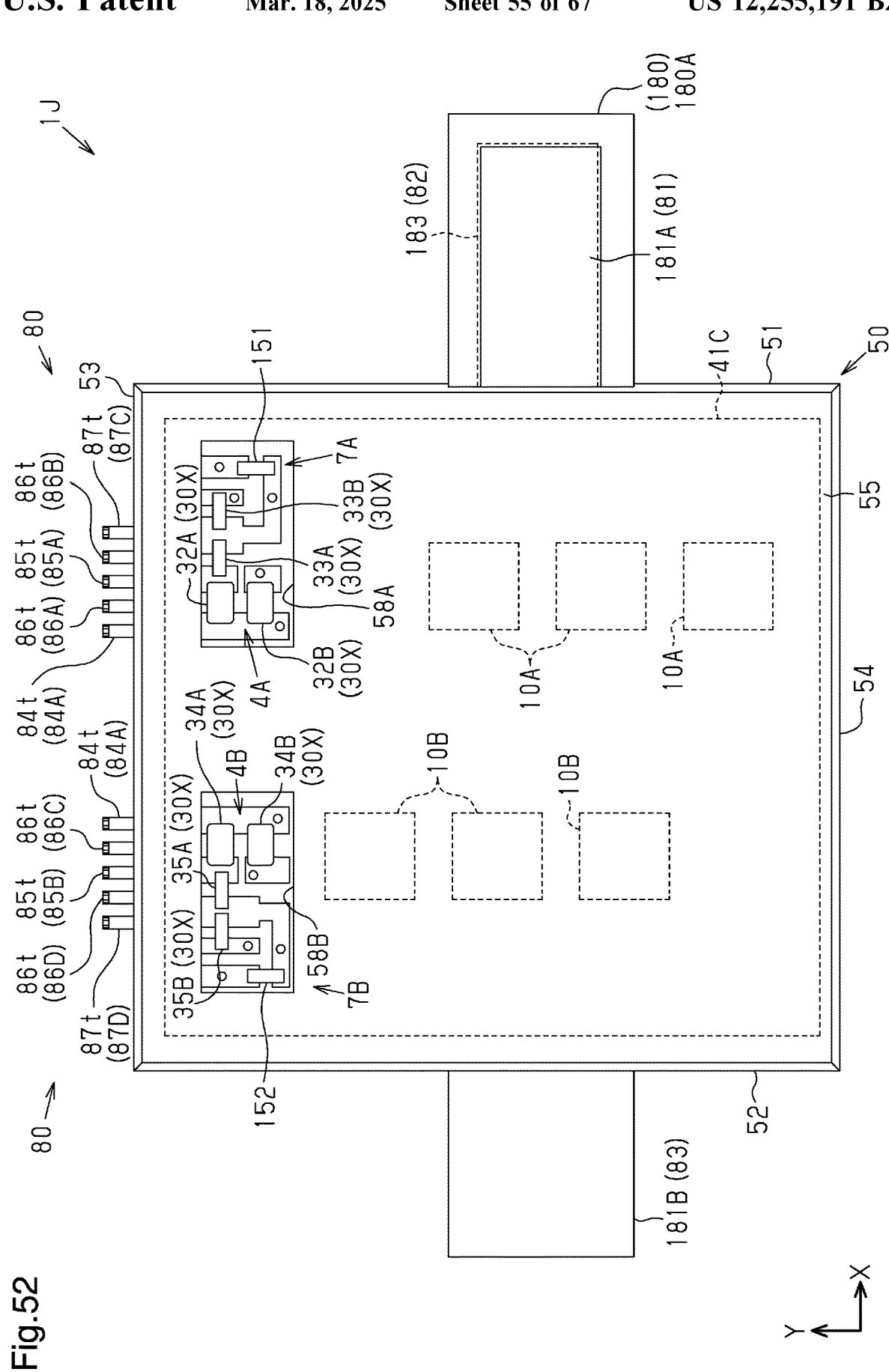
FIG. 52 is a plan view of a semiconductor device in accordance with a ninth embodiment.

As shown in FIG. 52, the resin member 50 includes two resin openings that expose the conductive substrate 180 from the top resin surface 55, namely, the first control side opening 58A and the second control side opening 58B. As shown in FIG. 52, the first control side opening 58A is separate from the second control side opening 58B.

The first control side opening 58A is located at a position overlapping the first semiconductor elements 10A as viewed in the length direction Y and toward the third resin side surface 53 from the first semiconductor elements 10A. The second control side opening 58B is located at a position overlapping the second semiconductor elements 10B as viewed in the length direction Y and toward the third resin side surface 53 from the second semiconductor elements 10B. In this manner, the first control side opening 58A and the second control side opening 58B are arranged along one side of the resin member 50 in a state spaced apart from each other in a plan view. That is, in a plan view, the first control side opening 58A and the second control side opening 58B are arranged to align with each other in the length direction Y and spaced apart in the width direction X. In a plan view, the control side openings 58A and 58B are arranged in the top resin surface 55 at the end located toward the third resin side surface 53. The first control side opening 58A is located toward the first resin side surface 51 from the second control side opening 58B.

In a plan view, the first control side opening 58A is located between the first semiconductor elements 10A and the terminal portion 84t of the first control lead 84A in the length direction Y. In the present embodiment, as shown in FIG. 27, in a plan view, the first control side opening 58A is located between the first semiconductor elements 10A and the pad portion 84p of the first control lead 84A in the length direction Y. Further, in a plan view, the first control side opening 58A is located between the first semiconductor elements 10A and the terminal portion 85t of the first control lead 85A in the length direction Y. In the present embodiment, the first control side opening 58A is located between the first semiconductor elements 10A and the pad portion 85p of the first control lead 85A in the length direction Y.

As shown in FIG. 56, the first control side opening 58A exposes part of the first wiring region 70A of the conductive substrate 180. Thus, the first control side opening 58A exposes part of a mounting region in the conductive substrate 180 on which electronic components other than the first semiconductor elements 10A are mounted at a portion located toward the first resin side surface 51 in the width direction X. The first control side opening 58A exposes an area of the first wiring region 70A located toward the third resin side surface 53. In the present embodiment, the first control side opening 58A exposes the first surge reduction circuit 4A and the first current detection circuit 7A, which are electrically connected to the first semiconductor elements 10A. In further detail, the first control side opening 58A exposes the first low-voltage diodes 32A and 32B, the first capacitors 33A and 33B, the first control wire 63A, the first control wire 64A, the first control power wire 65A, and the first control power wire 66A. Further, the first control side opening 58A exposes the first resistor 151 and the conductive portion 181Q. In the present embodiment, the first control side opening 58A does not expose the first control lead connection members 94A and 95A, the first control power connection members 96A and 96B, and the first overcurrent detection connection member 173. The shape of the first control side opening 58A in a plan view, although not limited in particular, is rectangular so that the width direction X is the long-side direction and the length direction Y is the short-side direction. The interior of the first control side opening 58A is an open space.

As shown in FIG. 57, in a plan view, the second control side opening 58B is located between the second semiconductor elements 10B and the terminal portion 84t of the second control lead 84B in the length direction Y. In the present embodiment, the second control side opening 58B is located between the second semiconductor elements 10B and the pad portion 84p of the second control lead 84B in the length direction Y. Further, in a plan view, the second control side opening 58B is located between the second semiconductor elements 10B and the terminal portion 85t of the second control lead 85B in the length direction Y. In the present embodiment, the second control side opening 58B is located between the second semiconductor elements 10B and the pad portion 85p of the second control lead 85B in the length direction Y in a plan view.

The second control side opening 58B exposes part of the second wiring region 70B of the conductive substrate 180. Thus, the second control side opening 58B exposes part of a mounting region in the conductive substrate 180 on which electronic components other than the second semiconductor elements 10B are mounted at a portion located toward the second resin side surface 52 in the width direction X. The second control side opening 58B exposes an area of the second wiring region 70B located toward the third resin side surface 53. In the present embodiment, the second control side opening 58B exposes the second surge reduction circuit 4B and second current detection circuit 7B, which are electrically connected to the second semiconductor elements 10B. In further detail, the second control side opening 58B exposes the second low-voltage diodes 34A and 34B, the second capacitors 35A and 35B, the second control wire 63B, the second control wire 64B, the second control power wire 65B, and the second control power wire 66B. Further, the second control side opening 58B exposes the second resistor 152 and the conductive portion 181R. In the present embodiment, the second control side opening 58B does not expose the second control lead connection members 94B and 95B, the second control power connection members 96C and 96D, and the second overcurrent detection connection member 174. The shape of the second control side opening 58B in a plan view, although not limited in particular, is rectangular so that the width direction X is the long-side direction and the length direction Y is the short-side direction. The interior of the second control side opening 58B is an open space. The semiconductor device 1J in accordance with the present embodiment has the same advantages as the semiconductor device 1F in accordance with the sixth embodiment and the semiconductor device 1D in accordance with the fourth embodiment.

Tenth Embodiment

With reference to FIGS. 58 to 61, a semiconductor device 1K in accordance with a tenth embodiment will now be described. The semiconductor device 1K in accordance with the present embodiment differs from the semiconductor device 1F in accordance with the sixth embodiment in the mounting mode of the first wiring region 70A and the second wiring region 70B. The semiconductor device 1K in accordance with the present embodiment uses the semiconductor elements 10A and 10B of the fourth embodiment. In the description hereafter, same reference numerals are given to those components that are the same as the corresponding components of the semiconductor device 1F in accordance with the sixth embodiment. Such components will not be described in detail.

The semiconductor device 1K in accordance with the present embodiment differs from the semiconductor device 1F in accordance with the sixth embodiment in that the first current detection circuit 7A is used instead of the first short-circuiting detection circuit 3A and the second current detection circuit 7B is used instead of the second short-circuiting detection circuit 3B. Further, the semiconductor device 1K differs from the semiconductor device 1F in accordance with the sixth embodiment in that the first surge absorption circuit 5A and the first interface circuit 6A of the third embodiment are used instead of the first surge reduction circuit 4A and the second surge absorption circuit 5B and the second interface circuit 6B of the third embodiment are used instead of the second surge reduction circuit 4B. In this manner, the semiconductor device 1K in accordance with the present embodiment is formed by combining the semiconductor device 1F in accordance with the sixth embodiment with the surge absorption circuits 5A and 5B and interface circuits 6A and 6B of the semiconductor device 1E in accordance with the fifth embodiment.

In the same manner as the semiconductor device 1J in accordance with the ninth embodiment, the semiconductor device 1K in accordance with the present embodiment includes the first overcurrent detection wire 160A and the second overcurrent detection wire 160B. That is, the semiconductor device 1K includes the conductive portions 181N, 181P, 181Q, and 181R. The conductive portions 181E and 181F and the conductive portion 181G and 181H are positioned and shaped in the same manner as the conductive portions 181E and 181F and the conductive portions 181G and 181H of the ninth embodiment.

Figure 60:
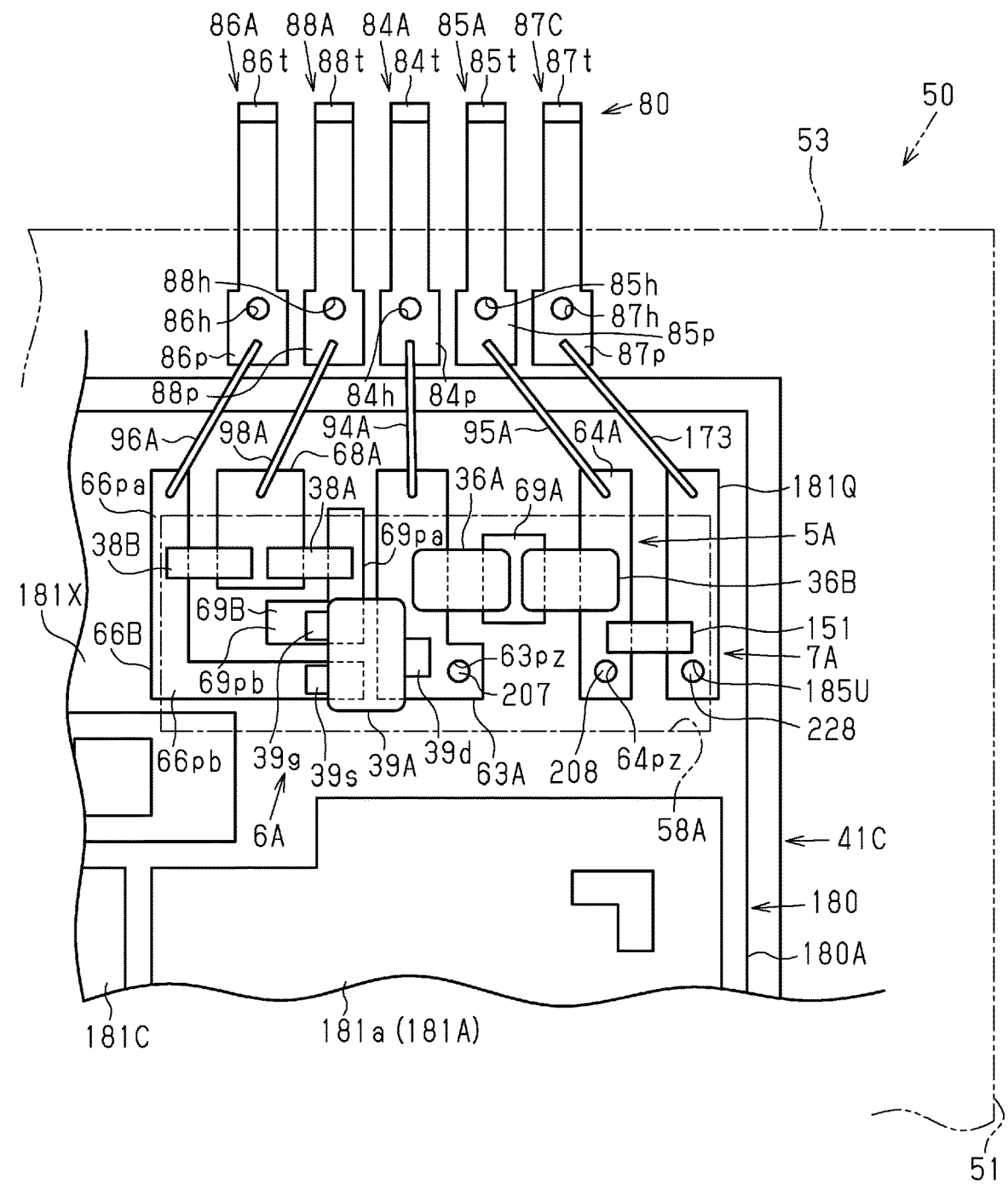
FIG. 60 is an enlarged view of a first wiring region in the semiconductor device shown in FIG. 57.

As shown in FIG. 60, the first resistor 151 is connected to the conductive portion 181Q and the first control power wire 66A. The first resistor 151 is located toward the conductive portion 181A from the first low-voltage diodes 36A and 36B and the first resistor 38A and 38B in the length direction Y. The first resistor 151 is overlapped with the first switching element 39A as viewed in the width direction X.

Figure 61:
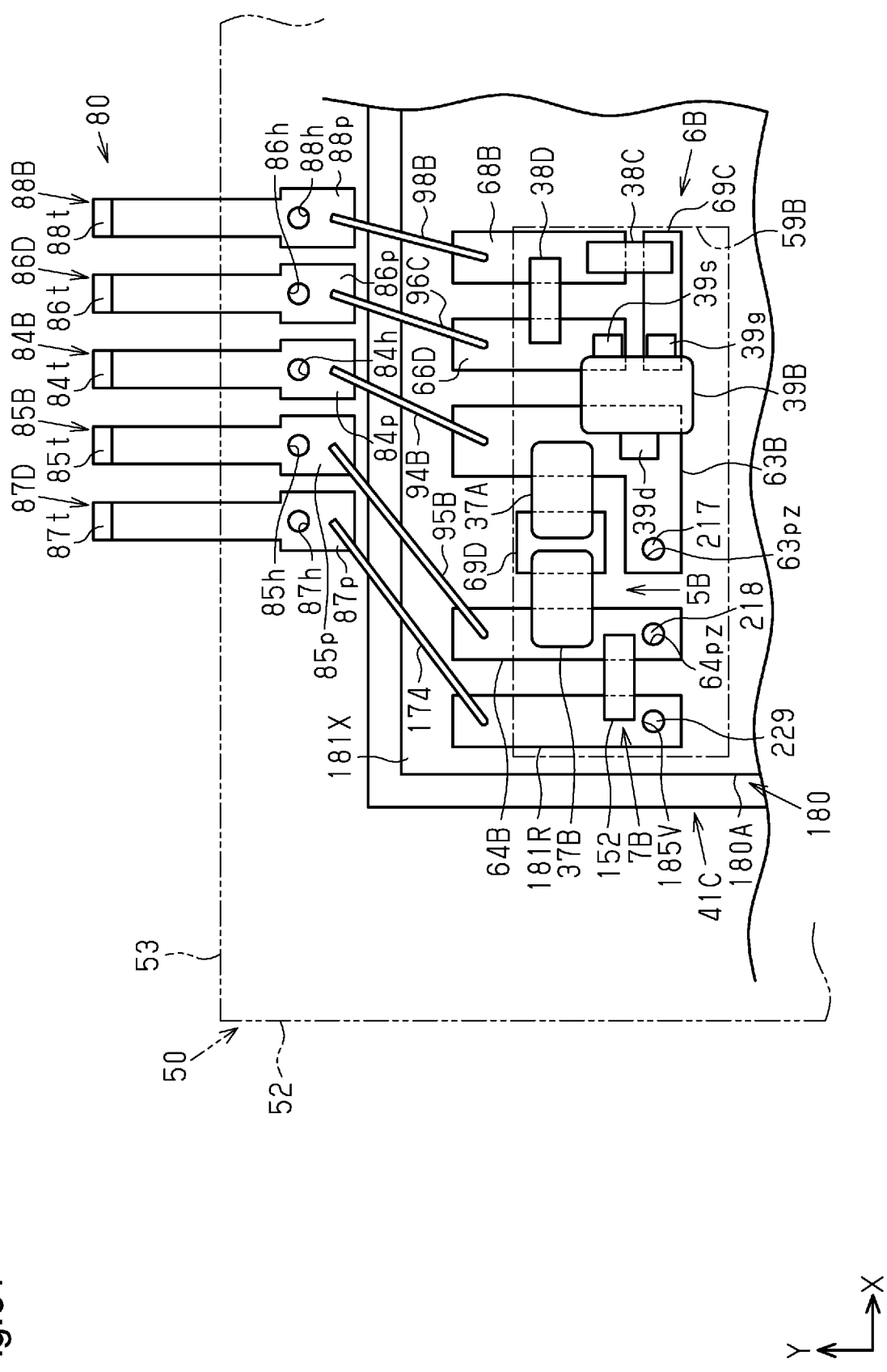
FIG. 61 is an enlarged view of a second wiring region in the semiconductor device shown in FIG. 57.

As shown in FIG. 61, the second resistor 152 is connected to the conductive portion 181R and the second control power wire 66B. The second resistor 152 is located toward the conductive portion 181B (refer to FIG. 57) from the second low-voltage diodes 37A and 37B and the second resistors 38C and 38D in the length direction Y. The second resistor 152 is overlapped with the second switching element 39B in the width direction X.

Figure 58:
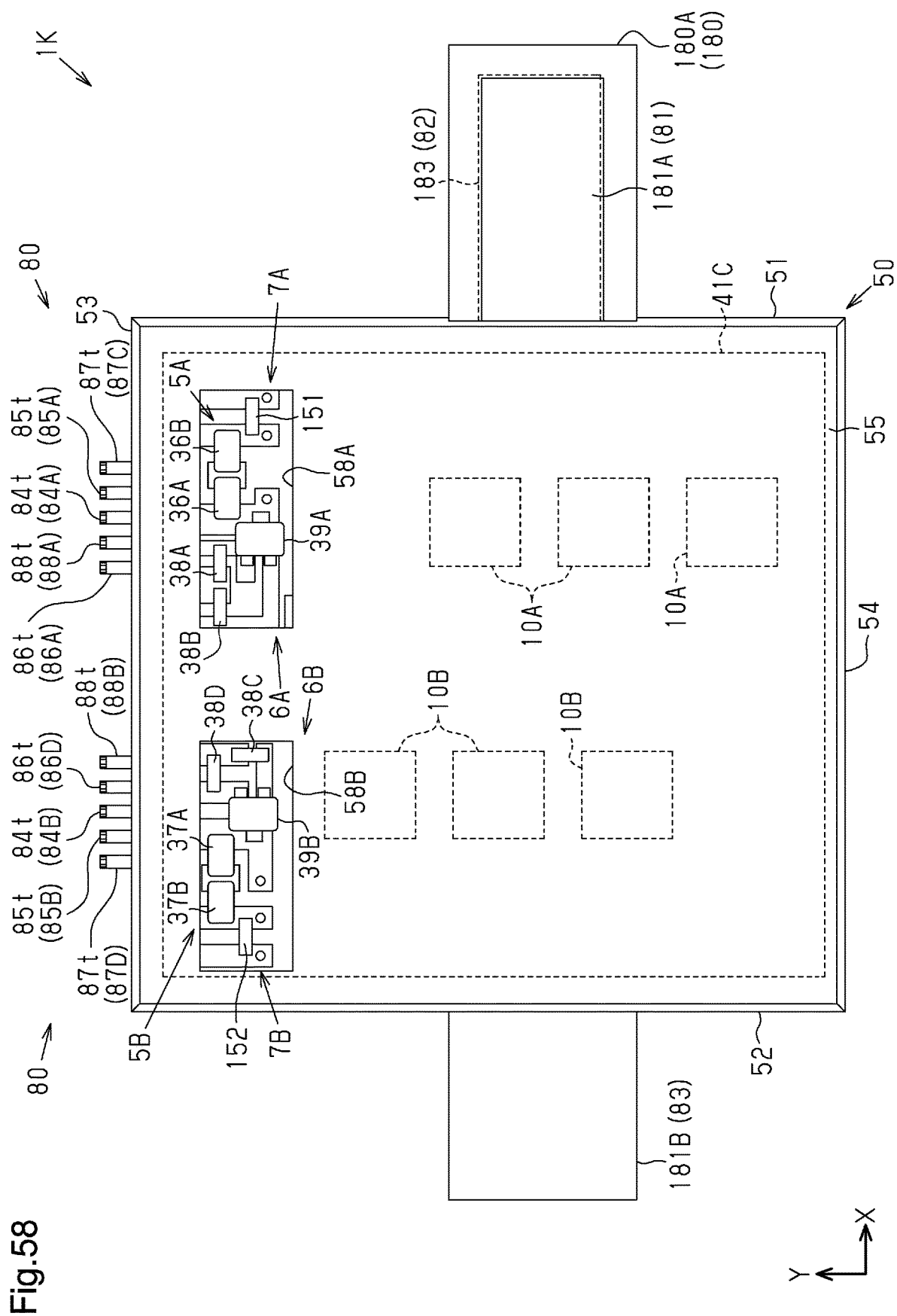
FIG. 58 is a plan view of a semiconductor device in accordance with a tenth embodiment.
Figure 59:
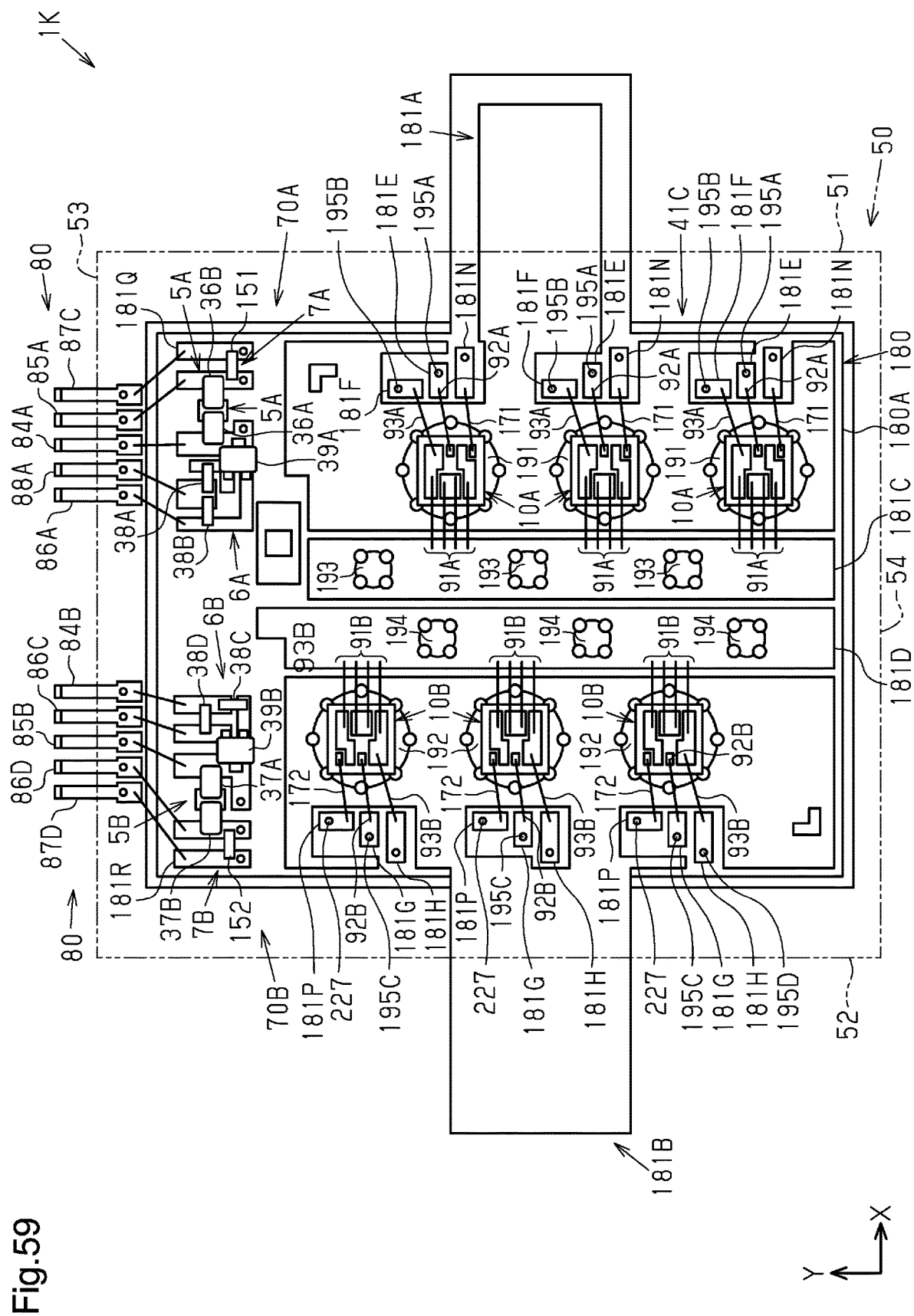
FIG. 59 is a plan view showing the semiconductor device in accordance with the tenth embodiment in a state in which a resin member is removed from the semiconductor device.

As shown in FIG. 58, the resin member 50 includes two resin openings that expose the conductive substrate 180 from the top resin surface 55, namely, the first control side opening 58A and the second control side opening 58B. As shown in FIG. 58, the first control side opening 58A is separate from the second control side opening 58B.

The first control side opening 58A is located at a position overlapping the first semiconductor elements 10A as viewed in the length direction Y and toward the third resin side surface 53 from the first semiconductor elements 10A. The second control side opening 58B is located at a position overlapping the second semiconductor elements 10B as viewed in the length direction Y and toward the third resin side surface 53 from the second semiconductor elements 10B. In this manner, the first control side opening 58A and the second control side opening 58B are arranged along one side of the resin member 50 in a state spaced apart from each other in a plan view. That is, in a plan view, the first control side opening 58A and the second control side opening 58B are arranged aligned with each other in the length direction Y and spaced apart in the width direction X. In a plan view, the control side openings 58A and 58B are arranged in the top resin surface 55 at the end located toward the third resin side surface 53. The first control side opening 58A is located toward the first resin side surface 51 from the second control side opening 58B.

In a plan view, the first control side opening 58A is located between the first semiconductor elements 10A and the terminal portion 84t of the first control lead 84A in the length direction Y. In the present embodiment, as shown in FIG. 32, in a plan view, the first control side opening 58A is located between the first semiconductor elements 10A and the pad portion 84p of the first control lead 84A in the length direction Y. Further, in a plan view, the first control side opening 58A is located between the first semiconductor elements 10A and the terminal portion 85t of the first control lead 85A in the length direction Y. In the present embodiment, the first control side opening 58A is located between the first semiconductor elements 10A and the pad portion 85p of the first control lead 85A in the length direction Y.

As shown in FIG. 60, the first control side opening 58A exposes part of the first wiring region 70A of the conductive substrate 180. Thus, the first control side opening 58A exposes part of a mounting region in the conductive substrate 180 on which electronic components other than the first semiconductor elements 10A are mounted. The first control side opening 58A exposes an area of the first wiring region 70A located toward the third resin side surface 53. In the present embodiment, the first control side opening 58A exposes the first interface circuit 6A, the first surge absorption circuit 5A, and the first current detection circuit 7A. In further detail, the first control side opening 58A exposes part of the first control wire 63A, part of the first control wire 64A, the first relay wire 69A, part of the second control power wire 66B, part of the first interface wire 68A, the second relay wire 69B, the first low-voltage diodes 36A and 36B, the first resistor 38A, the first resistor 38B, and the first switching element 39A. Further, the first control side opening 58A exposes the first resistor 151 and the conductive portion 181Q. In the present embodiment, the first control side opening 58A does not expose the first drive wire 62A. The shape of the first control side opening 58A in a plan view, although not limited in particular, is rectangular so that the width direction X is the long-side direction and the length direction Y is the short-side direction. The interior of the first control side opening 58A is an open space.

As shown in FIG. 61, in a plan view, the second control side opening 58B is located between the second semiconductor elements 10B and the terminal portion 84t of the second control lead 84B in the length direction Y. In the present embodiment, the second control side opening 58B is located between the second semiconductor elements 10B and the pad portion 84p of the second control lead 84B in the length direction Y. Further, in a plan view, the second control side opening 58B is located between the second semiconductor elements 10B and the terminal portion 85t of the second control lead 85B in the length direction Y. In the present embodiment, the second control side opening 58B is located between the second semiconductor elements 10B and the pad portion 85p of the second control lead 85B in the length direction Y in a plan view.

The second control side opening 58B exposes part of the second wiring region 70B of the conductive substrate 180. The second control side opening 58B exposes two types of circuits that are electrically connected to the first semiconductor elements 10B. In the present embodiment, the second control side opening 58B exposes the second interface circuit 6B, the second surge absorption circuit 5B, and the second current detection circuit 7B. In further detail, the second control side opening 58B exposes part of the second control wire 63B, part of the second control wire 64B, the fourth relay wire 69D, part of the second control power wire 66D, part of the second interface wire 68B, the fourth relay wire 69D, the second low-voltage diodes 37A and 37B, the second resistor 38C, the second resistor 38D, and the second switching element 39B. Further, the second control side opening 58B exposes the second resistor 152 and the second overcurrent detection wire 160B. In the present embodiment, the second control side opening 58B does not expose the second drive wire 62B. The shape of the second control side opening 58B in a plan view, although not limited in particular, is rectangular so that the width direction X is the long-side direction and the length direction Y is the short-side direction. The interior of the second control side opening 58B is an open space. The semiconductor device 1K in accordance with the present embodiment has the same advantages as the semiconductor device 1F in accordance with the sixth embodiment and the semiconductor device 1E in accordance with the fifth embodiment.

Modified Examples

The embodiments described above exemplify, without any intention to limit, applicable forms of a semiconductor device according to this disclosure. The semiconductor device in accordance with this disclosure may be modified from the embodiments described above. For example, the configuration in each of the above embodiments may be replaced, changed, or omitted in part or include an additional element. In the modified examples described hereafter, same reference characters are given to those components that are the same as the corresponding components of the above embodiments. Such components will not be described in detail.

In the semiconductor device 1A in accordance with the first embodiment, the drive connection members 91A and 91B, the control connection members 92A and 92B, the control connection members 93A and 93B, the control lead connection members 94A and 94B, the control lead connection members 95A and 95B, the control power connection members 96A to 96D, and the short-circuiting detection connection members 97A and 97B may be formed from the same material and have the same diameter. This eliminates the need to change wires in the wire forming step and simplifies the wire forming step.

In the semiconductor device 1B in accordance with the second embodiment, the drive connection members 91A and 91B, the control connection members 92A and 92B, the control connection members 93A and 93B, the control connections members 140A and 140B, the control connection members 141A and 141B, and the short-circuiting detection connection members 142A and 142B may be formed from the same material and have the same diameter. This eliminates the need to change wires in the wire forming step and simplifies the wire forming step.

In the semiconductor device 1C in accordance with the third embodiment, the drive connection members 91A and 91B, the control connection members 92A and 92B, the control connection members 93A and 93B, the control lead connection members 94A and 94B, the control lead connection members 95A and 95B, the control power connection members 96B and 96D, the short-circuiting detection connection members 97A and 97B, and the interface connection members 98A and 98B may be formed from the same material and have the same diameter. This eliminates the need to change wires in the wire forming step and simplifies the wire forming step.

In the semiconductor devices 1A to 1H, 1J, and 1K in accordance with the above embodiments, the drive connection members 91A and 91B may have a larger diameter than the other connection members.

In the semiconductor device 1B in accordance with the second embodiment, the first control side opening 58A may have any shape in a plan view. For example, the first control side opening 58A may have a bulging shape in a plan view so as to project toward the conductive substrate 60 in the length direction Y. In this case, the first control side opening 58A may be formed so as not to expose the first control connection member 141A.

In the semiconductor device 1B in accordance with the second embodiment, the second control side opening 58B may have any shape in a plan view. For example, the second control side opening 58B may have a bulging shape in a plan view so as to project toward the conductive substrate 60 in the length direction Y. In this case, the second control side opening 58B may be formed so as not to expose the second control connection member 141B.

In the semiconductor device 1B in accordance with the second embodiment, an insulative substrate or insulative sheet (not shown) that is electrically insulative may be joined with at least one of a portion of the first conductive member 42A located toward the third resin side surface 53 of the resin member 50 from the conductive substrate 60 and a portion of the second conductive member 42B located toward the third resin side surface 53 from the conductive substrate 60. Further, an insulative substrate or insulative sheet that is electrically insulative may be formed on at least one of a portion of the first conductive member 42A located toward the third resin side surface 53 from the conductive substrate 60 or a portion of the first conductive member 42B located toward the third resin side surface 53 from the conductive substrate 60.

Figure 62:
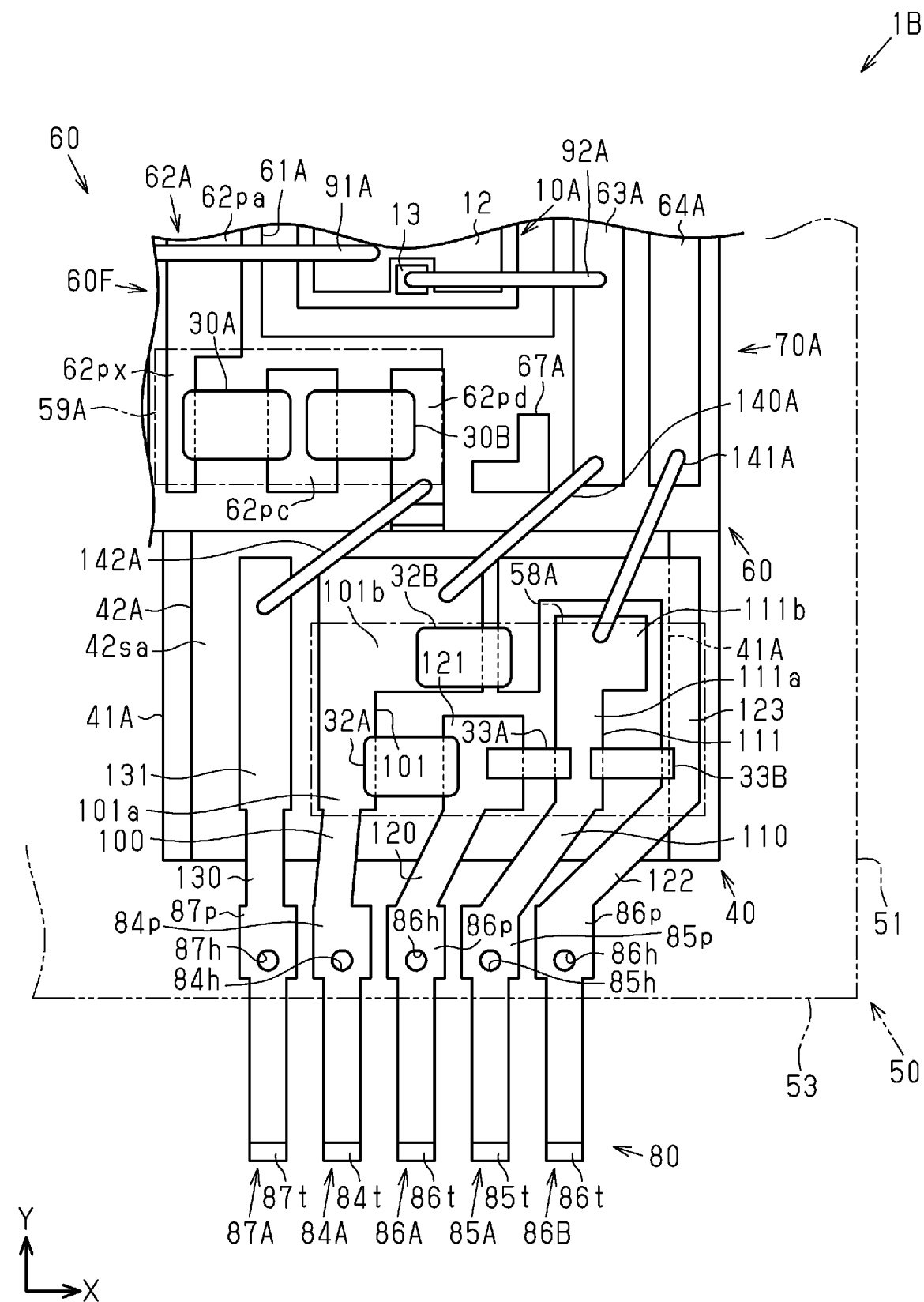
FIG. 62 is an enlarged view of a first wiring region in a semiconductor device of a modified example.

In the semiconductor device 1B in accordance with the second embodiment, the structure connecting the first control power lead 86B and the first low-voltage diode 32B may be changed in any manner. For example, as shown in FIG. 62, the first control power lead 86B may extend around the first control lead 85A to the first low-voltage diode 32B so that the first control power lead 86B connects to the first low-voltage diode 32B. In this case, the length of the second part 111b in the second wire section 111 of the first control lead 85A in the width direction X is less than the length of the second part 111b of the second embodiment in the width direction X.

The circuit configuration of the semiconductor device 1C in accordance with the third embodiment may be applied to the semiconductor device 1B in accordance with the second embodiment.

In the semiconductor device 1C in accordance with the third embodiment, the low-voltage diodes 36A, 36B, 37A, and 37B, the resistors 38A to 38D, and the switching elements 39A and 39B may each be disposed outside the conductive substrate 60 like the semiconductor device 1B in accordance with the second embodiment.

Figure 63:
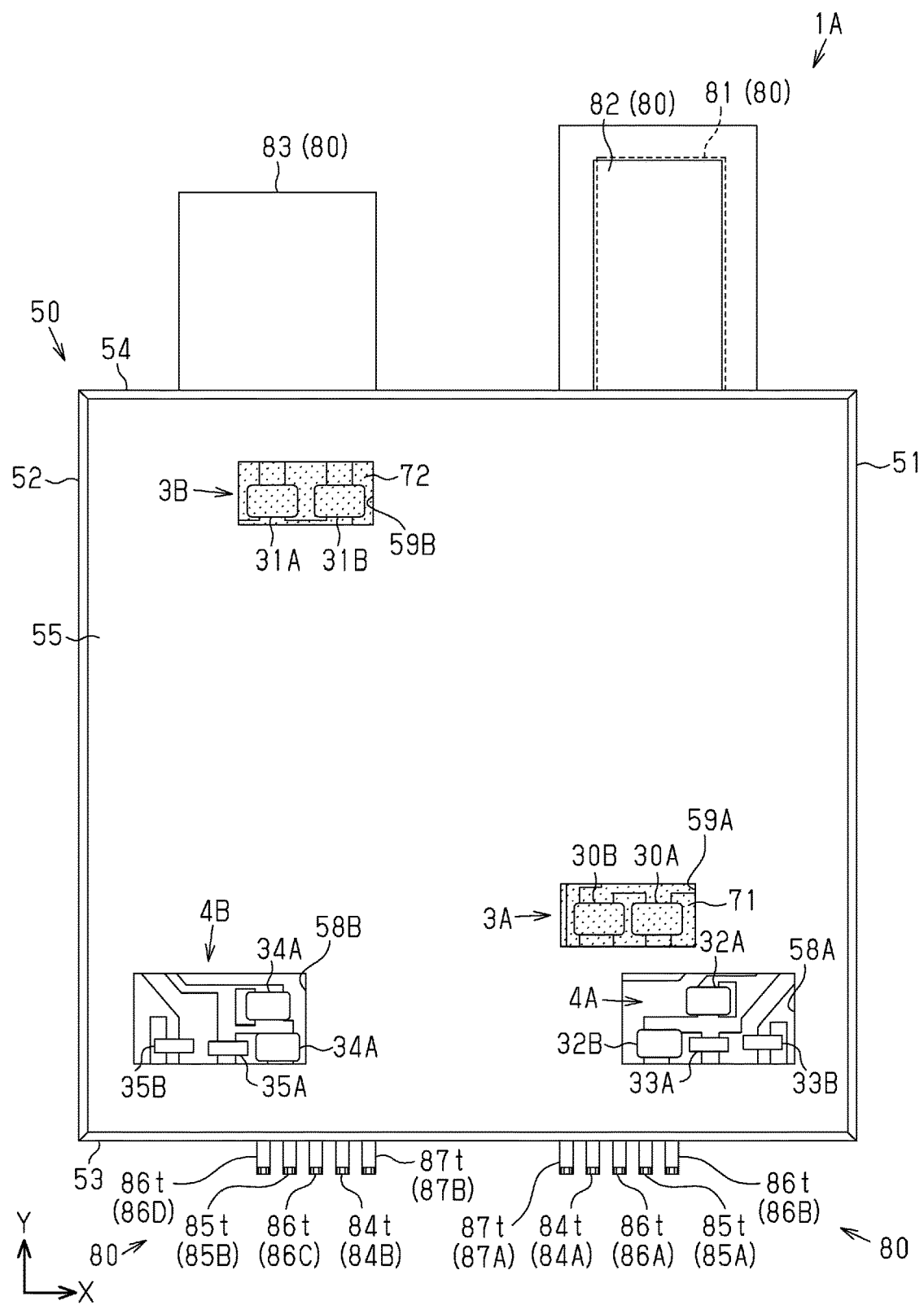
FIG. 63 is a plan view of a semiconductor device in a modified example.

In the semiconductor devices 1A to 1H, 1J, and 1K in accordance with the above embodiments, the layout of the input leads 81 and 82 and the output lead 83 may be changed in any manner. For example, the input leads 81 and 82 and the output lead 83 may be arranged so that the input leads 81 and 82 and the output lead 83 project from the same side of the resin member 50. In FIG. 63, the input leads 81 and 82 and the output lead 83 project from the fourth resin side surface 54. The input leads 81 and 82 are spaced apart from the output lead 83 in the width direction X.

In the semiconductor devices 1A to 1E in accordance with the first to fifth embodiments, instead of the first insulative substrate 41A and the second insulative substrate 41B, the first conductive member 42A and the second conductive member 42B may be supported by a single insulative substrate.

In the semiconductor device 1A to 1E in accordance with the first to fifth embodiment, the conductive substrate 60 may have any number of layers.

In the semiconductor devices in accordance with the first to fifth embodiments 1A to 1E, the fourth substrate layers 60D and 60E may be formed integrally. In this case, the fourth substrate layers 60D and 60E do not expose the exposed portions 82d of the second input lead 82 and form a conductive portion that covers the exposed portions 82d.

In the semiconductor devices in accordance with the first to fifth embodiments 1A to 1E, the fifth substrate layers 60F and 60G may be formed integrally. In this case, a conductive portion may be formed covering the conductive portion of the fourth substrate layers 60D and 60D.

In the semiconductor devices 1A to 1C in accordance with the first to third embodiments, at least one of the insulative material 71, which fills the first drive side opening 59A, and the insulative material 72, which fills the second drive side opening 59B, may be omitted. This allows either the first high-voltage diodes 30A and 30B, which are disposed in the first drive side opening 59A, or the second high-voltage diodes 31A and 31B, which are disposed in the second drive side opening 59B, to be readily removed from the conductive substrate 60. Thus, a high-voltage diode having different electrical properties from the high-voltage diodes 30A, 30B, 31A, and 31B can be mounted in at least one of the first drive side opening 59A and the second drive side opening 59B. This allows the electrical properties of the semiconductor device 1A to 1C to be readily adjusted. Further, in the sixth to eighth embodiments 1F to 1H, one of the insulative material 71, which fills the first drive side opening 59A, and the insulative material 72, which fills the second drive side opening 59B, may be omitted.

In the semiconductor devices 1A to 1C and 1F to 1H in accordance with the first to third embodiments and the sixth to eighth embodiments, as long as at least a wire section formed by a metal layer or a wire section of a lead is exposed, an electronic component can be mounted on the wire section formed by the metal layer or the wire section of the lead in the drive side openings 59A and 59B and the control side openings 58A and 58B. The drive side openings 59A and 59B and the control side openings 58A and 58B will now be described in paragraphs (A) to (F).

(A) In the semiconductor devices 1A to 1C and 1F to 1H, the insulative material 71 and the first high-voltage diodes 30A and 30B can be omitted from the first drive side opening 59A. With this configuration, for example, when applying the semiconductor devices 1A to 1C in accordance with the above embodiments to an electric circuit such as an inverter circuit, an electronic component such as a high-voltage diode may be mounted in the first drive side opening 59A to optimize the electrical characteristics of the electric circuit. This allows the electrical characteristics of the semiconductor devices 1A to 1C to be optimized for an electric circuit such as an inverter circuit.

(B) In the semiconductor devices 1A to 1C and 1F to 1H, the insulative material 72 and the second high-voltage diodes 31A and 31B can be omitted from the second drive side opening 59B. With this configuration, for example, when applying the semiconductor devices 1A to 1C in accordance with the above embodiments to an electric circuit such as an inverter circuit, an electronic component such as a high-voltage diode may be mounted in the second drive side opening 59B to optimize the electrical characteristics of the electric circuit. This allows the electrical characteristics of the semiconductor devices 1A to 1C to be optimized for an electric circuit such as an inverter circuit.

(C) In the semiconductor devices 1A, 1B, and 1F in accordance with the first, second, and sixth embodiments, either the first low-voltage diodes 32A and 32B or the first capacitors 33A and 33B may be omitted from the first control side opening 58A. With this configuration, for example, when applying the semiconductor devices 1A, 1B, and 1F in accordance with the first, second, and sixth embodiments to an electric circuit such as an inverter circuit, an electronic component such as a low-voltage diode or a capacitor may be mounted in the first control side opening 58A to optimize the electrical characteristics of the electric circuit. This allows the electrical characteristics of the semiconductor devices 1A, 1B, and 1F to be optimized for an electric circuit such as an inverter circuit. Such a modification may also be made to the semiconductor device 1J in accordance with the ninth embodiment.

(D) In the semiconductor devices 1C and 1H in accordance with the third and eighth embodiments, at least one of the first low-voltage diodes 36A and 36B, the first resistor 38A, the first resistor 38B, and the first switching element 39A can be omitted from the first control side opening 58A. With this configuration, for example, when applying the semiconductor devices 1C and 1H to an electric circuit such as an inverter circuit, an electronic component such as a low-voltage diode may be mounted in the first control side opening 58A to optimize the electrical characteristics of the electric circuit. This allows the electrical characteristics of the semiconductor devices 1C and 1H to be optimized for an electric circuit such as an inverter circuit. Such a modification may also be made to the semiconductor device 1K in accordance with the tenth embodiment.

(E) In the semiconductor devices 1A, 1B, and 1F in accordance with the first, second, and sixth embodiments, either the second low-voltage diodes 34A and 34B or the second capacitors 35A and 35B may be omitted from the second control side opening 58B. With this configuration, for example, when applying the semiconductor devices 1A, 1B, and 1F of the first, second, and sixth embodiments to an electric circuit such as an inverter circuit, an electronic component such as a low-voltage diode or a capacitor may be mounted in the second control side opening 58B to optimize the electrical characteristics of the electric circuit. This allows the electrical characteristics of the semiconductor devices 1A, 1B, and 1F to be optimized for an electric circuit such as an inverter circuit. Such a modification may also be made to the semiconductor device 1J in accordance with the ninth embodiment.

(F) In the semiconductor devices 1C and 1H in accordance with the third and eighth embodiments, at least one of the second low-voltage diodes 37A and 37B, the second resistors 38C and 38D, and the second switching element 39B may be omitted from the second control side opening 58B. With this configuration, for example, when applying the semiconductor devices 1C and 1H to an electric circuit such as an inverter circuit, an electronic component such as a low-voltage diode may be mounted in the second control side opening 58B to optimize the electrical characteristics of the electric circuit. This allows the electrical characteristics of the semiconductor devices 1C and 1H to be optimized for an electric circuit such as an inverter circuit. Such a modification may also be made to the semiconductor device 1K in accordance with the tenth embodiment.

Figure 64:
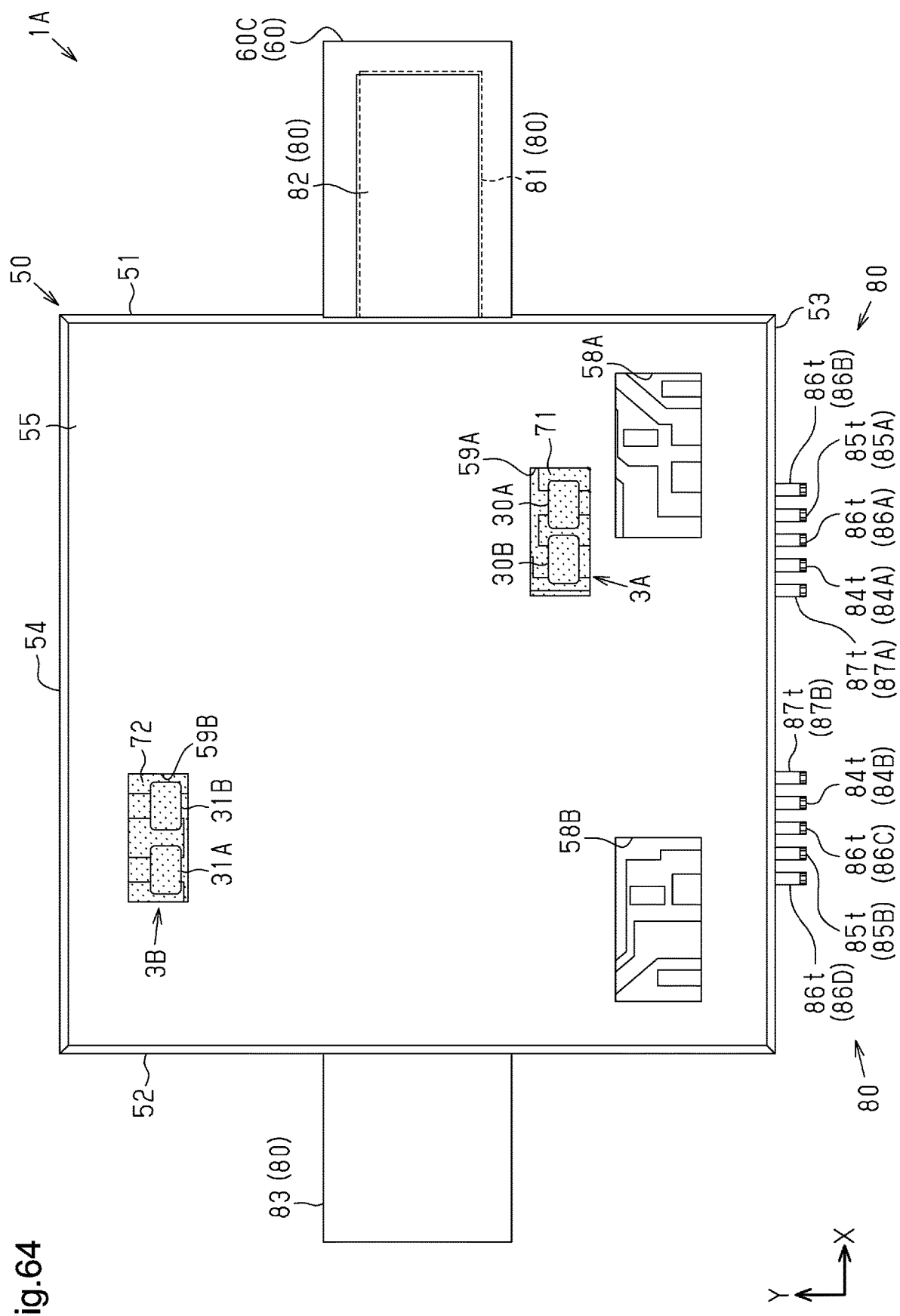
FIG. 64 is a plan view of a semiconductor device in a modified example.

As one example of the modifications described in paragraphs (A) to (F), FIG. 64 shows a state in which the first low-voltage diodes 32A and 32B and the first capacitors 33A and 33B are not mounted in the first control side opening 58A of the semiconductor device 1A and a state in which the second low-voltage diodes 34A and 34B and the second capacitors 35A and 35B are not mounted in the second control side opening 58B. In this case, for example, after mounting the semiconductor device 1A on a conductive substrate to which the semiconductor device 1A is applied, the electrical characteristics of the surge reduction circuits 4A and 4B are adjusted in accordance with the electrical characteristics of the electric circuit formed on the conductive substrate.

Figure 65:
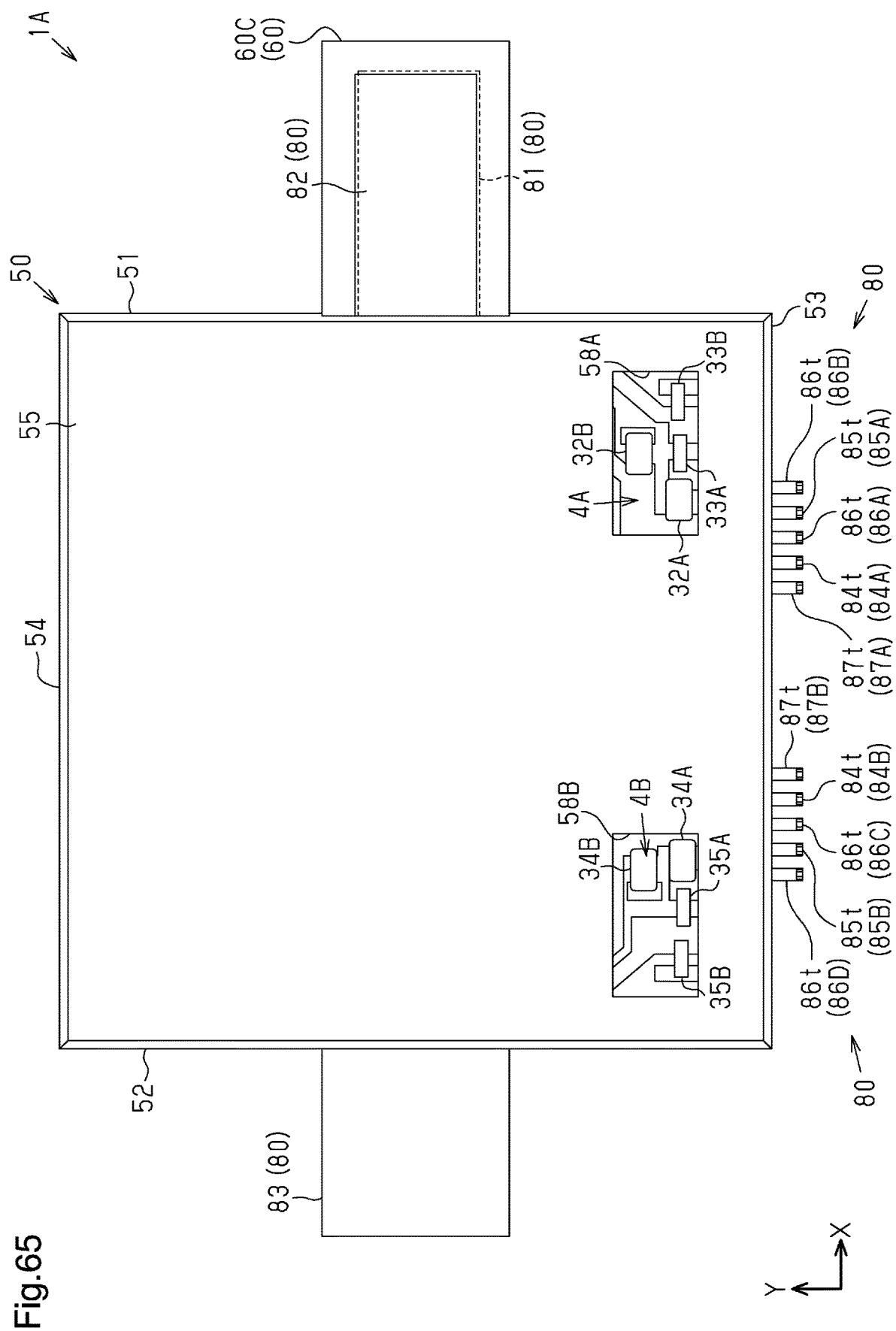
FIG. 65 is a plan view of a semiconductor device in a modified example.

In the semiconductor devices 1A to 1C and 1F to 1H, at least one of the first drive side opening 59A and the second drive side opening 59B may be omitted from the resin member 50. For example, in the semiconductor device 1A shown in FIG. 65, the first drive side opening 59A and the second drive side opening 59B are omitted from the resin member 50. In this case, the first high-voltage diodes 30A and 30B and the second high-voltage diodes 31A and 31B may be arranged in the resin member 50, and the first high-voltage diodes 30A and 30B and the second high-voltage diodes 31A and 31B may be omitted.

In the semiconductor devices 1D to 1F and 1K, the first semiconductor elements 10A and the second semiconductor elements 10B have the same electrode configuration. However, the first semiconductor elements 10A and the second semiconductor elements 10B may have any electrode configuration. For example, the electrode configuration of the first semiconductor elements 10A and the electrode configuration of the second semiconductor elements 10B may be symmetric with respect to a center line extending in the length direction Y. In this case, in the semiconductor devices 1E, 1F, and 1K in accordance with the fifth, sixth, and tenth embodiments, the current sensing electrodes 17 of the second semiconductor elements 10B are electrically connected by the second drive connection members 172 to the conductive portions 181P. The second source electrode 12B of each second semiconductor element 10B is connected to the corresponding conductive portion 181H by the second control connection member 93B.

In the semiconductor devices 1A to 1H, 1J, and 1K, the first semiconductor elements 10A and the second semiconductor elements 10B are not limited to transistors such as MOSFETs. For example, they may be diodes or LSIs.

When the first semiconductor elements 10A and the second semiconductor elements 10B are diodes, the control electrode is omitted from each of the first semiconductor elements 10A and the second semiconductor elements 10B. That is, the first semiconductor elements 10A and the second semiconductor elements 10B each include an anode electrode, serving as the first drive electrode, and a cathode electrode, serving as the second drive electrode. In this case, the first control wire 63A and the second control wire 63B are omitted. Accordingly, the first control lead 84A and the second control lead 84B are omitted. The first control wire 64A and the second control wire 64B may be left to detect the amount of current flowing to the first semiconductor elements 10A and the second semiconductor elements 10B.

Further, the first control wire 64A and the second control wire 64B may be omitted. Accordingly, the first control lead 85A and the second control lead 85B may be omitted.

In a case where the first semiconductor elements 10A and the second semiconductor elements 10B are LSIs, the first drive electrode and the second drive electrode are omitted from each of the first semiconductor elements 10A and the second semiconductor elements 10B. That is, the first semiconductor elements 10A and the second semiconductor elements 10B each include a control electrode.

In the semiconductor devices 1A to 1H, 1J, and 1K in accordance with the above embodiments, either the first semiconductor elements 10A or the second semiconductor elements 10B may be omitted. Omission of the second semiconductor elements 10B allows for omission of the leads arranged in the length direction Y next to the second insulative substrate 41B, the second conductive member 42B, the portion of the conductive substrate 60 supported by the second conductive member 42B, and the second conductive member 42B. Omission of the first semiconductor elements 10A allows for omission of the leads arranged in the length direction Y next to the first insulative substrate 41A, the first conductive member 42A, the portion of the conductive substrate 60 supported by the first conductive member 42A, and the first conductive member 42A.

In the semiconductor devices 1A to 1H, 1J, and 1K in accordance with the above embodiments, the conductive substrates 60 and 180 may be single-layer substrates.

In the semiconductor devices 1A to 1H, 1J, and 1K in accordance with the above embodiments, the conductive substrates 60 and 180 may be omitted. In this case, an insulative layer is formed on the main surfaces 42*sa* and 42*sb* of the conductive members 42A and 42B, and a metal layer or a wire portion formed by a metal plate is formed on the insulative layer.

In the conductive substrate preparing step and the substrate bonding step of the method for manufacturing the semiconductor devices in accordance with the first to fifth embodiments 1A to 1E, after bonding the first input lead 81 to the main surface 42*sa* of the first conductive member 42A and bonding the output lead 83 to the main surface 42*sb* of the second conductive member 42B, the conductive substrate 60 may be bonded to the main surface 42*sa* of the first conductive member 42A and the main surface 42*sb* of the second conductive member 42B.

Technical concepts that can be recognized from the above embodiments and modified examples will now be described.

Embodiment 1

A semiconductor device including:
a semiconductor element;
a support substrate that supports the semiconductor element;
a conductor electrically connected to the semiconductor element; and
a resin member that encapsulates the semiconductor element, where
the conductor includes a mounting region on which an electronic component is mounted, and
the resin member includes a resin opening that exposes the mounting region.

Embodiment 2

The semiconductor device according to embodiment 1, including:
a conductive substrate serving as the conductor and including a conductive portion of a metal layer formed on a substrate that is electrically insulative, where
the semiconductor element is electrically connected to the conductive portion of the conductive substrate,
the support substrate supports the conductive substrate, and
the resin member encapsulates the conductive substrate.

Embodiment 3

The semiconductor device according to embodiment 2, where the mounting region includes the conductive portion to mount the electronic component.

Embodiment 4

The semiconductor device according to embodiment 3, where
the semiconductor element includes a first drive electrode and a second drive electrode,
the conductive portion includes a drive conductive portion electrically connected to the first drive electrode, and
the resin opening includes a drive side opening that exposes part of the drive conductive portion.

Embodiment 5

The semiconductor device according to embodiment 4, where the electronic component is mounted on part of the drive conductive portion to detect short-circuiting of the semiconductor element.

Embodiment 6

The semiconductor device according to embodiment 5, where the electronic component includes a diode.

Embodiment 7

The semiconductor device according to any one of embodiments 4 to 6, where the drive side opening is filled with a resin material that is electrically insulative.

Embodiment 8

The semiconductor device according to embodiment 7, where the resin material differs from that of the resin member.

Embodiment 9

The semiconductor device according to any one of embodiments 2 to 8, where the semiconductor element includes a control electrode that controls current supplied to the semiconductor element, the conductive portion includes a control conductive portion electrically connected to the control electrode, and the resin opening includes a control side opening that exposes part of the control conductive portion.

Embodiment 10

The semiconductor device according to any one of embodiments 2 to 8, where:
the semiconductor element is a transistor including a first drive electrode, a second drive electrode, and a control electrode;
the conductive portion includes
a drive conductive portion electrically connected to the first drive electrode, and
a control conductive portion electrically connected to the control electrode;
the resin opening includes a drive side opening that exposes part of the drive conductive portion and a control side opening that exposes part of the control conductive portion; and
the drive side opening is separate from the control side opening.

Embodiment 11

The semiconductor device according to any one of embodiments 2 to 10, where:
the semiconductor element is a transistor including a first drive electrode, a second drive electrode, and a control electrode;
the conductive portion includes
a control conductive portion electrically connected to the control electrode, and
a reference conductive portion electrically connected to the second drive electrode to set a voltage applied to the control electrode based on a potential difference from the control conductive portion; and
the resin opening includes a control side opening that exposes part of the reference conductive portion.

Embodiment 12

The semiconductor device according to any one of embodiments 2 to 8, where:
the semiconductor element is a transistor including a first drive electrode, a second drive electrode, and a control electrode;
the conductive portion includes
a control conductive portion electrically connected to the control electrode, and
a reference conductive portion electrically connected to the second drive electrode to set a voltage applied to the control electrode based on a potential difference from the control conductive portion; and
the resin opening includes a control side opening that exposes part of the control conductive portion and part of the reference conductive portion.

Embodiment 13

The semiconductor device according to any one of embodiments 9, 10, and 12, where the electronic component is mounted on the control conductive portion, which is exposed from the control side opening, to reduce surge in a voltage applied to the control electrode.

Embodiment 14

The semiconductor device according to embodiment 11 or 12, where the electronic component is mounted on the reference conductive portion, which is exposed from the control side opening, to reduce surge in a voltage applied to the second drive electrode.

Embodiment 15

The semiconductor device according to any one of embodiments 2 to 8, where the semiconductor element includes a control electrode that controls voltage supplied to the semiconductor element, the semiconductor device including:
a control lead formed by a metal plate electrically connected to the control electrode, where:
the control lead includes
a control terminal that projects from a surface of the resin member, and
a control conductive portion located inward from the surface of the resin member and electrically connected to the control terminal; and
the resin opening includes a control side opening that exposes part of the control conductive portion.

Embodiment 16

The semiconductor device according to any one of embodiments 2 to 8, where the semiconductor element is a transistor including a first drive electrode, a second drive electrode, and a control electrode, the semiconductor device including:
a control lead formed by a metal plate electrically connected to the control electrode; and
a reference lead formed by a metal plate and electrically connected to the second drive electrode to set a voltage applied to the control electrode based on a potential difference from the control lead, where:
the reference lead includes
a reference terminal that projects from a surface of the resin member, and
a reference conductive portion located inward from the surface of the resin member and electrically connected to the reference terminal; and
the resin opening includes a control side opening that exposes part of the reference conductive portion.

Embodiment 17

The semiconductor device according to any one of embodiments 2 to 8, where the semiconductor element is a transistor including a first drive electrode, a second drive electrode, and a control electrode, the semiconductor device including:
a control lead formed by a metal plate electrically connected to the control electrode; and
a reference lead formed by a metal plate and electrically connected to the second drive electrode to set a voltage applied to the control electrode based on a potential difference from the control lead, where:
the control lead includes a control terminal that projects from a surface of the resin member, and
a control conductive portion located inward from the surface of the resin member and electrically connected to the control terminal;
the reference lead includes
a reference terminal that projects from a surface of the resin member, and
a reference conductive portion located inward from the surface of the resin member and electrically connected to the reference terminal; and
the resin opening includes a control side opening that exposes part of the control conductive portion and part of the reference conductive portion.

Embodiment 18

The semiconductor device according to embodiment 15 or 17, where the electronic component is mounted on the control conductive portion, which is exposed from the control side opening, to reduce surge in a voltage applied to the control electrode.

Embodiment 19

The semiconductor device according to embodiment 16 or 17, where the electronic component is mounted on the reference conductive portion, which is exposed from the control side opening, to reduce surge in a voltage applied to the second drive electrode.

Embodiment 20

The semiconductor device according to any one of embodiments 15 to 19, where
the semiconductor element includes a first drive electrode and a second drive electrode,
the conductive portion includes a drive conductive portion electrically connected to the first drive electrode,
the resin opening includes a drive side opening that exposes part of the drive conductive portion, and
the control side opening is spaced apart from the drive side opening.

Embodiment 21

The semiconductor device according to embodiment 15 or 17, where the control side opening is located between the semiconductor element and the control terminal of the control lead as viewed in a thickness direction of the support substrate.

Embodiment 22

The semiconductor device according to embodiment 16, where the control side opening is located between the semiconductor element and the reference terminal of the reference lead as viewed in a thickness direction of the support substrate.

Embodiment 23

The semiconductor device according to any one of embodiments 2 to 22, where
the support substrate includes a conductive member formed of metal,
the conductive substrate is stacked on the conductive member, and
the semiconductor element is mounted on the conductive member.

Embodiment 24

The semiconductor device according to embodiment 23, where
the conductive substrate includes a substrate opening that extends through the conductive substrate in a thickness direction of the conductive substrate, and
the semiconductor element is disposed in the substrate opening.

Embodiment 25

The semiconductor device according to any one of embodiments 2 to 22, where:
the semiconductor element includes a first semiconductor element and a second semiconductor element that are connected to each other in series;
the first semiconductor element and the second semiconductor element each include a first drive electrode and a second drive electrode;
the second drive electrode of the first semiconductor element is connected to the first drive electrode of the second semiconductor element;
the conductive portion includes
a first drive conductive portion electrically connected to the first drive electrode of the first semiconductor element, and
a second drive conductive portion electrically connected to the first drive electrode of the second semiconductor element; and
the resin opening includes
a first drive side opening that exposes part of the first drive conductive portion, and
a second drive side opening that exposes part of the second drive conductive portion.

Embodiment 26

The semiconductor device according to embodiment 25, where:
the first semiconductor element and the second semiconductor element each include a control electrode;
the conductive portion includes
a first control conductive portion electrically connected to the control electrode of the first semiconductor element, and
a second control conductive portion electrically connected to the control electrode of the second semiconductor element; and
the resin opening includes
a first control side opening that exposes part of the first control conductive portion, and
a second control side opening that is spaced apart from the first control side opening and exposes part of the second control conductive portion.

Embodiment 27

The semiconductor device according to embodiment 26, including:

a first control lead formed by a metal plate electrically connected to the control electrode of the first semiconductor element; and
a second control lead formed by a metal plate electrically connected to the control electrode of the second semiconductor element, where
part of the first control conductive portion is located between the first semiconductor element and the first control lead as viewed in a thickness direction of the support substrate, and
part of the second control conductive portion is located between the second semiconductor element and the second control lead as viewed in the thickness direction.

Embodiment 28

The semiconductor device according to embodiment 27, where
the first control side opening is located between the first semiconductor element and the first control lead as viewed in the thickness direction, and
the second control side opening is located between the second semiconductor element and the second control lead as viewed in the thickness direction.

Embodiment 29

The semiconductor device according to any one of embodiments 26 to 28, where:
the conductive portion includes
a first reference conductive portion electrically connected to the second drive electrode of the first semiconductor element to set a voltage applied to the control electrode of the first semiconductor element based on a potential difference from the first control conductive portion, and
a second reference conductive portion electrically connected to the second drive electrode of the second semiconductor element to set a voltage applied to the control electrode of the second semiconductor element based on a potential difference from the second control conductive portion;
the first control side opening exposes part of the first reference conductive portion; and
the second control side opening exposes part of the second reference conductive portion.

Embodiment 30

The semiconductor device according to embodiment 29, including:
a first reference lead formed by a metal plate electrically connected to the second drive electrode of the first semiconductor element; and
a second reference lead formed by a metal plate electrically connected to the second drive electrode of the second semiconductor element, where
part of the first reference conductive portion is located between the first semiconductor element and the first reference lead as viewed in a thickness direction of the support substrate, and
part of the second reference conductive portion is located between the second semiconductor element and the second reference lead as viewed in the thickness direction.

Embodiment 31

The semiconductor device according to any one of embodiments 26 to 30, where
the support substrate is shaped to be rectangular as viewed in a thickness direction of the support substrate, and
the first control side opening and the second control side opening are aligned in a state spaced apart from each other in a direction parallel to one side of the support substrate as viewed in the thickness direction.

Embodiment 32

The semiconductor device according to any one of embodiments 26 to 31, where the electric component is mounted on each of the first control conductive portion, which is exposed from the first control side opening, and the second control conductive portion, which is exposed from the second control side opening, to reduce surge in a voltage applied to the control electrode.

Embodiment 33

The semiconductor device according to embodiments 29 or 30, where the electric component is mounted on each of the first reference conductive portion, which is exposed from the first control side opening, and the second reference conductive portion, which is exposed from the second control side opening, to reduce surge in a voltage applied to the second drive electrode.

Embodiment 34

The semiconductor device according to any one of embodiments 2 to 8, where:
the semiconductor element includes a first semiconductor element and a second semiconductor element that are connected to each other in series;
each of the first semiconductor element and the second semiconductor element is a transistor including a first drive electrode, a second drive electrode, and a control electrode;
the second drive electrode of the first semiconductor element is connected to the first drive electrode of the second semiconductor element,
the semiconductor device including:
a first control lead electrically connected to the control electrode of the first semiconductor element; and
a second control lead electrically connected to the control electrode of the second semiconductor element, where
the first control lead includes
a first control terminal that projects from a surface of the resin member, and
a first control conductive portion located inward from the surface of the resin member and electrically connected to the first control terminal,
the second control lead includes
a second control terminal that projects from the surface of the resin member, and
a second control conductive portion located inward from the surface of the resin member and electrically connected to the second control terminal, and
the resin opening includes
a first control side opening that exposes part of the first control conductive portion, and a second control side opening that is spaced apart from the first control side opening and exposes part of the second control conductive portion.

Embodiment 35

The semiconductor device according to embodiment 34, where
the resin member is shaped to be rectangular as viewed in a thickness direction of the resin member, and
the first control side opening and the second control side opening are aligned in a state spaced apart from each other in a direction parallel to one side of the resin member as viewed in the thickness direction.

Embodiment 36

The semiconductor device according to any one of embodiments 2 to 8, where
the semiconductor element includes a first semiconductor element and a second semiconductor element that are connected to each other in series,
the first semiconductor element and the second semiconductor element each include a first drive electrode and a second drive electrode, and
the second drive electrode of the first semiconductor element is connected to the first drive electrode of the second semiconductor element,
the semiconductor device including:
a first reference lead electrically connected to the second drive electrode of the first semiconductor element; and
a second reference lead electrically connected to the second drive electrode of the second semiconductor element, where:
the first reference lead includes
 a first reference terminal that projects from a surface of the resin member, and
 a first reference conductive portion located inward from the surface of the resin member and electrically connected to the first reference terminal;
the second reference lead includes
 a second reference terminal that projects from the surface of the resin member, and
 a second reference conductive portion located inward from the surface of the resin member and electrically connected to the second reference terminal; and
the resin opening includes
 a first control side opening that exposes part of the first reference conductive portion, and
 a second control side opening that exposes part of the second reference conductive portion.

Embodiment 37

The semiconductor device according to any one of embodiments 2 to 8, where:
the semiconductor element includes a first semiconductor element and a second semiconductor element that are connected to each other in series;
each of the first semiconductor element and the second semiconductor element is a transistor including a first drive electrode, a second drive electrode, and a control electrode; and
the second drive electrode of the first semiconductor element is connected to the first drive electrode of the second semiconductor element,
the semiconductor device including:
a first control lead electrically connected to the control electrode of the first semiconductor element;
a second control lead electrically connected to the control electrode of the second semiconductor element;
a first reference lead electrically connected to the second drive electrode of the first semiconductor element; and
a second reference lead electrically connected to the second drive electrode of the second semiconductor element, where:
the first control lead includes
 a first control terminal that projects from a surface of the resin member, and
 a first control conductive portion located inward from the surface of the resin member and electrically connected to the first control terminal;
the second control lead includes
 a second control terminal that projects from the surface of the resin member, and
 a second control conductive portion located inward from the surface of the resin member and electrically connected to the second control terminal;
the first reference lead includes
 a first reference terminal that projects from the surface of the resin member, and
 a first reference conductive portion located inward from the surface of the resin member and electrically connected to the first reference terminal;
the second reference lead includes
 a second reference terminal that projects from the surface of the resin member, and
 a second reference conductive portion located inward from the surface of the resin member and electrically connected to the second reference terminal; and
the resin opening includes
 a first control side opening that exposes part of the first control conductive portion and part of the first reference conductive portion, and
 a second control side opening that exposes part of the second control conductive portion and part of the second reference conductive portion.

Embodiment 38

The semiconductor device according to any one of embodiments 25 to 37, where:
the support substrate includes
 a first conductive member on which the first semiconductor element is mounted, and
 a second conductive member on which the second semiconductor element is mounted;
the first conductive member and the second conductive member are disposed in a state spaced apart from each other in a first direction that is orthogonal to the thickness direction as viewed in a thickness direction of the support substrate; and
the conductive substrate is arranged over the first conductive member and the second conductive member.

Embodiment 39

The semiconductor device according to any one of embodiments 2 to 38, where the conductive substrate is a multilayer conductive substrate.

Embodiment 40

The semiconductor device according to embodiment 39, where the conductive substrate includes a conductive portion to mount the electronic component, and the conductive portion is formed by an outermost layer of the multilayer conductive substrate.

Embodiment 41

The semiconductor device according to any one of embodiments 1 to 40, where the electronic component includes a Schottky barrier diode.

Embodiment 42

The semiconductor device according to any one of embodiments 1 to 40, where the electronic component includes two Schottky barrier diodes connected to each other in reverse-series.

Embodiment 43

The semiconductor device according to any one of embodiments 1 to 42, where the electronic component includes a transistor.

Embodiment 44

The semiconductor device according to any one of embodiments 1 to 43, where the electronic component includes a capacitor.

Embodiment 45

The semiconductor device according to any one of embodiments 2 to 23 and 25 to 37, where the semiconductor element is mounted on the conductive portion.

The invention claimed is:

1. A semiconductor device comprising:
a semiconductor element;
a support substrate that supports the semiconductor element;
a conductor electrically connected to the semiconductor element; and
a resin member that encapsulates the semiconductor element, wherein
the conductor includes a mounting region on which an electronic component is mounted, and
the resin member includes a resin opening that exposes the mounting region,
the semiconductor device further comprises a conductive substrate serving as the conductor and including a conductive portion of a metal layer formed on a substrate that is electrically insulative,
the semiconductor element is electrically connected to the conductive portion of the conductive substrate,
the support substrate supports the conductive substrate,
the resin member encapsulates the conductive substrate,
the mounting region includes the conductive portion to mount the electronic component,
the semiconductor element includes a first drive electrode and a second drive electrode,
the conductive portion includes a drive conductive portion electrically connected to the first drive electrode, and
the resin opening includes a drive side opening that exposes part of the drive conductive portion.

2. The semiconductor device according to claim 1, wherein the electronic component is mounted on part of the drive conductive portion to detect short-circuiting of the semiconductor element.

3. The semiconductor device according to claim 2, wherein the electronic component includes a diode.

4. The semiconductor device according to claim 1, wherein the drive side opening is filled with a resin material that is electrically insulative.

5. The semiconductor device according to claim 4, wherein the resin material differs from that of the resin member.

6. The semiconductor device according to claim 1, wherein
the semiconductor element includes a control electrode that controls current supplied to the semiconductor element,
the conductive portion includes a control conductive portion electrically connected to the control electrode, and
the resin opening includes a control side opening that exposes part of the control conductive portion.

7. The semiconductor device according to claim 6, wherein the electronic component is mounted on the control conductive portion, which is exposed from the control side opening, to reduce surge in a voltage applied to the control electrode.

8. The semiconductor device according to claim 1, wherein:
the semiconductor element is a transistor including a first drive electrode, a second drive electrode, and a control electrode,
the conductive portion includes:
  a drive conductive portion electrically connected to the first drive electrode; and
  a control conductive portion electrically connected to the control electrode, and
the resin opening includes a drive side opening that exposes part of the drive conductive portion and a control side opening that exposes part of the control conductive portion, and
the drive side opening is separate from the control side opening.

9. The semiconductor device according to claim 1, wherein
the semiconductor element is a transistor including a first drive electrode, a second drive electrode, and a control electrode,
the conductive portion includes:
  a control conductive portion electrically connected to the control electrode; and
  a reference conductive portion electrically connected to the second drive electrode to set a voltage applied to the control electrode based on a potential difference from the control conductive portion, and
the resin opening includes a control side opening that exposes part of the reference conductive portion.

10. The semiconductor device according to claim 9, wherein the electronic component is mounted on the reference conductive portion, which is exposed from the control side opening, to reduce surge in a voltage applied to the second drive electrode.

11. The semiconductor device according to claim 1, wherein:
the semiconductor element is a transistor including a first drive electrode, a second drive electrode, and a control electrode, the conductive portion includes:
a control conductive portion electrically connected to the control electrode; and
a reference conductive portion electrically connected to the second drive electrode to set a voltage applied to the control electrode based on a potential difference from the control conductive portion, and
the resin opening includes a control side opening that exposes part of the control conductive portion and part of the reference conductive portion.

12. The semiconductor device according to claim 1, wherein the semiconductor element includes a control electrode that controls voltage supplied to the semiconductor element, the semiconductor device comprising:
a control lead formed by a metal plate electrically connected to the control electrode, wherein
the control lead includes:
a control terminal that projects from a surface of the resin member; and
a control conductive portion located inward from the surface of the resin member and electrically connected to the control terminal, and
the resin opening includes a control side opening that exposes part of the control conductive portion.

13. The semiconductor device according to claim 12, wherein the electronic component is mounted on the control conductive portion, which is exposed from the control side opening, to reduce surge in a voltage applied to the control electrode.

14. The semiconductor device according to claim 12, wherein:
the semiconductor element includes a first drive electrode and a second drive electrode,
the conductive portion includes a drive conductive portion electrically connected to the first drive electrode, and
the resin opening includes a drive side opening that exposes part of the drive conductive portion, and
the control side opening is spaced apart from the drive side opening.

15. The semiconductor device according to claim 1, wherein the semiconductor element is a transistor including a first drive electrode, a second drive electrode, and a control electrode, the semiconductor device further comprising:
a control lead formed by a metal plate electrically connected to the control electrode; and
a reference lead formed by a metal plate and electrically connected to the second drive electrode to set a voltage applied to the control electrode based on a potential difference from the control lead, wherein
the reference lead includes:
a reference terminal that projects from a surface of the resin member; and
a reference conductive portion located inward from the surface of the resin member and electrically connected to the reference terminal, and
the resin opening includes a control side opening that exposes part of the reference conductive portion.

16. The semiconductor device according to claim 15, wherein the electronic component is mounted on the reference conductive portion, which is exposed from the control side opening, to reduce surge in a voltage applied to the second drive electrode.

17. The semiconductor device according to claim 1, wherein the semiconductor element is a transistor including a first drive electrode, a second drive electrode, and a control electrode, the semiconductor device further comprising:
a control lead formed by a metal plate electrically connected to the control electrode; and
a reference lead formed by a metal plate and electrically connected to the second drive electrode to set a voltage applied to the control electrode based on a potential difference from the control lead,
wherein the control lead includes:
a control terminal that projects from a surface of the resin member; and
a control conductive portion located inward from the surface of the resin member and electrically connected to the control terminal, and
the reference lead includes:
a reference terminal that projects from a surface of the resin member; and
a reference conductive portion located inward from the surface of the resin member and electrically connected to the reference terminal, and
the resin opening includes a control side opening that exposes part of the control conductive portion and part of the reference conductive portion.

* * * * *